(12) United States Patent
Raring et al.

(10) Patent No.: US 12,538,537 B2
(45) Date of Patent: Jan. 27, 2026

(54) MANUFACTURABLE GALLIUM CONTAINING ELECTRONIC DEVICES

(71) Applicant: KYOCERA SLD Laser, Inc., Goleta, CA (US)

(72) Inventors: James W. Raring, Goleta, CA (US); Nicholas J. Pfister, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 534 days.

(21) Appl. No.: 18/071,877

(22) Filed: Nov. 30, 2022

(65) Prior Publication Data

US 2023/0178611 A1 Jun. 8, 2023

Related U.S. Application Data

(63) Continuation-in-part of application No. 17/897,765, filed on Aug. 29, 2022, now Pat. No. 11,948,980, (Continued)

(51) Int. Cl.
*H10D 62/824* (2025.01)
*H01L 21/02* (2006.01)
(Continued)

(52) U.S. Cl.
CPC ..... *H10D 62/824* (2025.01); *H01L 21/02458* (2013.01); *H01L 21/311* (2013.01);
(Continued)

(58) Field of Classification Search
CPC ...... H10D 62/824; H10D 8/045; H10D 8/051; H10D 10/021; H10D 30/015; H10D 30/0516; H10D 84/01; H10D 84/05; H10D 84/204; H10D 84/811; H10D 84/83; H10D 86/021; H10D 86/481; H10D 86/60; H10D 8/422; H10D 8/60; H10D 30/475; H10D 62/343; H10D 62/8503; H10D 64/513; H10D 64/602; H10D 84/08; H10D 84/82; H10D 8/50; H10D 8/605; H10D 30/202; H10D 30/477; H10D 30/478; H10D 30/668; H10D 30/831; H10D 62/114; H10D 62/149; H10D 64/256; H01L 21/02458; H01L 21/311; H01L 21/6835; H01L 2224/95; H01L 23/3171; H01L 25/0753;
(Continued)

(56) References Cited

U.S. PATENT DOCUMENTS 9,653,642 B1 5/2017 Raring et al.
9,666,677 B1 5/2017 Raring et al.
(Continued)

OTHER PUBLICATIONS

International Search Report and Written Opinion for Application No. PCT/US2023/81408, mailed May 8, 2024, 12 pages.
(Continued)

*Primary Examiner* — Scott B Geyer
(74) *Attorney, Agent, or Firm* — Kilpatrick Townsend & Stockton LLP

(57) ABSTRACT

Electronic devices are formed on donor substrates and transferred to carrier substrates by forming bonding regions on the electronic devices and bonding the bonding regions to a carrier substrate. The transfer process may include forming anchors and removing sacrificial regions.

6 Claims, 103 Drawing Sheets

Example of carrier wafer processed to act as submount

Related U.S. Application Data which is a continuation of application No. 17/078,389, filed on Oct. 23, 2020, now Pat. No. 11,955,521, which is a continuation of application No. 16/835,082, filed on Mar. 30, 2020, now Pat. No. 10,854,778, which is a continuation of application No. 16/796,154, filed on Feb. 20, 2020, now Pat. No. 10,854,776, which is a continuation of application No. 16/005,255, filed on Jun. 11, 2018, now Pat. No. 10,629,689, which is a continuation of application No. 15/480,239, filed on Apr. 5, 2017, now Pat. No. 10,002,928, which is a continuation of application No. 15/209,309, filed on Jul. 13, 2016, now Pat. No. 9,653,642, which is a continuation-in-part of application No. 14/580,693, filed on Dec. 23, 2014, now Pat. No. 9,666,677.

(51) Int. Cl.

| | |
|---|---|
| *H01L 21/311* | (2006.01) |
| *H01L 21/683* | (2006.01) |
| *H01L 23/00* | (2006.01) |
| *H01S 5/02* | (2006.01) |
| *H01S 5/227* | (2006.01) |
| *H01S 5/343* | (2006.01) |
| *H10D 8/01* | (2025.01) |
| *H10D 10/01* | (2025.01) |
| *H10D 30/01* | (2025.01) |
| *H10D 84/00* | (2025.01) |
| *H10D 84/01* | (2025.01) |
| *H10D 84/05* | (2025.01) |
| *H10D 84/80* | (2025.01) |
| *H10D 84/83* | (2025.01) |
| *H10D 86/01* | (2025.01) |
| *H10D 86/40* | (2025.01) |
| *H10D 86/60* | (2025.01) |
| *H10H 20/01* | (2025.01) |
| *H10H 20/811* | (2025.01) |
| *H10H 20/812* | (2025.01) |
| *H10H 20/824* | (2025.01) |
| *H10H 20/825* | (2025.01) |
| *H10H 29/10* | (2025.01) |
| *H10D 8/00* | (2025.01) |
| *H10D 8/60* | (2025.01) |
| *H10D 30/47* | (2025.01) |
| *H10D 62/17* | (2025.01) |
| *H10D 62/85* | (2025.01) |
| *H10D 64/27* | (2025.01) |
| *H10D 64/60* | (2025.01) |
| *H10D 84/08* | (2025.01) |
| *H10D 84/82* | (2025.01) |

(52) U.S. Cl.
CPC .......... *H01L 21/6835* (2013.01); *H01L 24/00* (2013.01); *H01S 5/0203* (2013.01); *H01S 5/0217* (2013.01); *H01S 5/227* (2013.01); *H01S 5/34333* (2013.01); *H10D 8/045* (2025.01); *H10D 8/051* (2025.01); *H10D 10/021* (2025.01); *H10D 30/015* (2025.01); *H10D 30/0516* (2025.01); *H10D 84/01* (2025.01); *H10D 84/05* (2025.01); *H10D 84/204* (2025.01); *H10D 84/811* (2025.01); *H10D 84/83* (2025.01); *H10D 86/021* (2025.01); *H10D 86/481* (2025.01); *H10D 86/60* (2025.01); *H10H 20/0133* (2025.01); *H10H 20/01335* (2025.01); *H10H 20/0137* (2025.01); *H10H 20/018* (2025.01); *H10H 20/811* (2025.01); *H10H 20/812* (2025.01); *H10H 20/824* (2025.01); *H10H 20/825* (2025.01); *H10H 29/10* (2025.01); *H01L 2224/95* (2013.01); *H01L 2924/1203* (2013.01); *H01L 2924/12032* (2013.01); *H01L 2924/12041* (2013.01); *H01L 2924/1305* (2013.01); *H01L 2924/13055* (2013.01); *H01L 2924/13062* (2013.01); *H01L 2924/13064* (2013.01); *H01L 2924/13091* (2013.01); *H10D 8/422* (2025.01); *H10D 8/60* (2025.01); *H10D 30/475* (2025.01); *H10D 62/343* (2025.01); *H10D 62/8503* (2025.01); *H10D 64/513* (2025.01); *H10D 64/602* (2025.01); *H10D 84/08* (2025.01); *H10D 84/82* (2025.01)

(58) Field of Classification Search
CPC ... H01L 2221/6835; H01L 2221/68363; H01L 2221/68368; H01L 25/167; H01L 2224/18; H01L 21/7806; H10H 20/0133; H10H 20/01335; H10H 20/0137; H10H 20/018; H10H 20/811; H10H 20/812; H10H 20/824; H10H 20/825; H10H 29/10; H10H 20/857; H10H 29/142
See application file for complete search history.

(56) References Cited

U.S. PATENT DOCUMENTS

| | | |
|---|---|---|
| 10,002,928 B1 | 6/2018 | Raring et al. |
| 10,629,689 B1 | 4/2020 | Raring et al. |
| 10,854,776 B1 | 12/2020 | Raring et al. |
| 10,854,777 B1 | 12/2020 | Raring et al. |
| 10,854,778 B1 | 12/2020 | Raring et al. |
| 11,227,970 B1* | 1/2022 | Oyer ................. H01L 25/0753 |
| 11,948,980 B1 | 4/2024 | Raring et al. |
| 11,955,521 B1 | 4/2024 | Raring et al. |
| 2004/0209402 A1 | 10/2004 | Chai et al. |
| 2008/0219309 A1 | 9/2008 | Hata et al. |
| 2011/0151602 A1* | 6/2011 | Speier ................ H01L 21/6835 438/26 |
| 2011/0204376 A1 | 8/2011 | Su et al. |
| 2012/0256187 A1* | 10/2012 | Yu .......................... H10H 29/14 257/E33.056 |
| 2013/0214284 A1 | 8/2013 | Holder et al. |
| 2013/0313516 A1 | 11/2013 | David et al. |
| 2014/0023102 A1 | 1/2014 | Holder et al. |
| 2015/0140710 A1 | 5/2015 | McLaurin et al. |
| 2015/0229100 A1* | 8/2015 | Sztein .................. H01S 5/0215 438/33 |
| 2018/0034243 A1* | 2/2018 | Kelemen ............. H01S 5/0216 |
| 2019/0386173 A1* | 12/2019 | Chen .................... H10H 20/812 |
| 2020/0020825 A1* | 1/2020 | Yang ................... H10H 20/825 |
| 2020/0366050 A1 | 11/2020 | McLaurin et al. |
| 2020/0403114 A1* | 12/2020 | Meng .................. H01L 25/0753 |
| 2021/0104574 A1* | 4/2021 | Behringer ............ H10H 29/142 |
| 2021/0273415 A1 | 9/2021 | McLaurin et al. |
| 2021/0399183 A1* | 12/2021 | Hussell ................ H10H 20/857 |
| 2022/0131048 A1* | 4/2022 | Andrews .............. H10H 20/831 |
| 2022/0344476 A1 | 10/2022 | Chan et al. |
| 2023/0178611 A1 | 6/2023 | Raring et al. |

OTHER PUBLICATIONS

U.S. Appl. No. 17/078,389 Non-Final Office Action mailed Aug. 23, 2023, 7 pages.
U.S. Appl. No. 17/897,765 Non-Final Office Action mailed Aug. 23, 2023, 8 pages.
U.S. Appl. No. 14/580,693 Non-Final Office Action mailed Jun. 16, 2016, 23 pages.
U.S. Appl. No. 14/580,693 Notice of Allowance mailed Jan. 17, 2017, 8 pages.

(56) References Cited

OTHER PUBLICATIONS

U.S. Appl. No. 15/209,309 Notice of Allowance mailed Dec. 19, 2016, 12 pages.
U.S. Appl. No. 15/480,239 Non-Final Office Action mailed Jul. 3, 2017, 13 pages.
U.S. Appl. No. 15/480,239 Final Office Action mailed Oct. 24, 2017, 15 pages.
U.S. Appl. No. 15/480,239 Notice of Allowance mailed Feb. 20, 2018, 8 pages.
U.S. Appl. No. 16/005,255 Non-Final Office Action mailed Sep. 28, 2018, 28 pages.
U.S. Appl. No. 16/005,255 Non-Final Office Action mailed Aug. 6, 2019, 9 pages.
U.S. Appl. No. 16/005,255 Notice of Allowance mailed Dec. 17, 2019, 5 pages.
U.S. Appl. No. 16/796,154 Ex Parte Quayle Action mailed Jul. 8, 2020, 6 pages.
U.S. Appl. No. 16/796,154 Notice of Allowance mailed Jul. 28, 2020, 5 pages.
U.S. Appl. No. 16/796,183 Non-Final Office Action mailed Jul. 8, 2020, 8 pages.
U.S. Appl. No. 16/796,183 Notice of Allowance mailed Jul. 31, 2020, 8 pages.
U.S. Appl. No. 16/835,082 Non-Final Office Action mailed Jul. 9, 2020, 11 pages.
U.S. Appl. No. 16/835,082 Notice of Allowance mailed Jul. 31, 2020, 5 pages.
Invitation to Pay Additional Fees where Applicable for Application No. PCT/US2023/081408, mailed Feb. 27, 2024, 2 pages.

\* cited by examiner

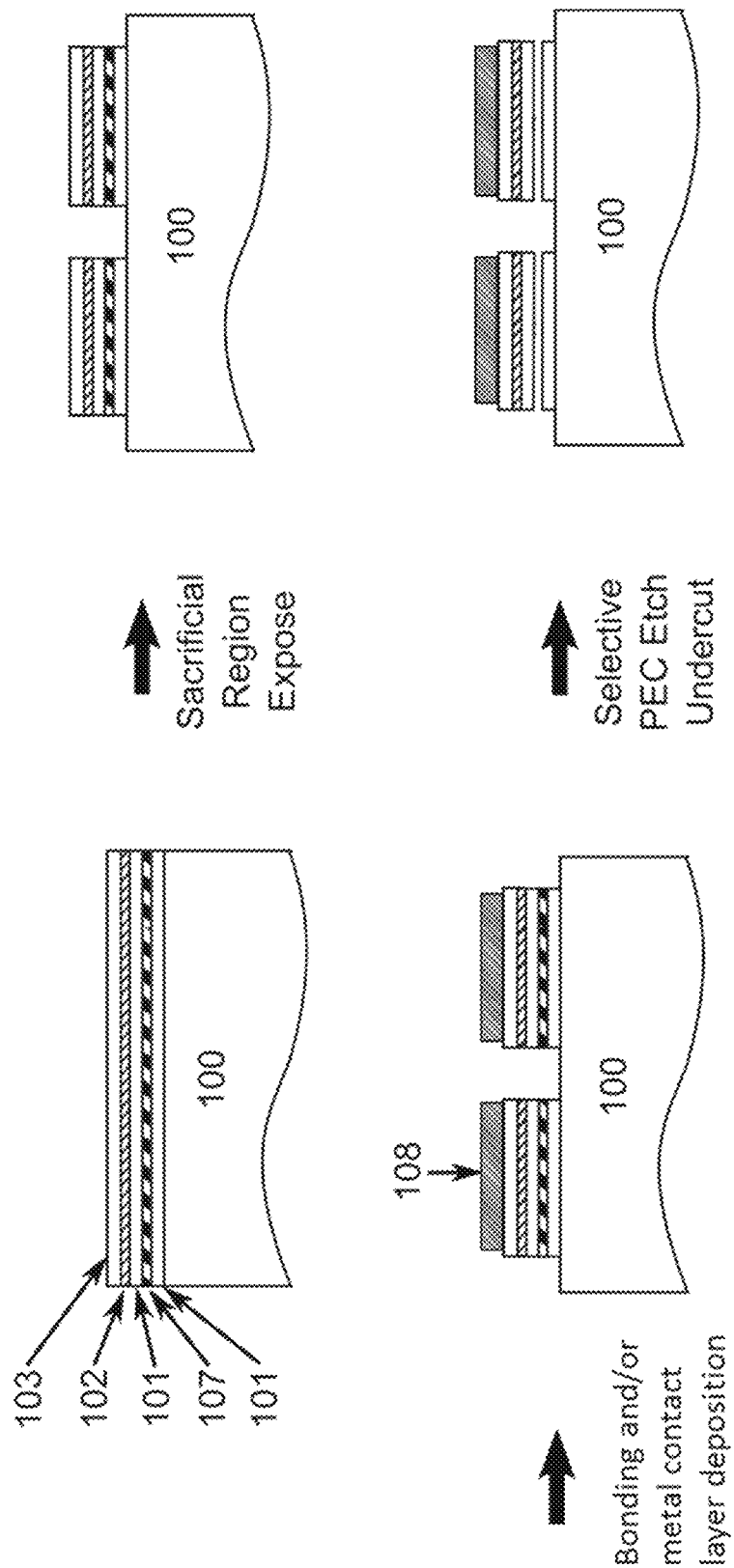
Figure 1A: Process Flow: Epitaxy Preparation

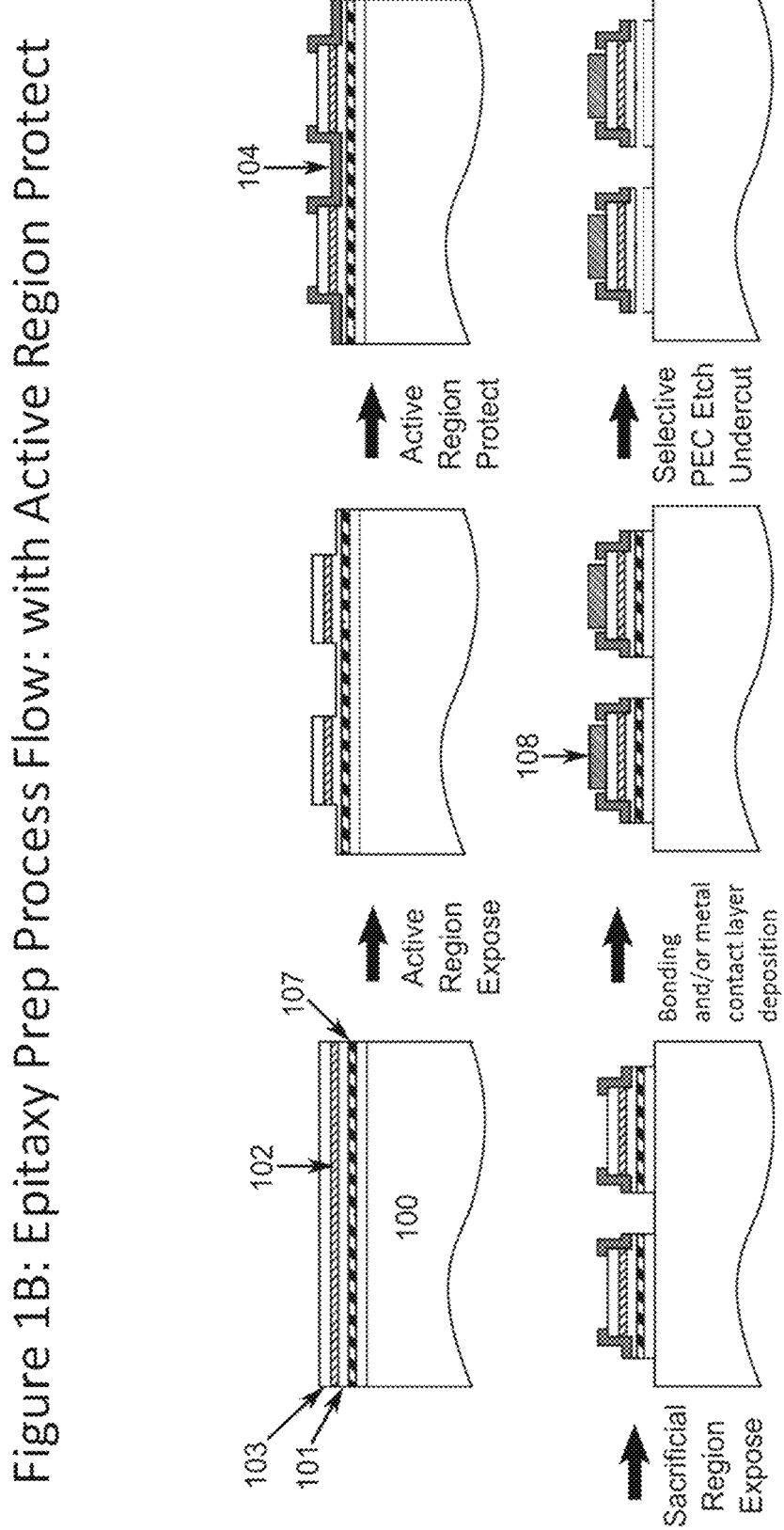

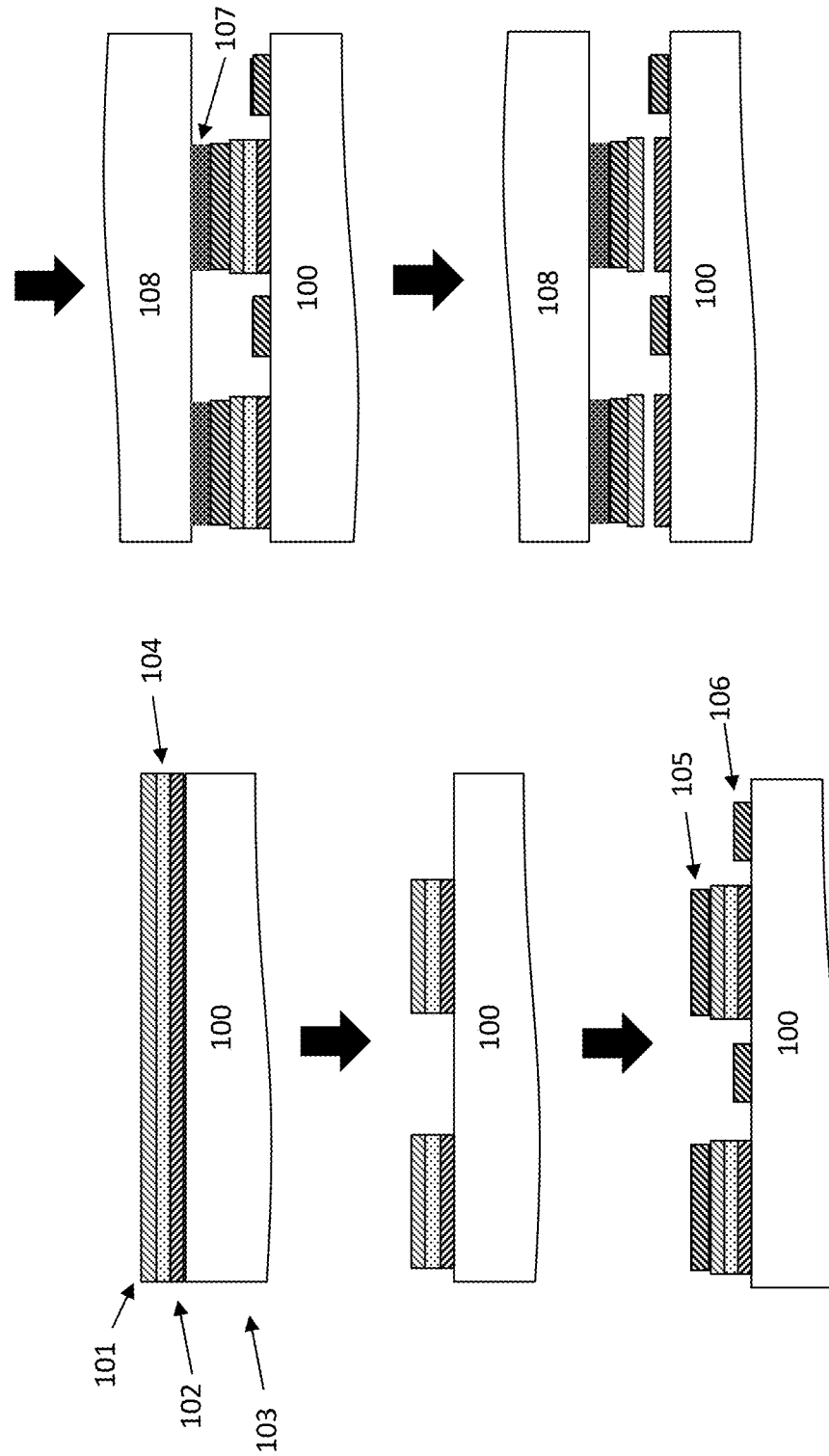
Figure 2A: Bond then etch

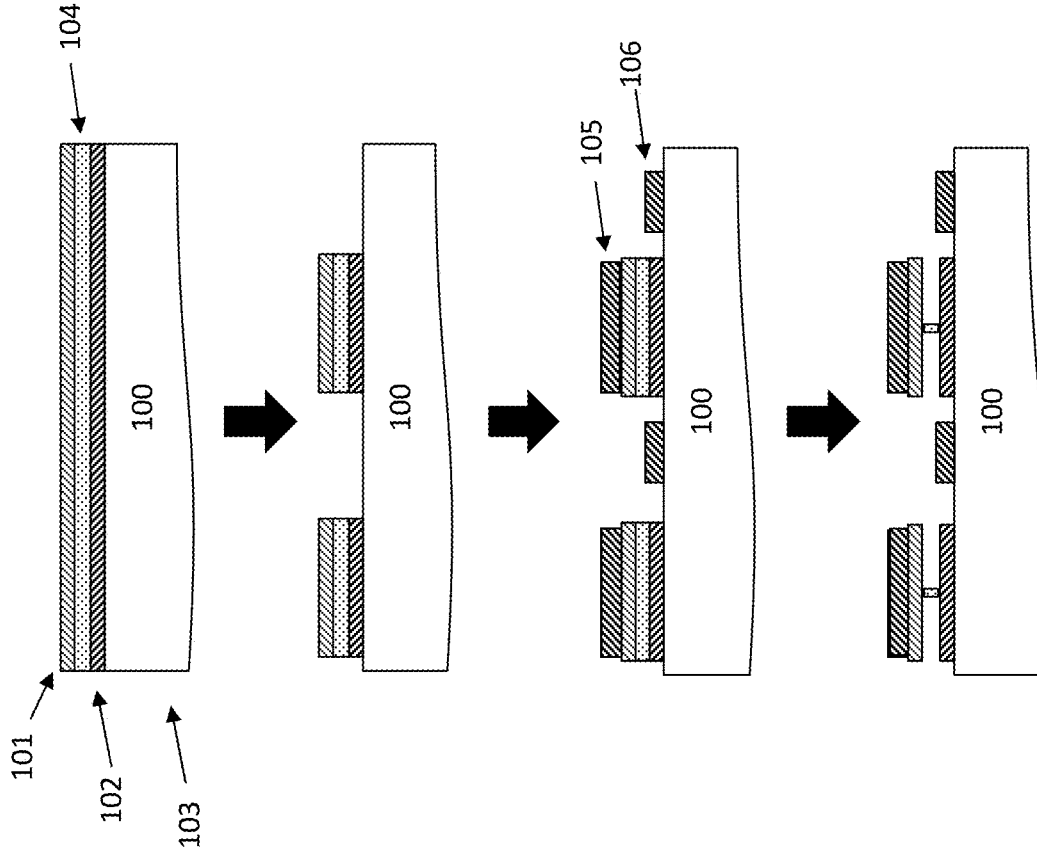
Figure 2B: Etch then bond: sacrificial layer not fully removed

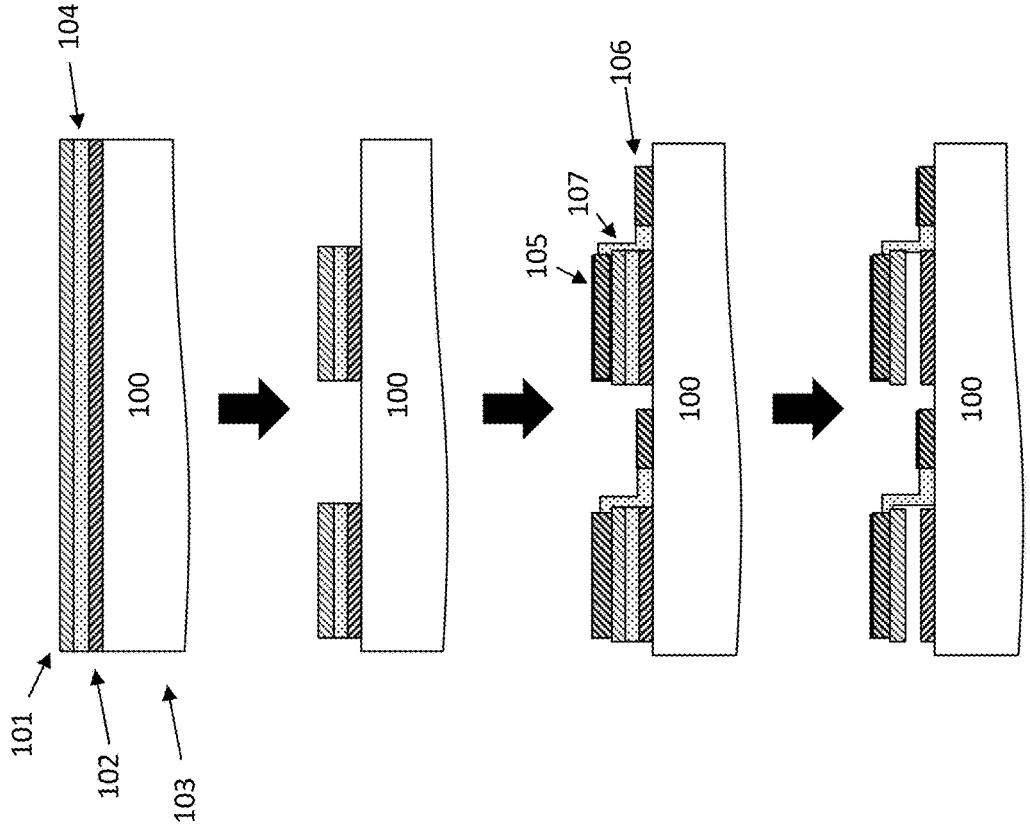
Figure 2C: Etch then bond: microfabricated anchor made from metal, ceramic, polymer, or the like.

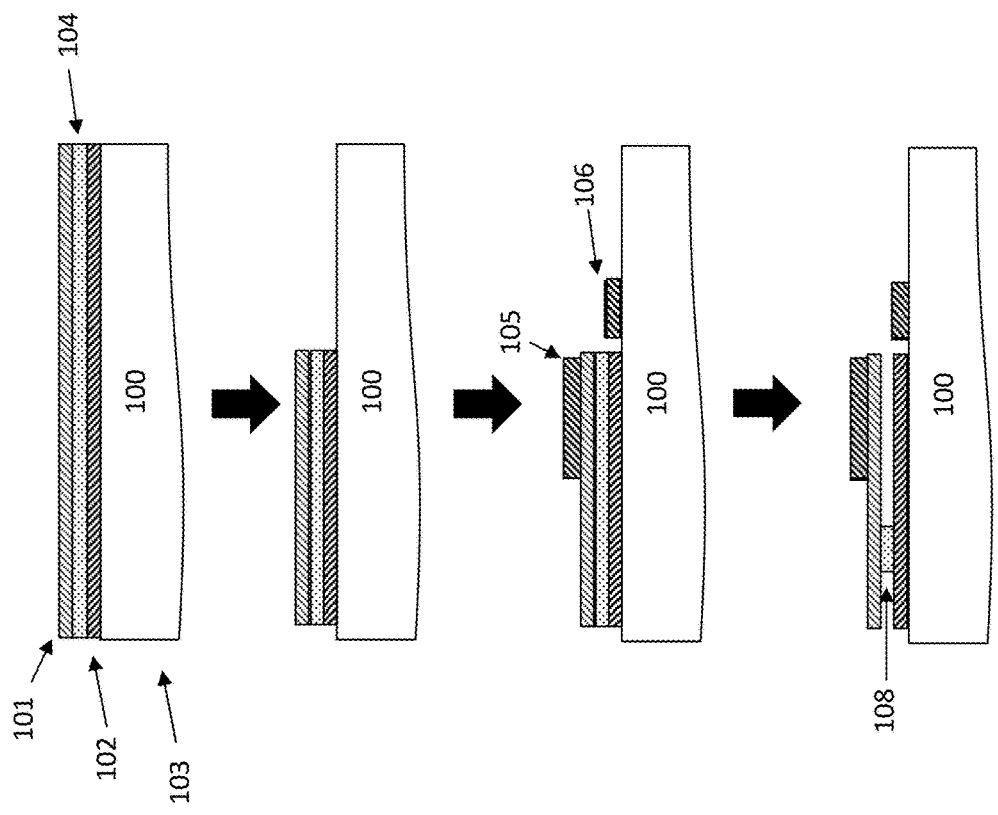
Figure 2D: Etch then bond: anchor composed of epitaxial semiconductor material

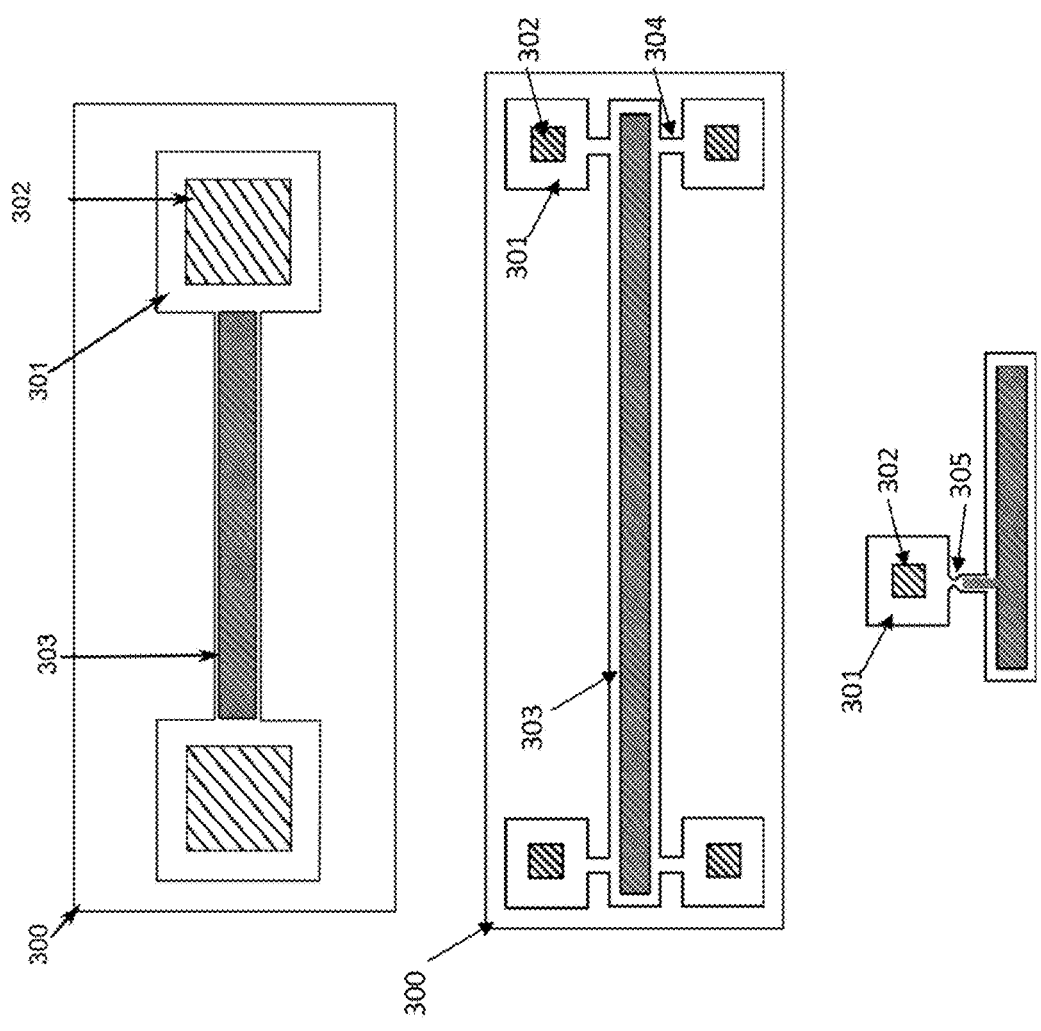
Figure 2E: Anchored PEC Undercut Top View

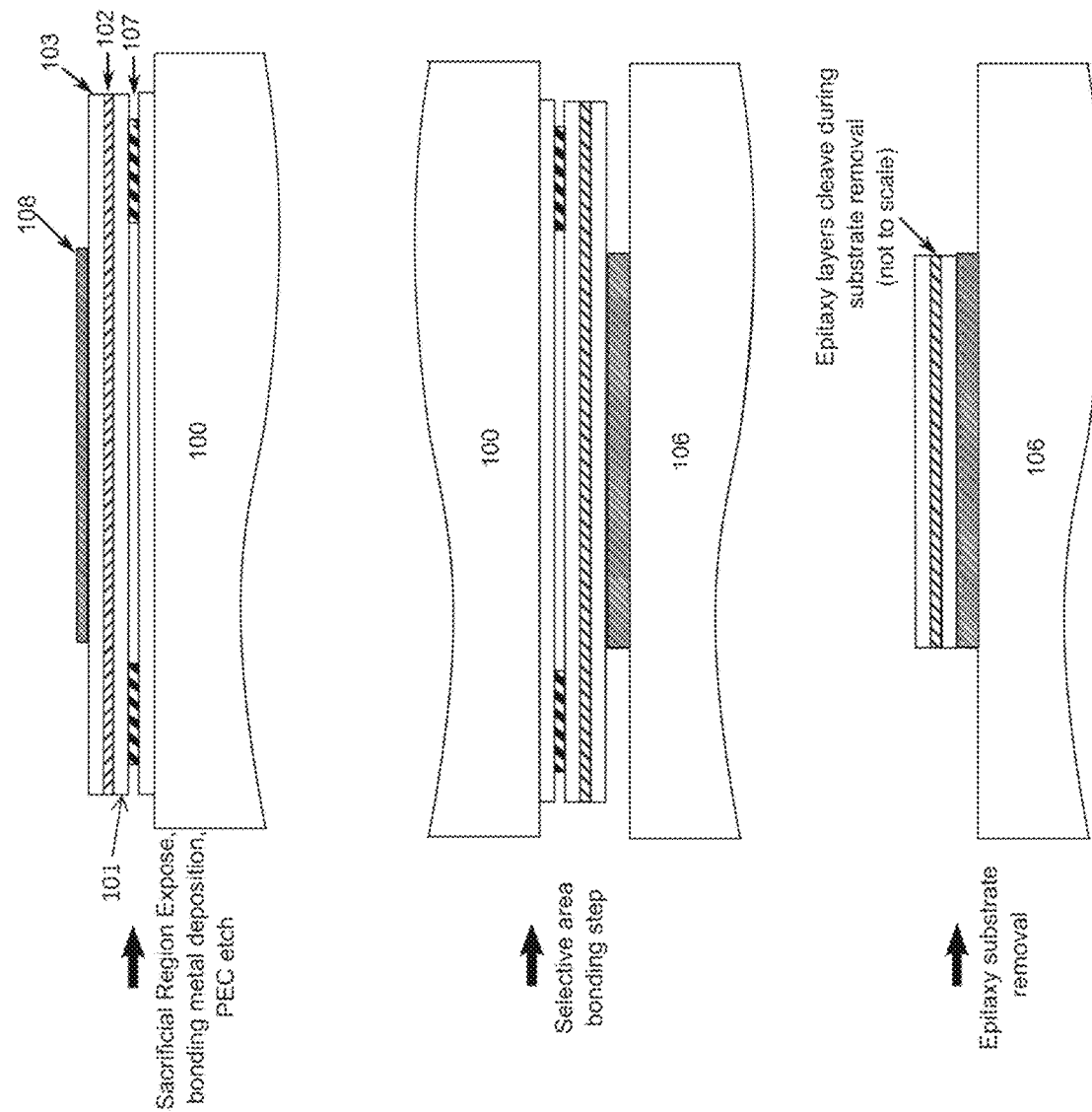

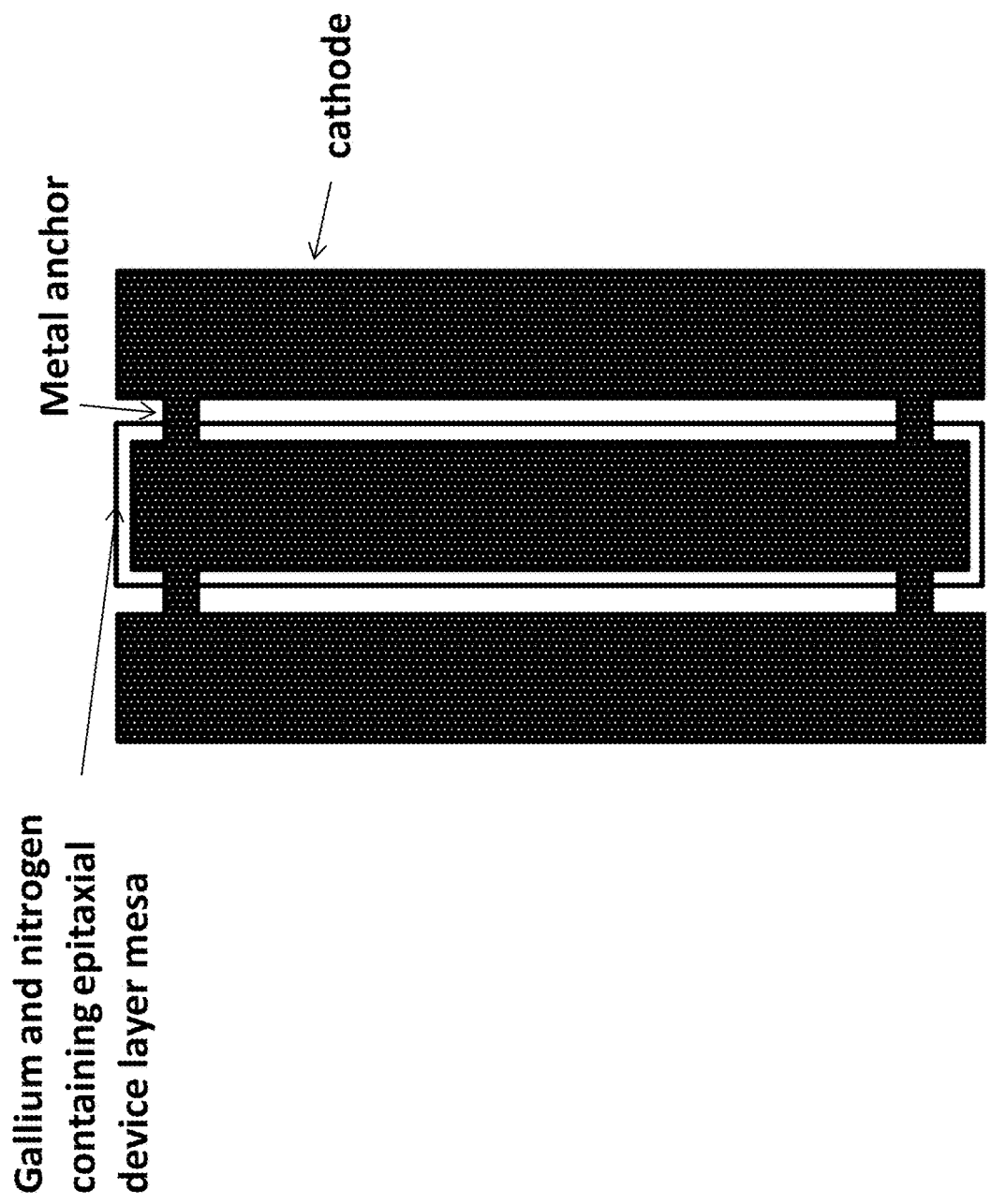
Figure 2G: plan view of transferrable mesa with metal anchors

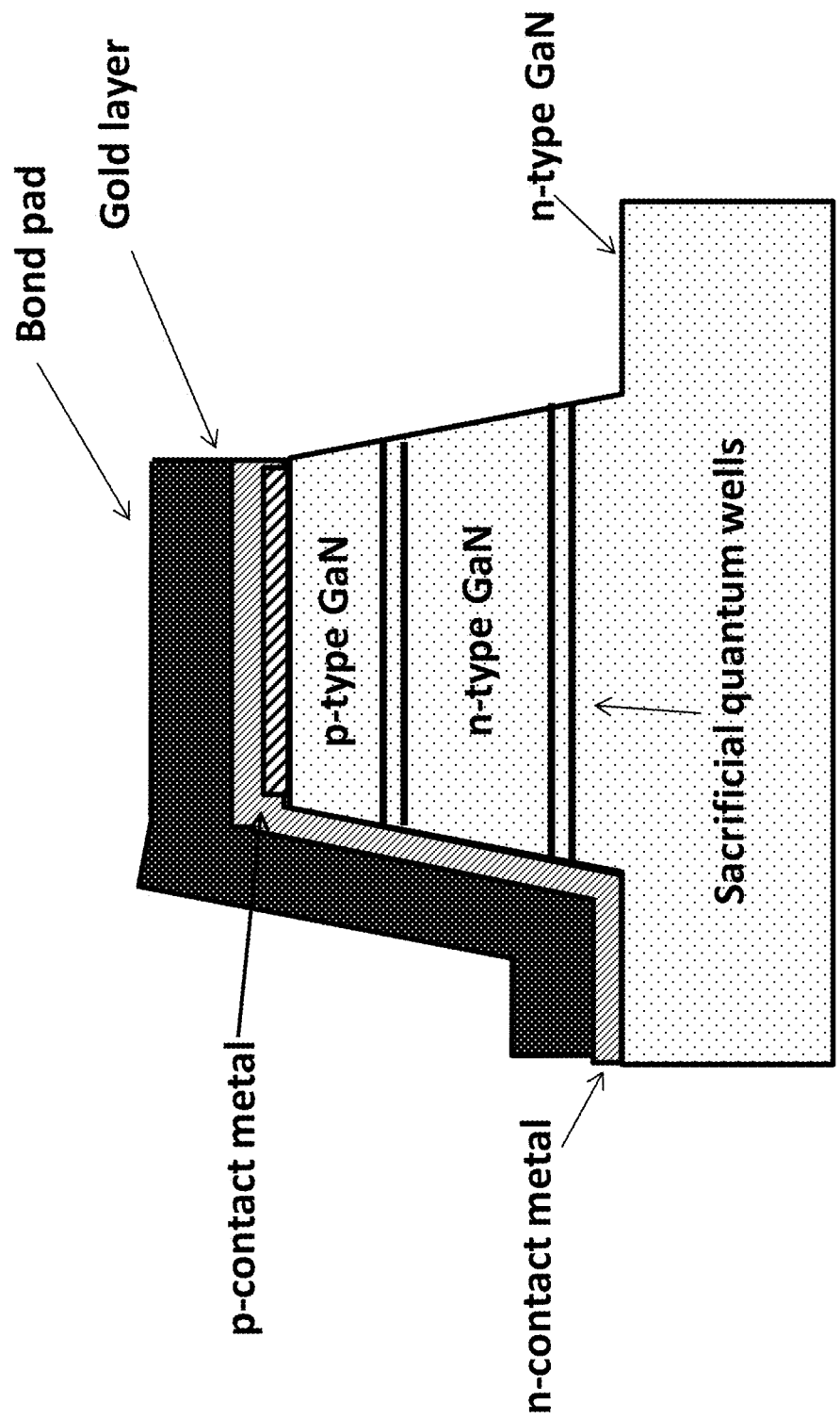
Figure 2H: cross sectional view of metal anchor

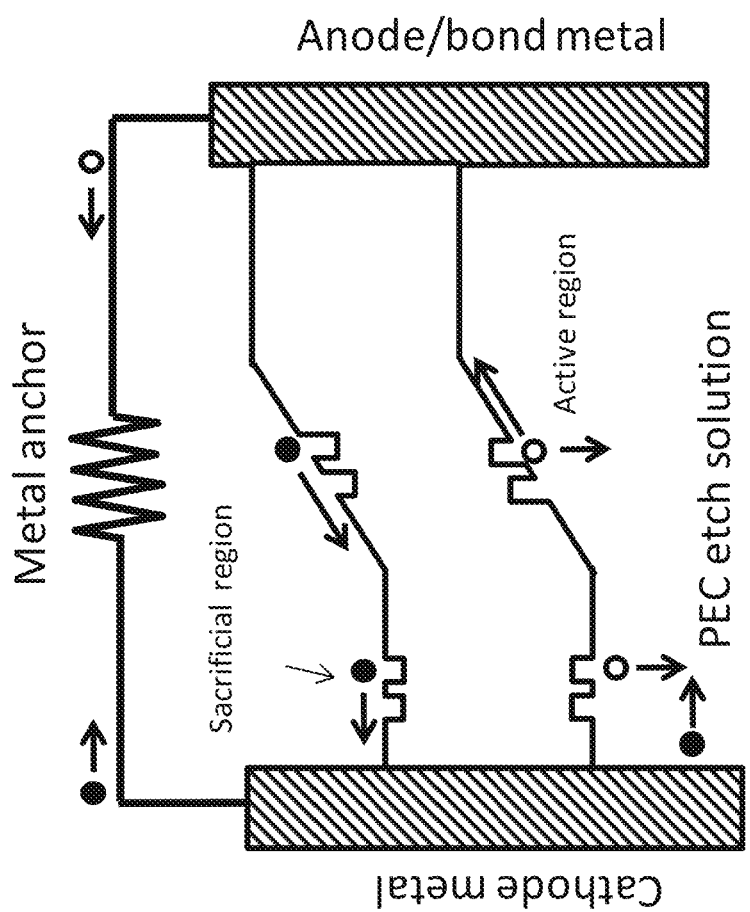
Figure 2l: Schematic of electrical circuit formed during PEC etching with metal anchors.

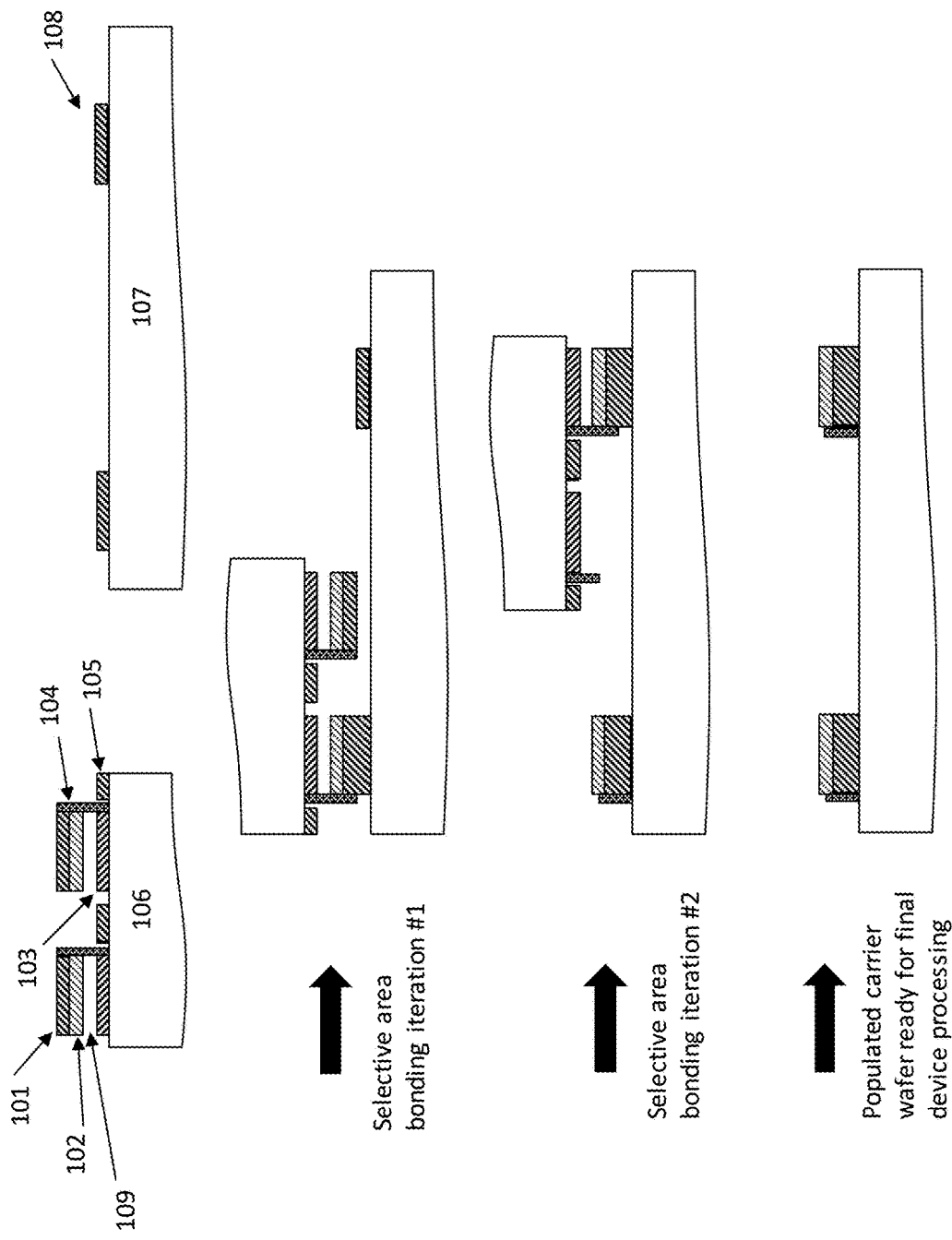
Figure 3A: Side view of die expansion with selective area bonding

Figures 3B-3G: Illustration of intermediate bonding medium approaches
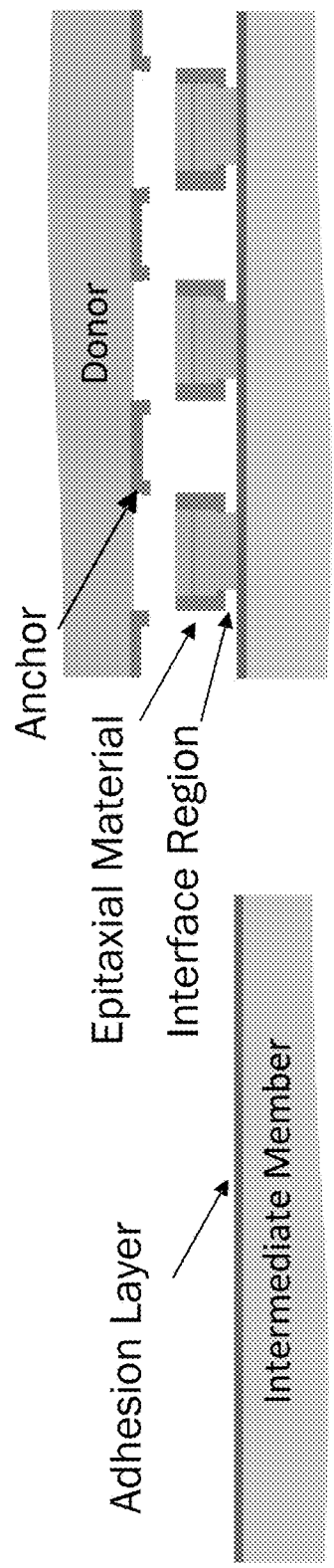
FIG. 3B: Apply UV/thermal release film onto intermediate substrate
FIG. 3C: Transfer devices from donor onto intermediate substrate
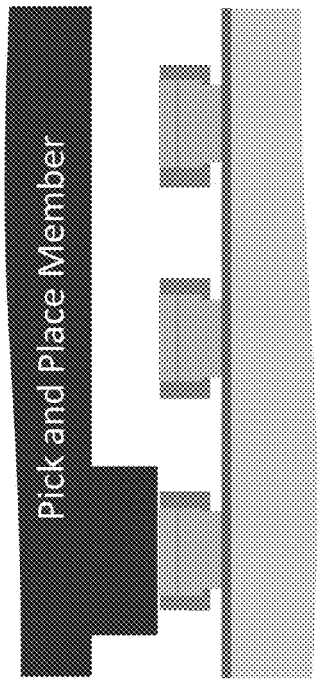
FIG. 3D: Pick select die from intermediate substrate with pedestal style die attach tool

Figures 3B-3G: Continued
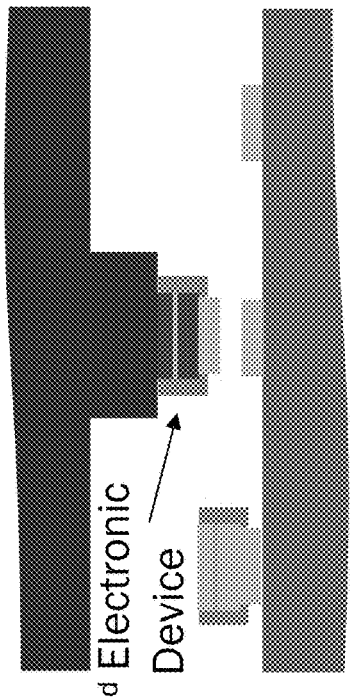
FIG. 3E: Align and bond device to carrier substrate
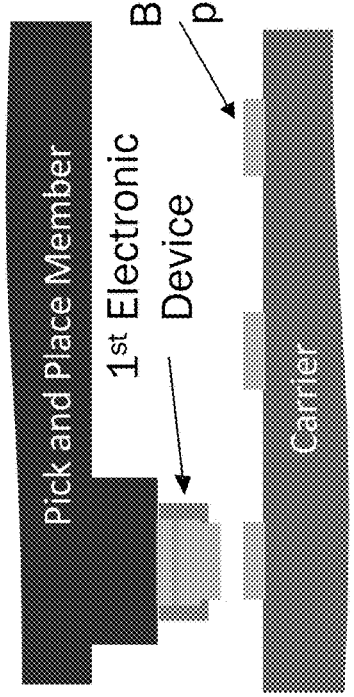
FIG. 3F: Repeat bonding process for devices from a different donor wafer
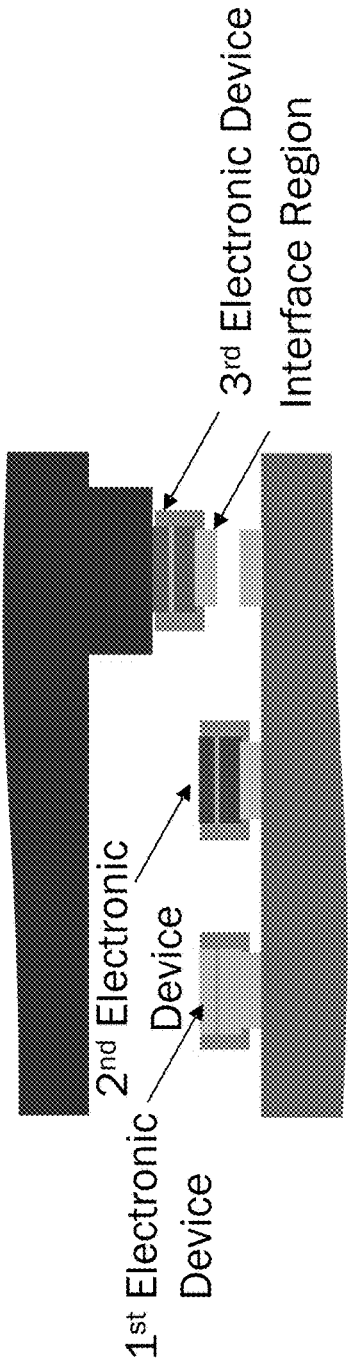
FIG. 3G: (Optional) Repeat bonding process for devices from one or more different donor wafers

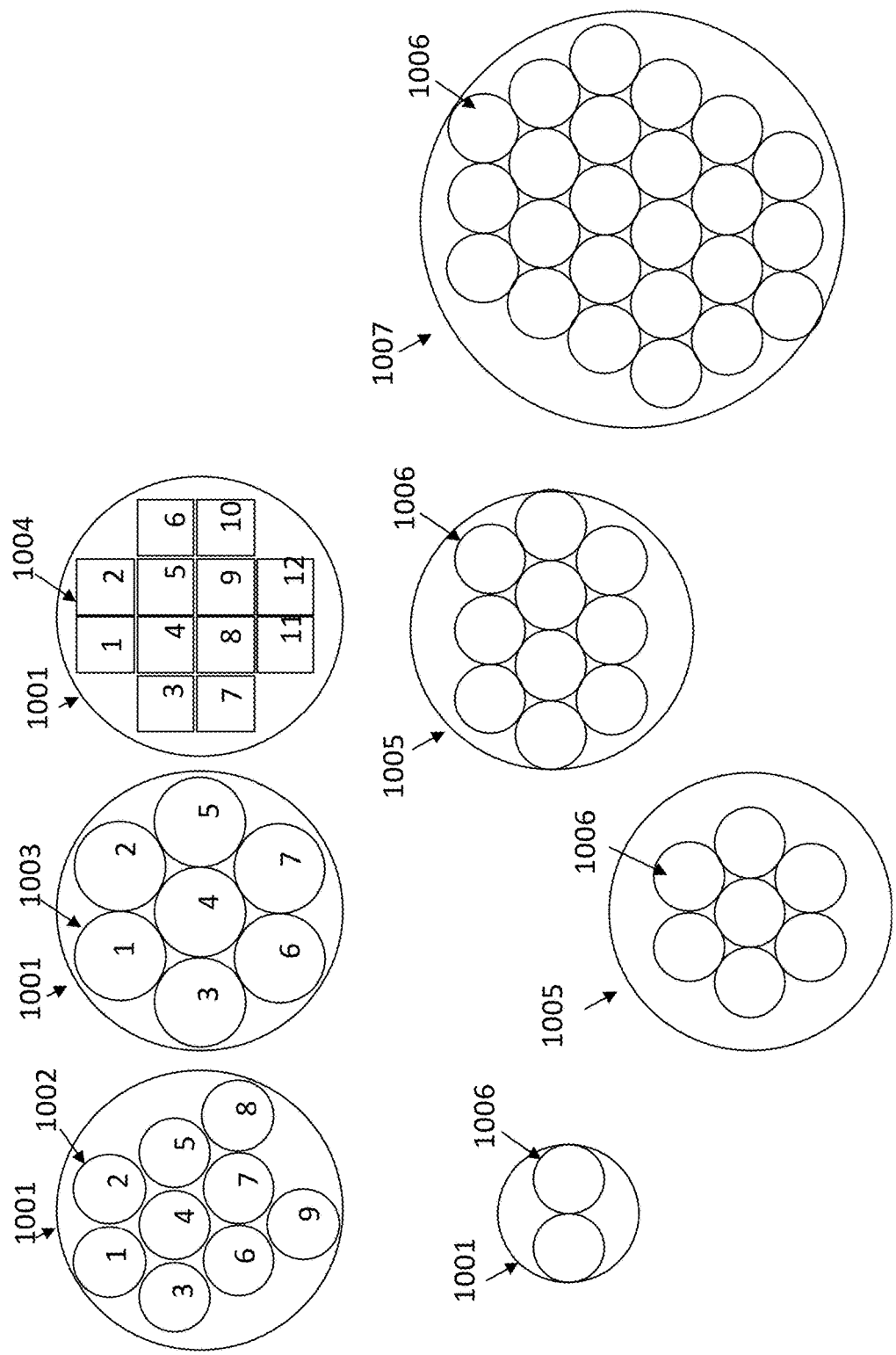
Figure 4A: Transferable regions for various substrate sizes on 100, 200 and 300 mm carrier wafers

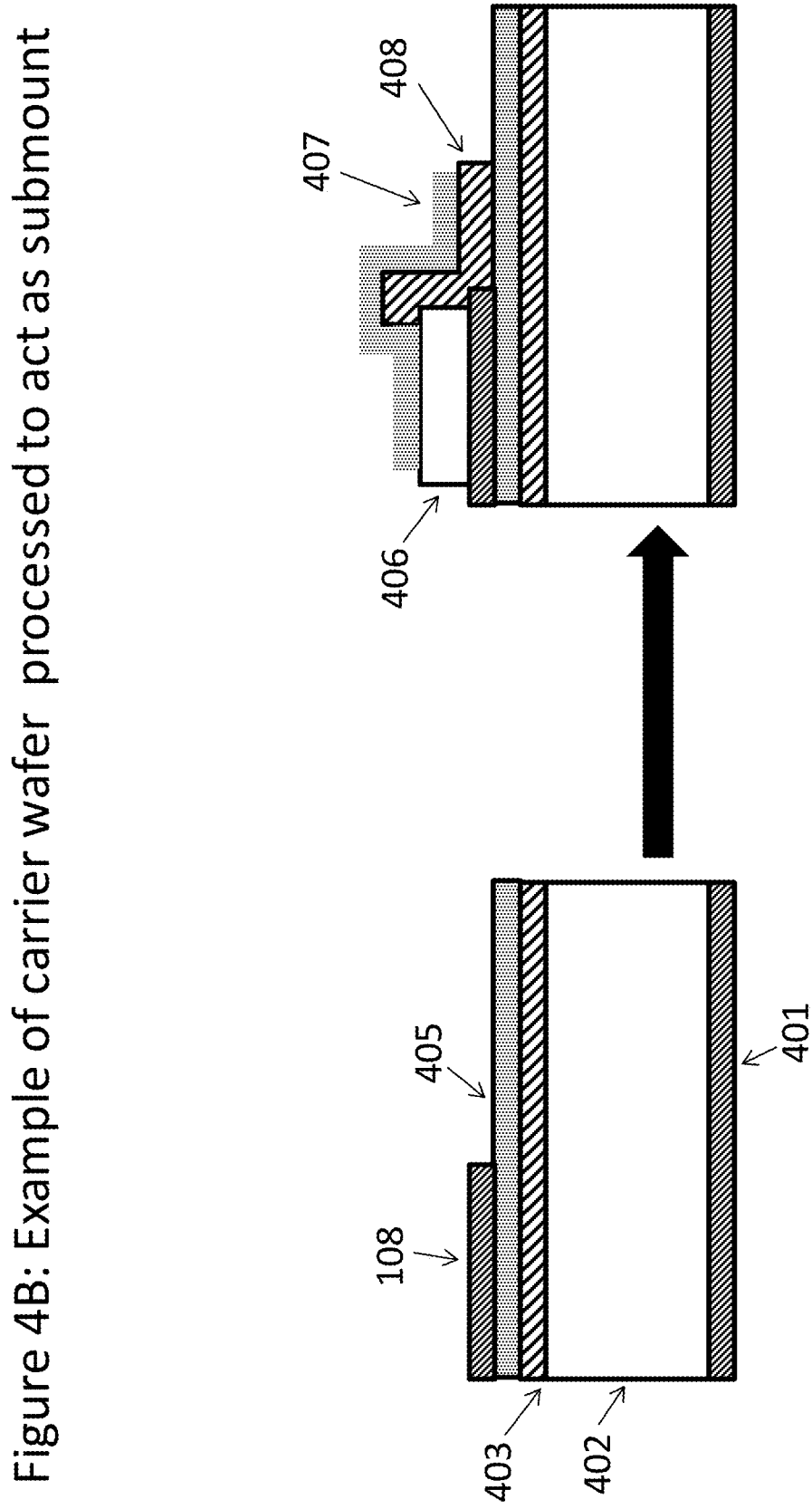
Figure 4B: Example of carrier wafer processed to act as submount

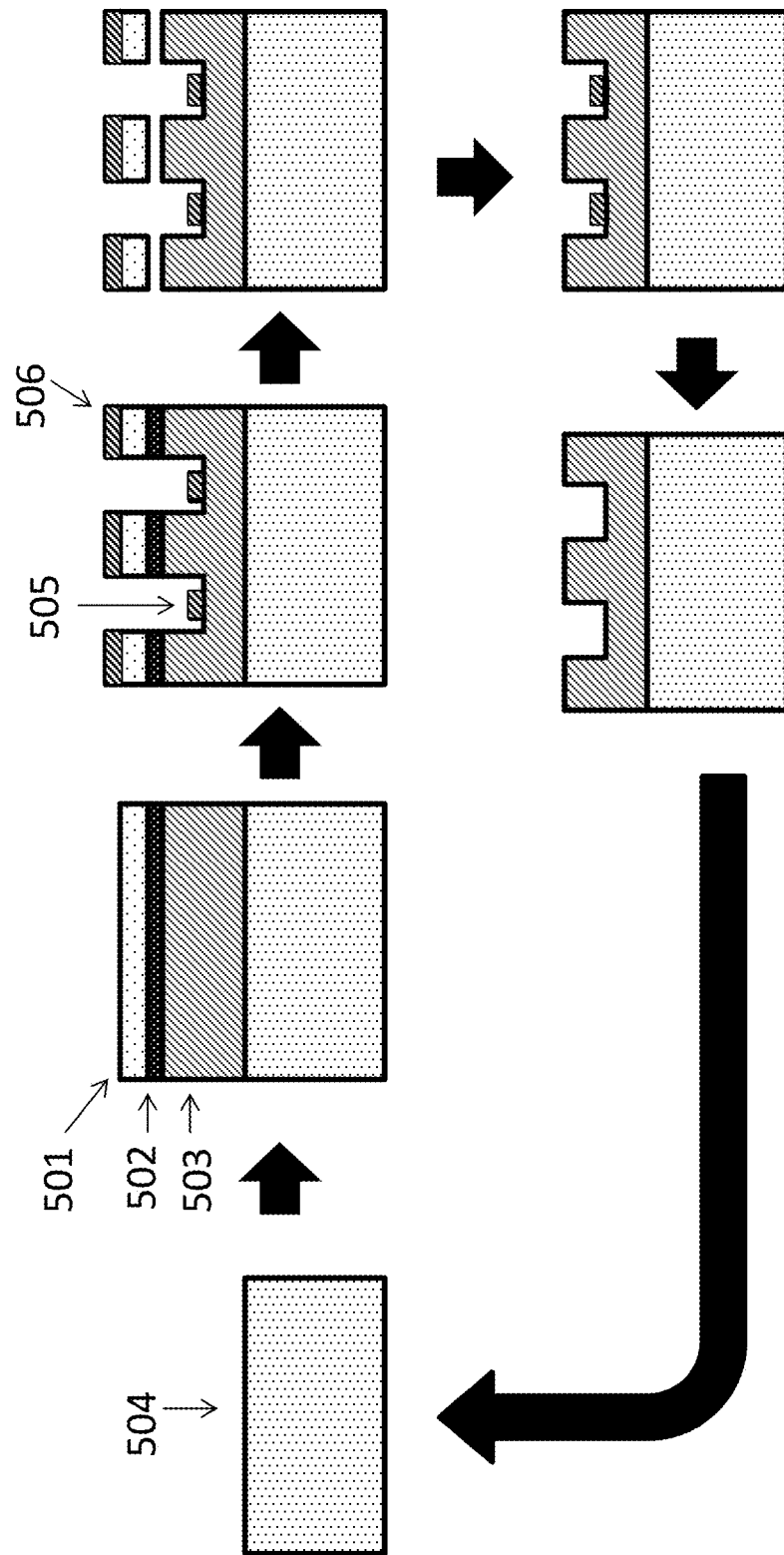
Figure 5. Example process flow of substrate reuse

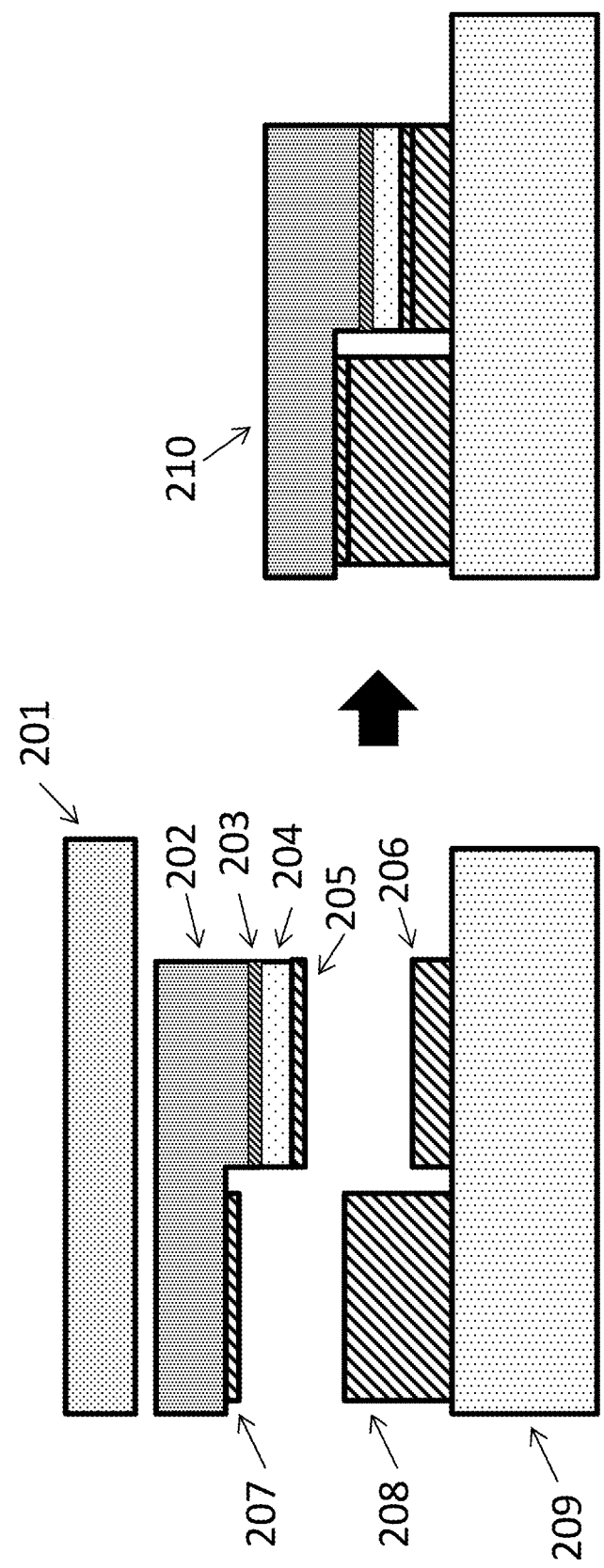
Figure 6A: Bonding of electronic device wafer

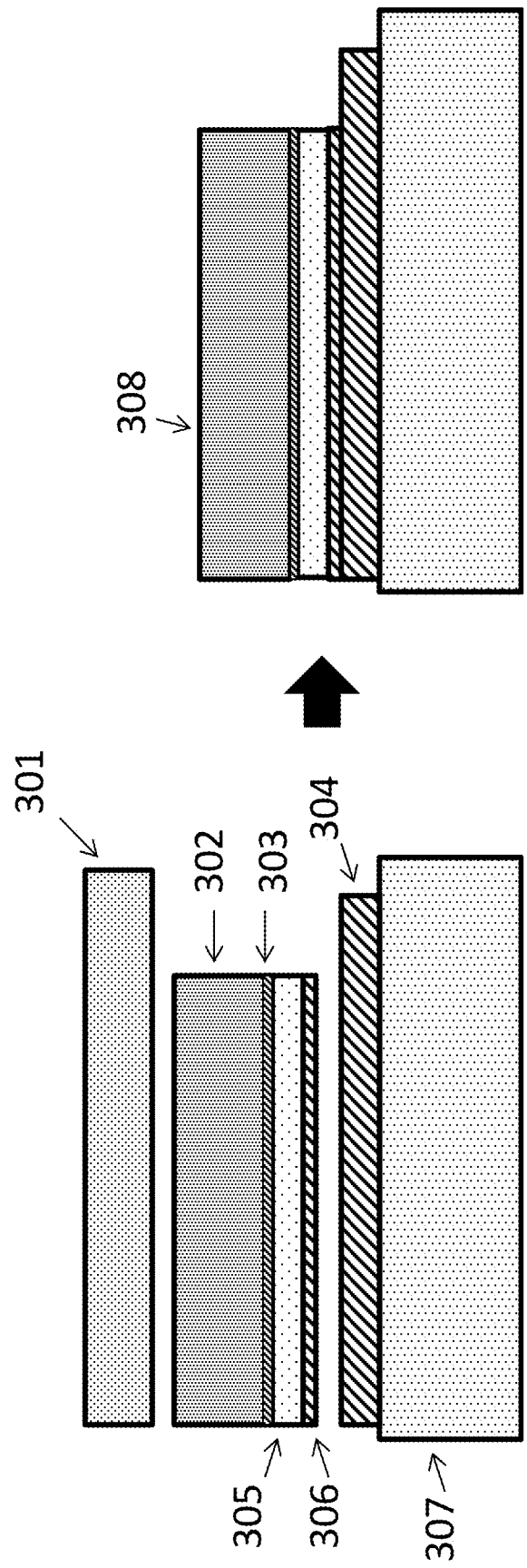
Figure 6B: Bonding of electronic device wafer

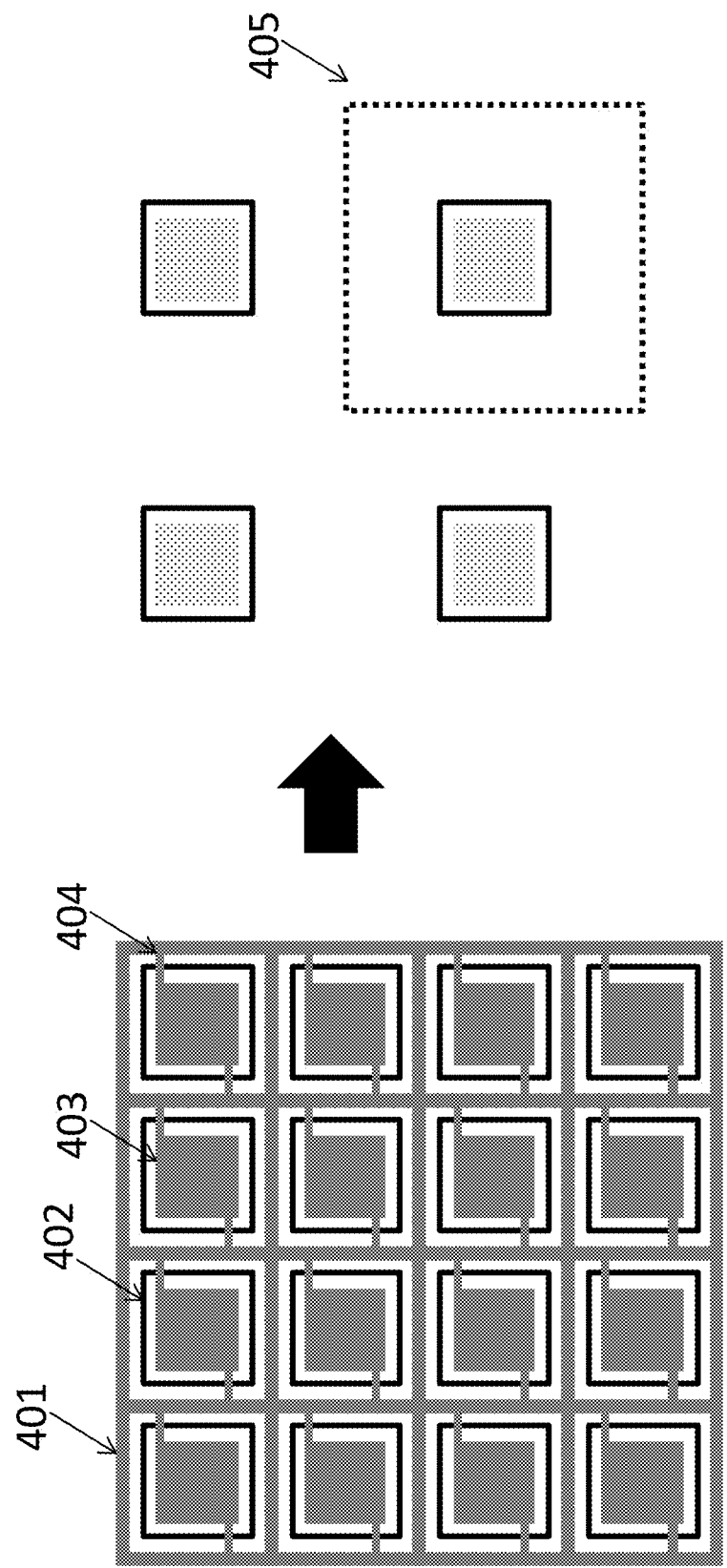
Figure 6C: Die expansion of electronic devices

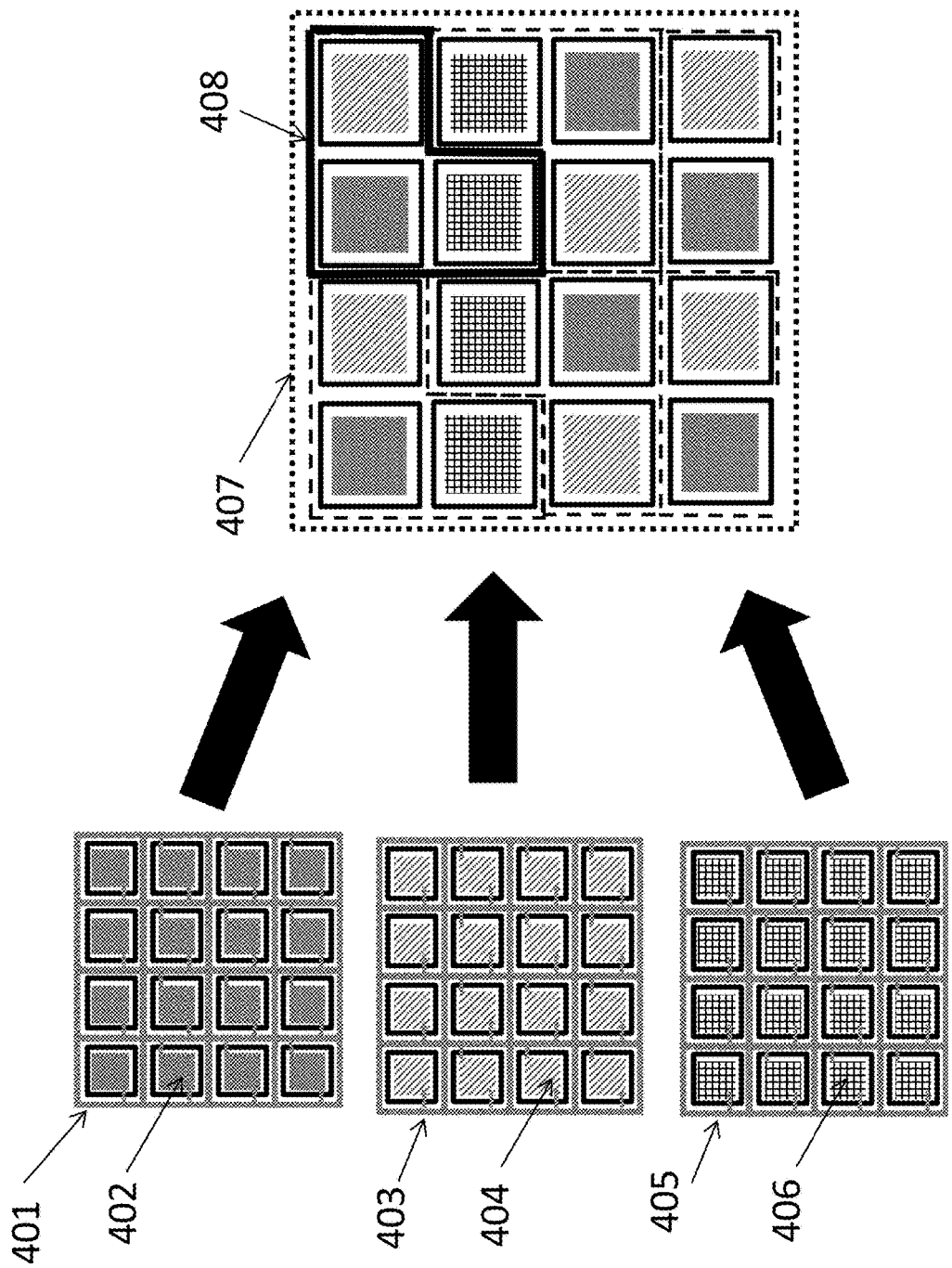
Figure 6D: Die expansion of electronic devices

Figure 7A: Material properties of GaN, SiC, and Si at 300K

| Properties* | GaN | Si | SiC |
|---|---|---|---|
| $E_G$ (eV) | 3.4 | 1.12 | 3.2 |
| $E_{BR}$ (MV/cm) | 3.3 | 0.3 | 3.5 |
| $V_s$ (x $10^7$ cm/s) | 2.5 | 1.0 | 2.0 |
| $\mu$ (cm$^2$/Vs) | 990 - 2000 | 1500 | 650 |

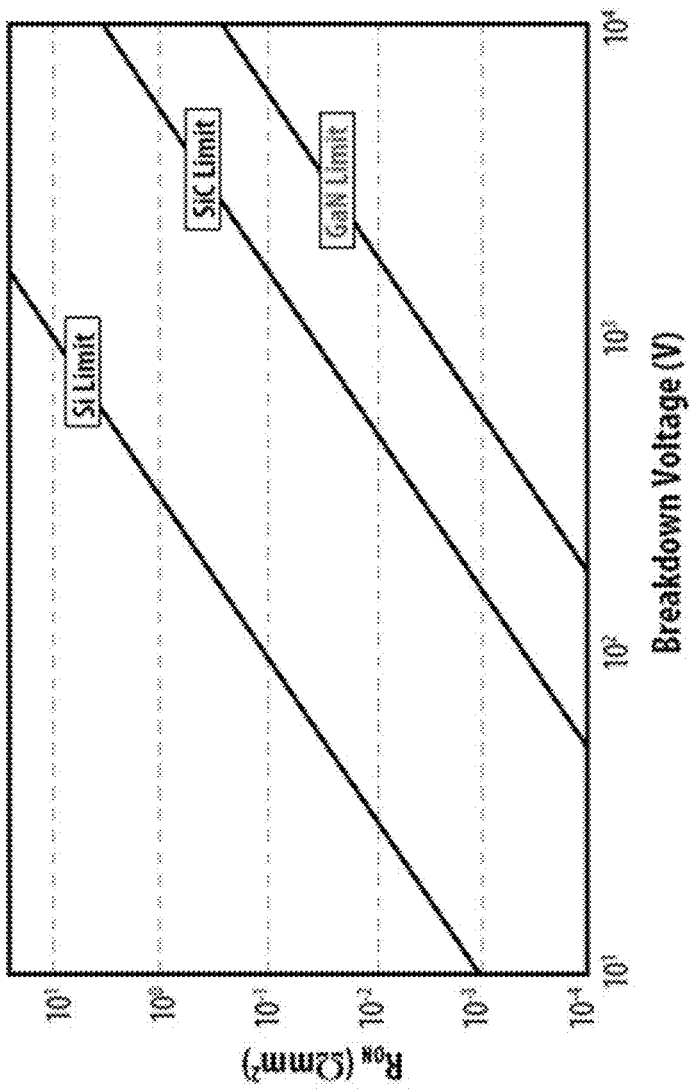
Figure 7B: Theoretical on-resistance vs blocking voltage for GaN, SiC, and Si

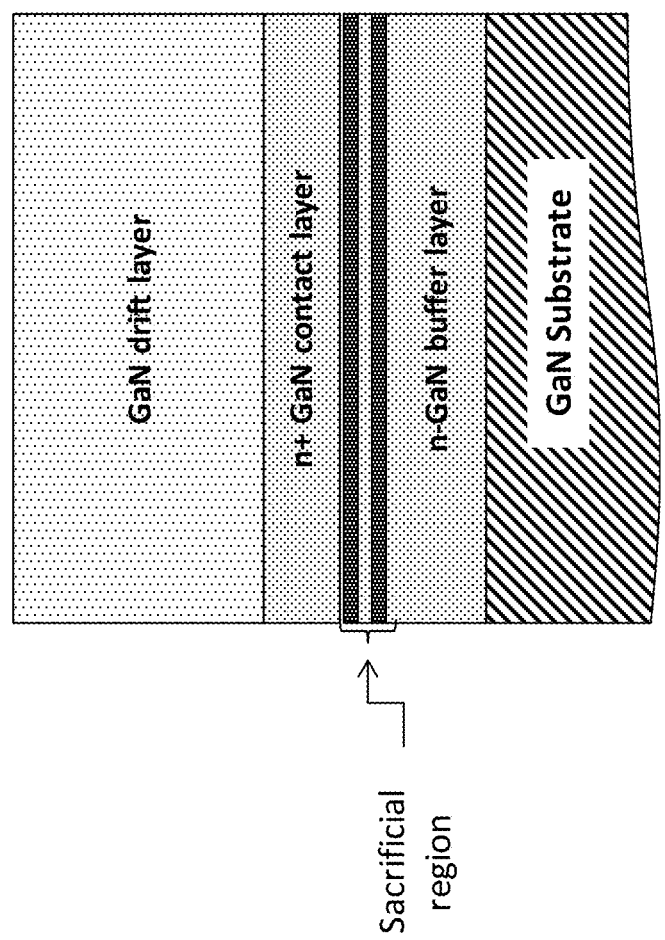
Figure 8A: Example of epitaxial stack grown on bulk gallium and nitrogen containing substrate to form a vertical Schottky barrier diode device

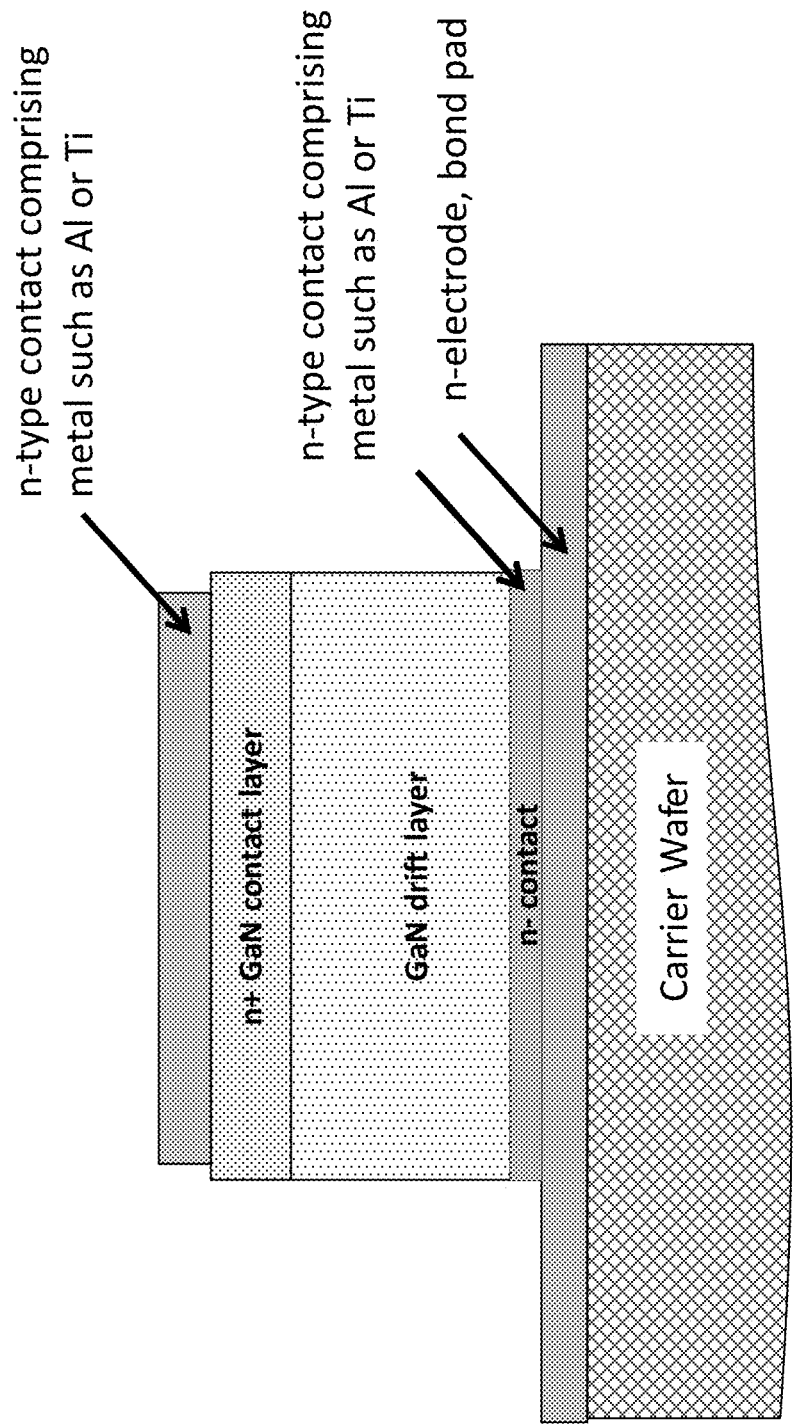
Figure 8B: Vertical Schottky barrier diode device formed on wafer from epitaxial stack shown in Figure 8A

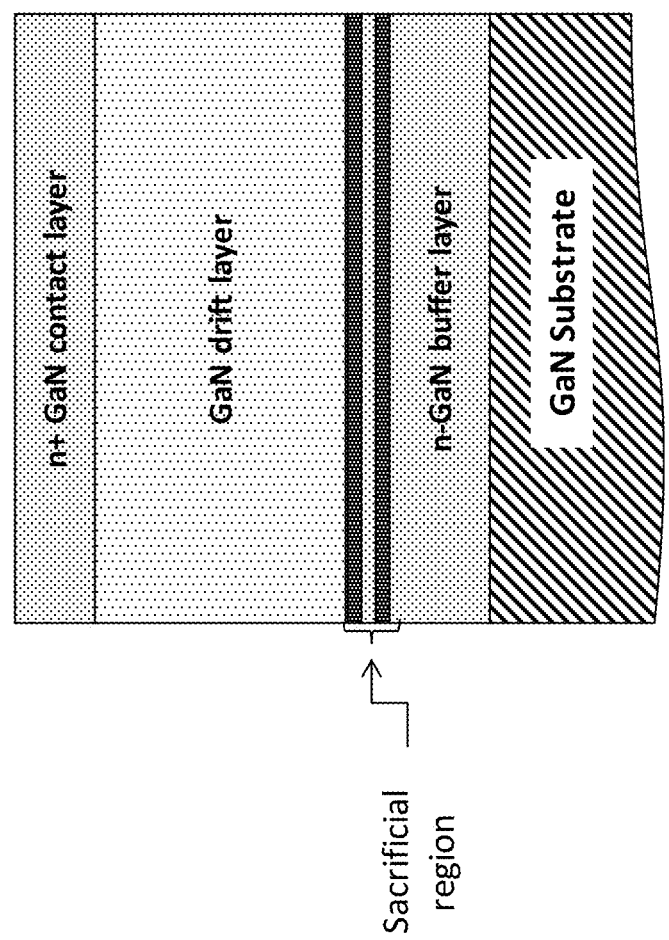
Figure 8C: Example of epitaxial stack grown on bulk gallium and nitrogen containing substrate to form a vertical Schottky barrier diode device

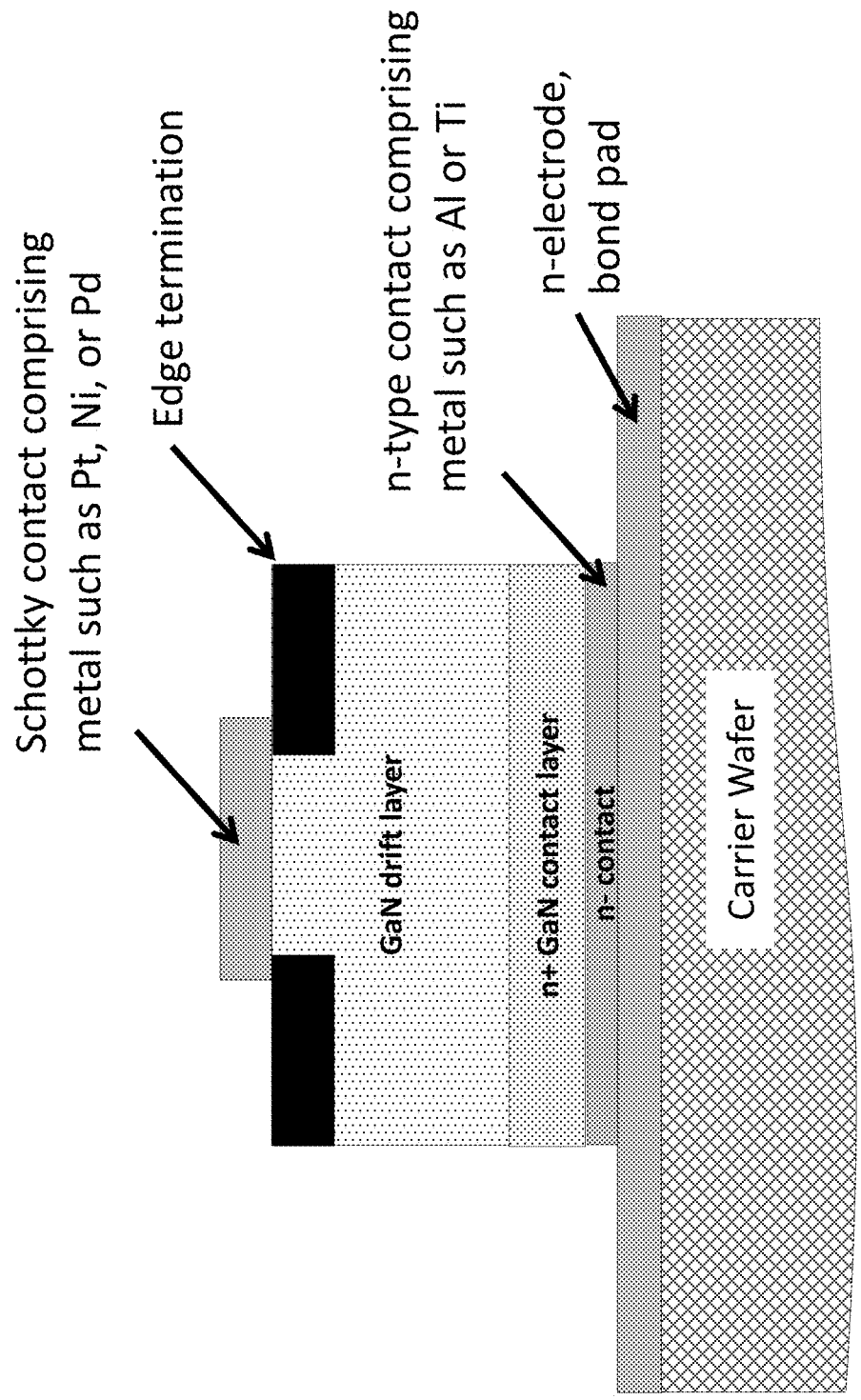
Figure 8D: Vertical Schottky barrier diode device formed on carrier wafer from epitaxial stack shown in Figure 8C

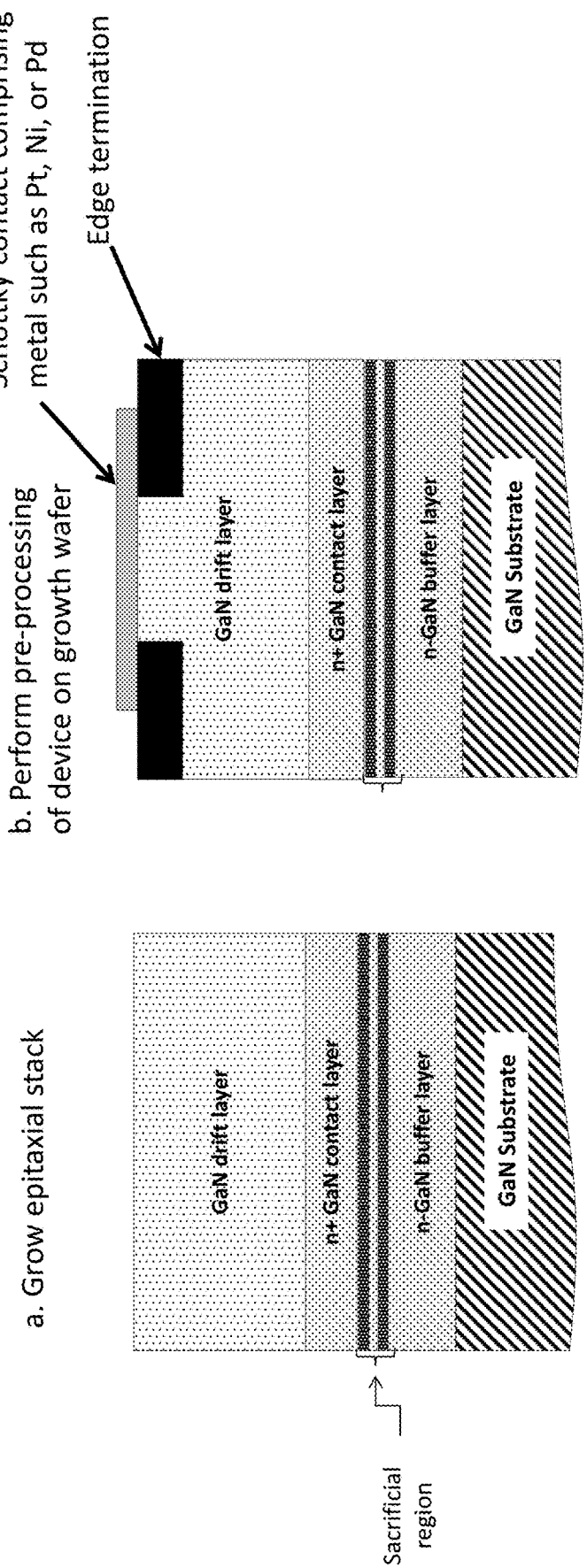
Figure 8E: Example of epitaxial stack and pre-processing of a vertical Schottky barrier diode device on bulk gallium and nitrogen containing substrate

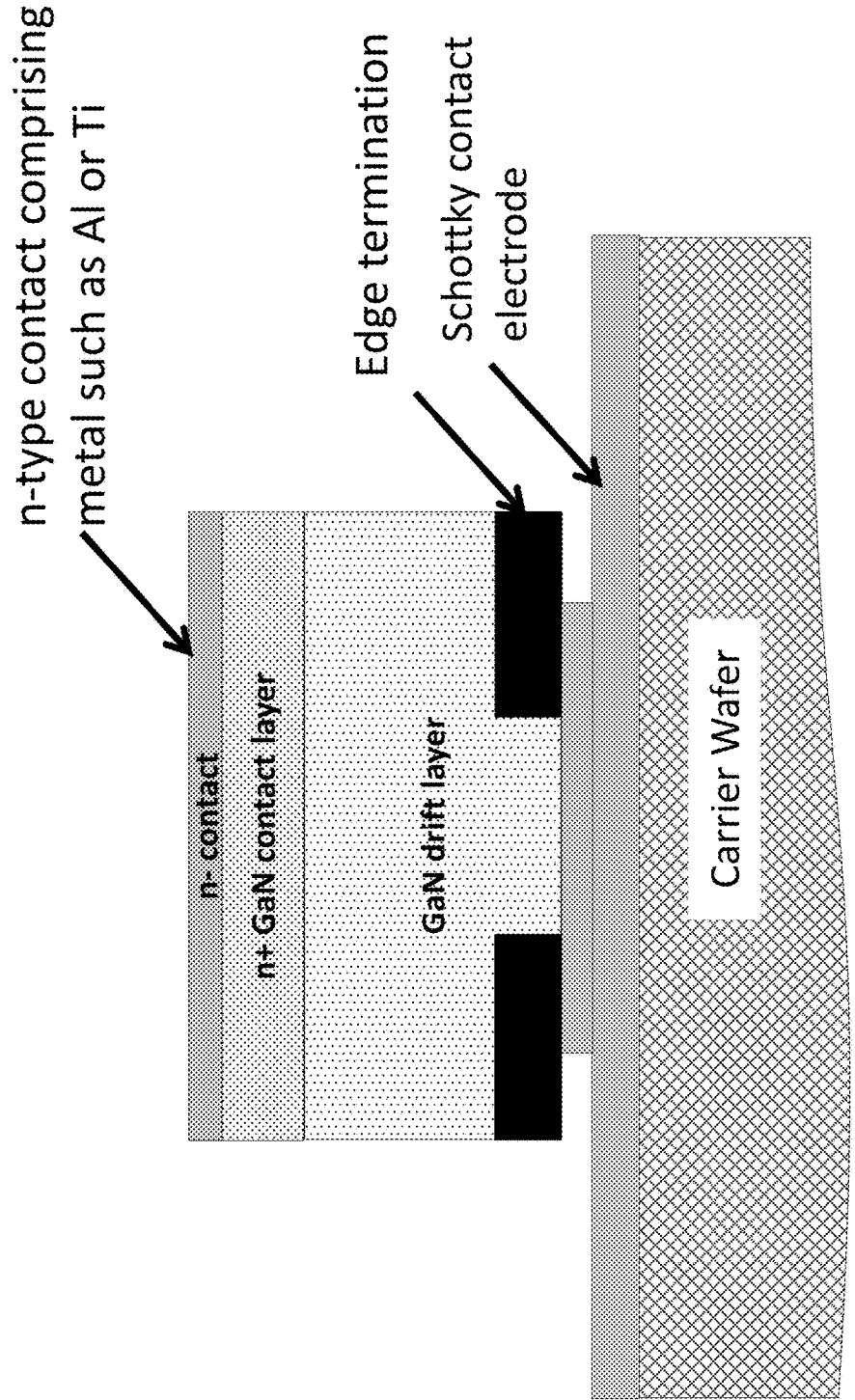
Figure 8F: Vertical Schottky barrier diode device formed on carrier wafer from epitaxial stack shown in Figure 8E

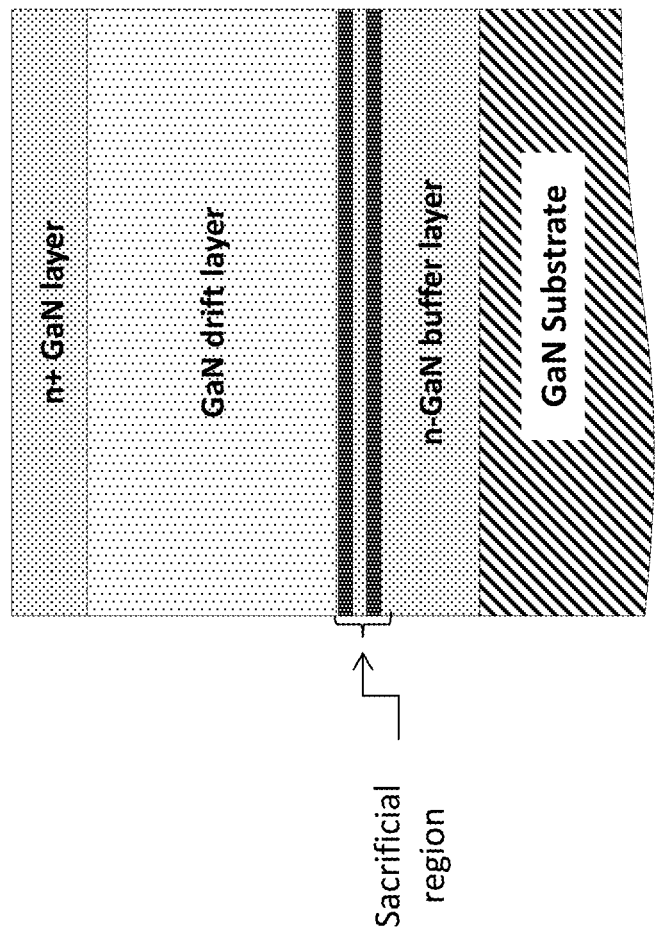
Figure 8G: Example of epitaxial stack grown on bulk gallium and nitrogen containing substrate to form a vertical metal-insulator-semiconductor barrier Schottky rectifier

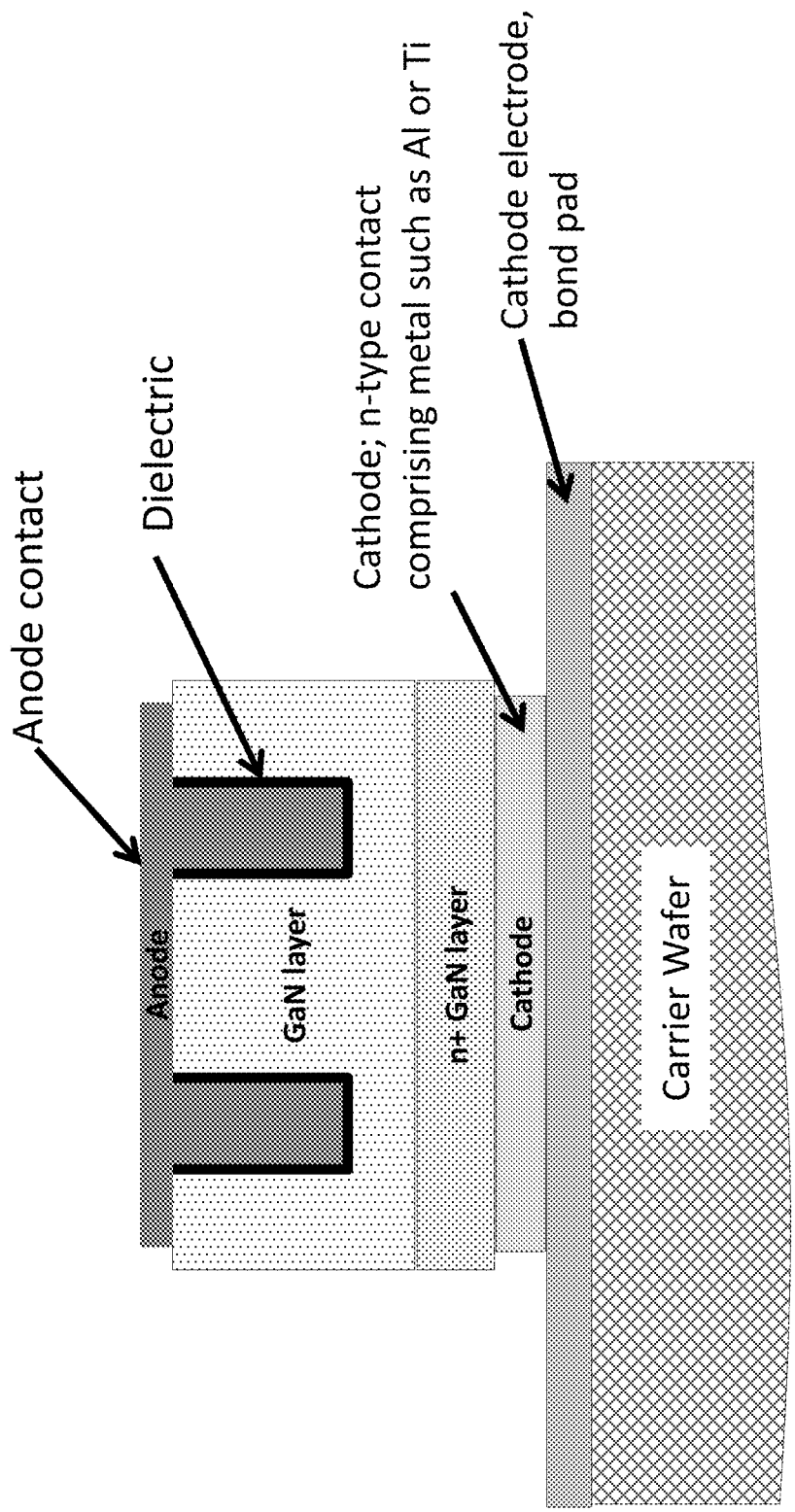
Figure 8H: Metal-insulator-semiconductor barrier Schottky rectifier device formed on wafer from epitaxial stack shown in Figure 8G (normally off device)

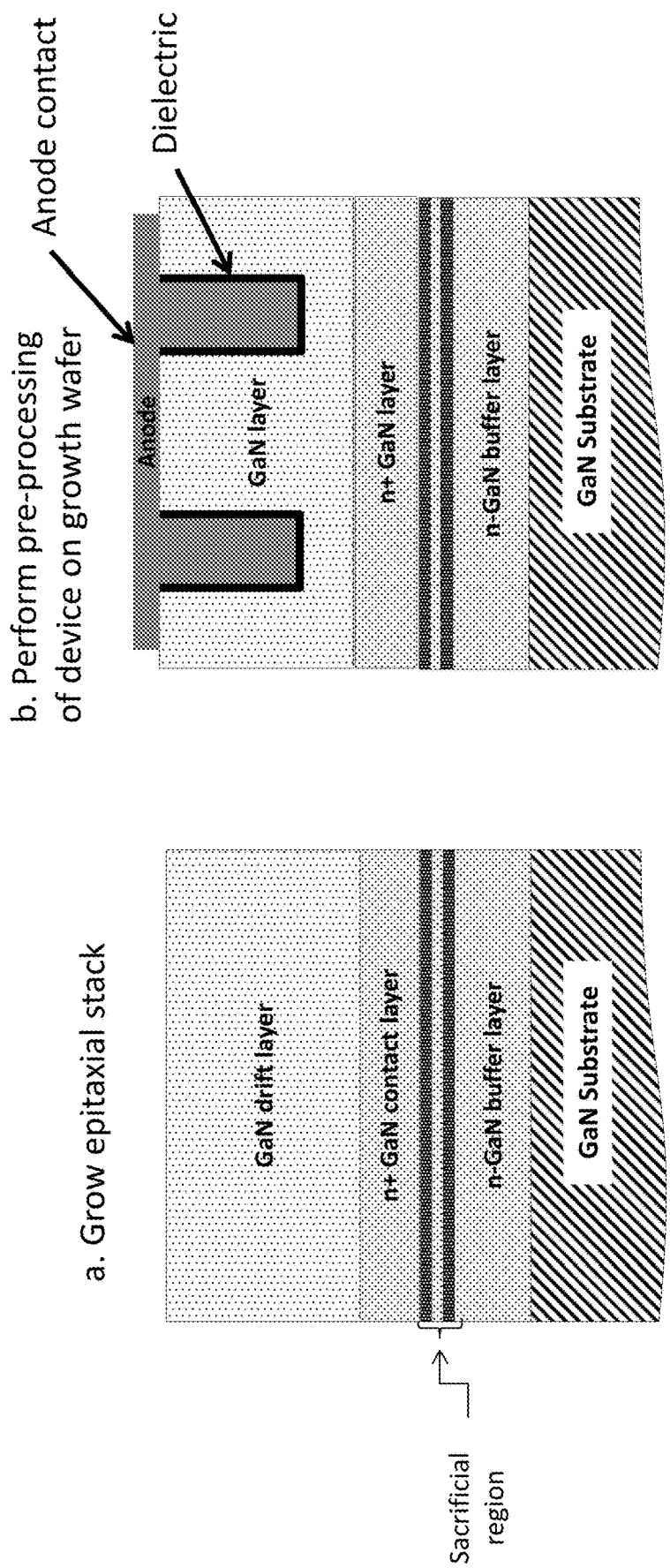
Figure 8l: Example of epitaxial stack grown on bulk gallium and nitrogen containing substrate to form a vertical metal-insulator-semiconductor barrier Schottky rectifier

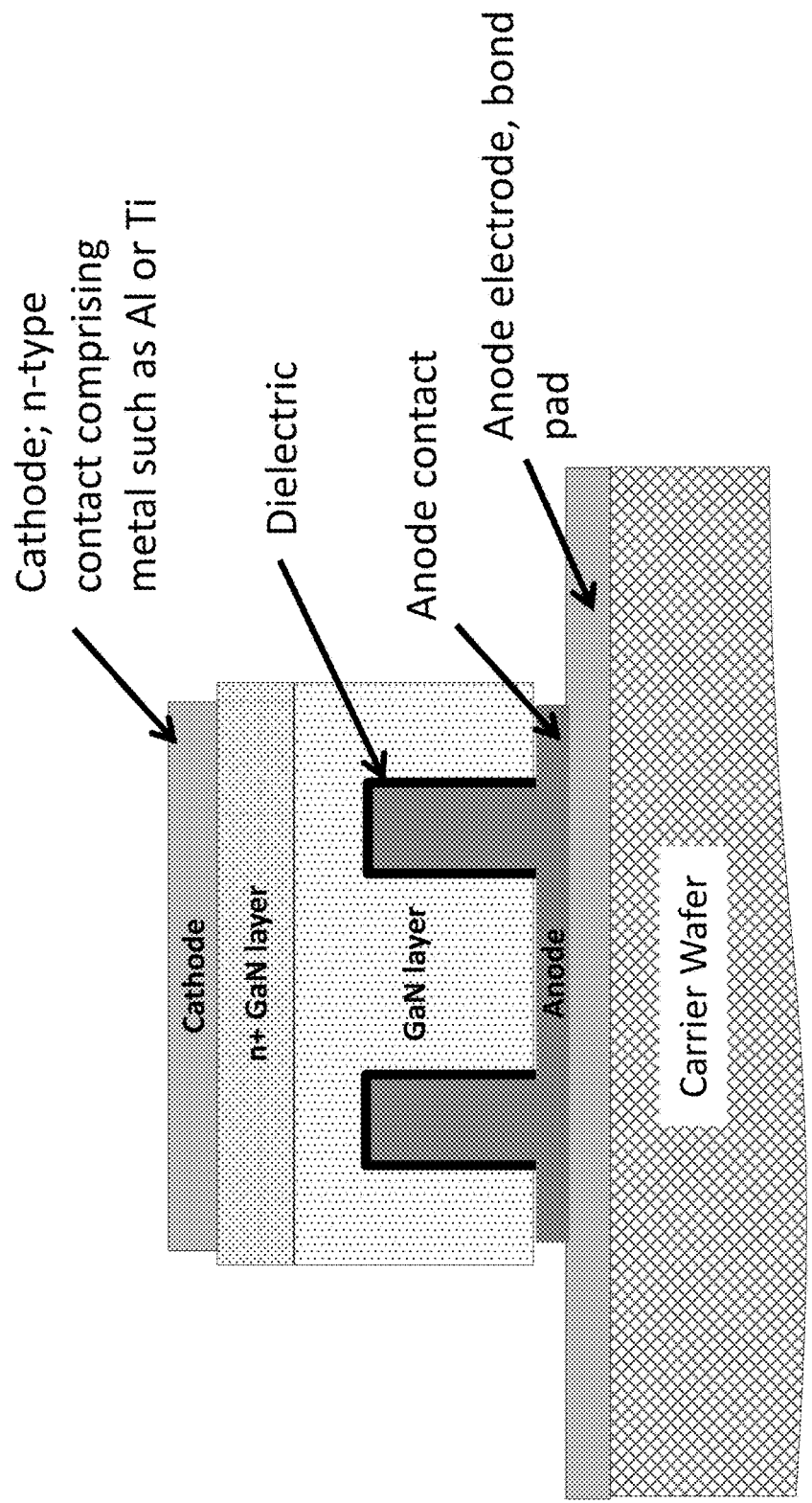
Figure 8J: Metal-insulator-semiconductor barrier Schottky rectifier device formed on wafer from epitaxial stack shown in Figure 8I (normally off-device)

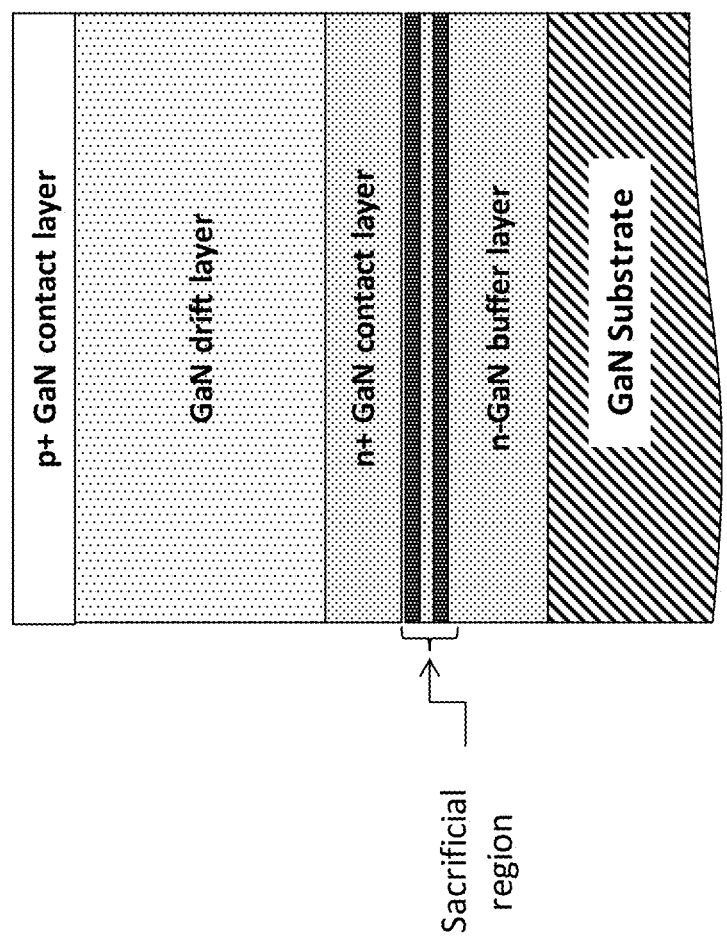
Figure 9A: Example of epitaxial stack grown on bulk gallium and nitrogen containing substrate to form a vertical pn diode device

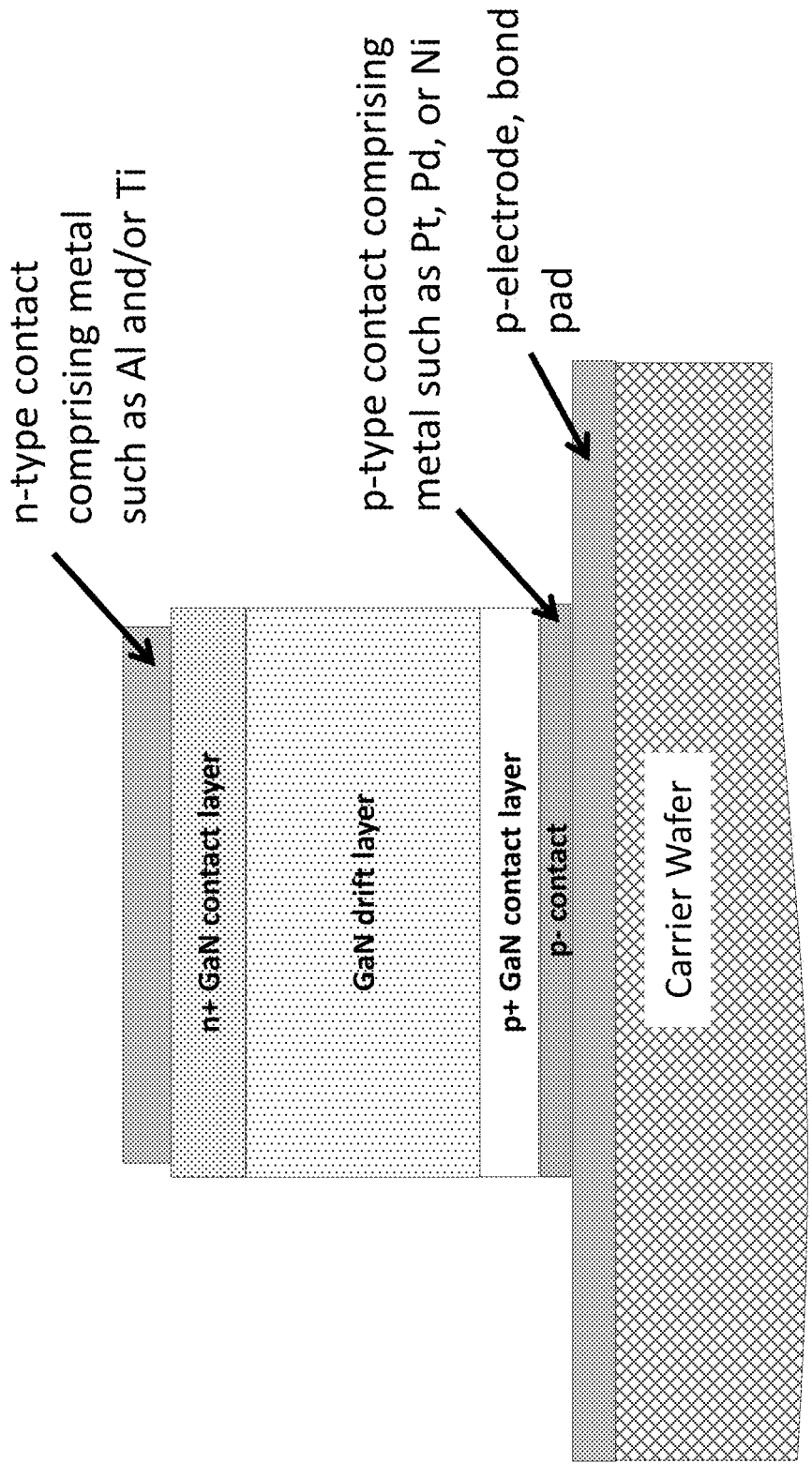
Figure 9B: Vertical pn diode device formed on carrier wafer from epitaxial stack shown in Figure 9A

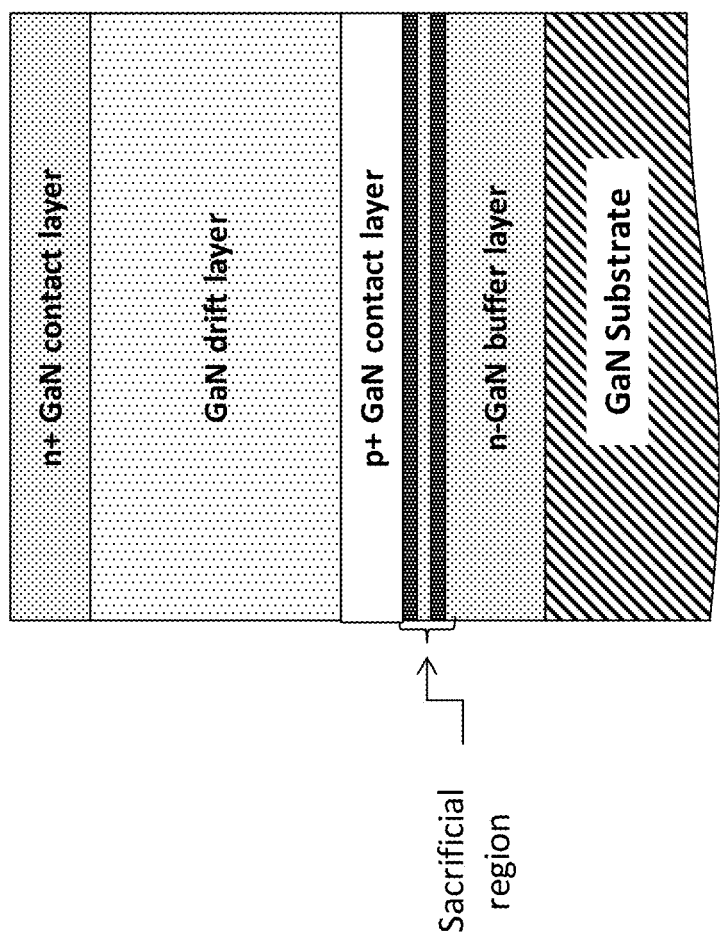
Figure 9C: Example of epitaxial stack grown on bulk gallium and nitrogen containing substrate to form a vertical pn diode device

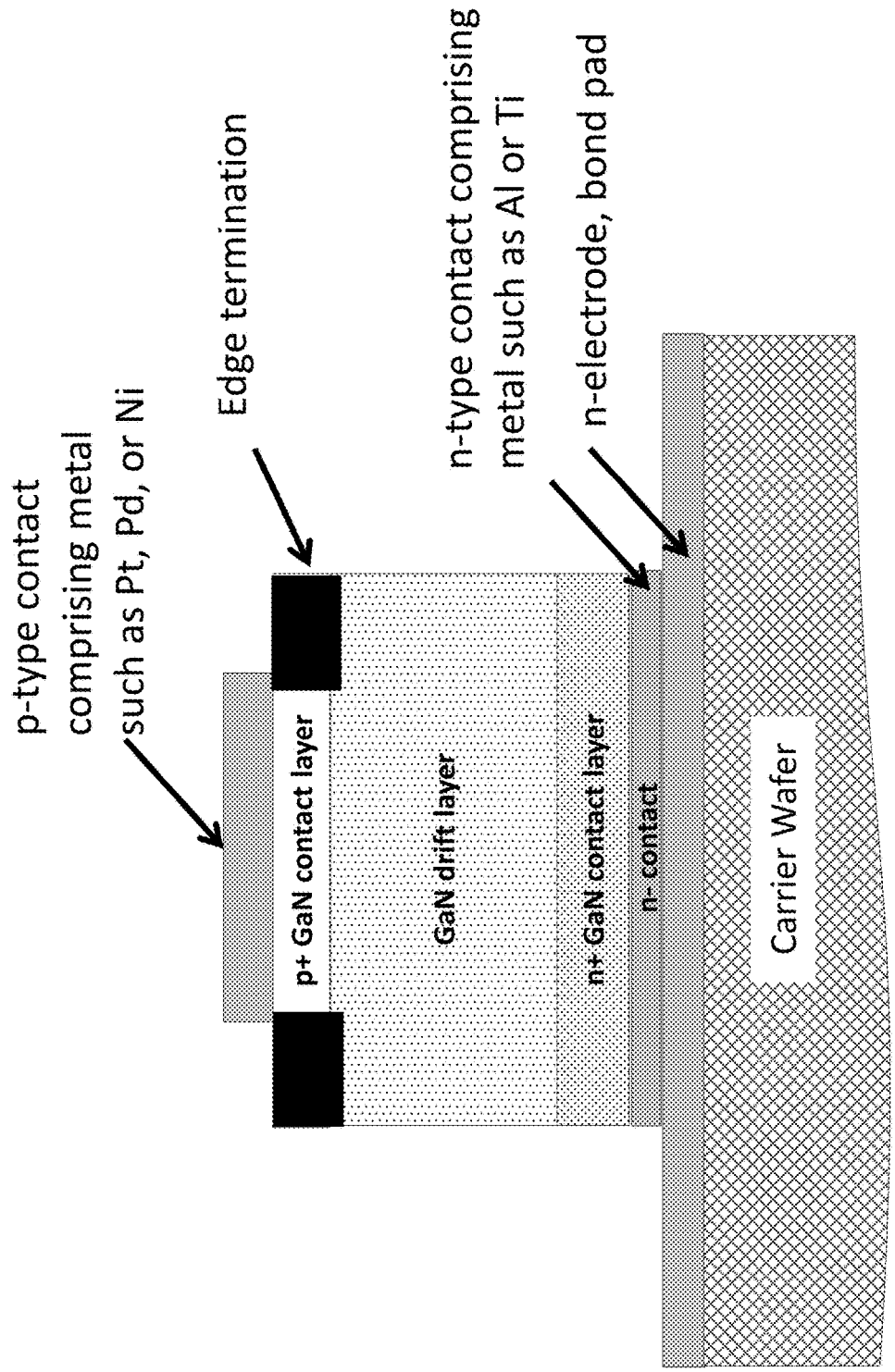
Figure 9D: Vertical pn diode device formed on carrier wafer from epitaxial stack shown in Figure 9C

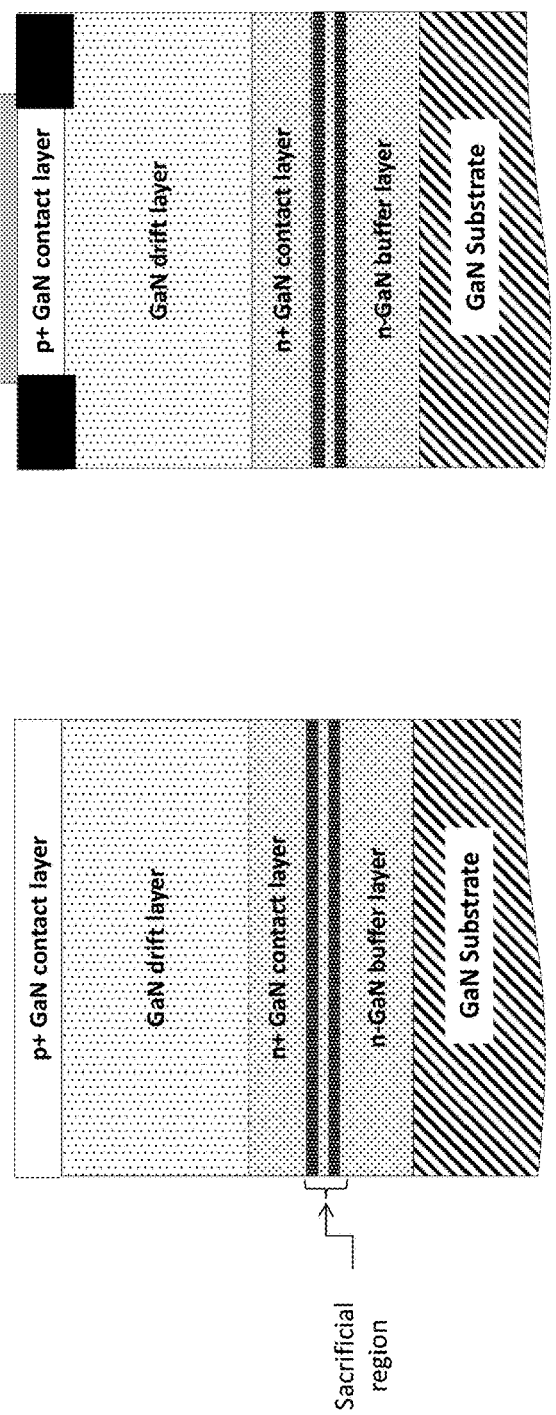
Figure 9E: Example of epitaxial stack grown on bulk gallium and nitrogen containing substrate to form a vertical pn diode device

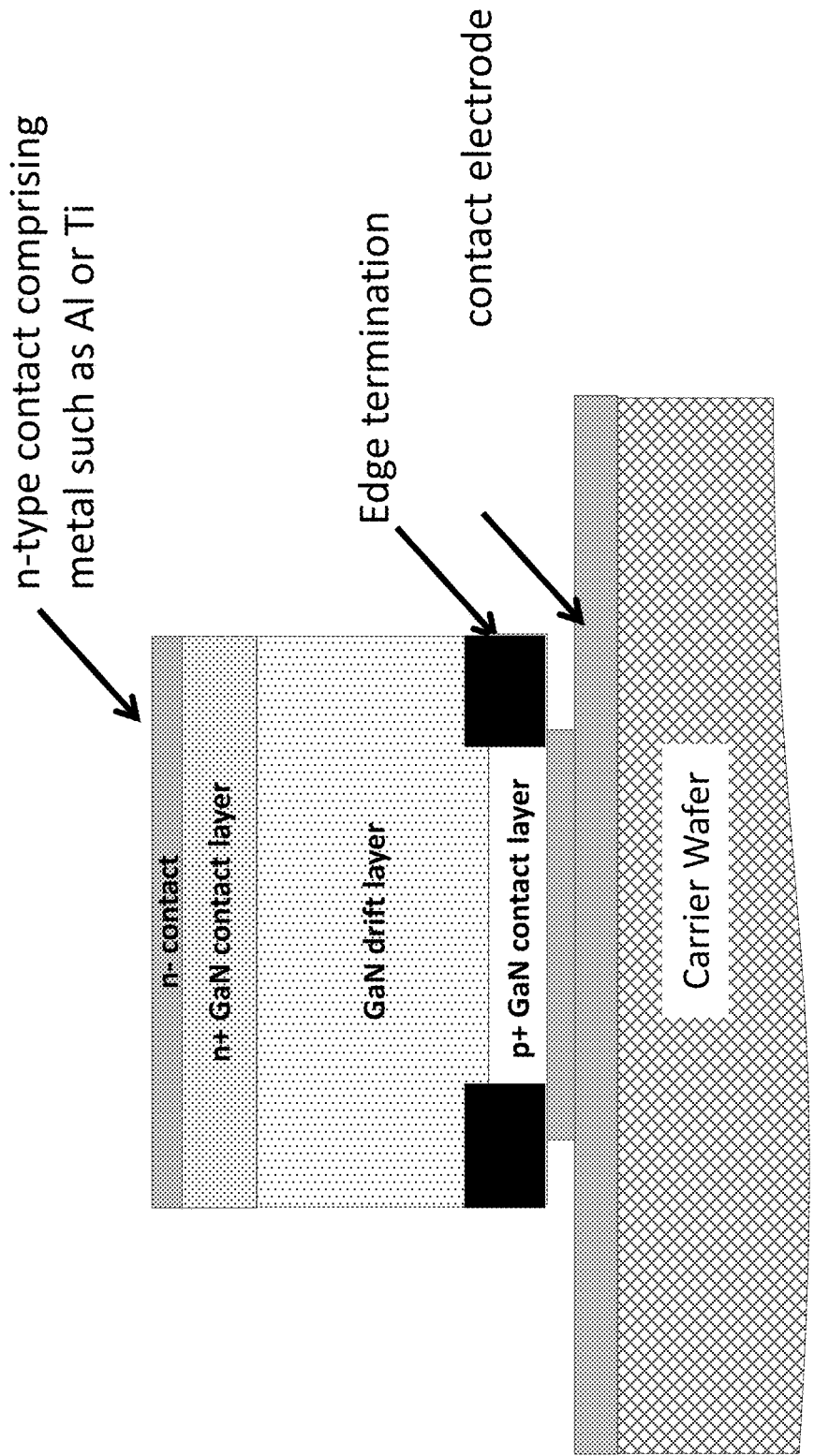
Figure 9F: Vertical pn diode device formed on carrier wafer from epitaxial stack shown in Figure 9E

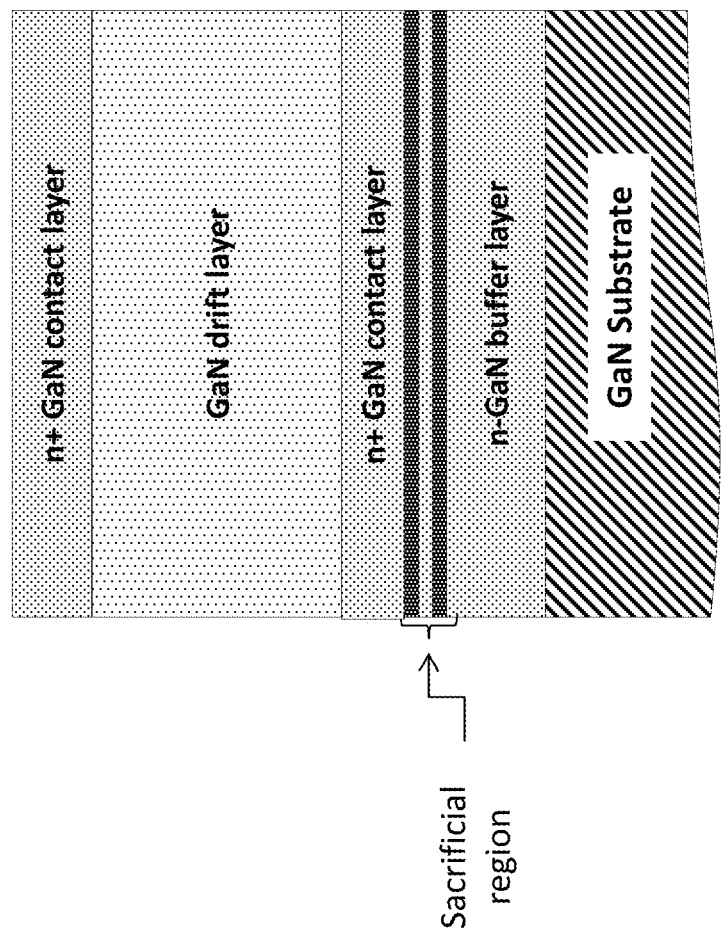
Figure 9G: Example of epitaxial stack grown on bulk gallium and nitrogen containing substrate to form a vertical SITs device

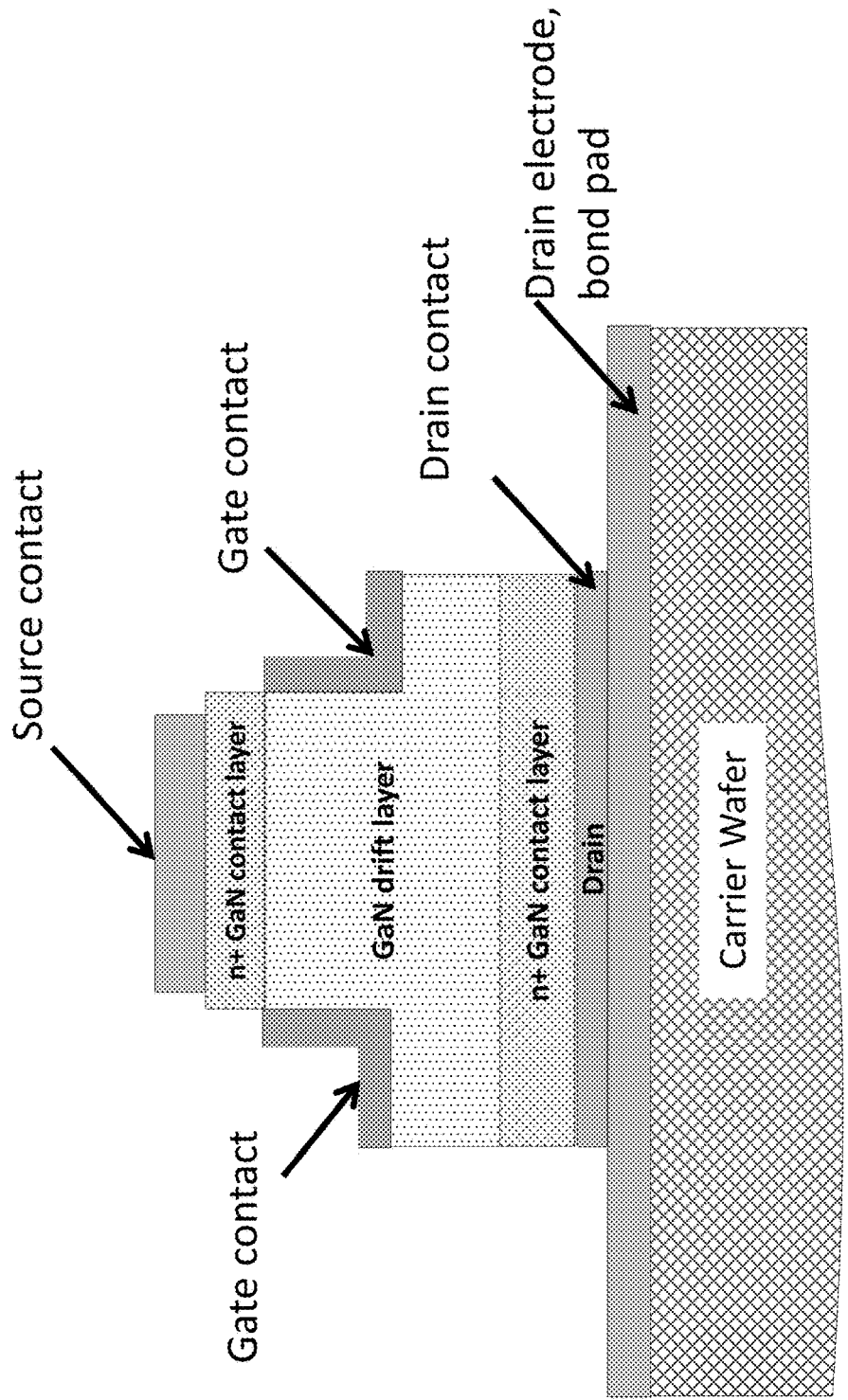
Figure 9H: SITs device formed on carrier wafer from epitaxial stack shown in Figure 9G

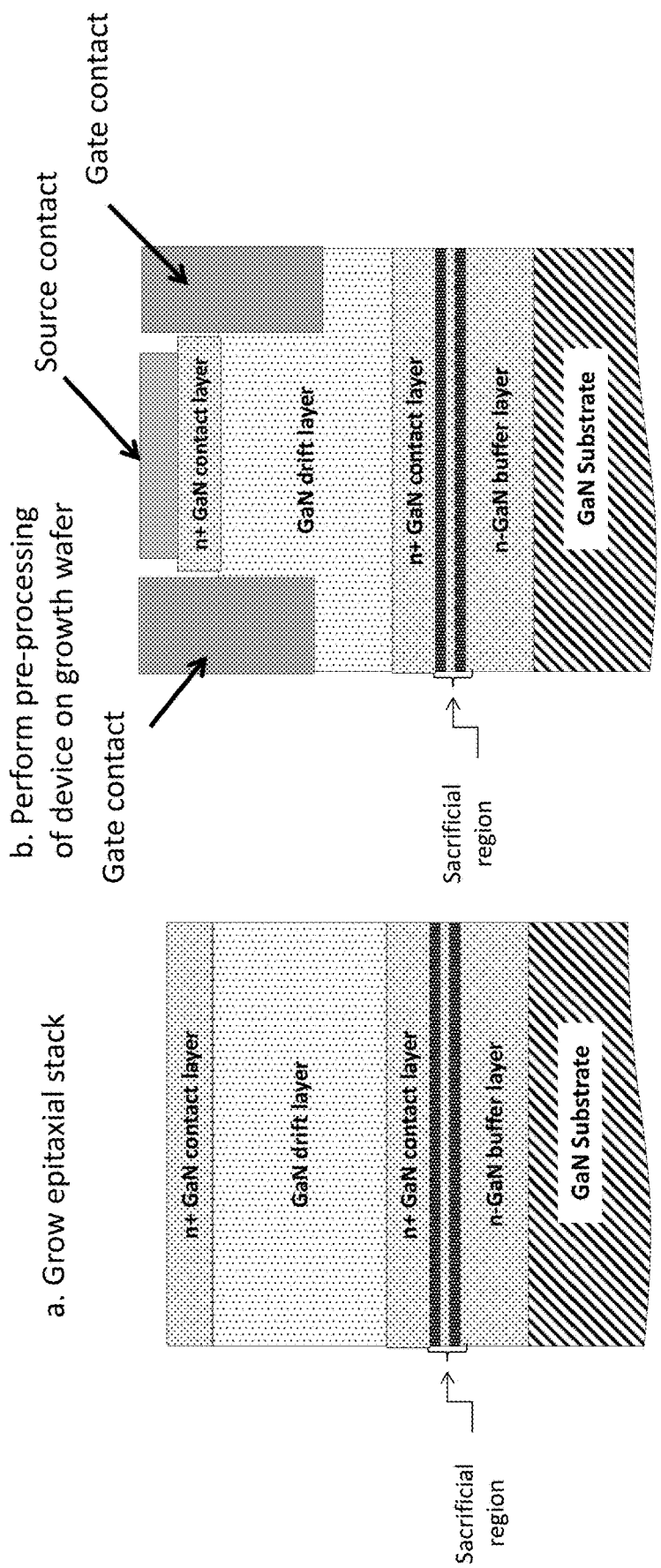
Figure 9i: Example of epitaxial stack grown on bulk gallium and nitrogen containing substrate to form a vertical SITs device

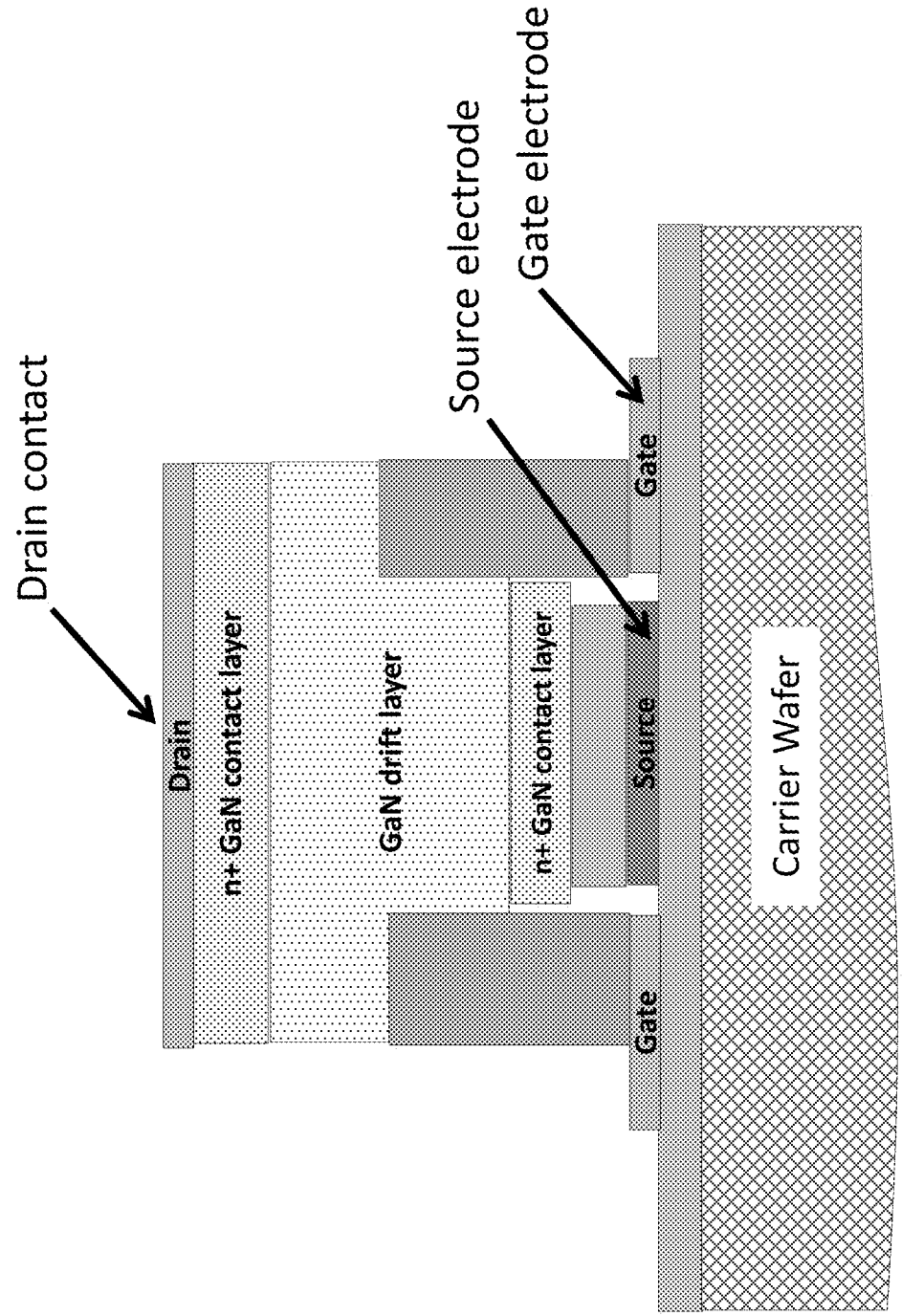
Figure 9J: SITs device formed on carrier wafer from epitaxial stack shown in Figure 9I

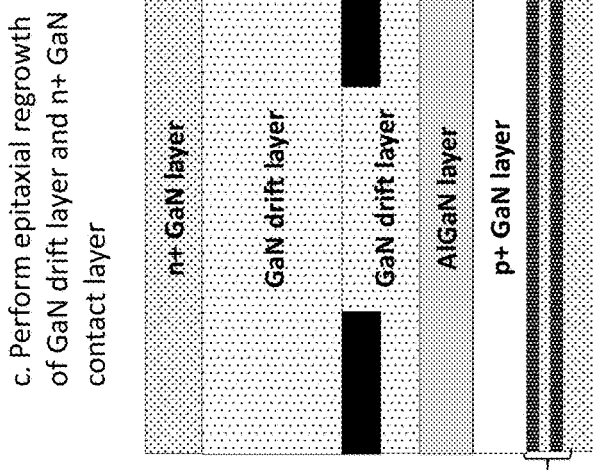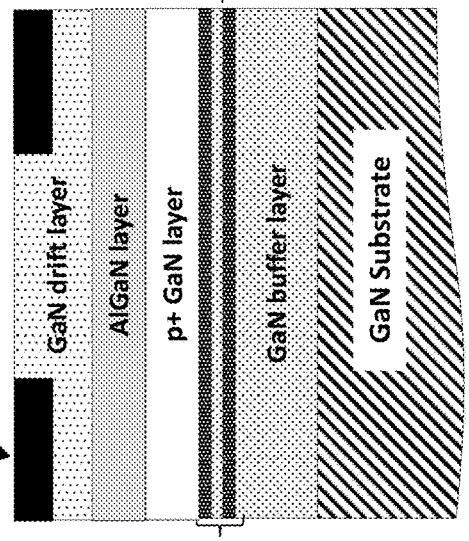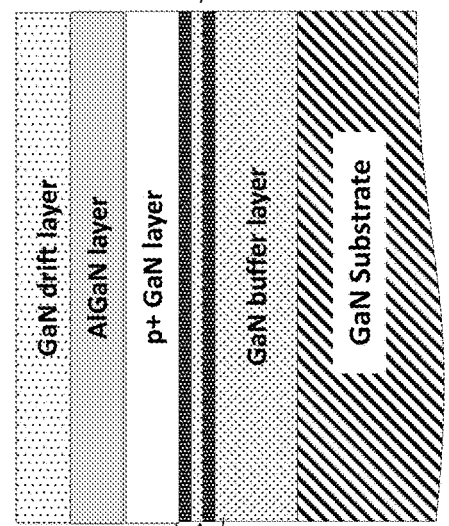
Figure 9K: Example of epitaxial stack grown on bulk gallium and nitrogen containing substrate to form a vertical CAVET device

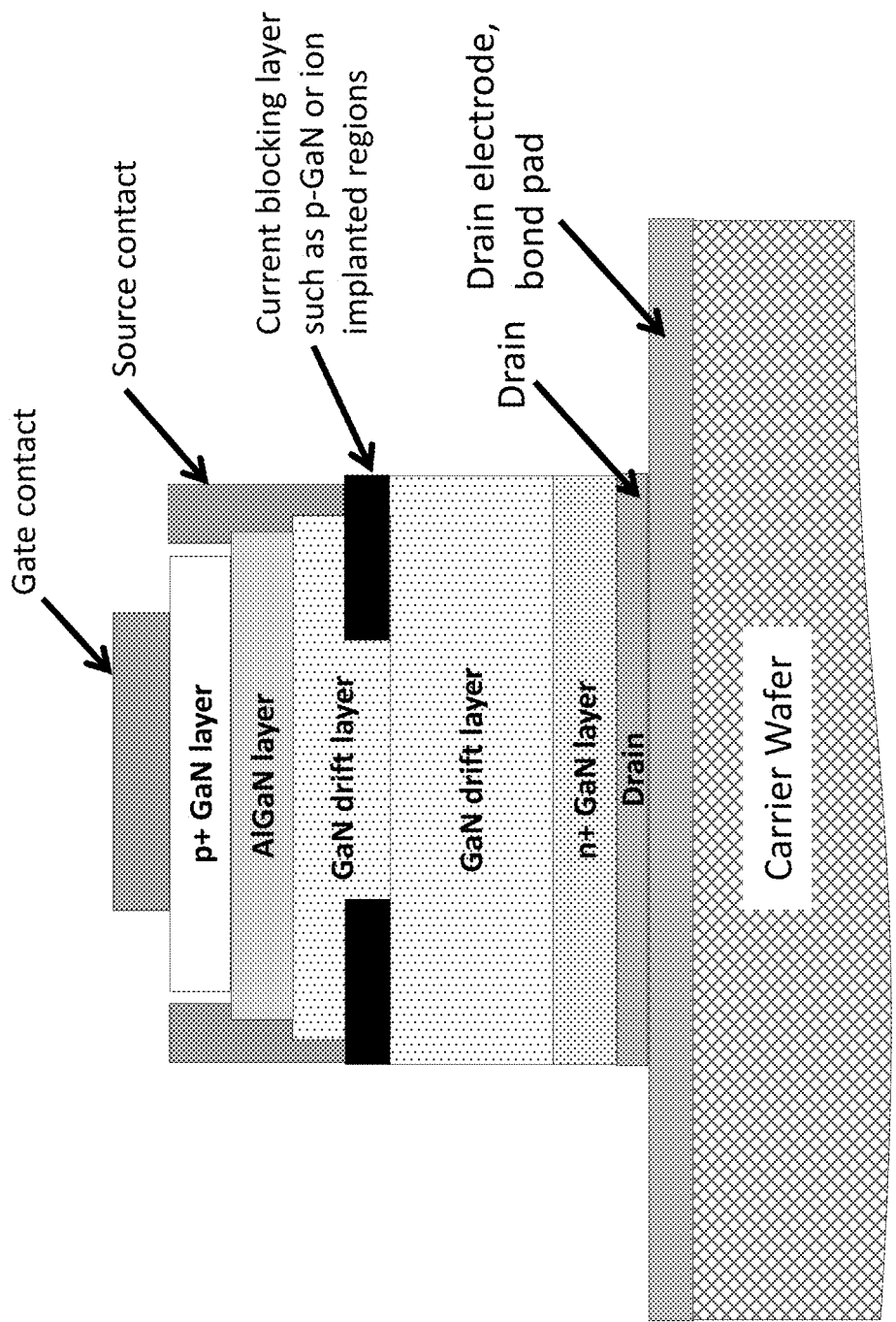
Figure 9L: CAVET device formed on carrier wafer from epitaxial stack shown in Figure 9K

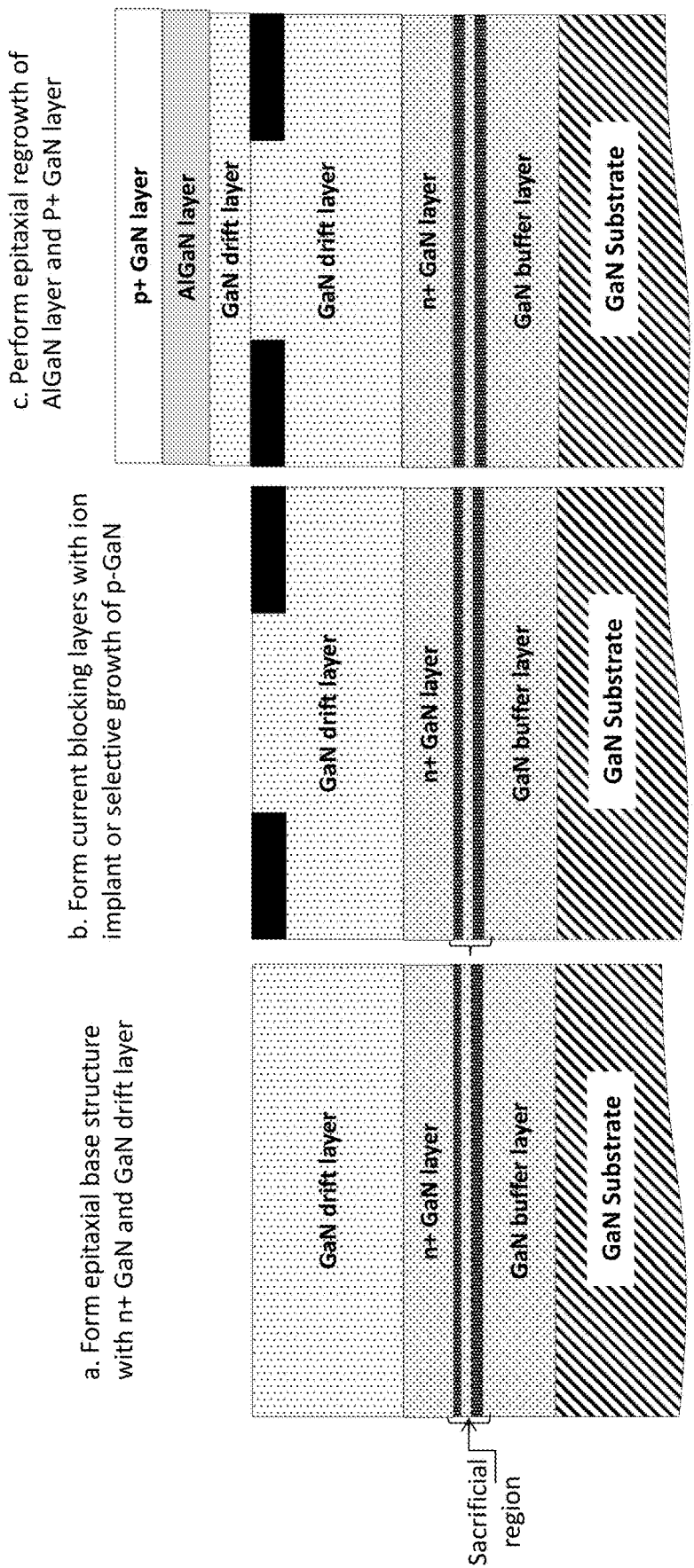
Figure 9M: Example of epitaxial stack grown on bulk gallium and nitrogen containing substrate to form a vertical CAVET device

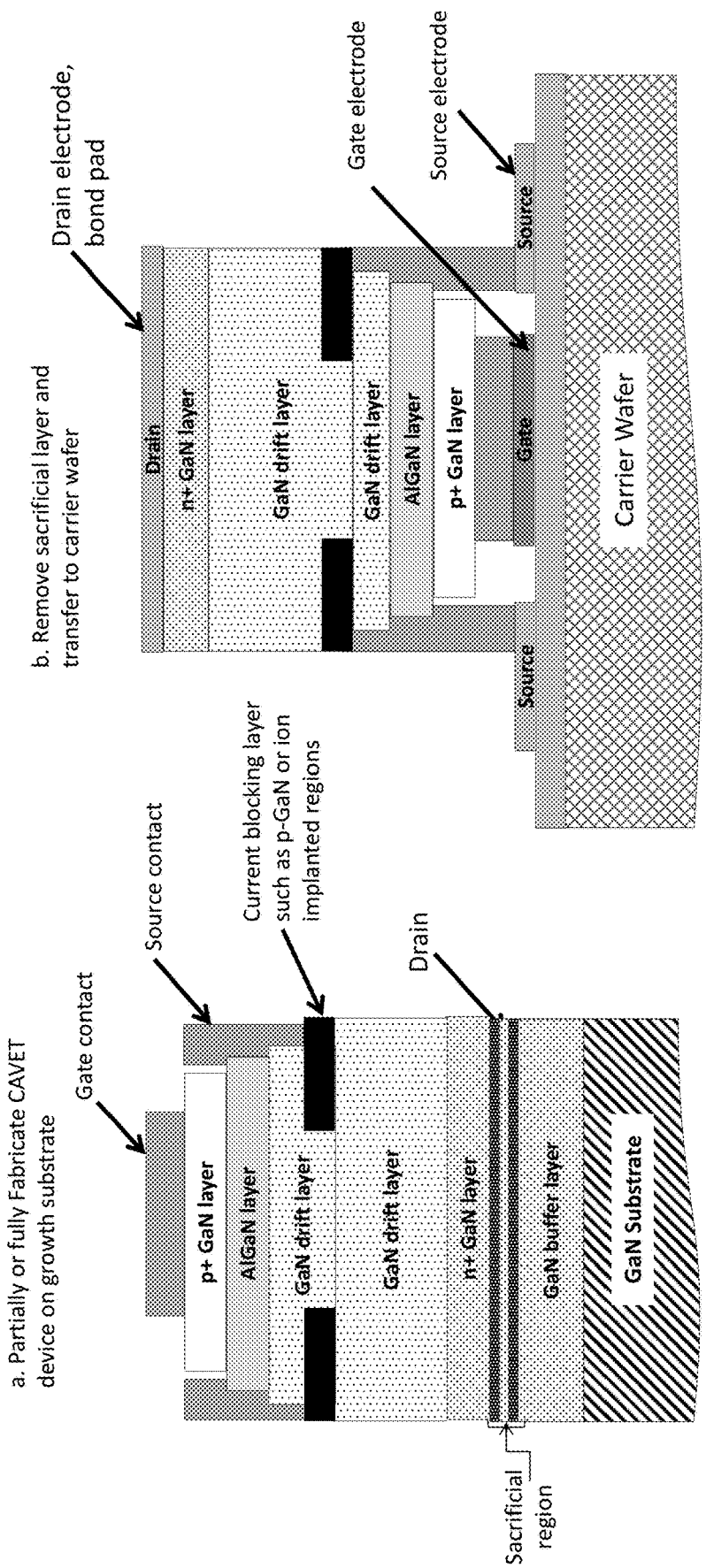
Figure 9N: CAVET device formed on carrier wafer from epitaxial stack shown in Figure 9M

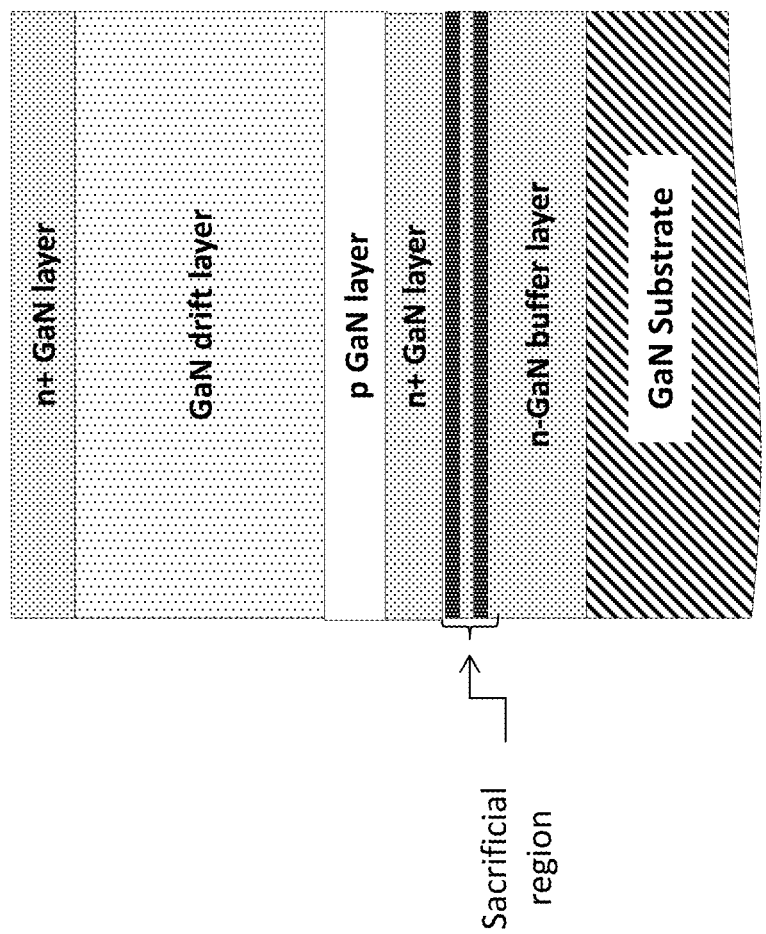
Figure 90: Example of epitaxial stack grown on bulk gallium and nitrogen containing substrate to form a vertical MOSFET device

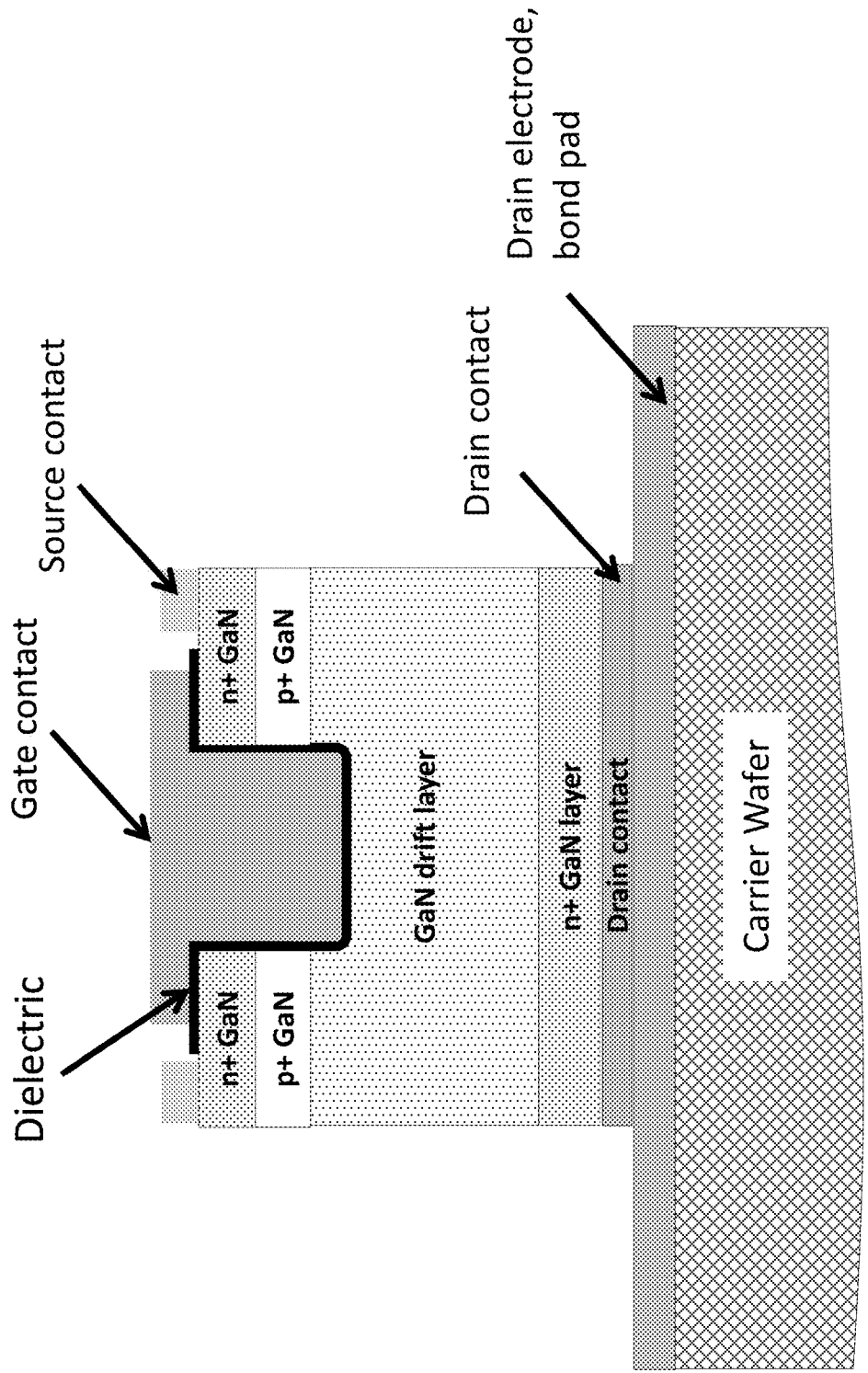
Figure 9P: Trench MOSFET device formed on carrier wafer from epitaxial stack shown in Figure 9O (normally off device)

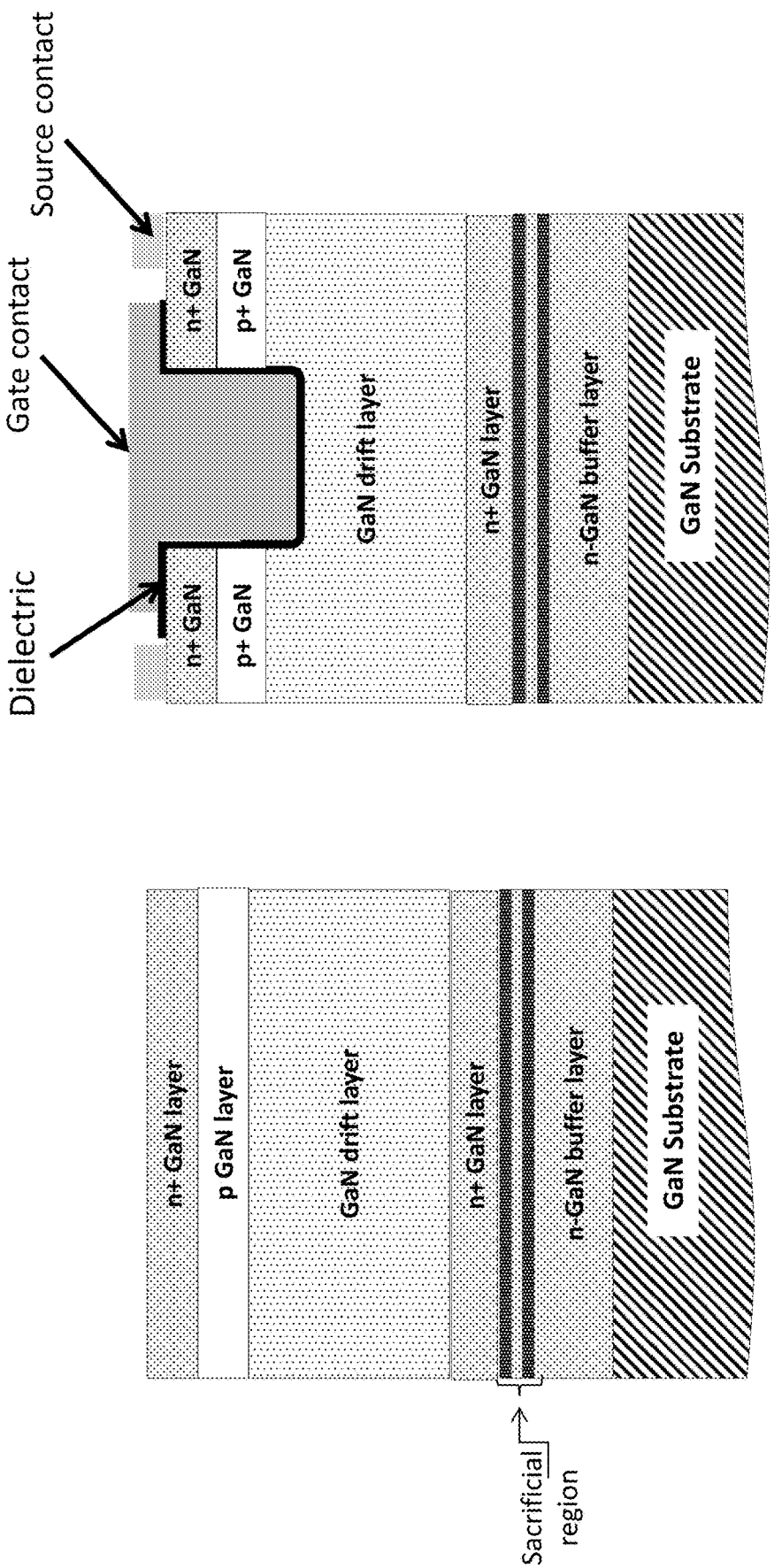
Figure 9Q: Example of epitaxial stack grown on bulk gallium and nitrogen containing substrate to form a vertical MOSFET device

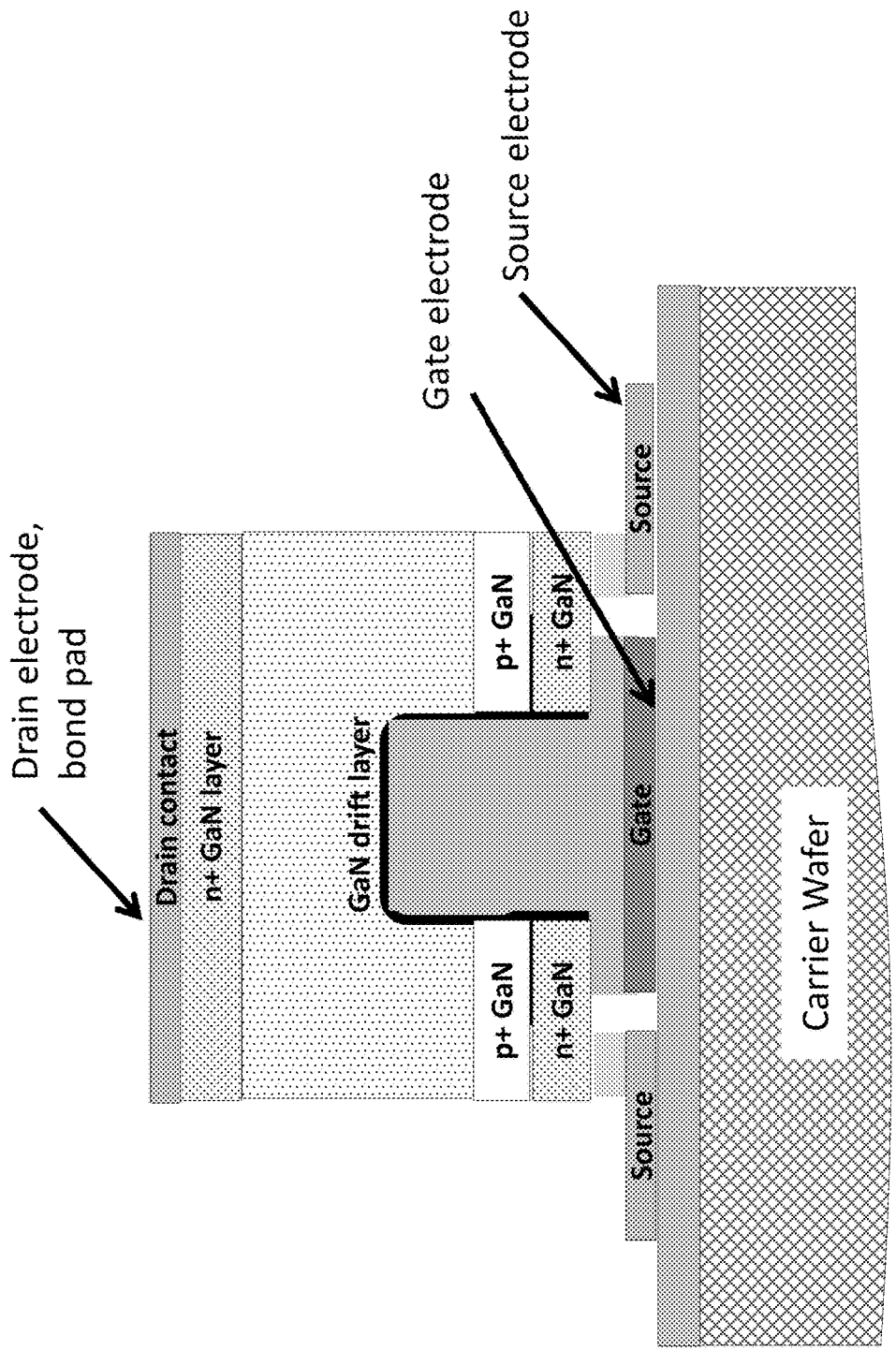
Figure 9R: Trench MOSFET device formed on carrier wafer from epitaxial stack shown in Figure 9Q (normally off device)

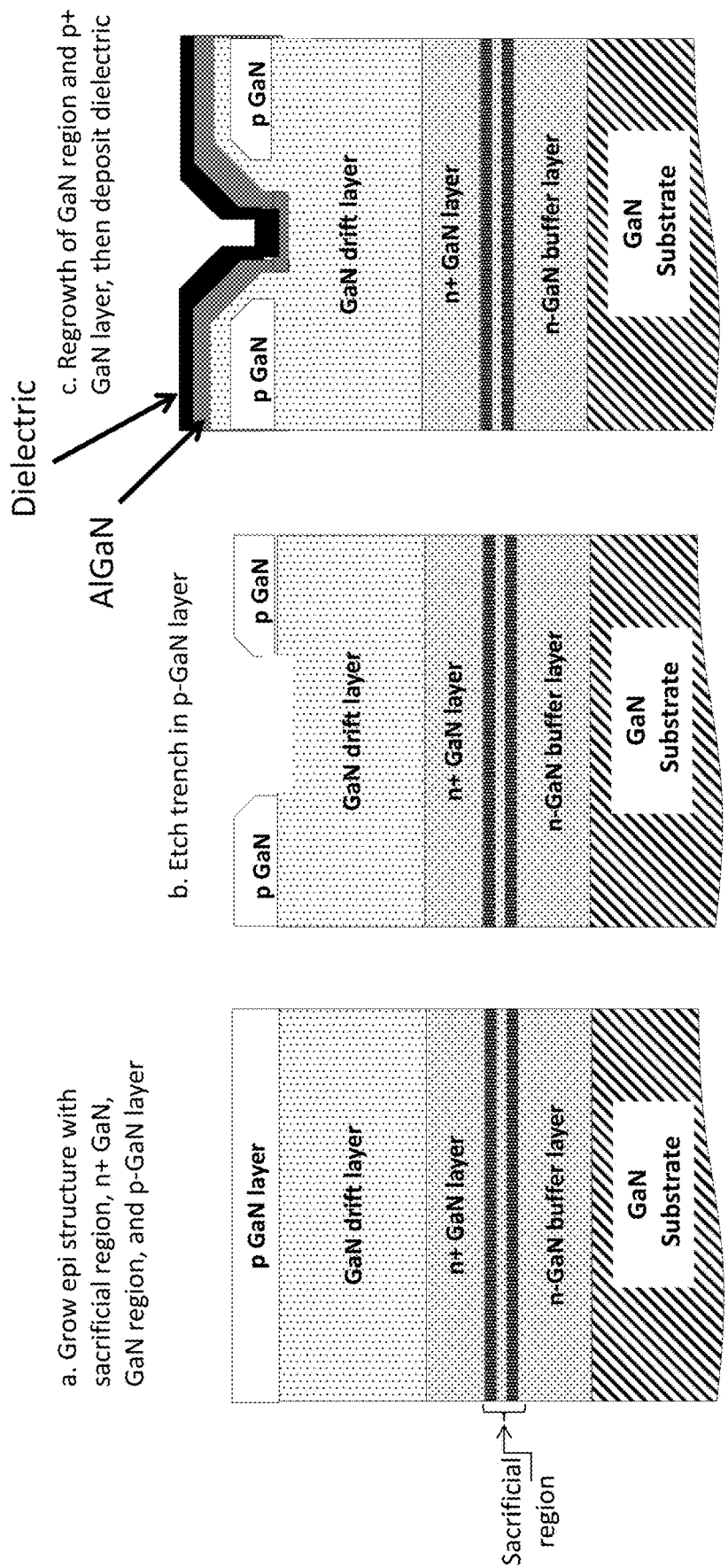
Figure 9S: Example of epitaxial stack grown on bulk gallium and nitrogen containing substrate to form a trench CAVET device (normally off device)

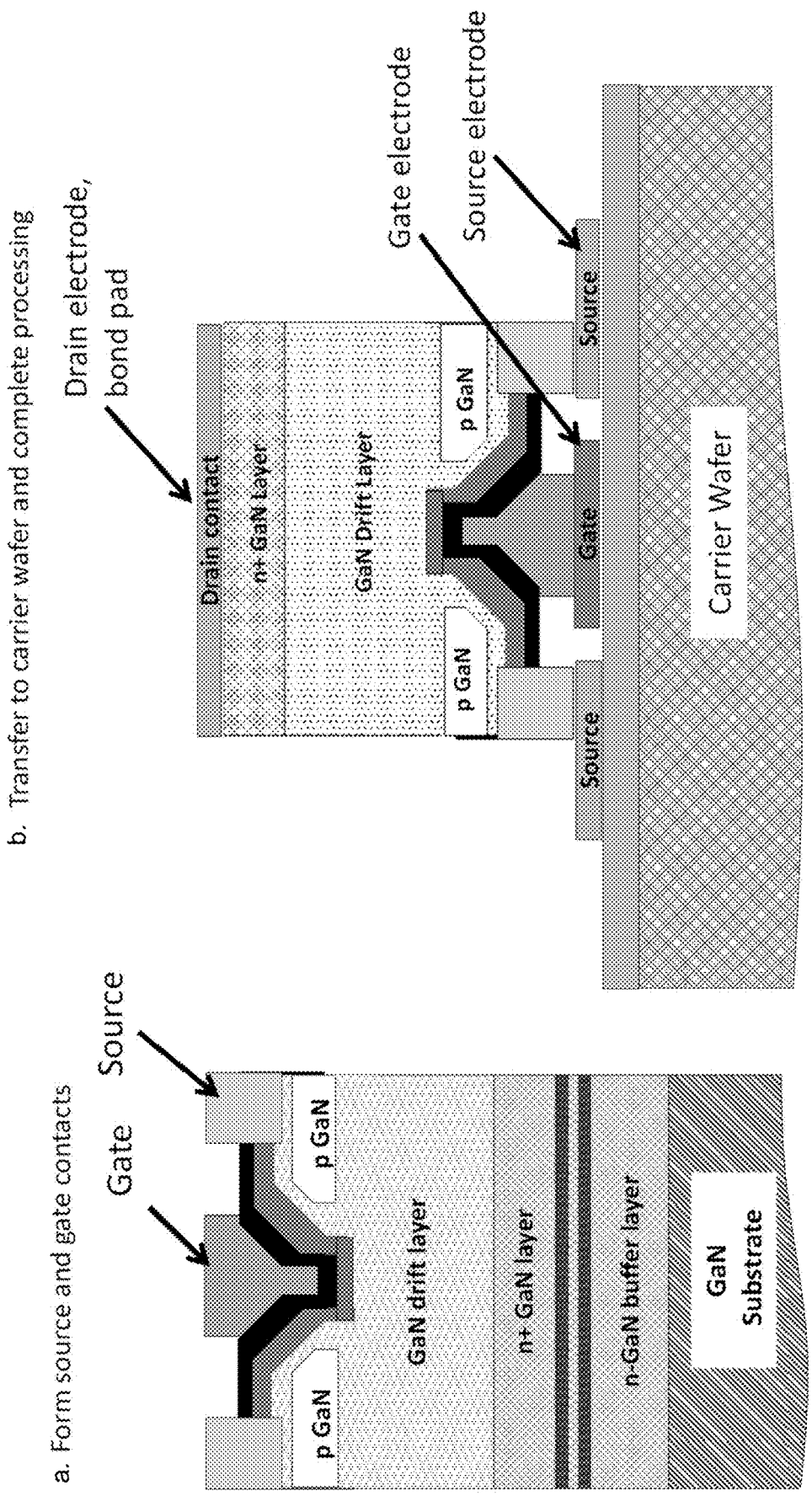
Figure 9T: Trench CAVET device formed on carrier wafer from epitaxial stack shown in Figure 9S (normally off device)

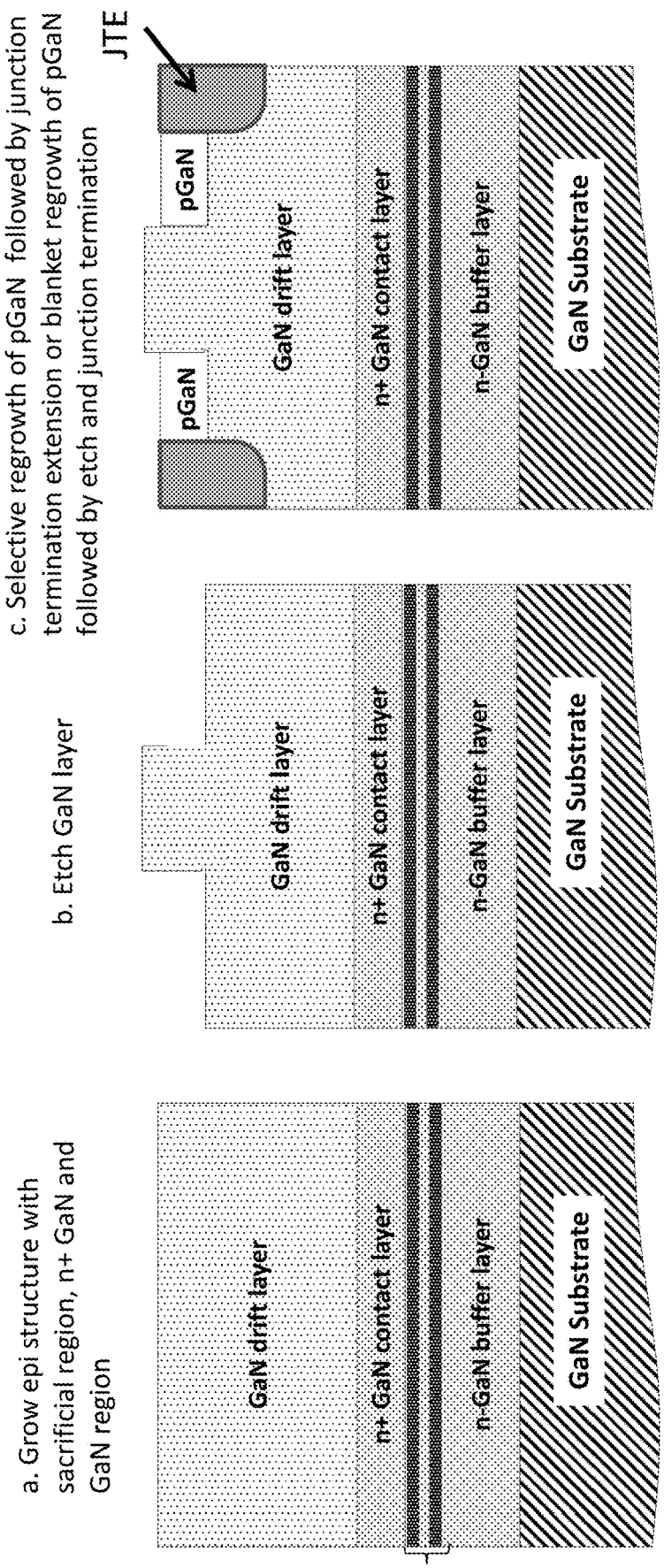
Figure 9U: Example of epitaxial stack grown on bulk gallium and nitrogen containing substrate to form a vertical eJFET device

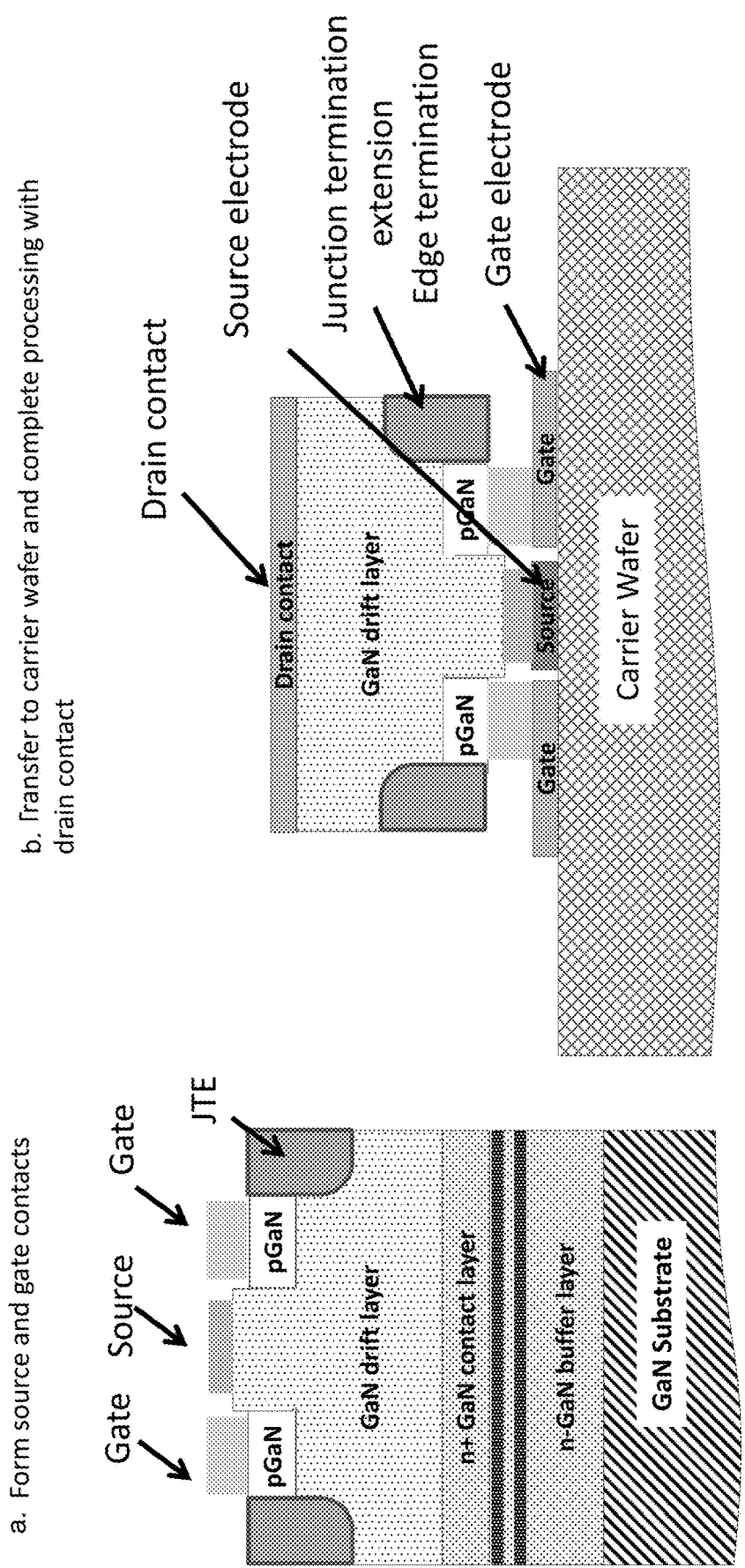
Figure 9V: Example of eJFET device formed on carrier wafer from epitaxial stack shown in Figure 9U

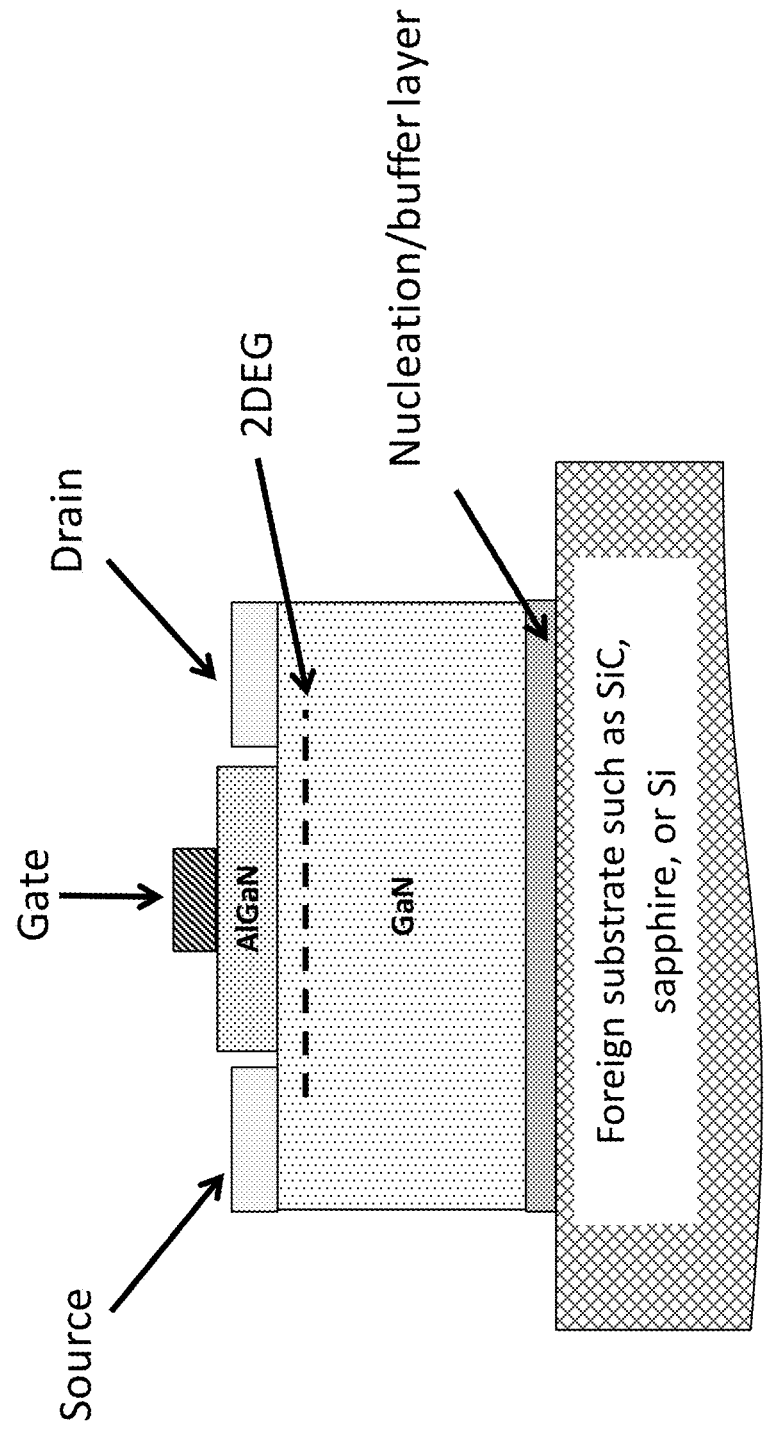
Figure 10A: Example of a conventional HEMT device formed epitaxially on a foreign substrate

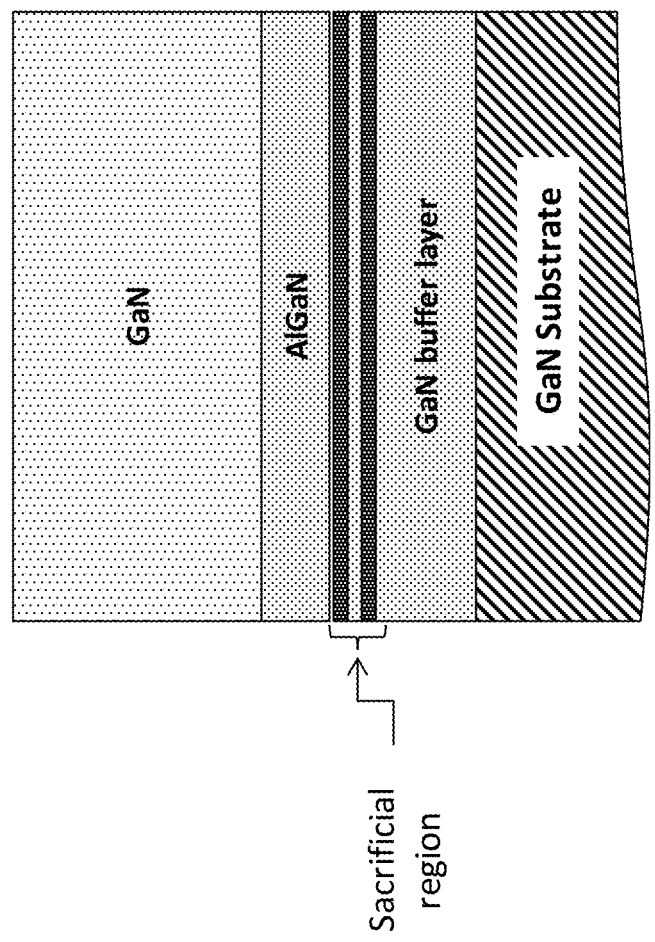
Figure 10B: Example of epitaxial stack grown on bulk gallium and nitrogen containing substrate to form a HEMT device

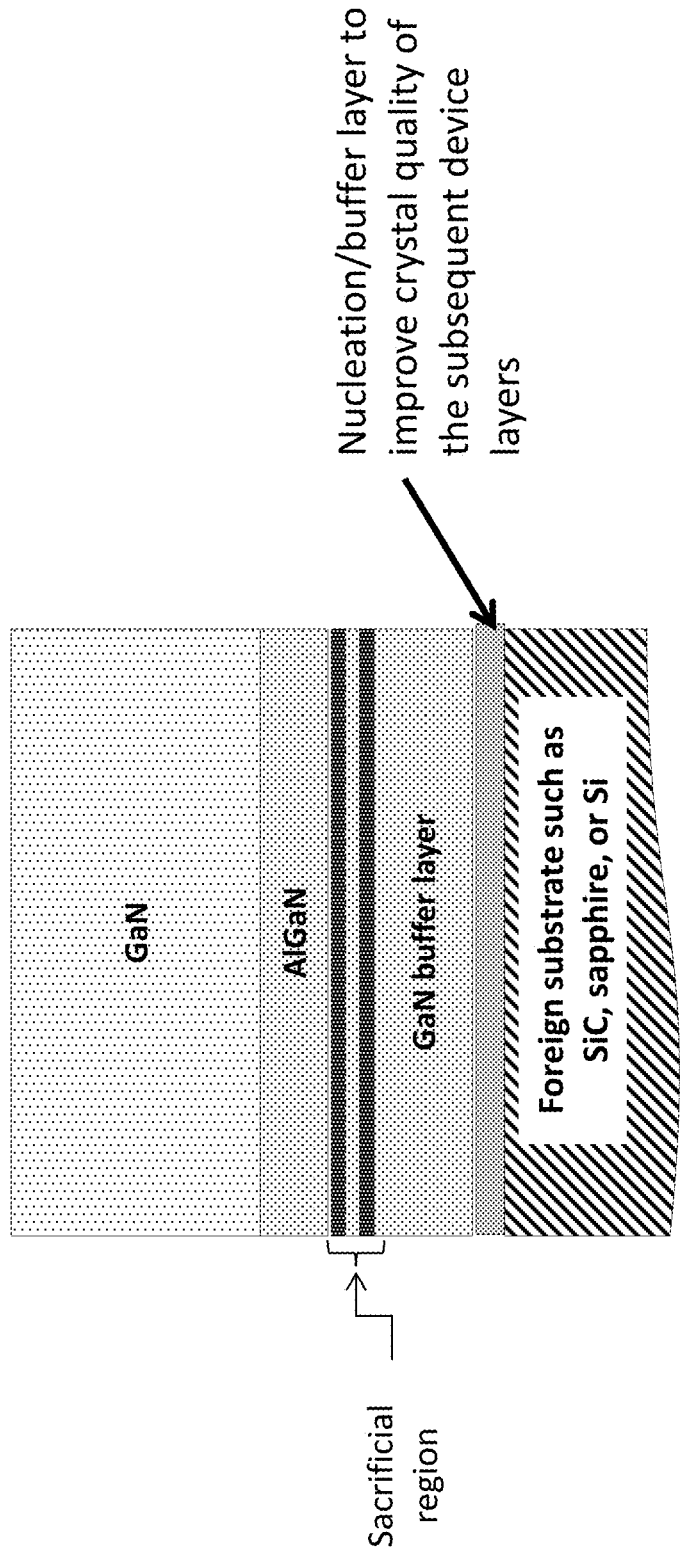
Figure 10C: Example of epitaxial structure for HEMT formed on a foreign substrate

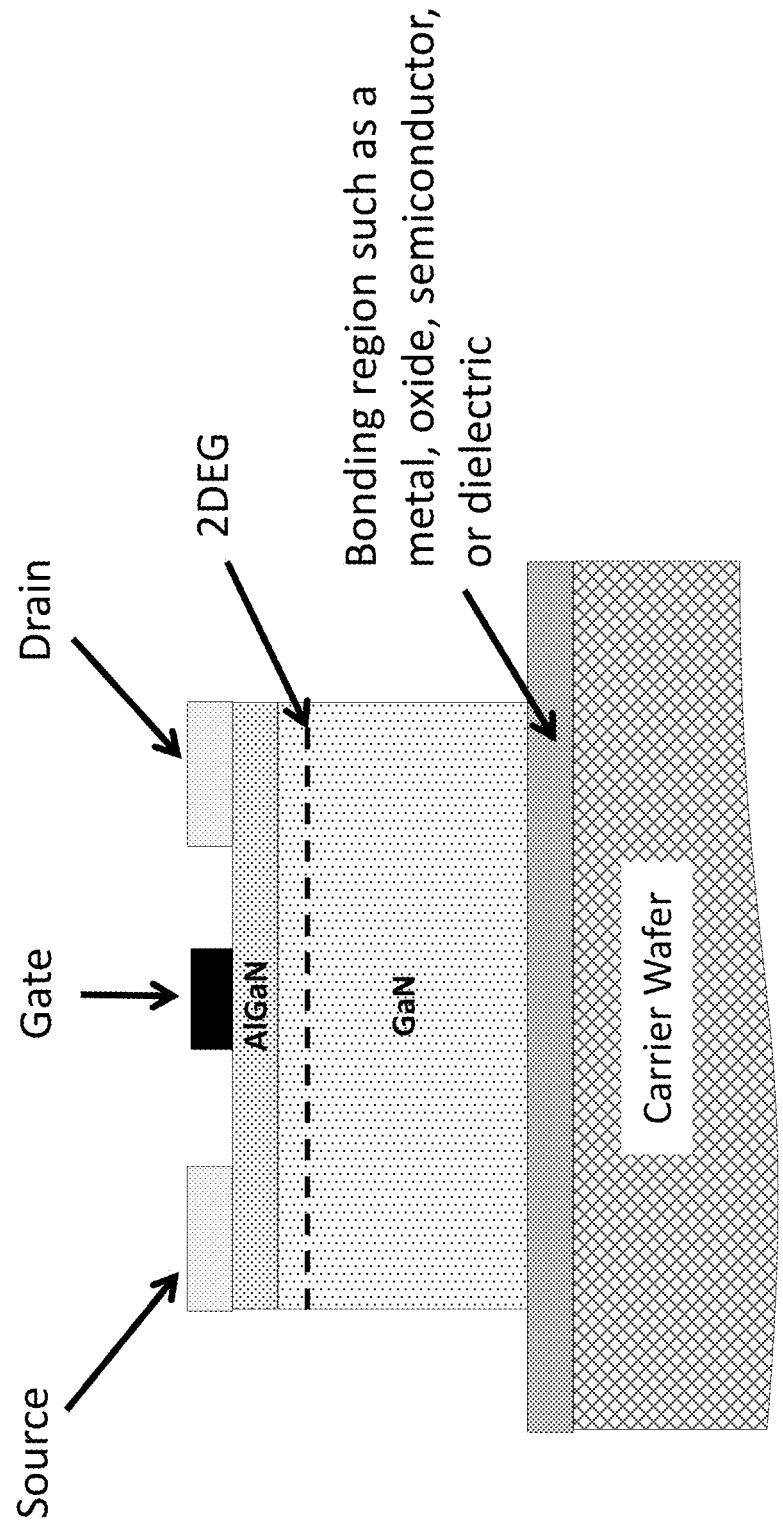
Figure 10D: Example of a HEMT/HFET device formed on carrier wafer from epitaxial stack shown in Figures 10B or 10C

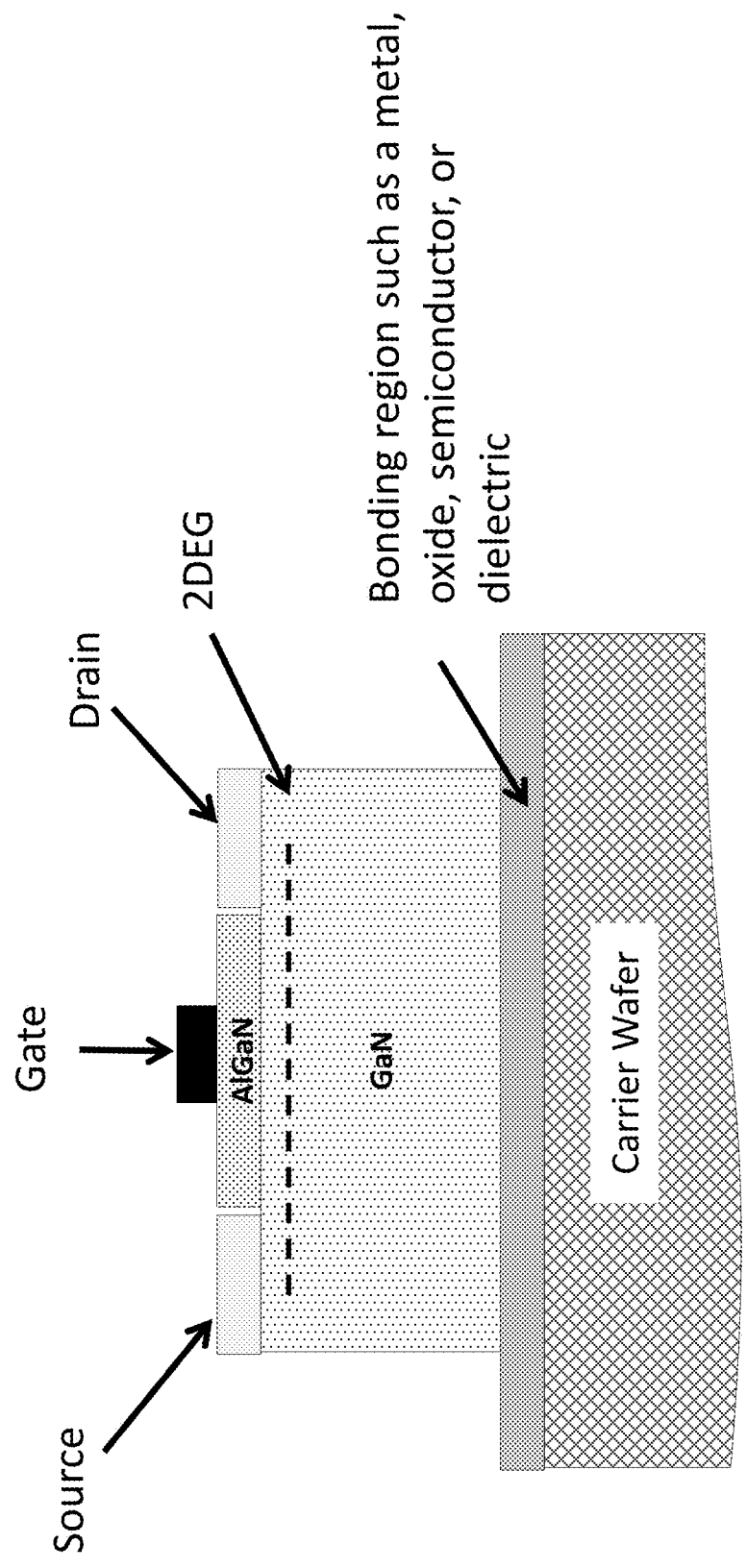
Figure 10E: Example of a HEMT/HFET device formed on carrier wafer from epitaxial stack shown in Figures 10B or 10C

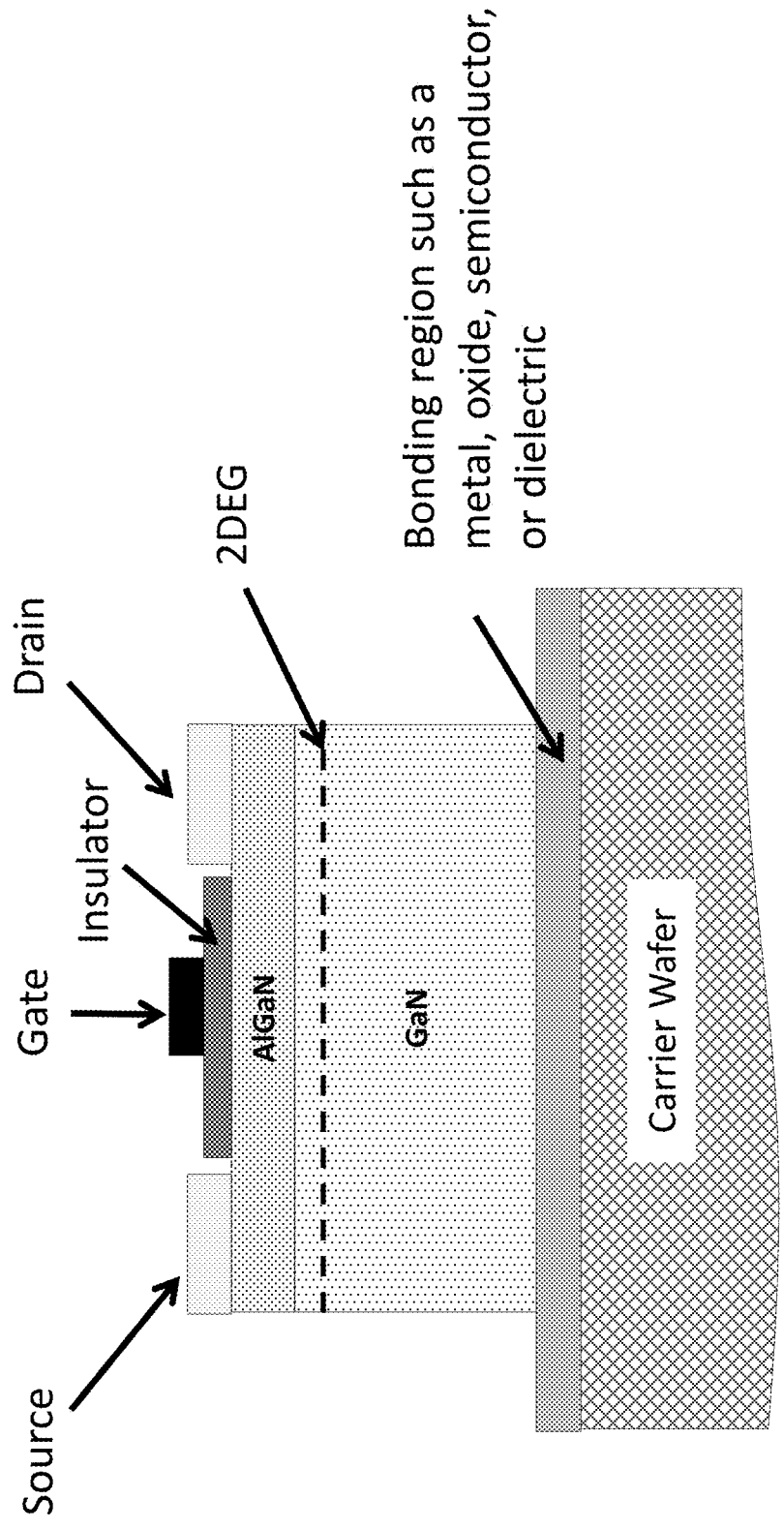
Figure 10F: Example of an insulated gate HEMT, MIS-HEMT device formed on carrier wafer from epitaxial stack shown in Figures 10B or 10C

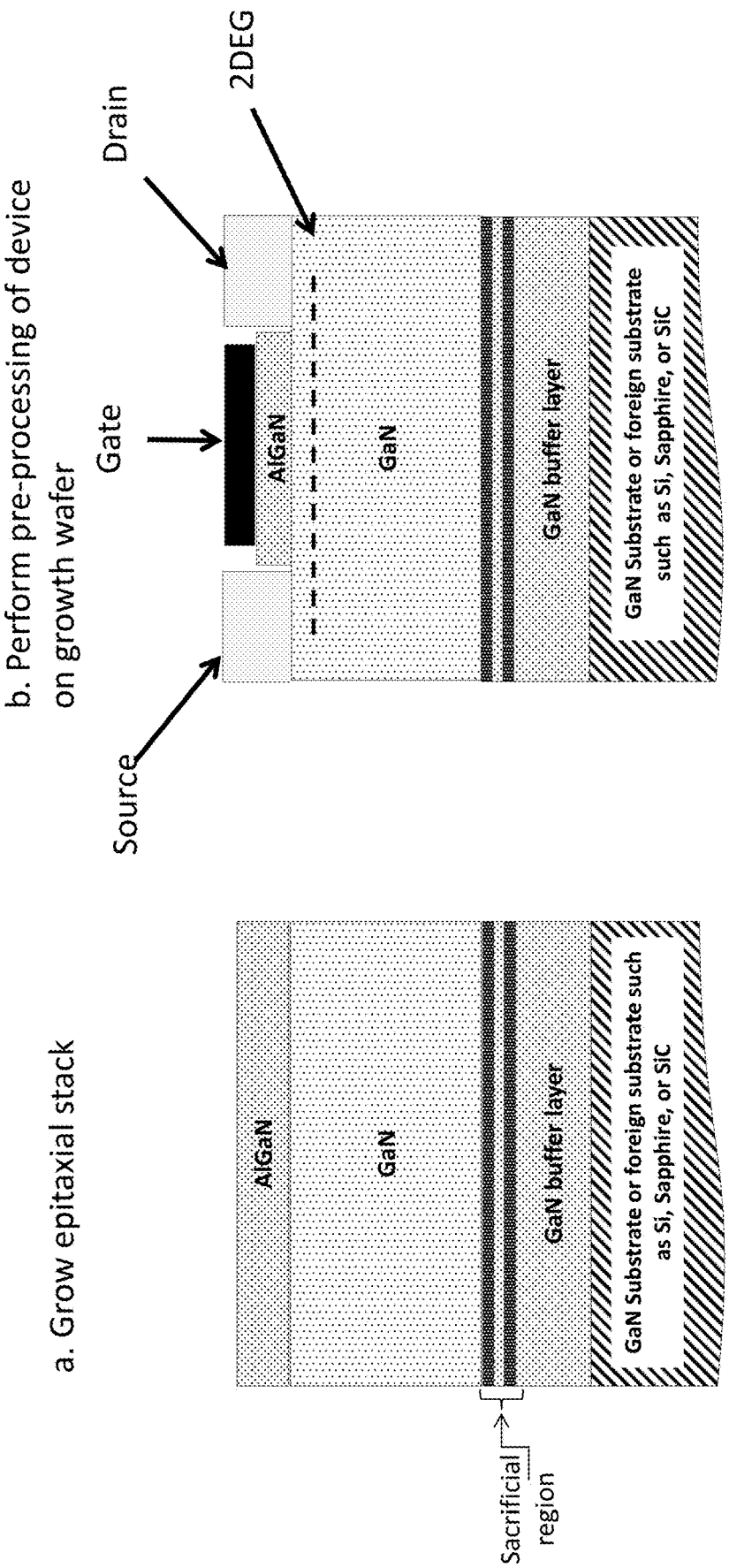
Figure 10G: Example of epitaxial stack grown on bulk gallium and nitrogen containing or foreign substrate to form a HEMT device

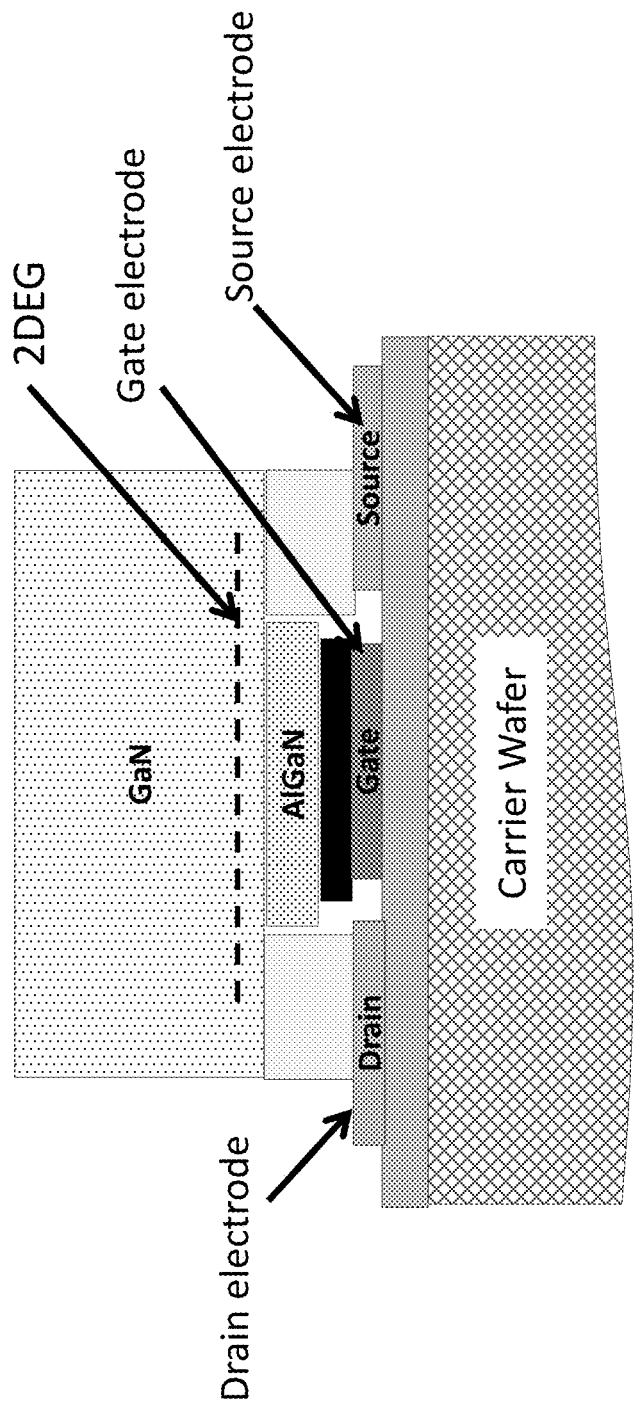
Figure 10H: Example of a HEMT device formed on carrier wafer from epitaxial stack and device process shown in Figure 10G

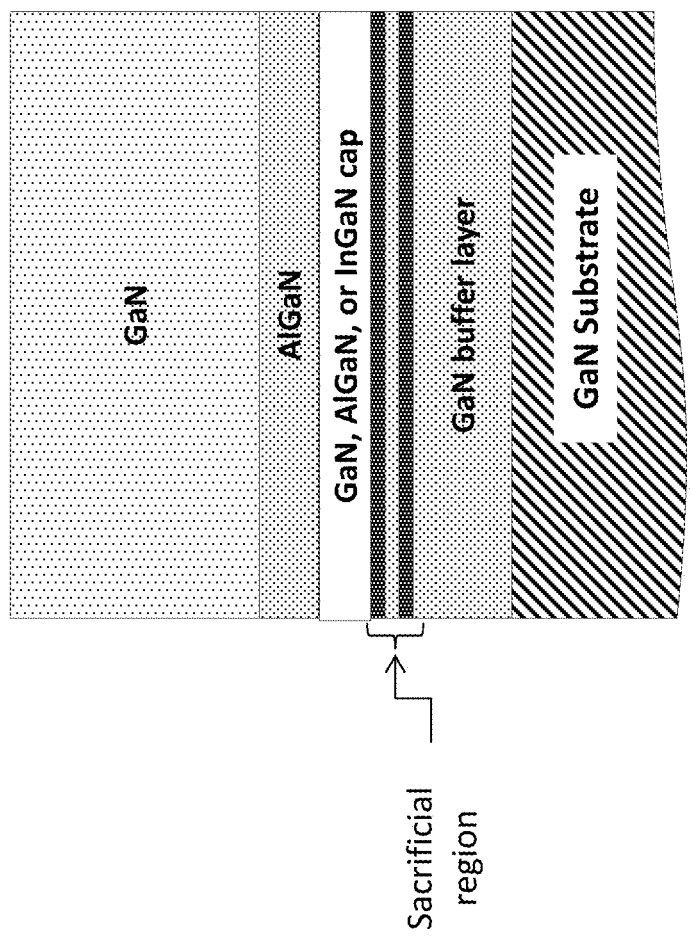
Figure 10l: Example of epitaxial stack grown on bulk gallium and nitrogen containing substrate to form a HEMT device

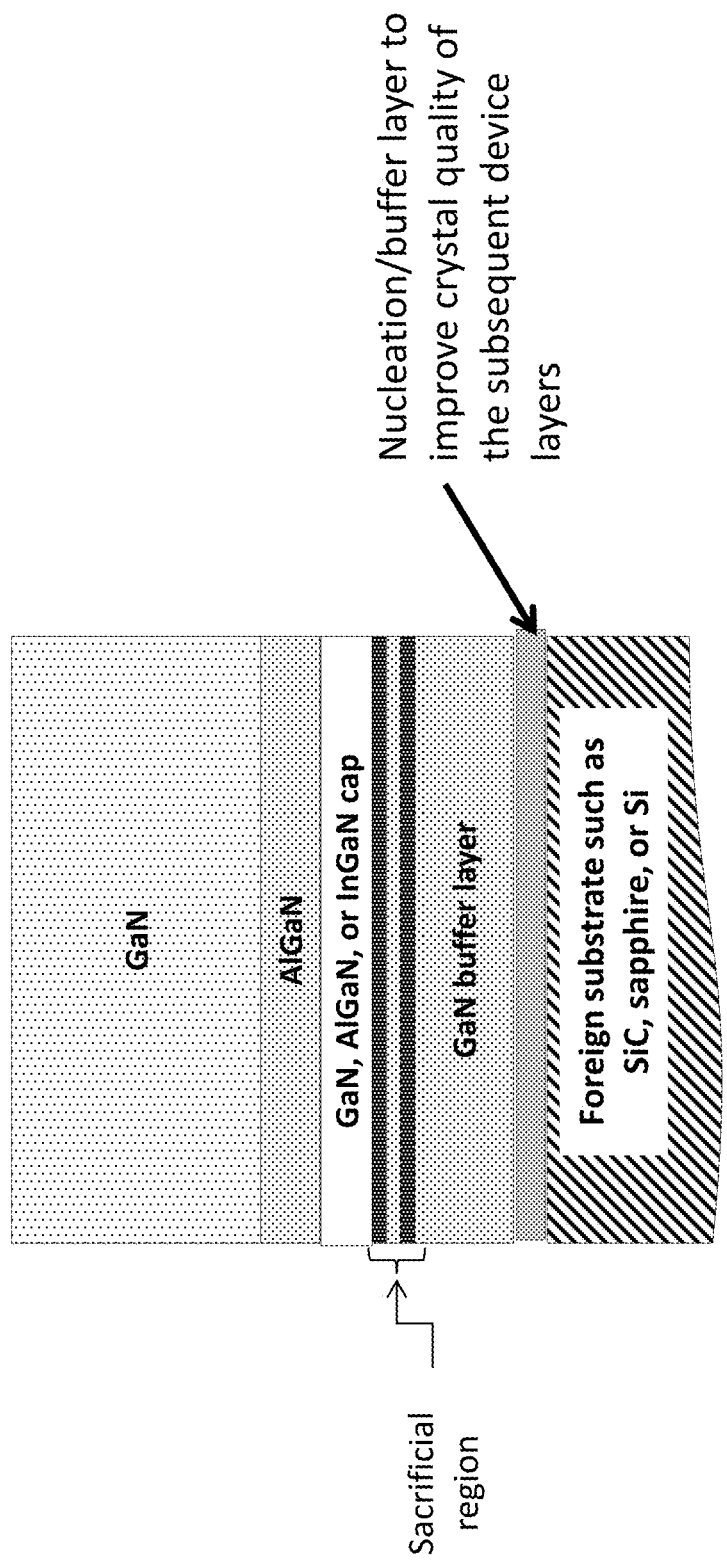
Figure 10J: Example of epitaxial stack grown on a foreign substrate to form a HEMT device

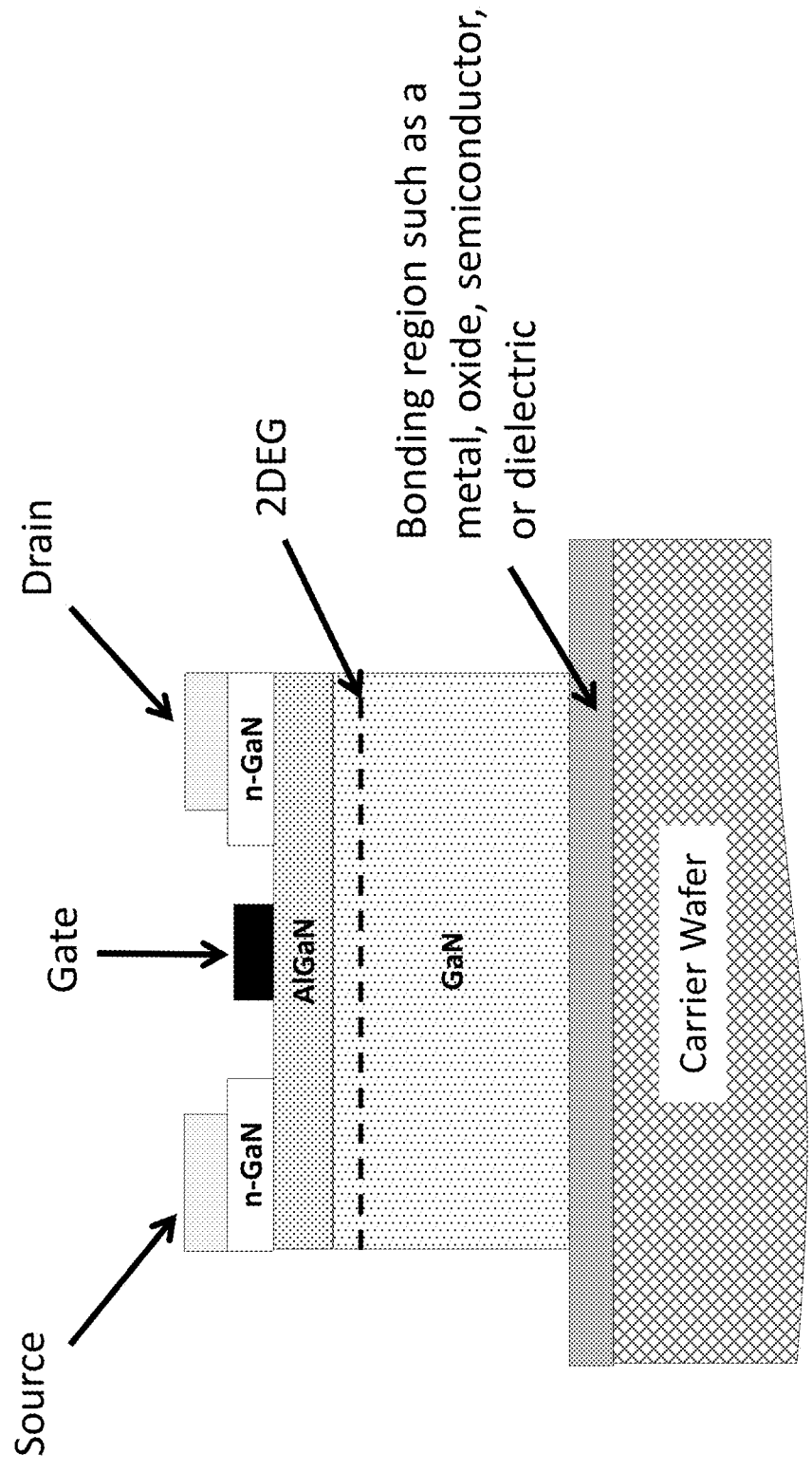
Figure 10K: Example of a HEMT device formed on carrier wafer from epitaxial stack shown in Figure 10I or 10J

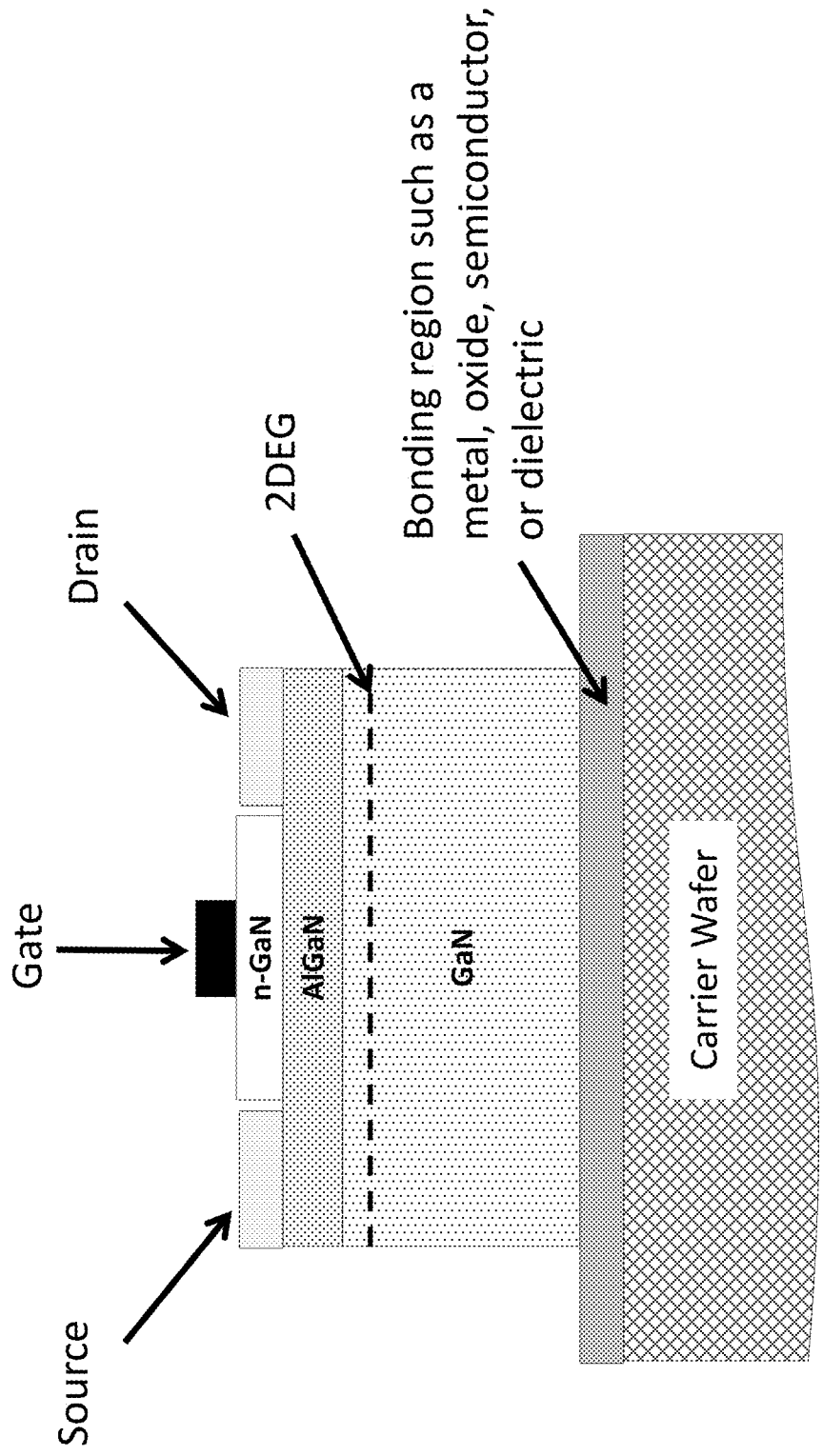
Figure 10L: Example of a HEMT device formed on carrier wafer from epitaxial stack shown in Figure 10I or 10J Figure 10M: Example of a HEMT device formed on carrier wafer from epitaxial stack shown in Figure 10I or 10J
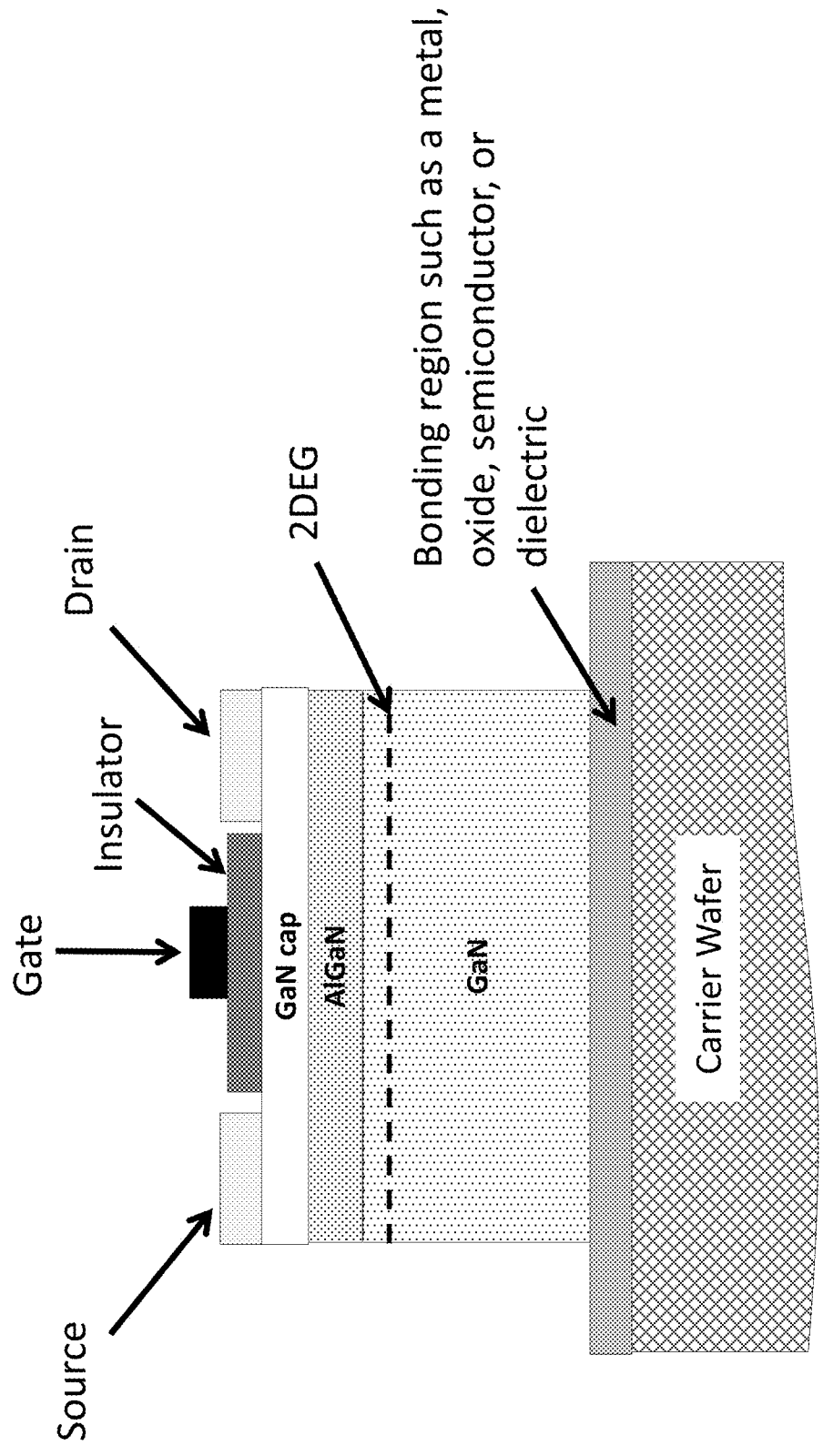

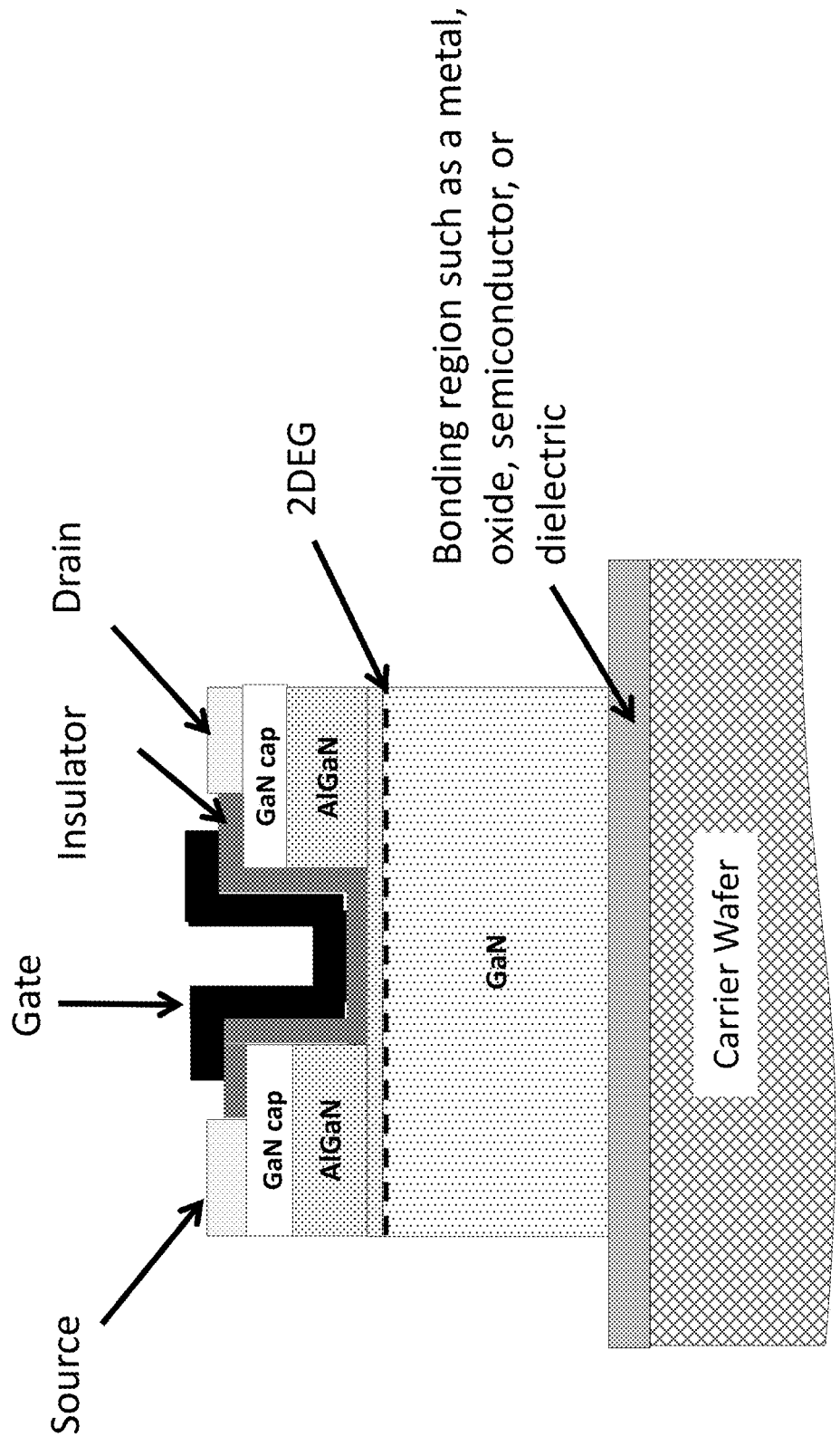
Figure 10N: Example of a recessed gate HEMT device formed on carrier wafer from epitaxial stack shown in Figure 10I or 10J

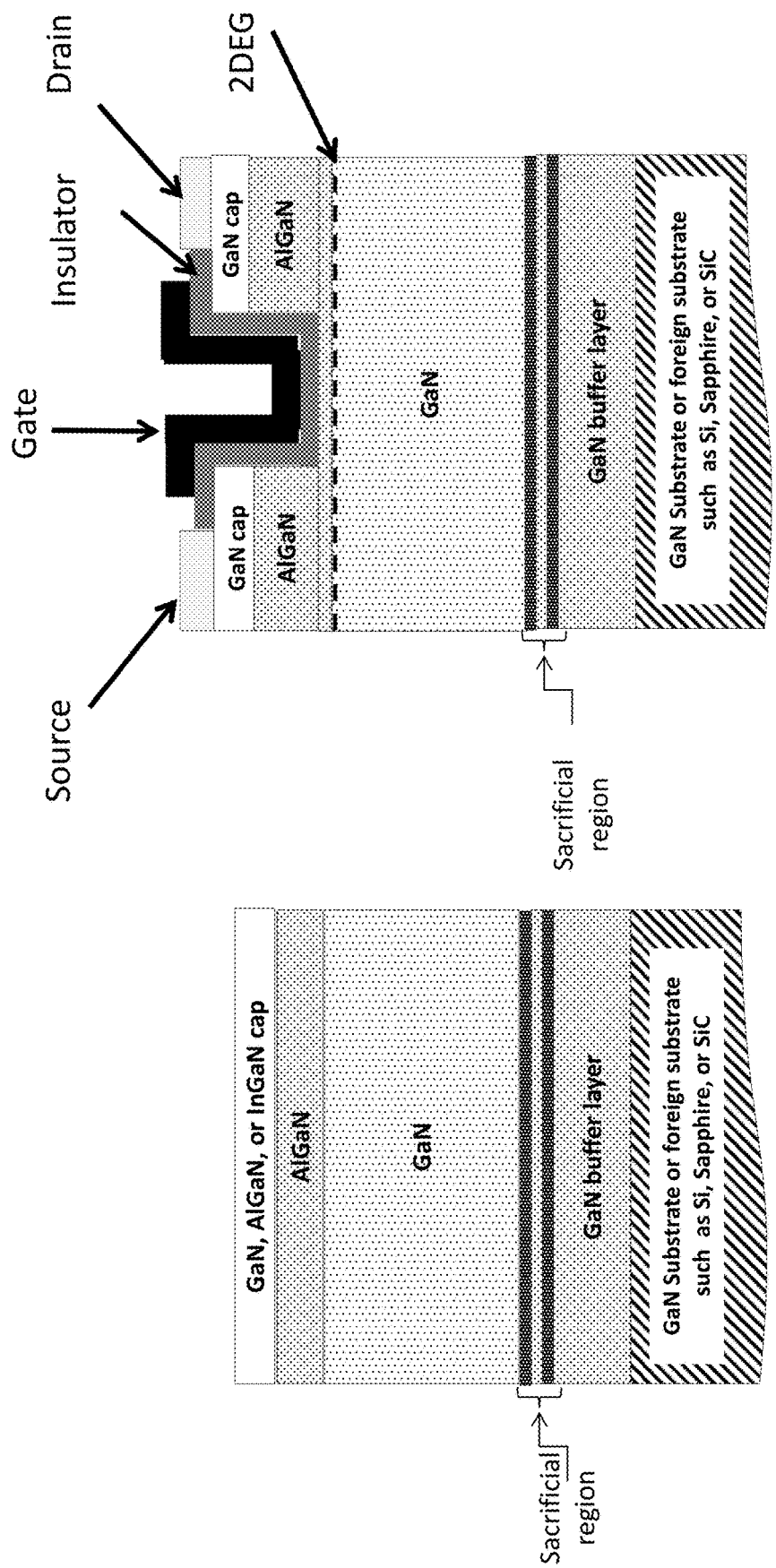
Figure 100: Example of epitaxial stack grown on bulk gallium and nitrogen containing or foreign substrate to form a HEMT device

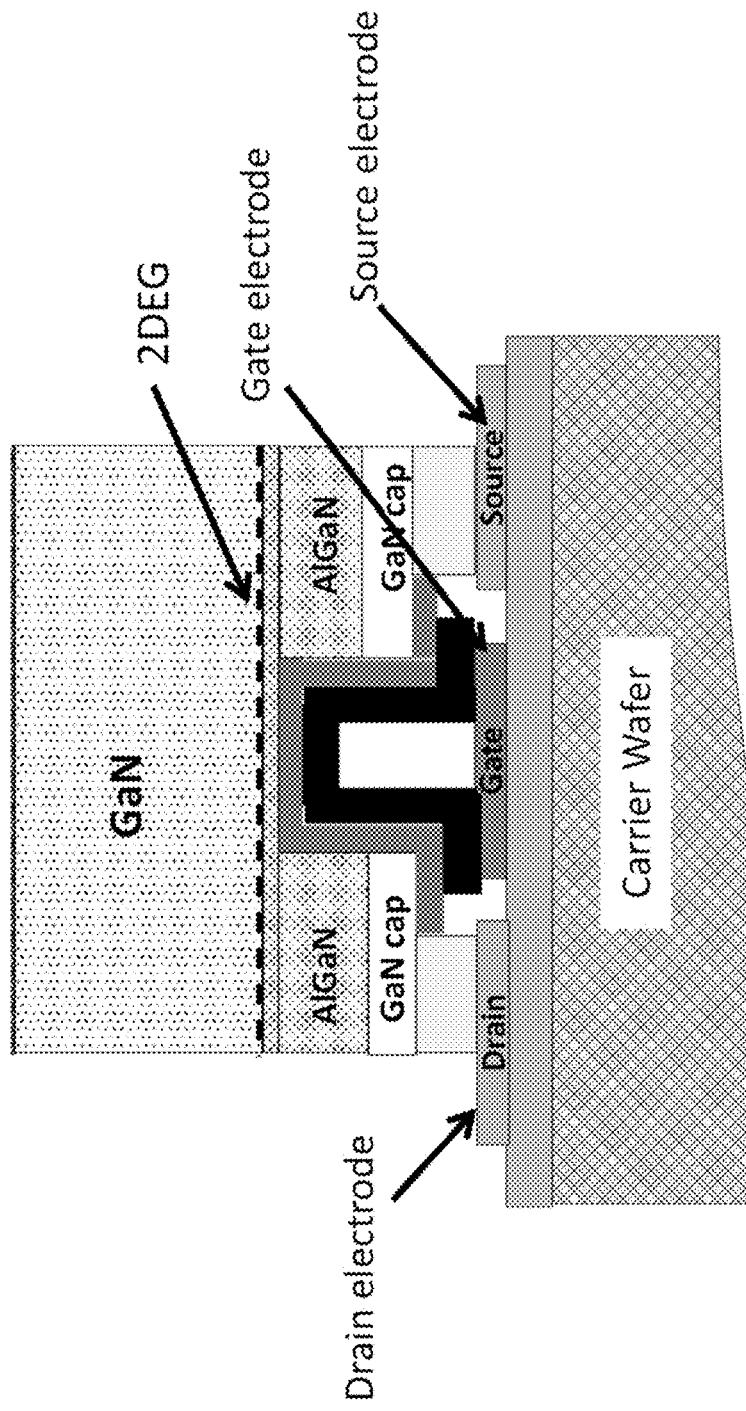
Figure 10P: Example of a HEMT device formed on carrier wafer from epitaxial stack and device process shown in Figure 10O

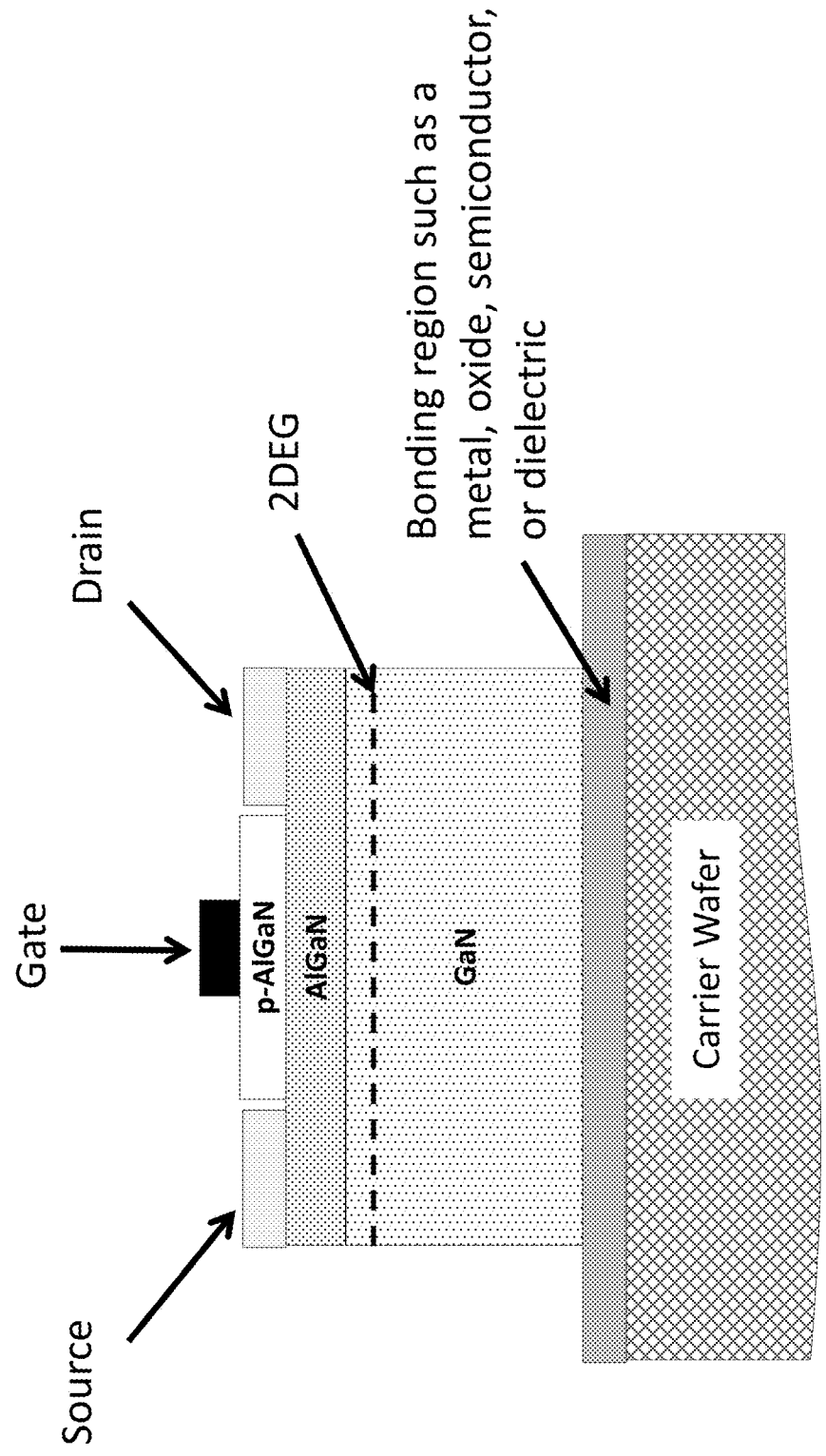
Figure 10Q: Example of a GIT device formed on carrier wafer from epitaxial stack shown in Figure 10I or 10J

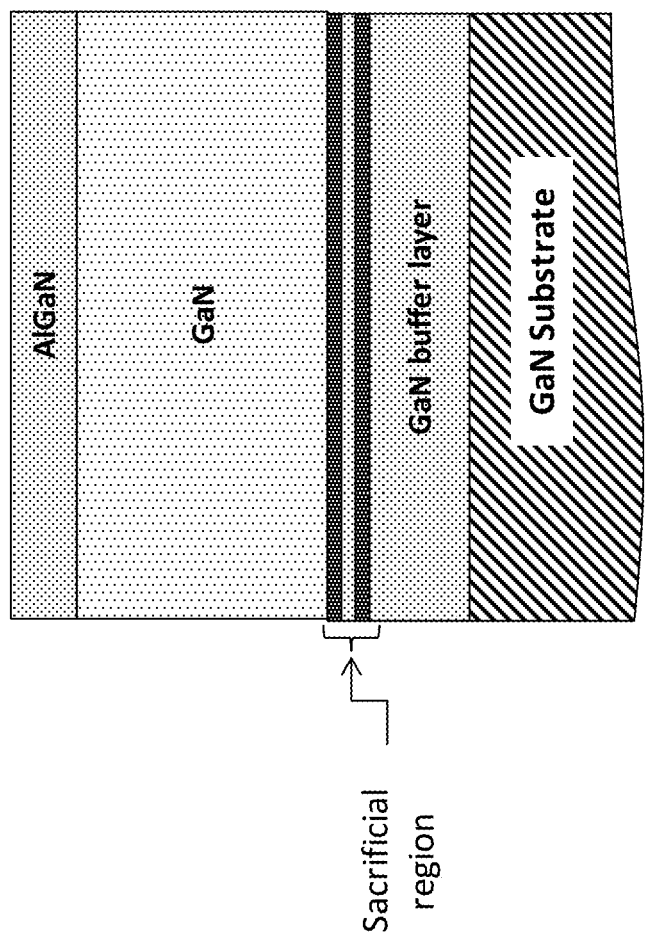
Figure 10R: Example of epitaxial stack grown on bulk gallium and nitrogen containing substrate to form a HEMT device

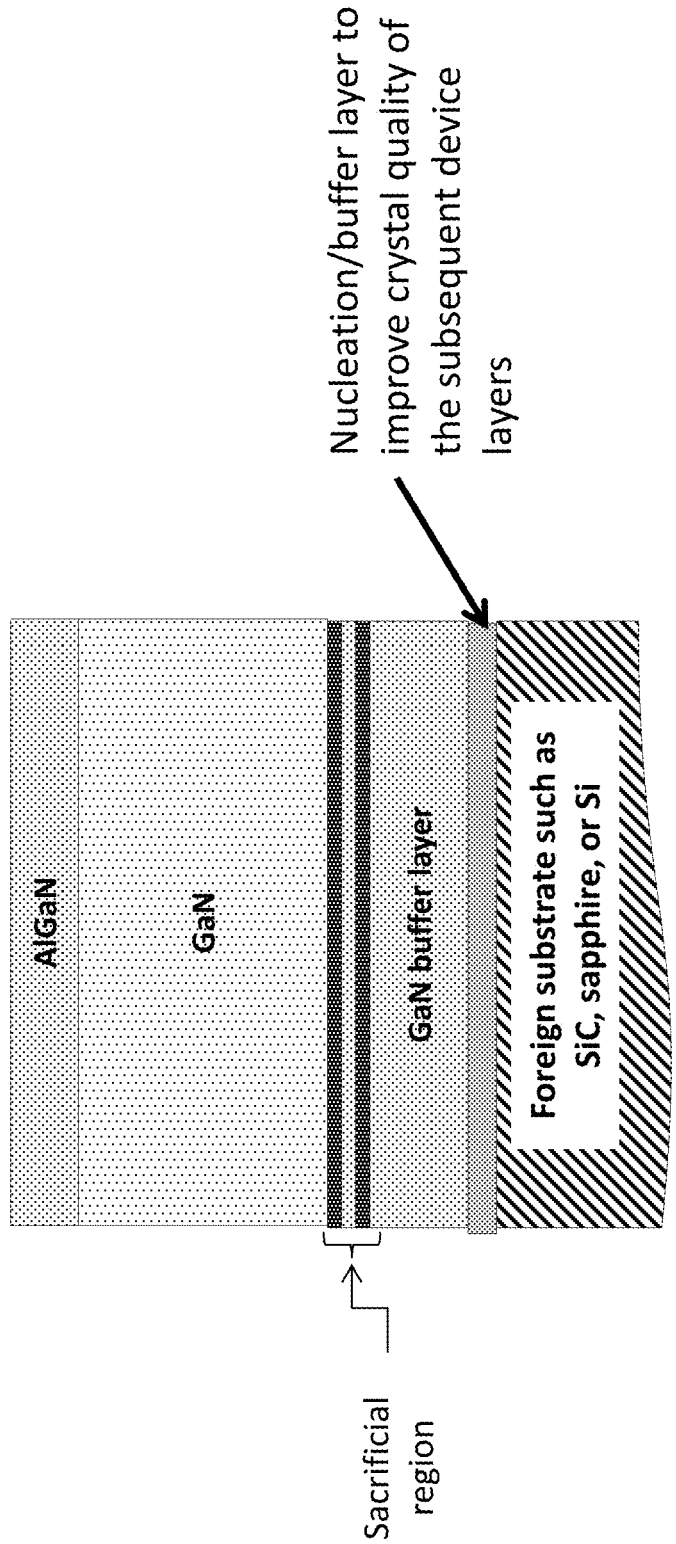
Figure 10S: Example of epitaxial stack grown on a foreign substrate to form a HEMT device

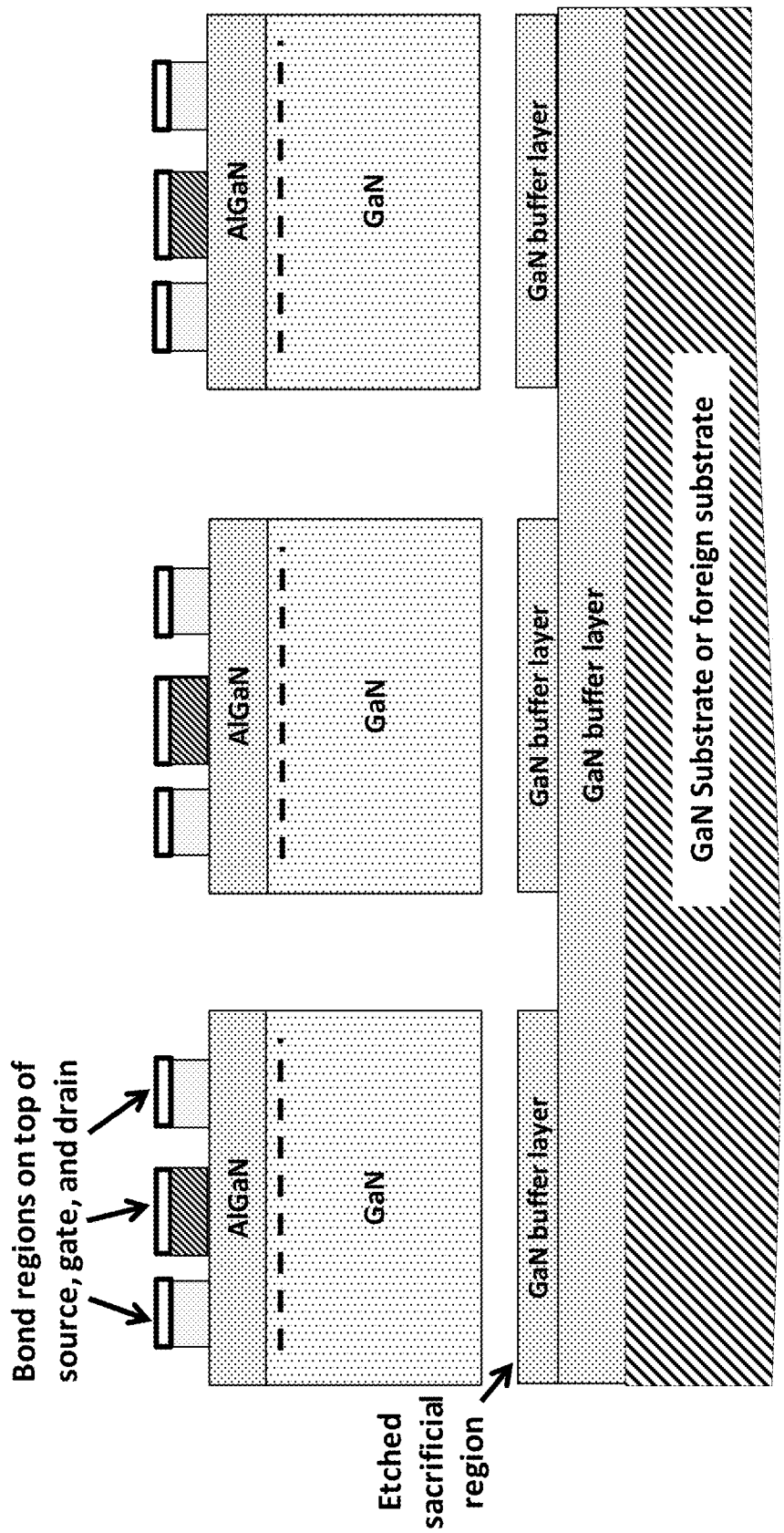
Figure 10T: Example of HEMT devices formed on a GaN substrate and prepared for transfer

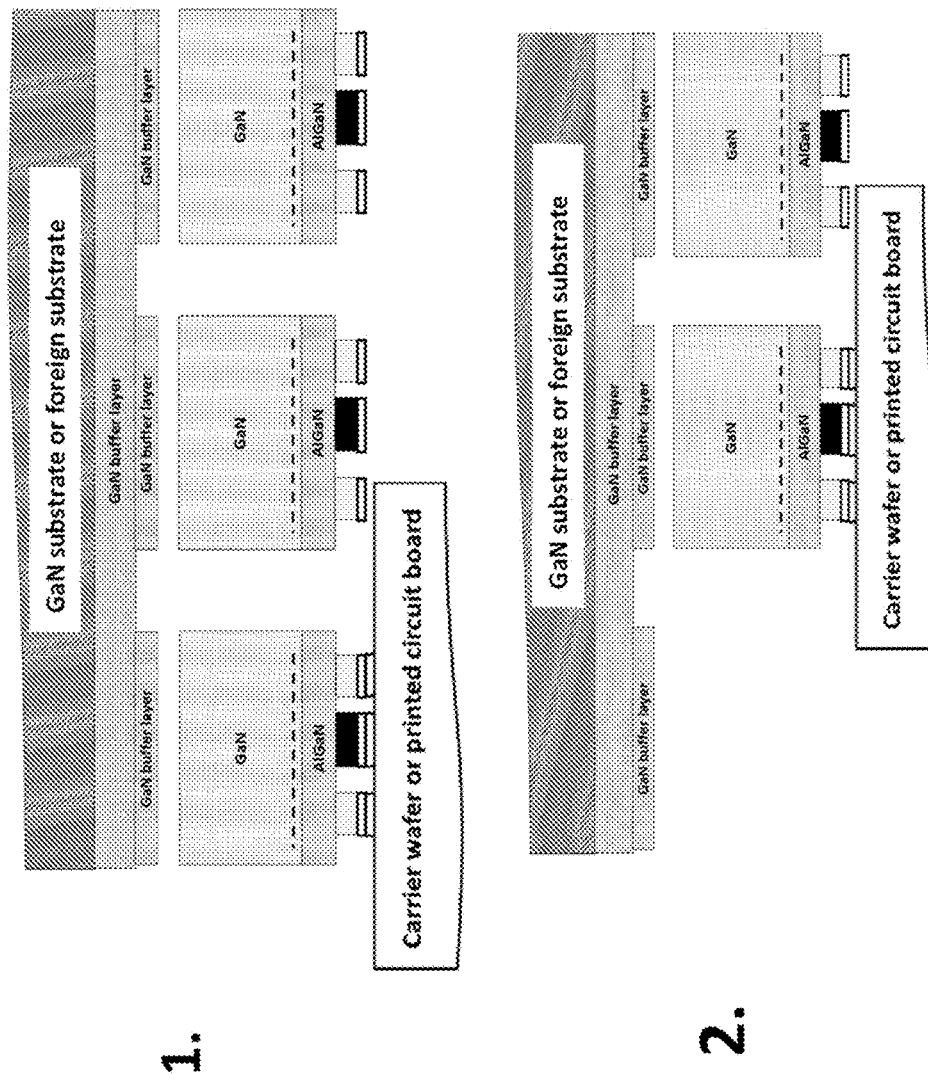
Figure 10U: Example of HEMT devices selectively transferred from a GaN substrate or a foreign substrate to a carrier wafer or printed circuit

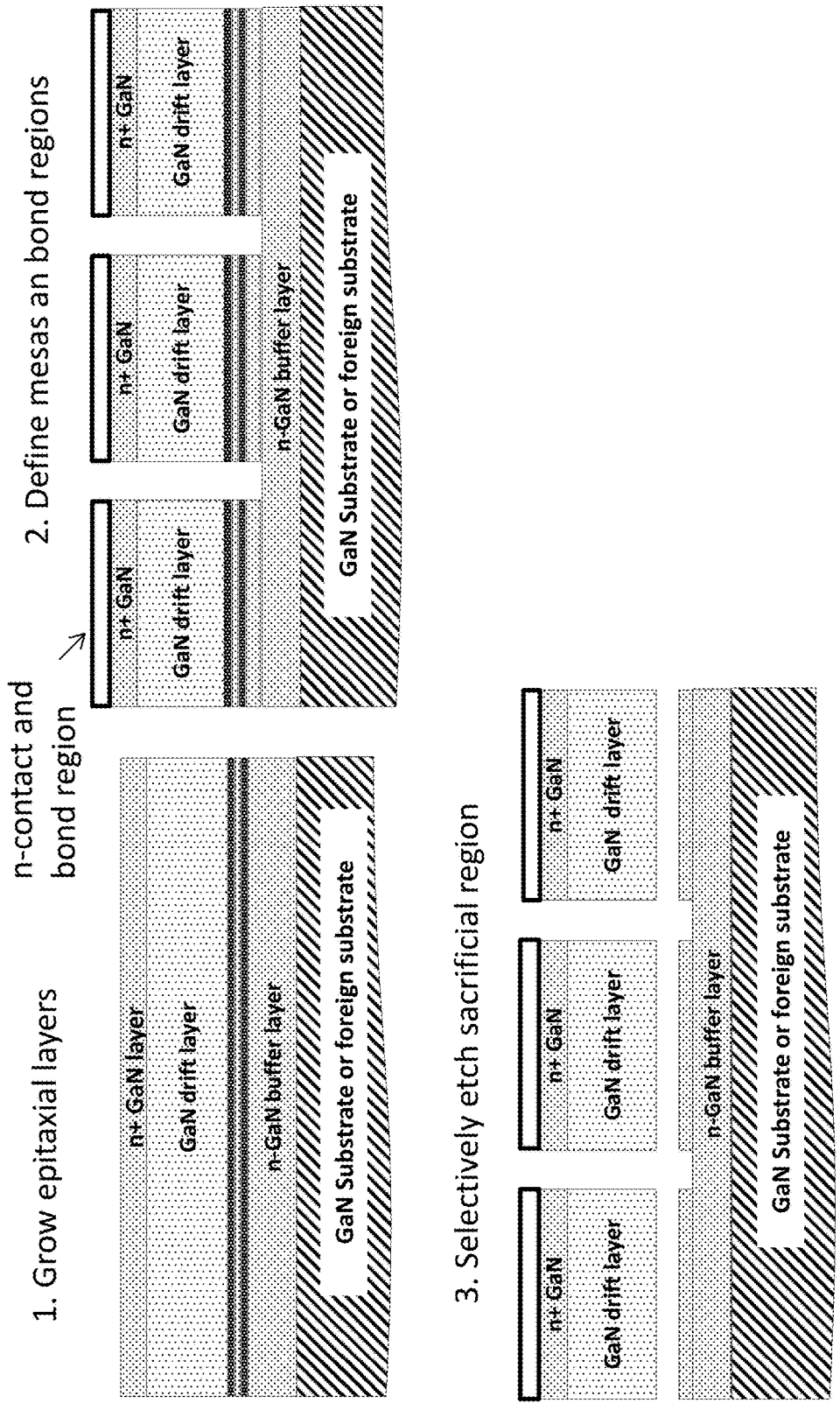
Figure 11A: Example of preparation of Schottky diode epitaxial device layers for die expanded transfer

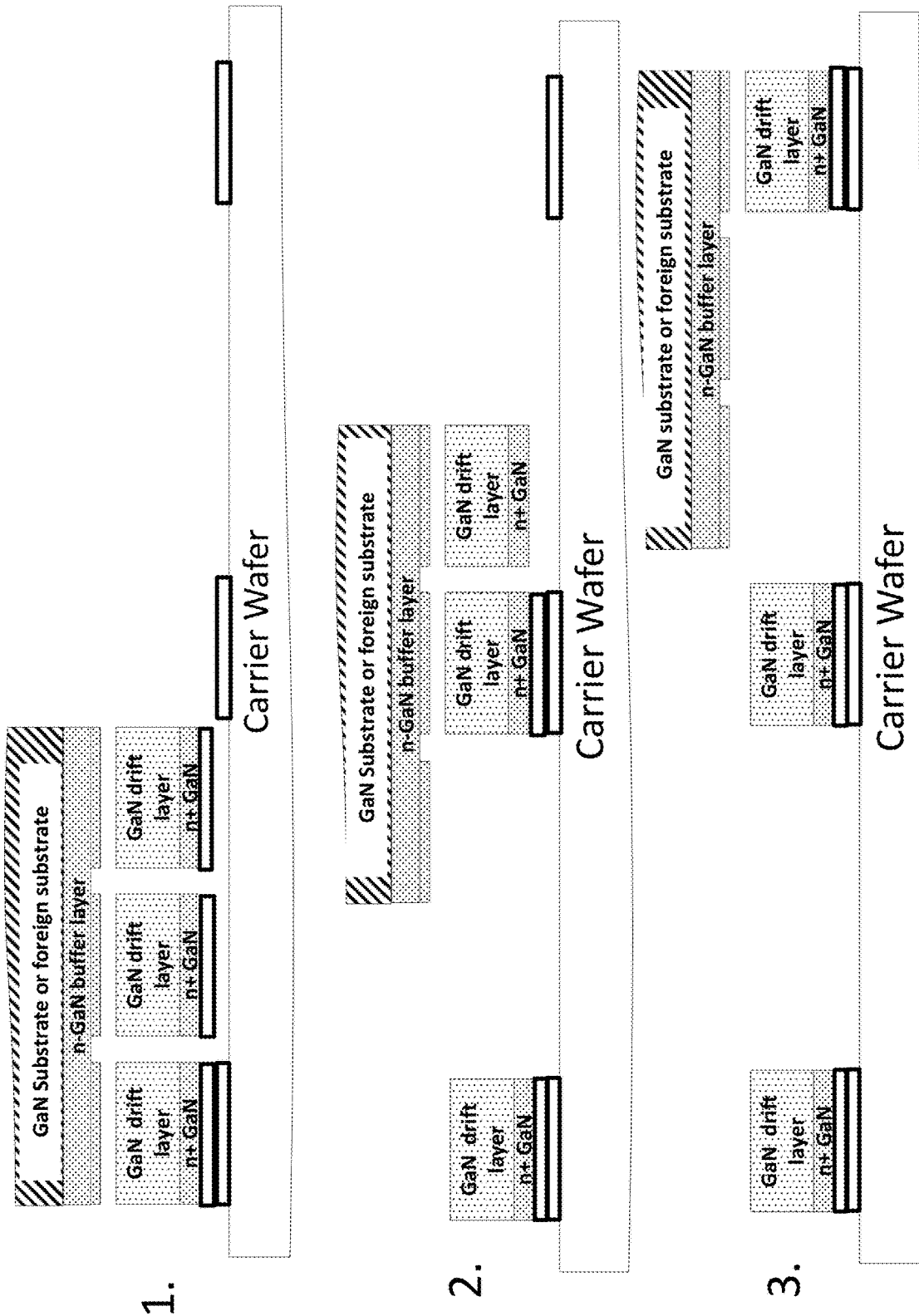
Figure 11B: Example of selective bonding for die expansion of Schottky diode devices

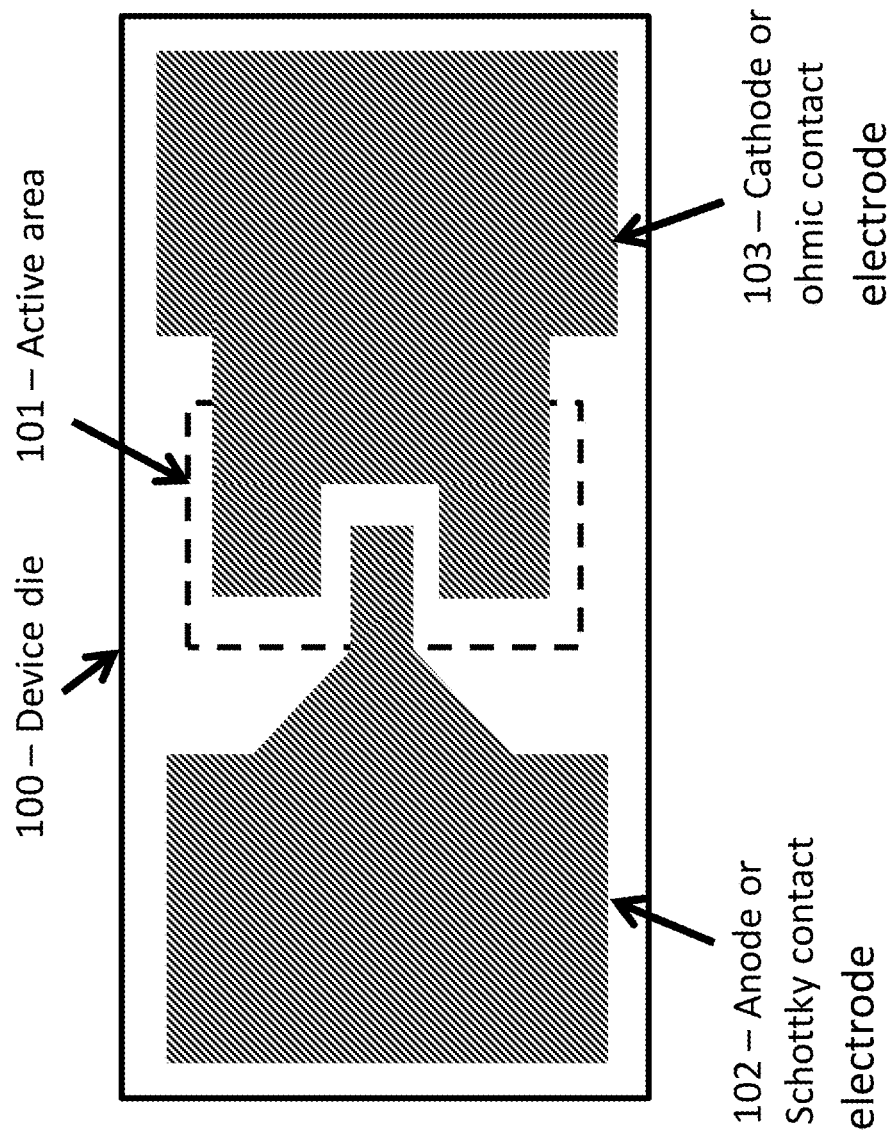
Figure 11C: Example top-view schematic of conventional Shottky diode device

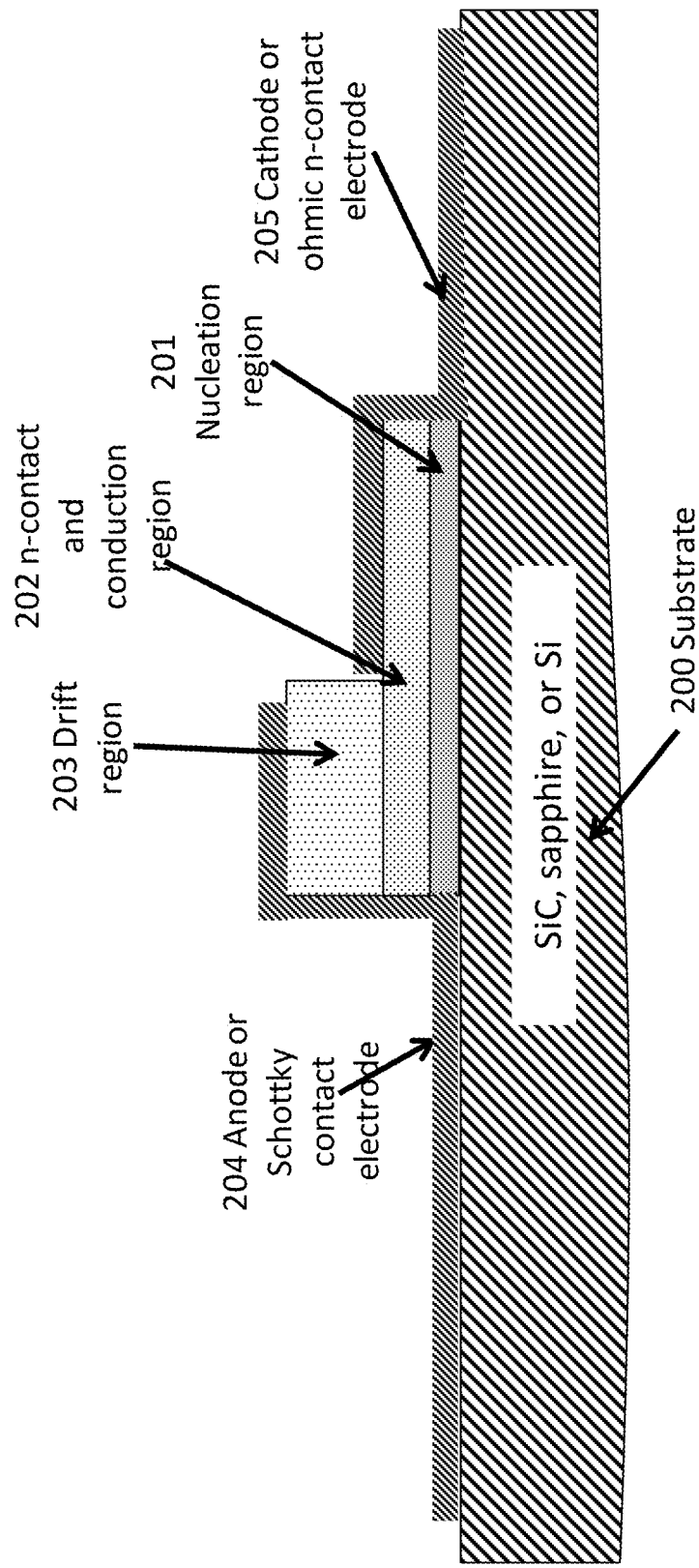
Figure 11D: Example cross-sectional view of a conventional Schottky diode device

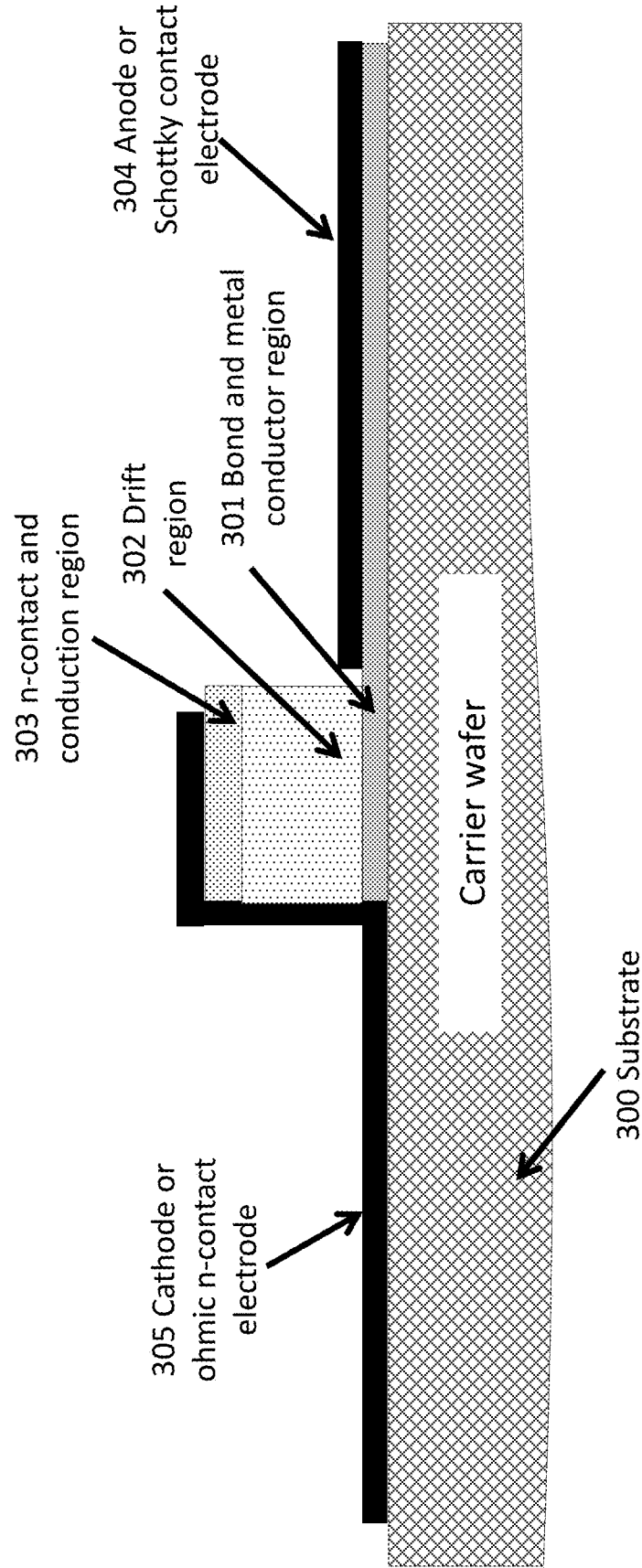
Figure 11E: Example cross-sectional view of Schottky diode device according to an embodiment

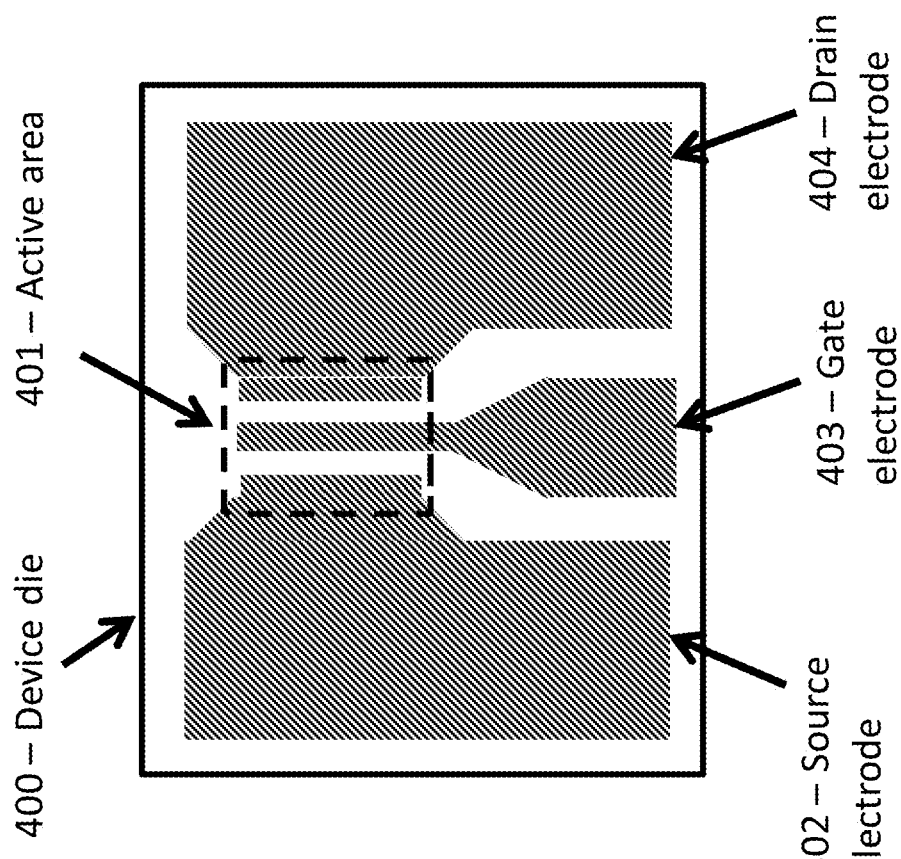
Figure 11F: Example top-view schematic of conventional HEMT device

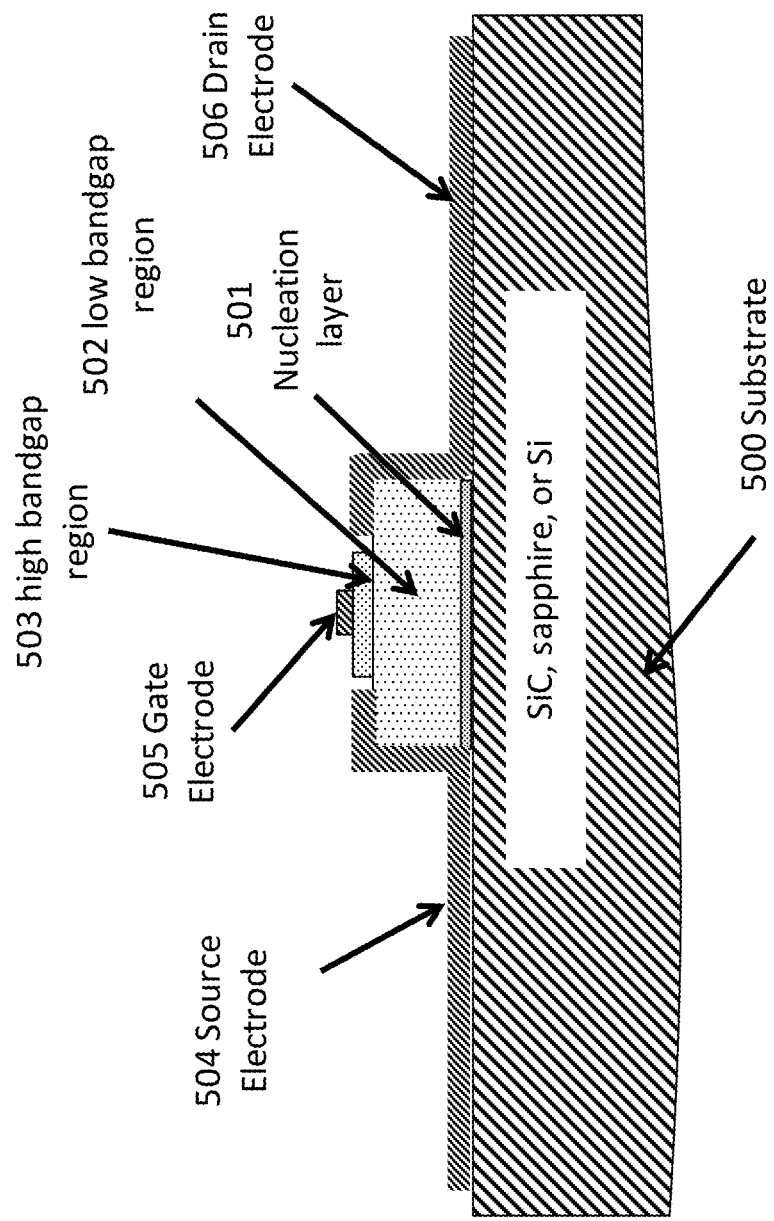
Figure 11G: Example cross-sectional view of a conventional HEMT device

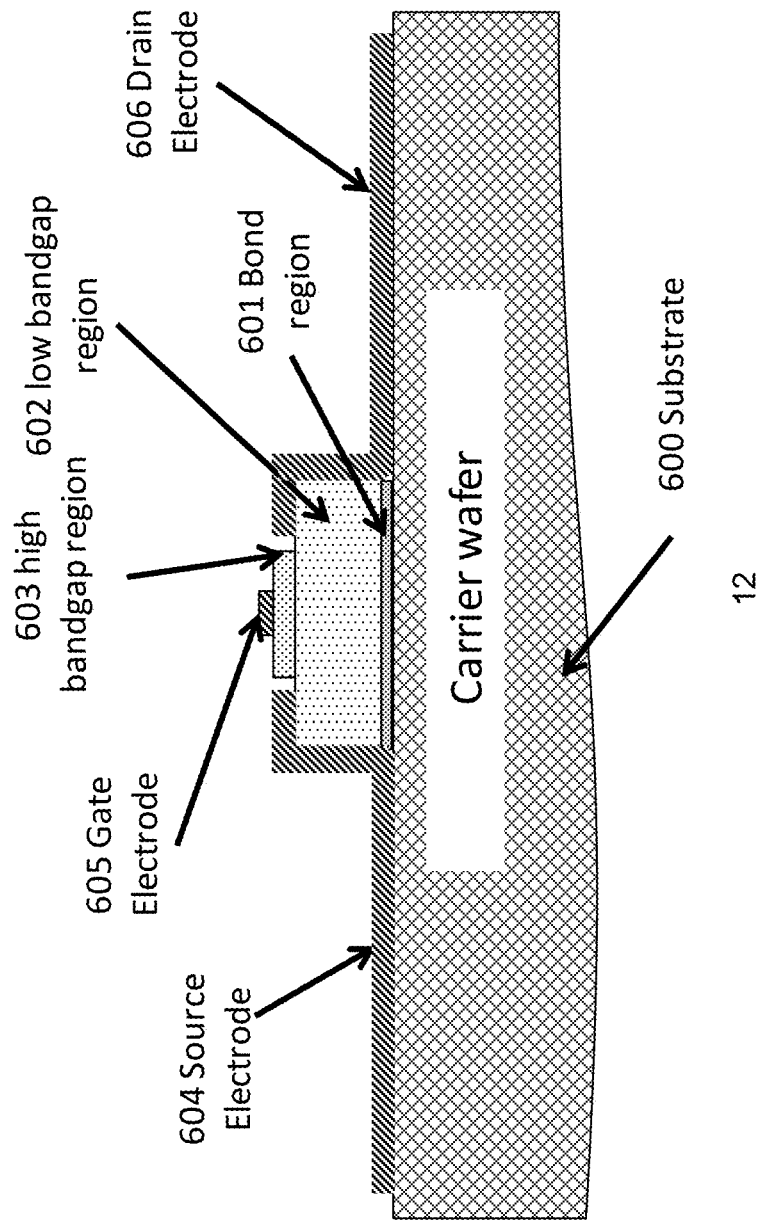
Figure 11H: Example cross-sectional view of HEMT device according to an embodiment

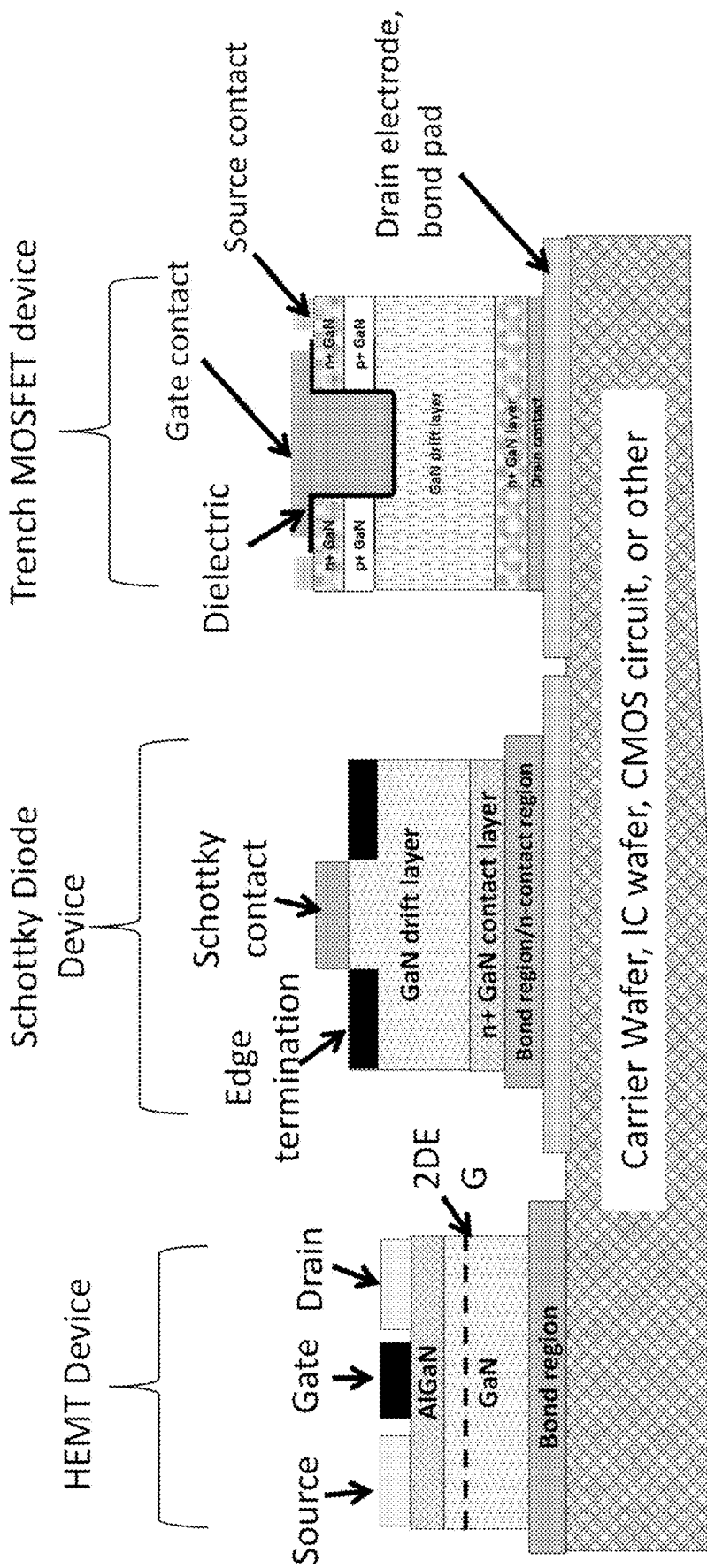
Figure 12A: Example of multiple different electronic device integration on the carrier wafer according to an embodiment

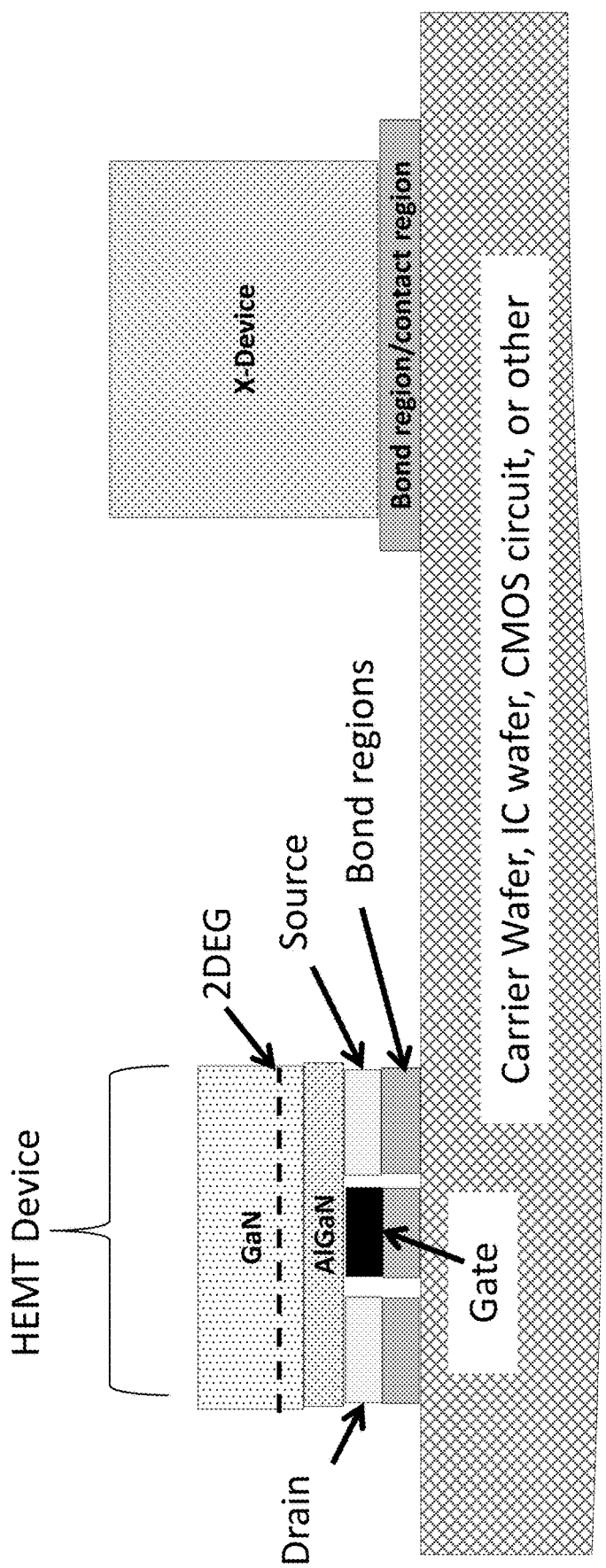
Figure 12B: Example of integrated circuit device including GaN electronic device and X-device, which could be any kind of device

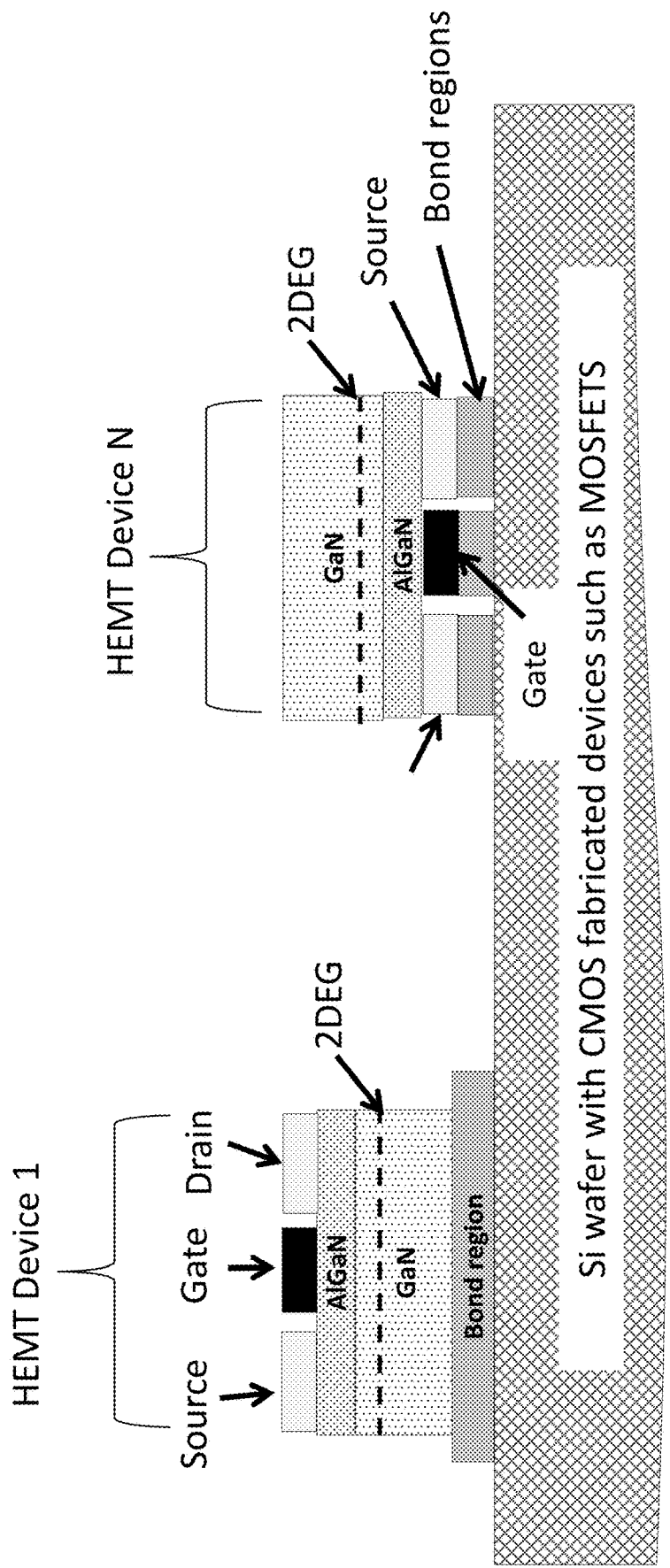
Figure 12C: Example of device integration on the carrier wafer according to an embodiment

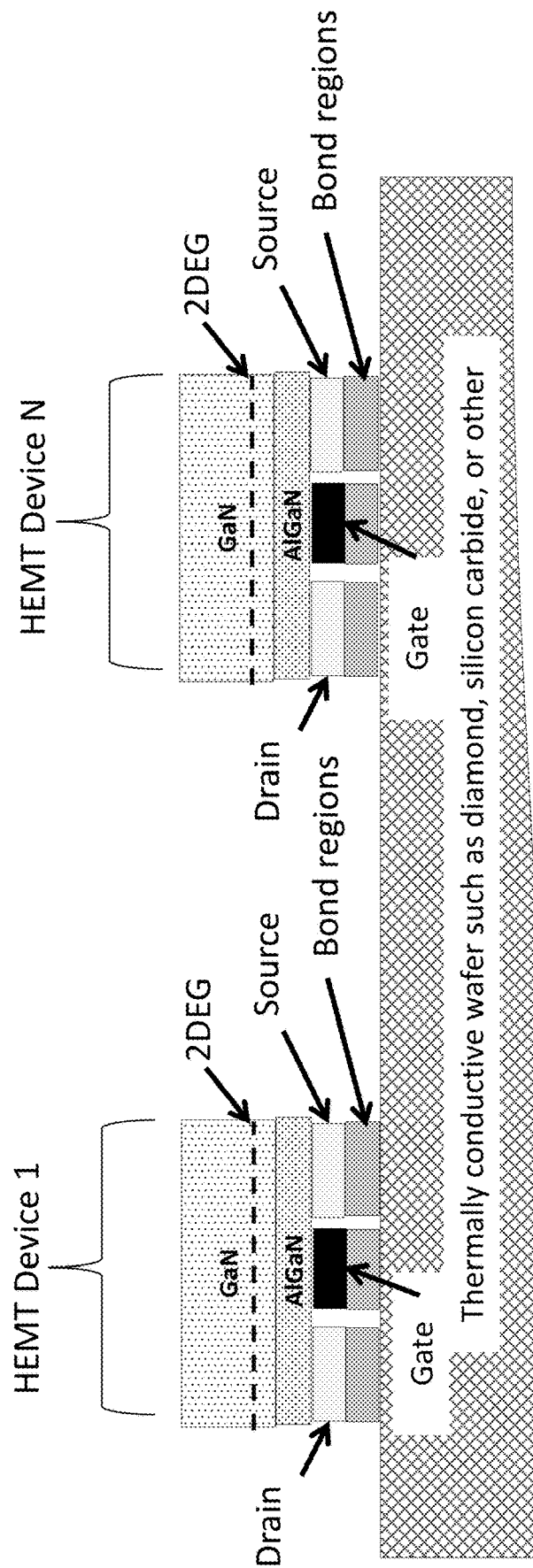
Figure 12D: Example of electronic devices integrated onto high thermal conductivity substrates

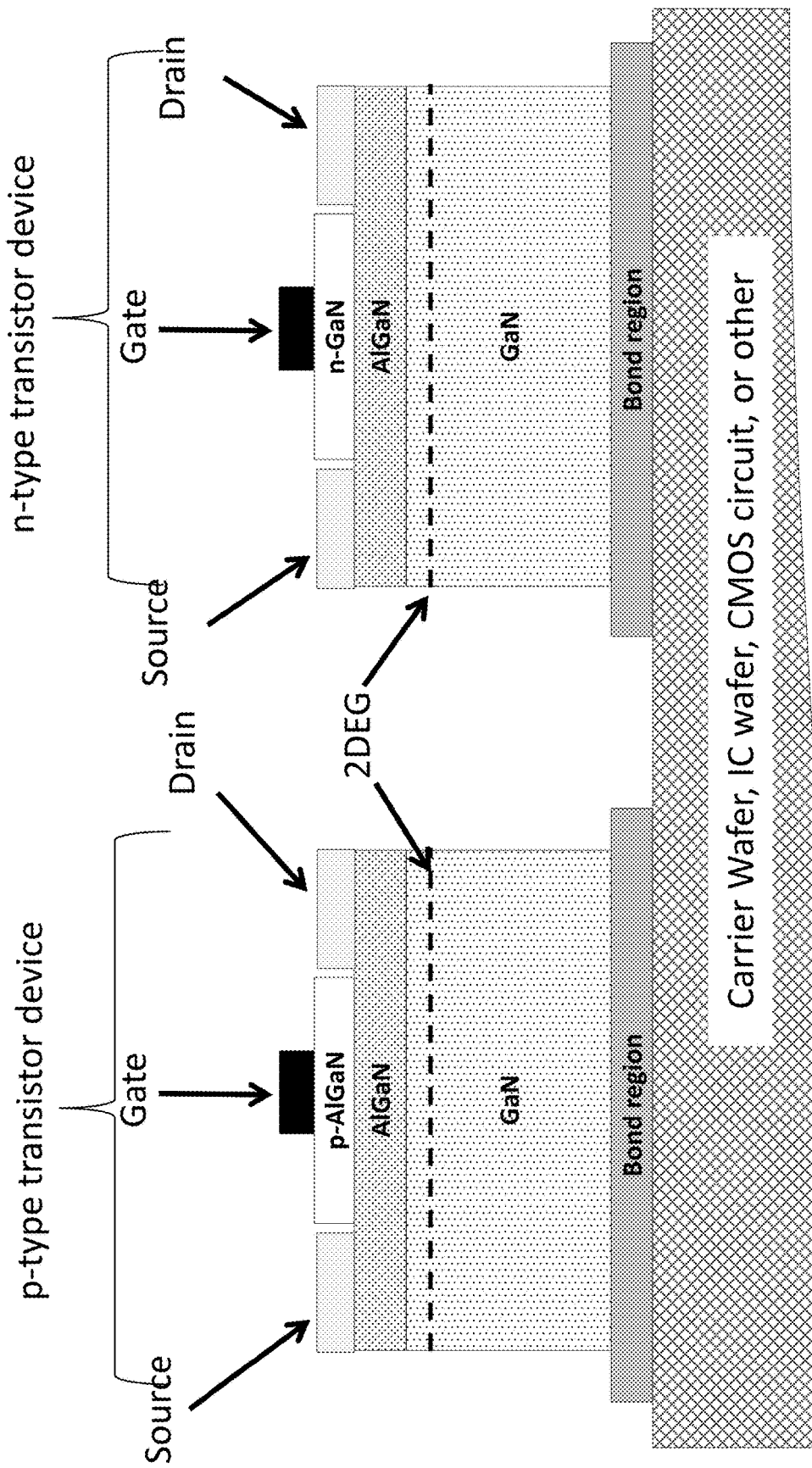
Figure 12E: Example of device integration on the carrier wafer according to an embodiment

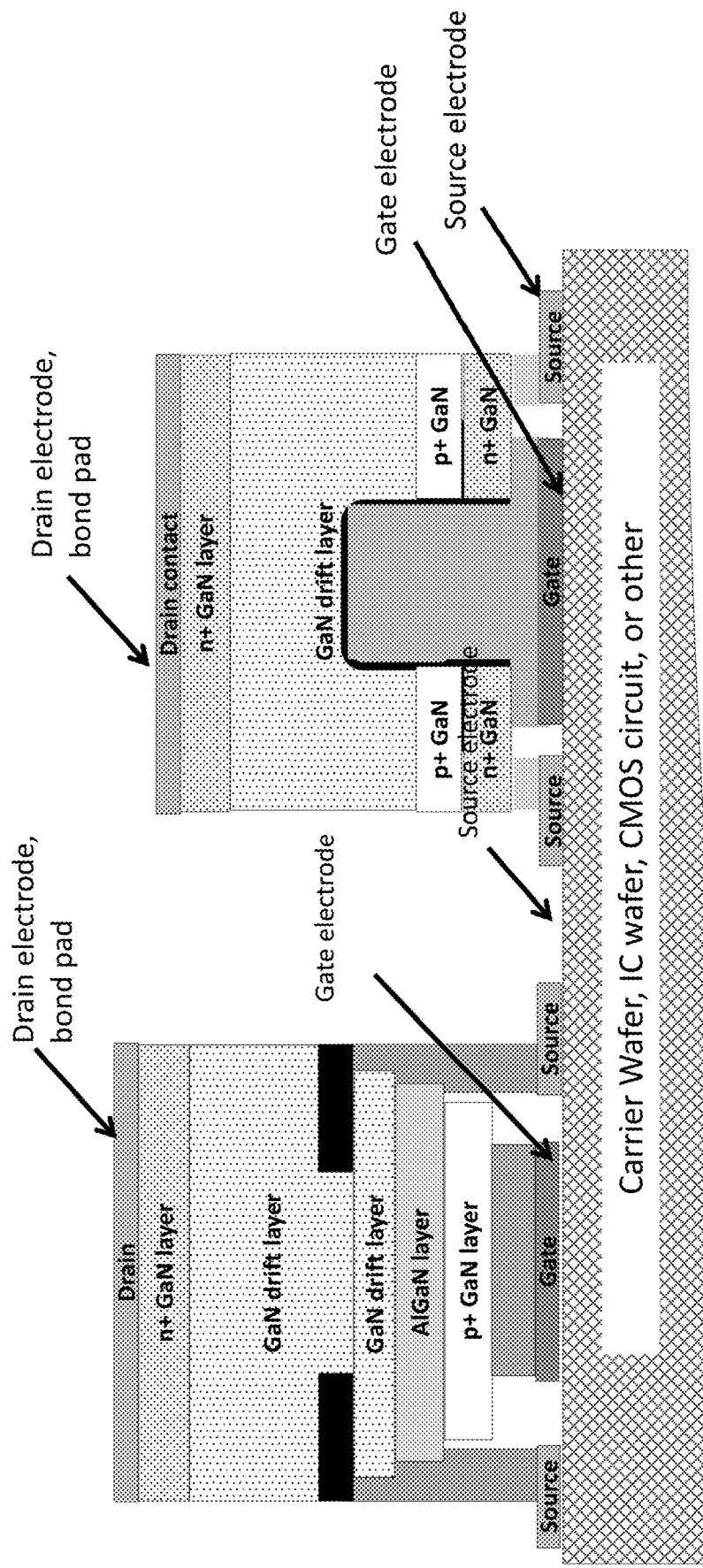
Figure 12F: Example of integrating a normally on CAVET device with a normally off trench MOSFET device

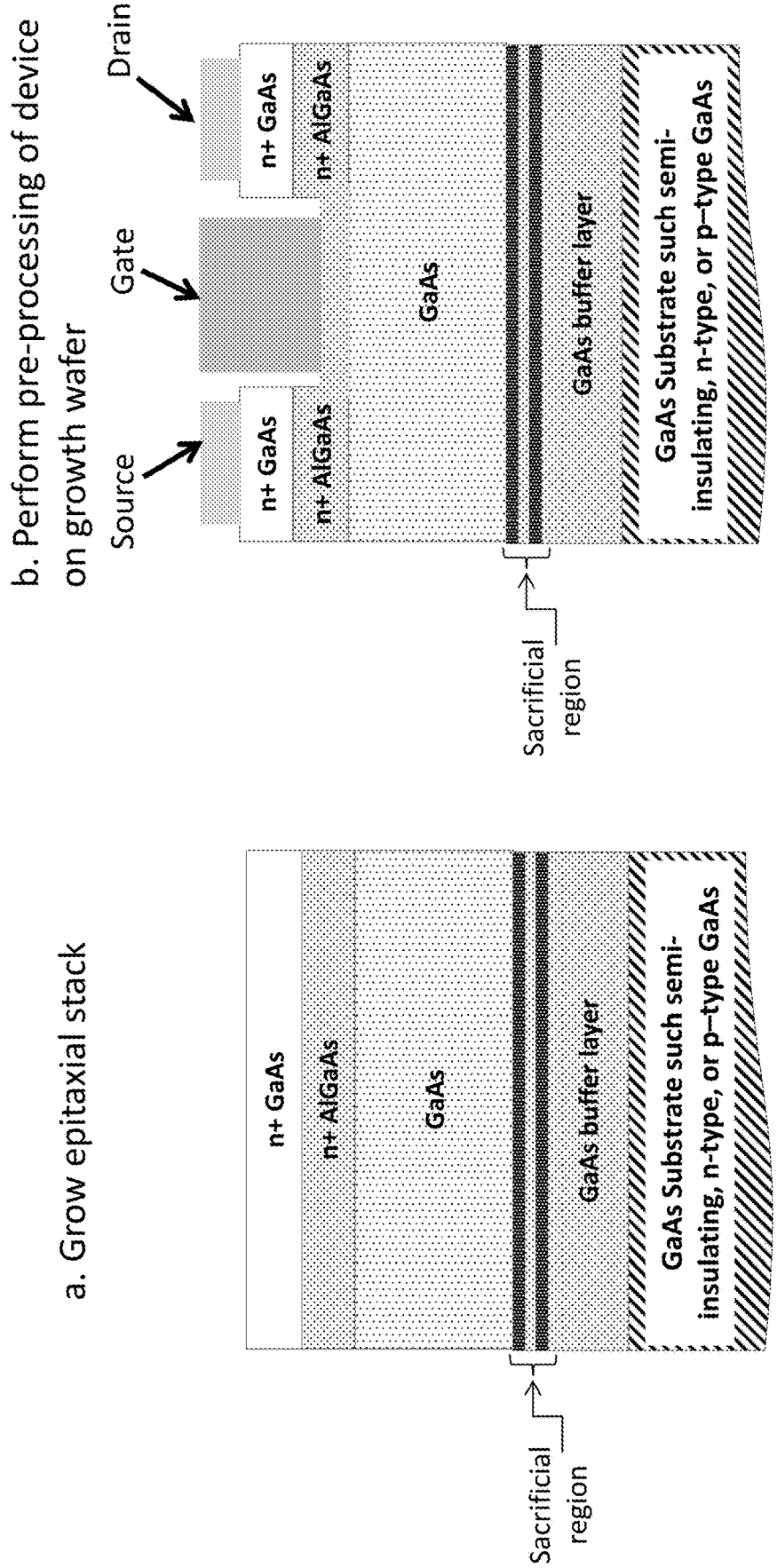
Figure 12G: Example epitaxial structure and formation of a GaAs electronic device

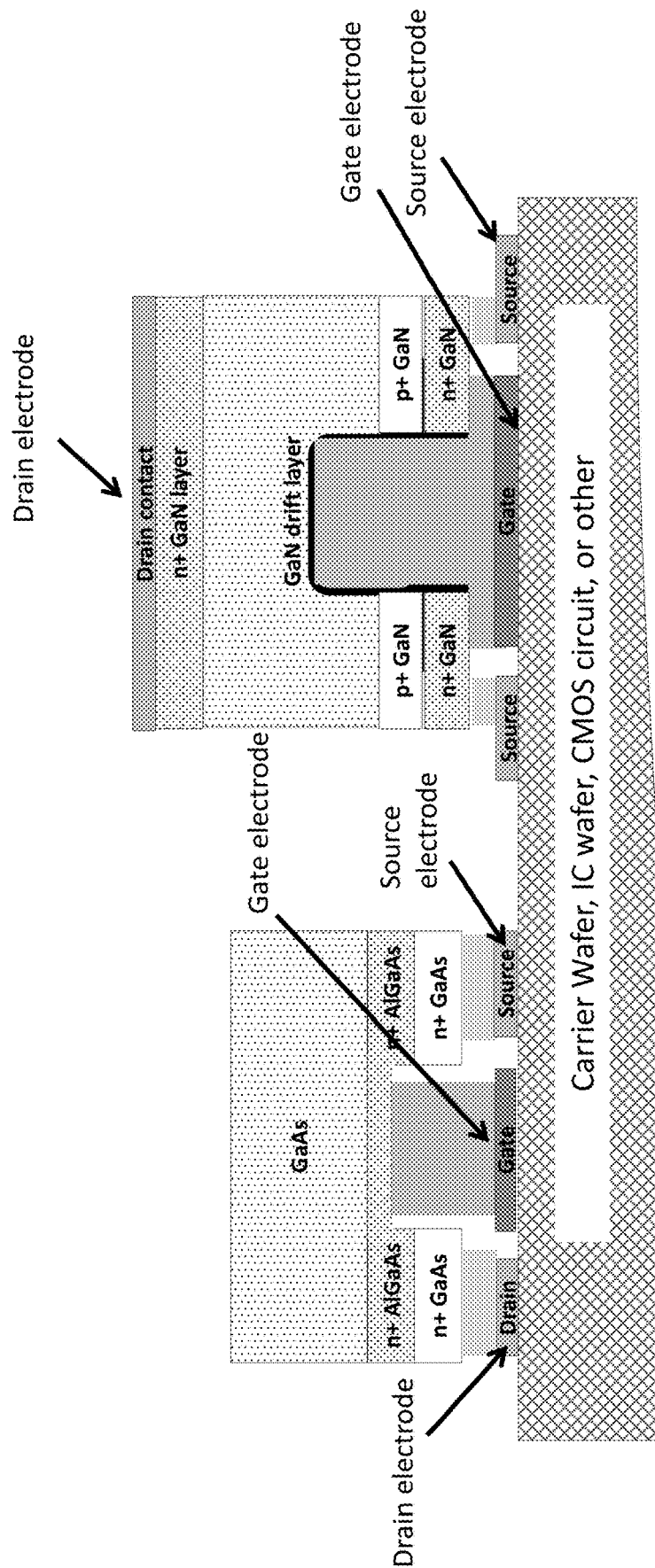
Figure 12H: Example of integrating a GaAs HEMT device with a normally off trench MOSFET device

Figure 13A: Example of integrated circuit formed with transferred GaN devices

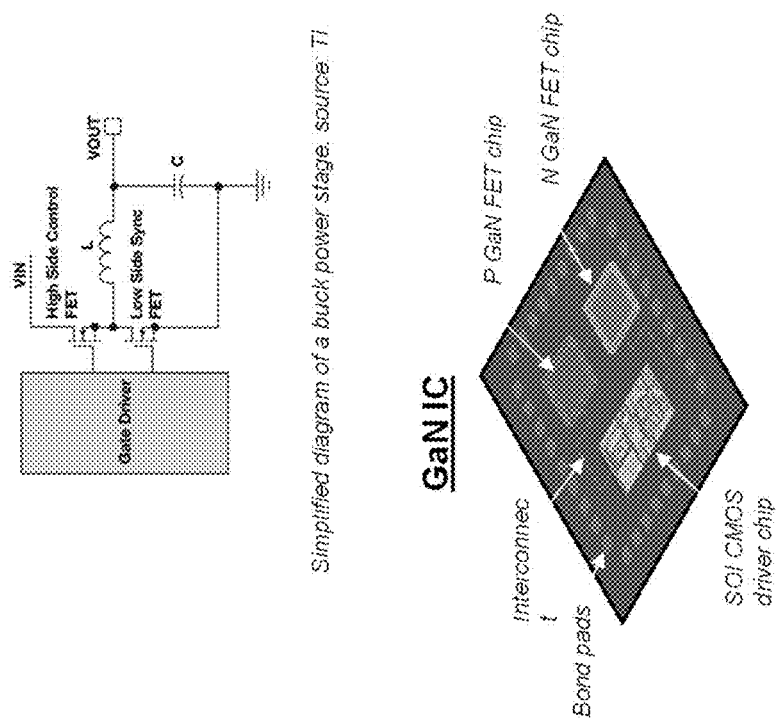

GaN IC Example

- Integrate GaN power transistors with a SOI CMOS driver chip onto an inexpensive package substrate (Si, glass, ceramic, etc)
- Can enable a a very small, very thin integrated voltage regulator (ex. buck converter).
- Leverage the transfer process to simultaneously bond and generate interconnects.
- The interconnection distance between transistors and gate driver is very short which significantly reduces parasitic and switching loss.
- Reduces electrical and thermal resistance to support high current density
- Interconnects and passives (inductors, capacitors, etc) are fabricated on the package substrate→ do not take up real estate on the expensive III-V substrate

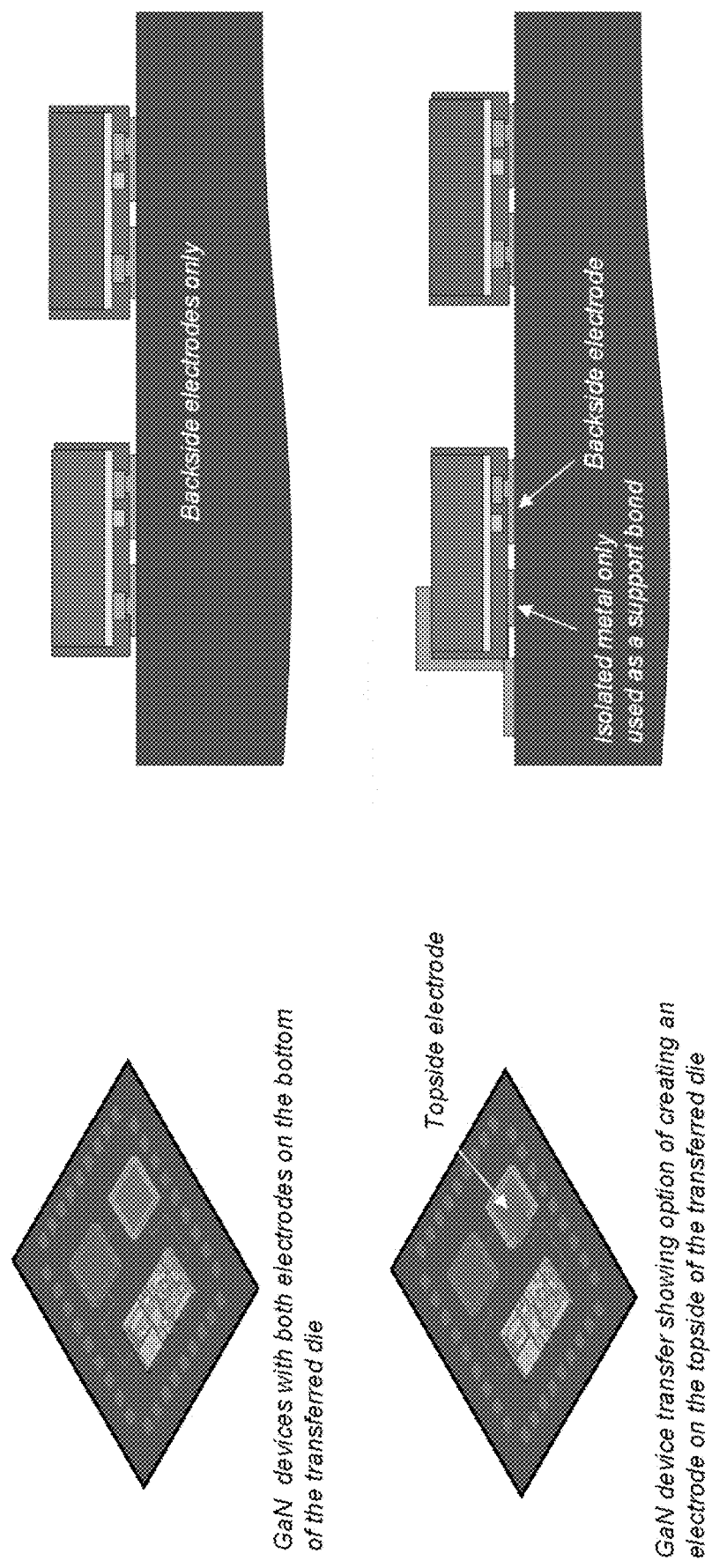
Figure 13B: Example of integrated circuit formed with transferred GaN devices having alternative contact

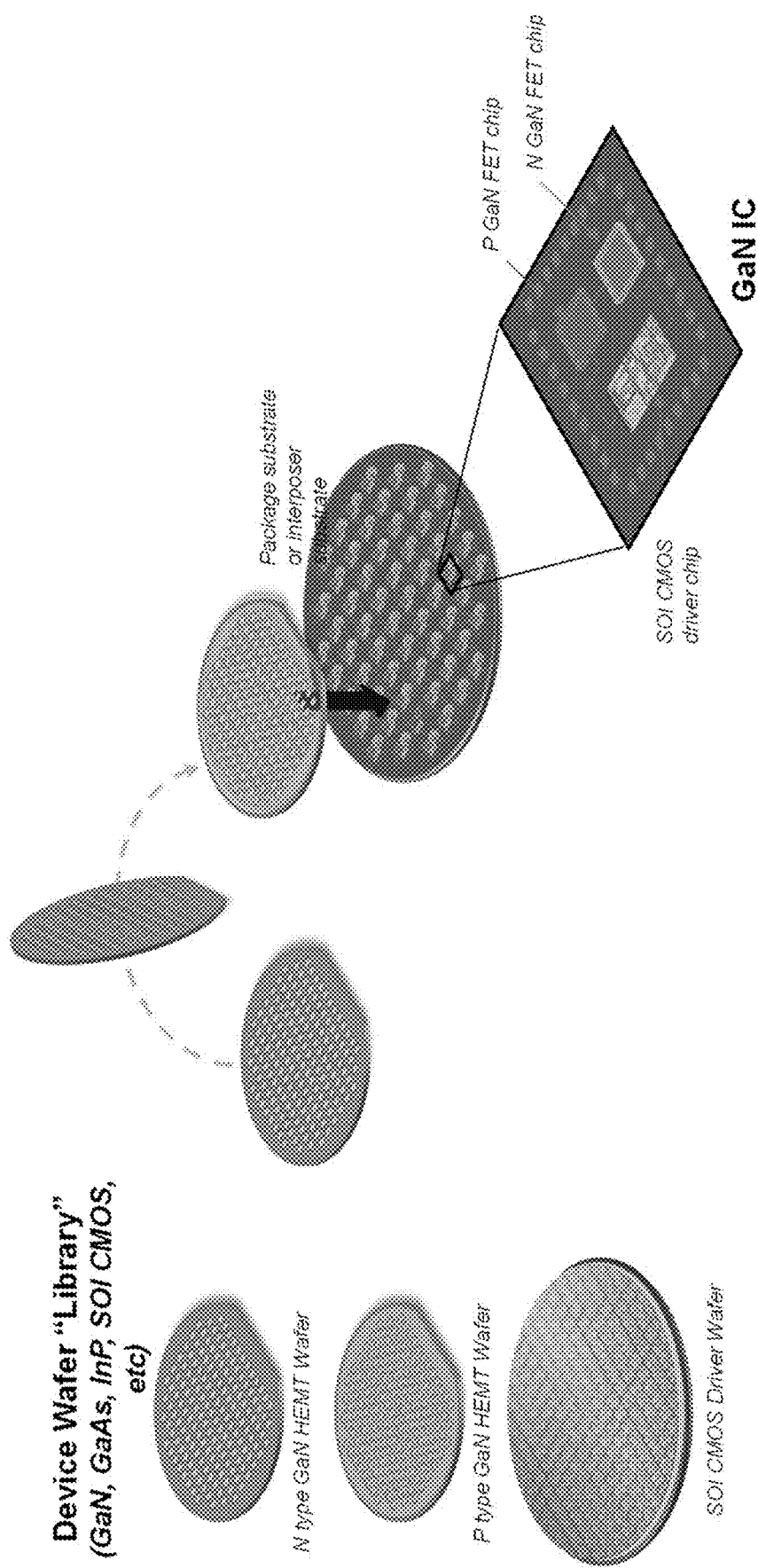
Figure 13C: GaN IC with Direct Bonding Approach

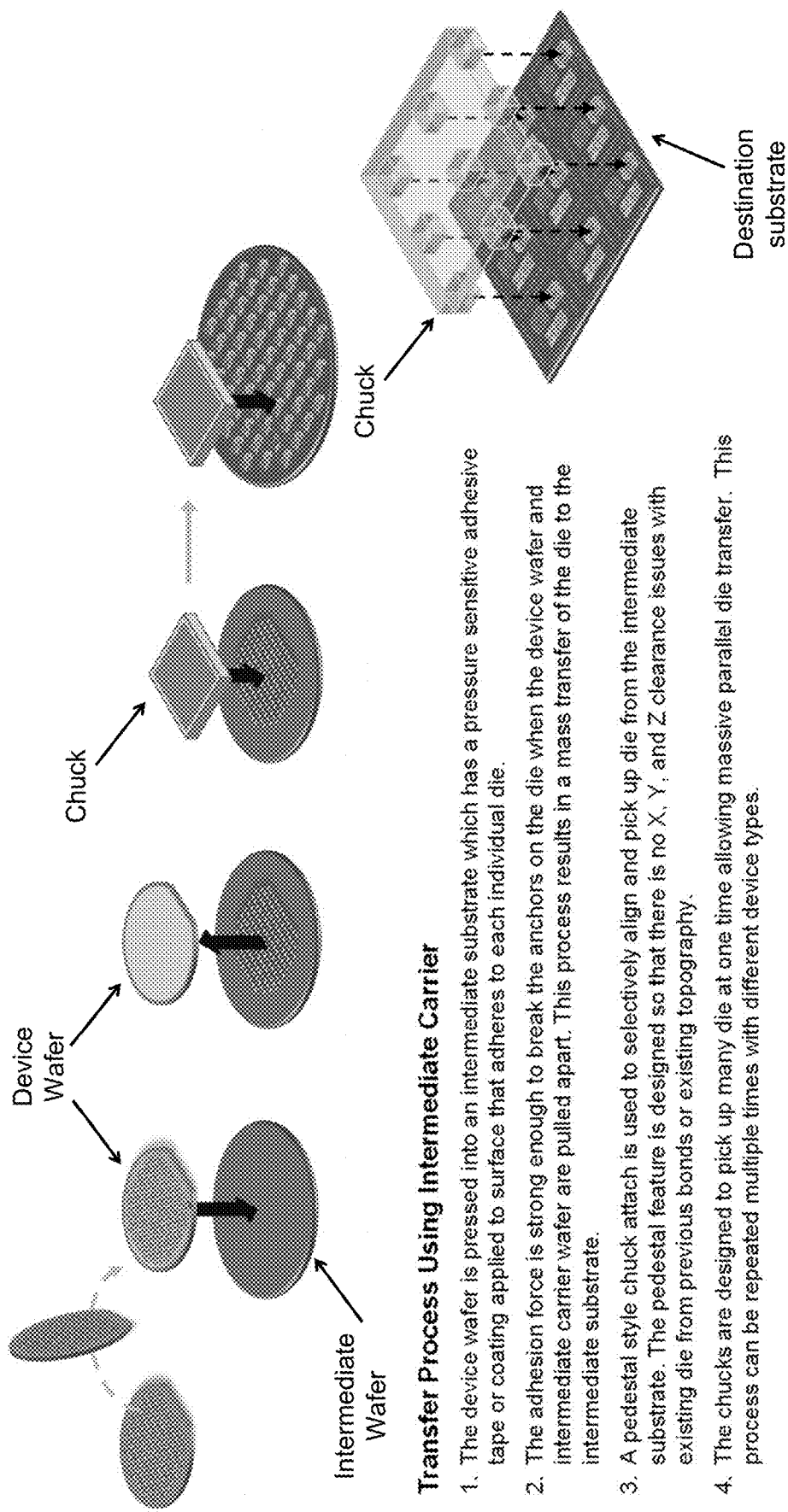

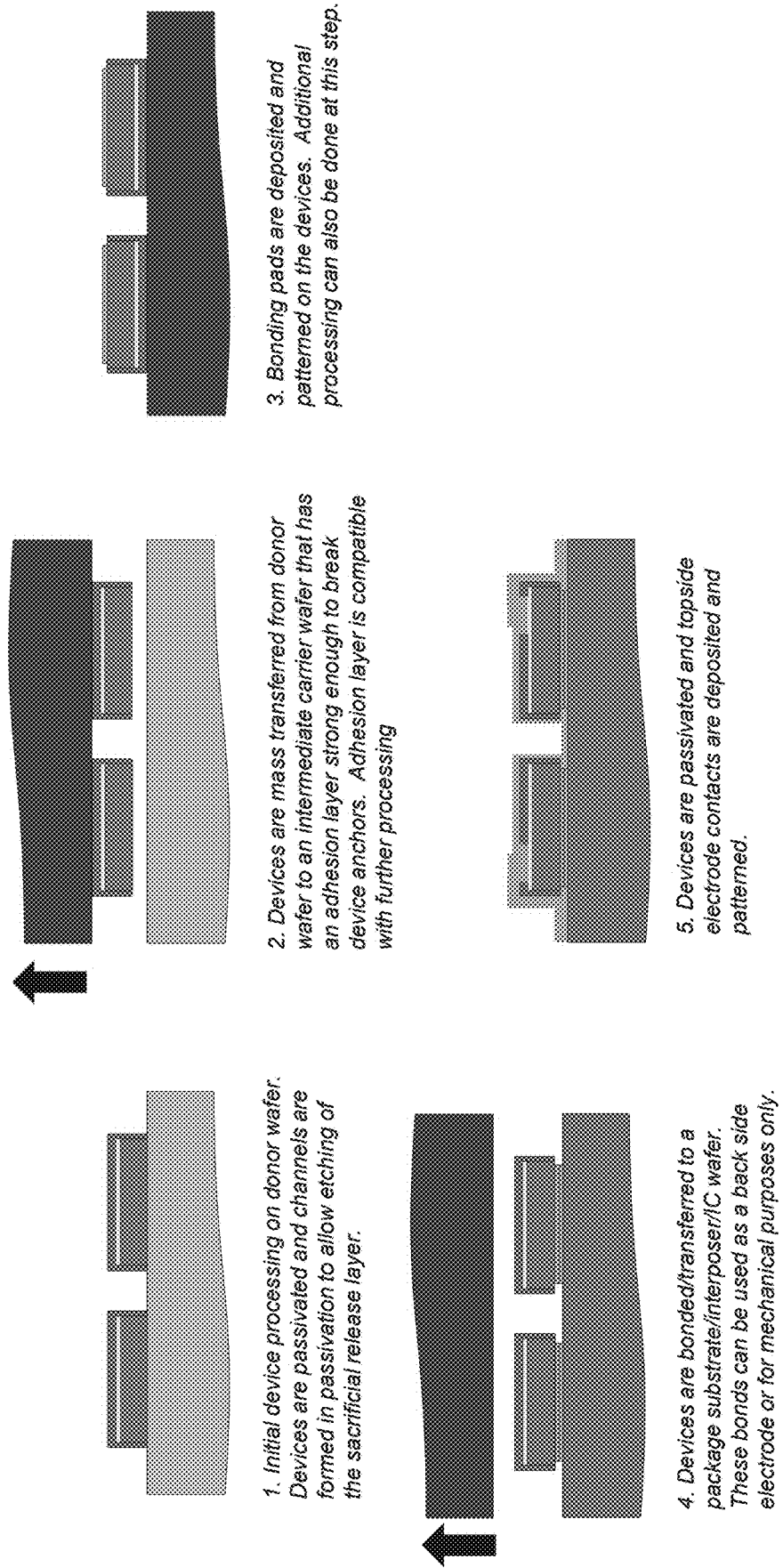
Figure 13E: GaN device formation with top-side contact process flow on intermediate carrier

Figure 13F: Heterogeneous Integration of III-V's on CMOS

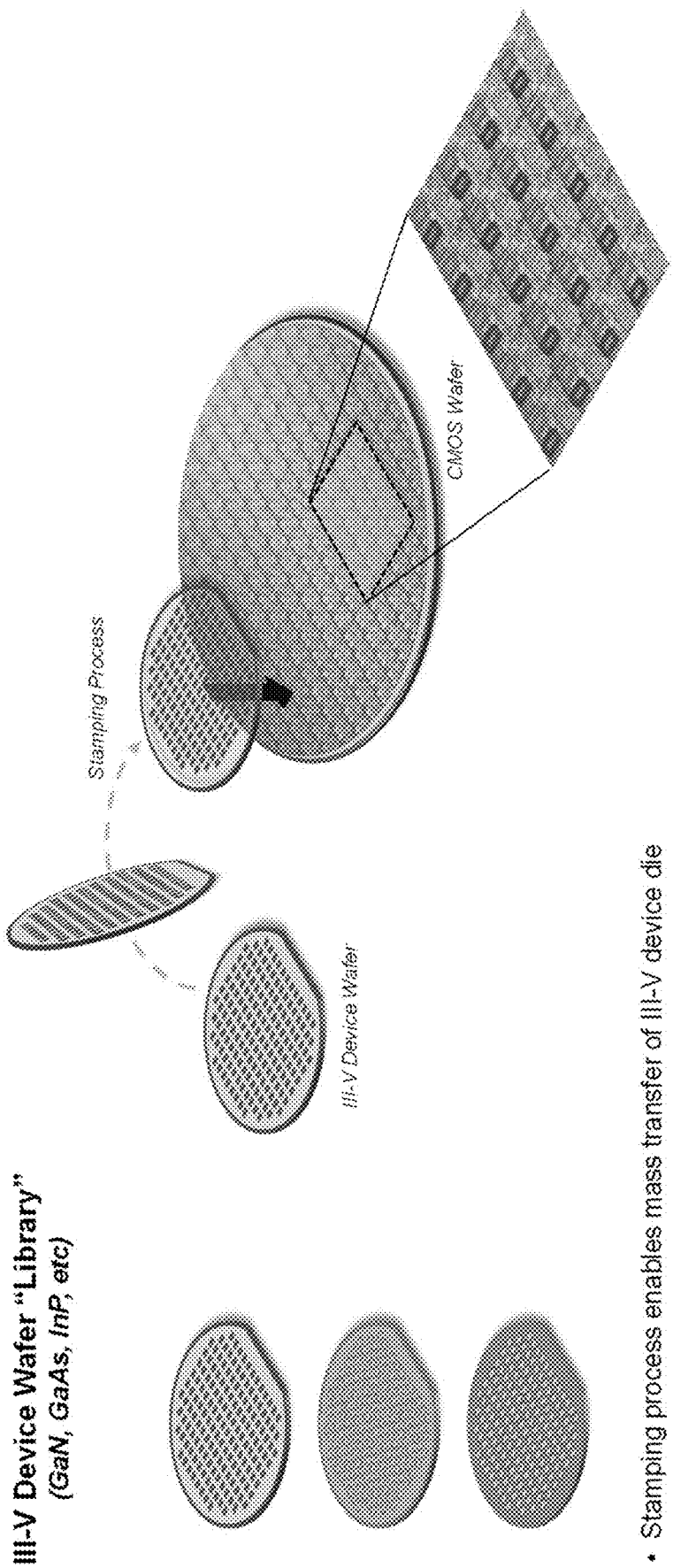

- Stamping process enables mass transfer of III-V device die
- Process steps and repeats across CMOS wafer forming bond and electrical interconnect simultaneously
- Densely spaced die on III-V wafer can be "re-pitched" (expanded) onto CMOS wafer → highly efficient use of III-V wafer
- Multiple device types from different wafers can be transferred enabling heterogenous integration of "best of breed" III-V devices with CMOS technologies
- Transfer process generates robust metallic bond that is compatible with CMOS BEOL interconnects

Figure 13G: Integration of GaN devices with CMOS

*Integrated Power Electronics Example*

- GaN HEMTs with CMOS drivers for power conversion (ex. buck converter)
- Leverage GaN for superior switching speed and improved efficiency
- transfer process enables direct bonding of the GaN HEMTs to the CMOS driver circuitry
- Greatly minimizes interconnect parasitics → faster and more efficient operation
- Eliminates substrate related HEMT substrate leakage paths → no substrate!
- Smaller foot print transferring HEMTs directly on top of CMOS

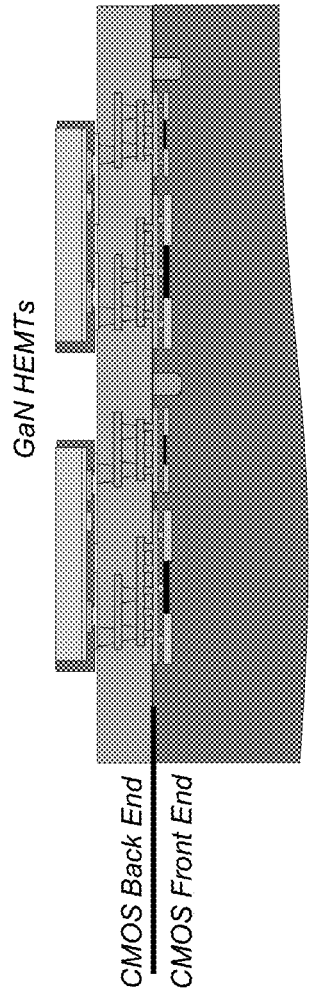

GaN HEMTs

CMOS Back End
CMOS Front End

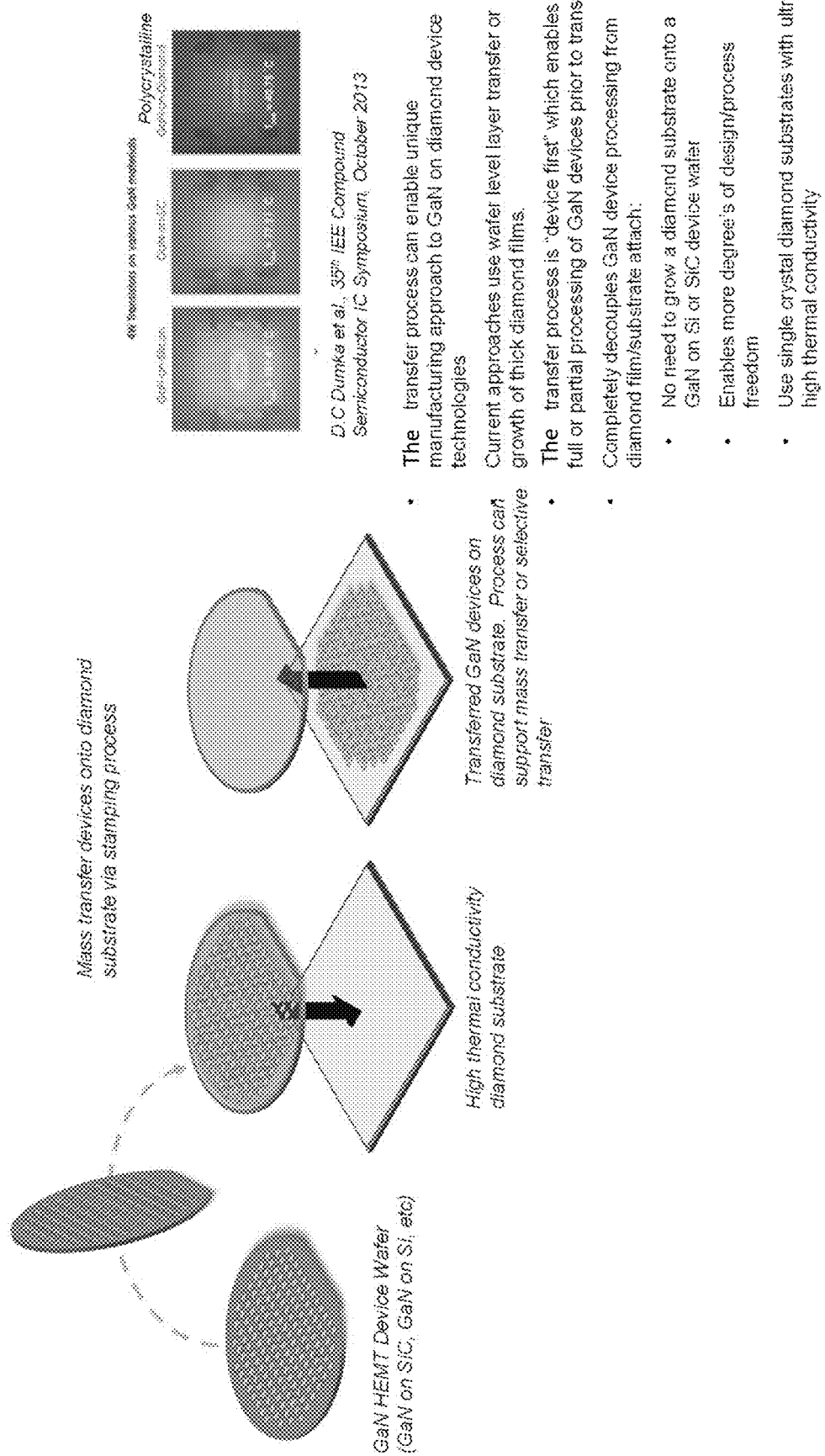
Figure 13H: GaN Device Integration on Diamond Substrates

Figure 13I: Improved Performance for RF/Power Devices

*Improved Thermal Performance of Power/RF Devices*

- Bond GaN power transistors to diamond to reduce junction temperature of RF and Power devices and improve output power and/or shrink devices
- Transfer process uses a robust metallic bonding for low thermal resistance
- The metallic bond also forms an electrical interconnect so no processing is necessary to electrically attach the chips post transfer.
- The bond approach inverts the die, reducing thermal path from device hot spot to diamond substrate

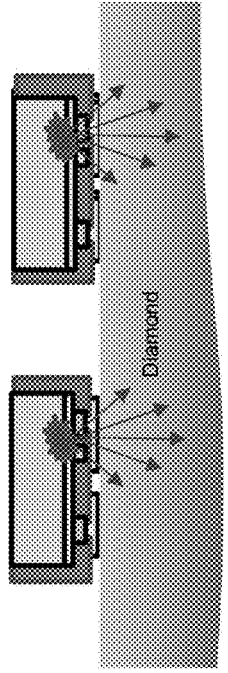

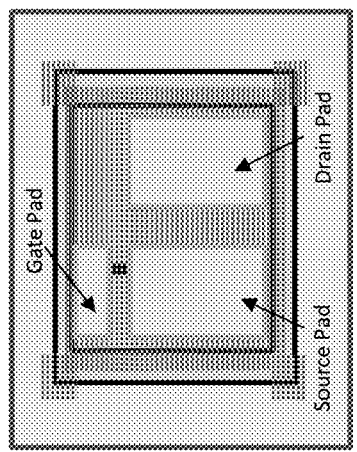

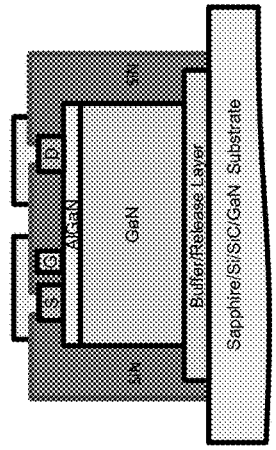

Figures 14A-14D: Selective anchor removal p Contact
n Contact
Passivation layer
Anchor metal
Active Region
Sacrificial Region

Figures 15A-15C: Vary bond thickness on donor
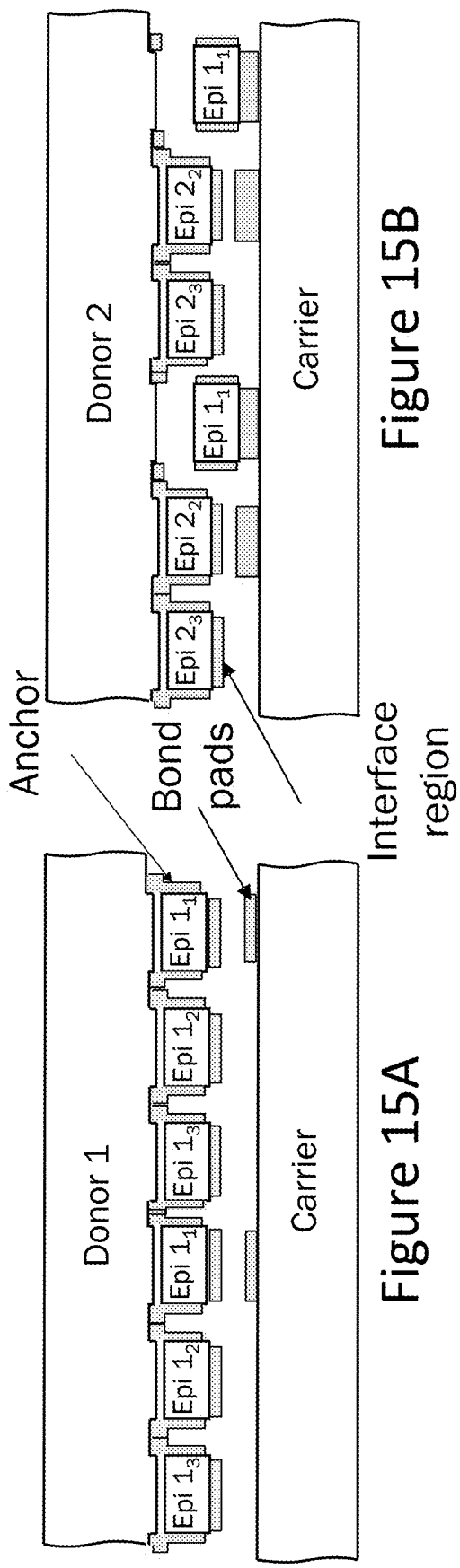
Figure 15A
Figure 15B
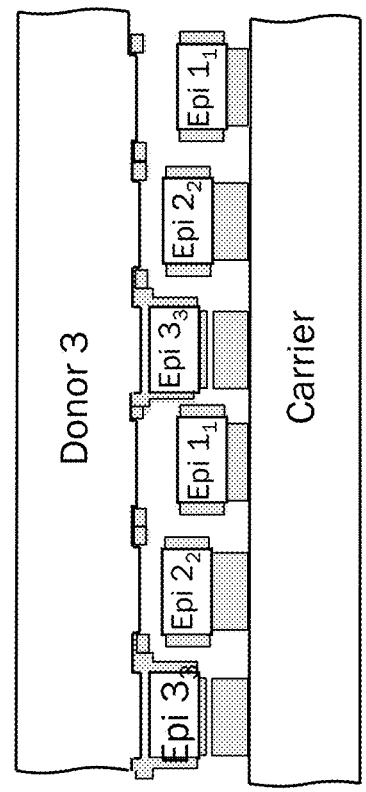
Figure 15C

MANUFACTURABLE GALLIUM CONTAINING ELECTRONIC DEVICES

CROSS-REFERENCE TO RELATED APPLICATIONS

This application is a continuation-in-part of U.S. application Ser. No. 17/897,765, filed Aug. 29, 2022, which is a continuation of U.S. application Ser. No. 17/078,389, filed Oct. 23, 2020, which is a continuation of U.S. application Ser. No. 16/835,082, filed Mar. 30, 2020, which is a continuation of U.S. application Ser. No. 16/796,154, filed Feb. 20, 2020, which is a continuation of U.S. application Ser. No. 16/005,255, filed Jun. 11, 2018, which is a continuation of U.S. application Ser. No. 15/480,239, filed Apr. 5, 2017, which is a continuation of U.S. application Ser. No. 15/209,309, filed Jul. 13, 2016, which is a continuation-in-part of U.S. application Ser. No. 14/580,693, filed Dec. 23, 2014, the contents of which are incorporated herein by reference in their entirety for all purposes.

BACKGROUND

Devices based on wide bandgap III-V semiconductor materials such as gallium nitride (GaN) play a major role in our modern world. They play critical roles in essentially all of our electronic devices and are instrumental in almost all of the machines and apparatus we rely on every day. Examples of such semiconductor devices include light emitting devices such as light emitting diodes and laser diodes, electronic devices such as Schottky diodes, p-n diodes, bipolar junction transistors, field effect transistors, metal-oxide-semiconductor field-effect transistors, insulated gate bipolar transistors, high electron mobility transistors, and heterojunction bipolar transistors to name a few, along with light absorbing devices such as solar cells. Forming such GaN devices of the highest performance often requires epitaxial structures with minimum defect density and the high crystal quality and purity. To achieve the low defect density and high crystal quality it is most optimum to grow the epitaxial device layers on native GaN substrates to form a pseudomorphic epitaxial structure that is relatively free from strain related defects that occur when growing the epitaxial device layers on foreign substrates.

Unfortunately, the synthesis of GaN single crystal substrates has been an extraordinarily difficult task. The highly successful Czochralski method for silicon crystal growth would have impractical process requirements comparable to conditions very deep within the Earth's mantle. Alternative approaches have been investigated for growing GaN bulk substrates, such as hydride vapor phase epitaxy (HVPE) and ammonothermal growth. Additionally, it is still a great challenge to scale up bulk GaN growth to larger wafer sizes. GaN substrates are currently available in 2" diameter at high volume and recent announcements have revealed availability in 4" in the near future, which is still drastically smaller than more mature substrate technologies such as 12" single crystal silicon. At the current GaN wafer diameter and prices, the native substrate option is not economically feasible for realizing semiconductor devices in many applications, specifically light emitting diode applications and power electronic applications. Given the obstacles in GaN native substrate manufacturing, there has been substantial effort devoted to epitaxy on foreign substrate materials. Common choices for GaN heteroepitaxy include sapphire, silicon carbide, and silicon. In the past decade, SiC and sapphire substrates have been widely used in nitride electronic devices, RF transistors, and other electronic devices.

The manufacturing of electronic devices from GaN related materials is dominated by the heteroepitaxial growth of GaN on foreign substrates such as Si, SiC and sapphire. Some electronic devices operate at such high current densities that the crystalline defects associated with heteroepitaxial growth are not acceptable. Because of this, very low defect-density, free-standing GaN substrates have become the substrate of choice for GaN electronic device manufacturing. Unfortunately, such bulk GaN substrates are costly and not widely available in large diameters. For example, 2" diameter is the most common bulk GaN c-plane substrate size today with recent progress enabling 4" diameter, which are still relatively small compared to the 6" and greater diameters that are commercially available for mature substrate technologies.

Semiconductor power electronic devices are a key class of semiconductor devices that hugely affect the world we live in. Power electronics started with the development of the mercury arc rectifier. Invented by Peter Cooper Hewitt in 1902, it was used to convert alternating current (AC) into direct current (DC). From the 1920's on, research continued on applying thyratrons and grid-controlled mercury arc valves to power transmission. Uno Lamm developed a valve with grading electrodes making mercury valves usable for high voltage direct current transmission. In 1933 selenium rectifiers were invented.

In 1947 the bipolar point-contact transistor was invented by Walter H. Brattain and John Bardeen under the direction of William Shockley at Bell Labs. In 1948, Shockley's invention of the bipolar junction transistor improved the stability and performance of transistors, and reduced costs. By the 1950's, semiconductor power diodes became available and started replacing vacuum tubes. In 1956 the Silicon Controlled Rectifier (SCR) was introduced by General Electric, greatly increasing the range of power electronics applications. In the 1960's the switching speed of bipolar junction transistors allowed for high frequency DC/DC converters. In 1976 power MOSFETs became commercially available. In 1982 the Insulated Gate Bipolar Transistor (IGBT) was introduced.

Power electronic devices may be used as switches or as amplifiers. An ideal switch is either open or closed and so dissipates no power, it withstands an applied voltage and passes no current, or passes any amount of current with no voltage drop. Semiconductor devices used as switches can approximate this ideal property, and so most power electronic applications rely on switching devices on and off, which makes systems very efficient as very little power is wasted in the switch. By contrast, in the case of the amplifier, the current through the device varies continuously according to a controlled input. The voltage and current at the device terminals follow a load line, and the power dissipation inside the device is large compared with the power delivered to the load.

The very high breakdown voltages, high electron mobility and saturation velocity of GaN has made it an ideal candidate for high-power and high-temperature power electronic devices, as evidenced by its high Johnson's Figure of Merit. Potential markets for high-power/high-frequency devices based on GaN include microwave radio-frequency power amplifiers (such as those used in high-speed wireless data transmission) and high-voltage switching devices for power grids. A potential mass-market application for GaN-based RF transistors is the microwave source for microwave ovens, replacing the magnetrons currently used. The large band gap means that the performance of GaN transistors is maintained up to higher temperatures than silicon transistors. The first gallium nitride metal semiconductor field-effect transistors (GaN MESFET) were experimentally demonstrated in 1993 and they are being actively developed. Other devices include p-n junction diodes, Schottky diodes, field effect transistors (FET), junction field effect transistors (JFET), insulated gate bipolar transistors (IGBT), heterojunction bipolar transistors (HBT), and high electron mobility transistors (HEMT). Such devices can be deployed in many applications such as in automobiles, hybrid electric automobiles, cell phones, iphones, ipads, computers, and others.

In 2010 the first enhancement mode gallium nitride transistors became generally available. These devices were designed to replace power MOSFETs in applications where switching speed or power conversion efficiency is critical. These transistors, also called eGaN FETs, are built by growing a thin layer of GaN on top of a standard silicon wafer. This allows the eGaN FETs to maintain costs similar to silicon power MOSFETs, but with the superior electrical performance GaN.

SUMMARY

Embodiments of the invention provide methods for fabricating electronic semiconductor devices based on high quality gallium and nitrogen containing epitaxial materials that are pseudomorphically grown on native gallium and nitrogen containing substrates such as GaN substrates or foreign substrates. Typically, these devices are fabricated using an epitaxial deposition of semiconductor device layers on a gallium and nitrogen containing substrate or foreign substrates followed by processing steps on the epitaxial substrate and overlying epitaxial material. By using a selective etch process such as a photo electrochemical (PEC) etch combined with a bonding process, at least a portion of an epitaxial material is transferred to a carrier wafer. Subsequently, the carrier wafer with the bonded epitaxial material may be subjected to subsequent processing steps to form semiconductor devices including electronic devices such as diode or transistor devices, Schottky diodes, p-n diodes, transistors, field effect transistors, bipolar junction transistors, high electron mobility transistors, or solar cell devices. In other embodiments the semiconductor devices may be fully or partially formed in the epitaxial material before transfer to the carrier wafer or to an integrated circuit. In other embodiments, different types of semiconductor devices are configured on a common carrier using the selective bonding and etching process to form an integrated device. What follows is a general description of the typical configuration and fabrication of some exemplary electronic devices.

The present invention breaks the barriers associated with currently available electronic device technology. Specifically, by patterning arrays of electronic devices into multiple donor wafers and then selectively transferring these electronic devices onto a carrier or host wafer, a 2-dimensional matrix of electronic devices can be configured. For example, a first donor wafer comprised of a gallium and arsenic substrate can be fabricated to form an array of electronic device structures, a second donor wafer comprised of a gallium and nitrogen substrate can be fabricated to form an array of electronic device structures, and a third donor wafer comprised of a gallium and nitrogen substrate can be fabricated to form an array of electronic device structures can be formed. Subsequently, the donor wafers can then be subjected to the transfer process described in this invention wherein only a fraction of the electronic device structures may be transferred to a carrier wafer. In some embodiments the carrier wafer is comprised of a gallium and nitrogen containing substrate or an alternative substrate and comprises one or more electronic devices formed directly on the carrier wafer.

The carrier wafer is designed to receive the electronic devices. The carrier wafer may be comprised of an interconnect network configured to enable addressability of the electronic devices. Any relevant interconnect schemes, configurations, and/or processes could be taken from existing technologies and applied to the present invention.

The present invention enables a highly manufacturable and cost-efficient process for producing electronic devices not readily possible with prior art. Specifically, the current invention allows for a wafer level transfer process from a donor wafer to a common carrier wafer forming the electronic device. Since it is a wafer level process, thousands, tens of thousands, or hundreds of thousands of electronic devices can be transferred in one process step (depending on wafer size and pitch) and hence avoiding any one-by-one pick and place techniques. This advantage can enable high throughput for low cost and high alignment tolerances for tight packing of the electronic devices. Moreover, since it is a selective transfer process from the donor to the carrier and the pitch of the electronic devices from the donor wafer to the carrier wafer can be expanded, a much higher density of electronic devices can be formed on single device type donor wafers than the final density of that single device type as expanded on the carrier wafer. For example, a donor wafer may be prepared with a device pitch of X. At the transfer step to the first carrier wafer, only ⅓ of the electronic devices may be transferred to the carrier wafer at a pitch of X/3, such that the resulting donor wafer has a repeating array different electronic devices spaced from each other by X but spaced from their next nearest neighbor with the same device type by X/3. The same sequence can be performed on a second and a third carrier wafer or on a second and third location on the first carrier wafer if the carrier wafer is larger than the donor wafer. This die expansion or transferring at a larger pitch enables an increased use of epitaxial and substrate area of the donor wafer.

In an example, the present invention provides a method for manufacturing gallium and nitrogen containing semiconductor devices with low cost and/or improved performance. The method includes providing a gallium and nitrogen containing substrate or a foreign substrate having a surface region and forming epitaxial material overlying the surface region, the epitaxial material comprising a sacrificial release region and a specific layer stack of high-quality epitaxial material designed for the semiconductor device to be fabricated in. For example, in a Schottky diode power electronic device the layer stack may comprise at least a nominally undoped or intrinsic gallium and nitrogen containing layer and a least an n-type gallium and nitrogen containing layer. In yet another example, in a p-n diode power electronic device the layer stack may comprise at least a nominally undoped or intrinsic gallium and nitrogen containing layer, a least an n-type gallium and nitrogen containing layer, and at least a p-type gallium and nitrogen containing layer. In yet another example, in a high electron mobility transistor (HEMT) power electronic device the layer stack may comprise at least two layers with different bandgaps such as GaN and AlGaN to form a 2-dimensional electron gap at the interface between the two layers with different bandgaps. The method includes patterning and then etching the epitaxial material to form a plurality of mesa regions corresponding to dice, each of the dice corresponding to at least one semiconductor device, such as an electronic device, a power electronic device, a solar cell device, or a combination thereof characterized by a first pitch between a pair of dice, the first pitch being larger than, equal to, or less than a design width. As used herein, the term mesa region or mesa is used to describe the patterned epitaxial material on the gallium and nitrogen containing substrate or the foreign substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

The method includes transferring each of the plurality of dice to a carrier wafer such that each pair of dice is configured with a second pitch between each pair of dice, the second pitch being less than, equal to, or larger than the first pitch corresponding to the design width. The method includes singulating the carrier wafer into a plurality of semiconductor devices on carrier chips.

In various embodiments the carrier wafer can be larger in diameter than the gallium and nitrogen containing substrate or the foreign substrate. For example, the gallium and nitrogen containing substrate can be a 2" round substrate or a smaller GaN substrate and the carrier wafer can be a 4", 6", 8", or 12" round or other size/shaped silicon substrate, sapphire substrate, glass substrate, glass ceramics substrate, quartz substrate, high purity fused silica substrate, silicon carbide substrate, aluminum nitride substrate, germanium substrate, aluminum oxynitride substrate, gallium arsenide substrate, diamond substrate, gallium nitride substrate, indium phosphide substrate, flexible member, circuit board member, silicon wafer with CMOS circuitry, silicon on insulator (SOI) substrate, or gallium nitride on silicon substrate. After the plurality of devices are transferred from the gallium and nitrogen containing substrate, the substrate can be prepared for re-use.

In an example, the present semiconductor device die configured with carrier, which can serve as a submount, can be packaged into a module without any further liftoff process or the like. The process is efficient and uses conventional process technology. Depending upon the embodiment, these and other benefits may be achieved.

In accordance with an embodiment, a partially completed semiconductor device includes a plurality of electronic devices arranged in an array overlying a surface region of a donor substrate, adjacent ones of the plurality of electronic devices in the array separated by a first pitch, each of the plurality of electronic devices comprising a sacrificial region overlying the surface region of the donor substrate and gallium containing device layers of epitaxial material overlying the sacrificial region, the epitaxial material comprises at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; bonding regions overlying a first portion of the plurality of electronic devices, each of the bonding regions comprising a metal contact configured to provide electrical coupling with at least one of the gallium containing device layers, wherein a surface region of a second portion of the bonding regions contact and are bonded to a surface region of contact regions on a carrier substrate to form bonded electronic devices, the contact regions on the carrier substrate configured to provide electrical coupling to corresponding electronic devices; and anchors extending between each of the plurality of electronic devices and the donor substrate. The bonded electronic devices on the donor substrate are configured to be releasable by selectively removing at least part of the sacrificial regions to transfer the second portion of the plurality of electronic devices to the carrier substrate, wherein the anchors are configured to mechanically support the plurality of electronic devices after removal of at least part of the sacrificial regions, and wherein adjacent pairs of the bonded electronic devices are configured with a second pitch on the carrier substrate that is equal to or greater than the first pitch.

In an embodiment, the gallium containing device layers comprise gallium and nitrogen or gallium and arsenic.

In another embodiment, the electronic devices comprise at least one of Schottky diode devices, p-n diode devices, bipolar junction transistor (BJT) devices, field-effect transistor (FET) devices, metal-oxide-semiconductor field-effect transistor (MOSFET) devices, junction field effect transistor (JFET) devices, enhancement mode junction field effect transistor (eJFET) devices, metal-semiconductor FET (MESFET) devices, high-electron-mobility transistor (HEMT) devices, insulated gate bipolar transistor (IGBT) devices, or heterojunction bipolar transistor (HBT) devices, metal-insulator semiconductor barrier Schottky rectifier devices, static induction transistor (SIT) devices, current apertured vertical electron transistor (CAVET) devices, and wherein the electronic devices comprise at least one of trench type devices, normally-on type devices, normally-off type devices, p-type devices, n-type devices, or combinations thereof.

In another embodiment, the carrier substrate is selected from silicon substrate, a sapphire substrate, an aluminum nitride substrate, a silicon nitride substrate, a silicon carbide substrate, a glass substrate, a group V semiconductor substrate, a III-V semiconductor substrate, a II-VI semiconductor substrate, a glass substrate, a glass ceramic substrate, a quartz substrate, a high purity fused silica substrate, a silicon carbide substrate, an aluminum nitride substrate, a germanium substrate, an aluminum oxynitride substrate, a gallium arsenide substrate, a diamond substrate, a synthetic diamond substrate, a gallium nitride substrate, an indium phosphide substrate, a flexible member, a circuit board member, a CMOS substrate, a silicon substrate with CMOS circuitry, a silicon on insulator (SOI) substrate, or a gallium nitride on silicon substrate.

In another embodiment, the donor substrate is selected from a gallium nitride substrate, a sapphire substrate, a silicon carbide substrate, a silicon substrate, a gallium oxide substrate, a spinel substrate, a lanthanum aluminate substrate, a magnesium oxide substrate, or a template type substrate.

In another embodiment, the sacrificial regions include GaN, InGaN, AlInGaN, AlGaN, AlGaAs, AlInP, InGaAs, InAlAs, Ge, silicon, or silicon oxide.

In yet another embodiment, the plurality of electronic devices include one or more components, the one or more components being selected from at least one of an electrical contact bond pad, a current spreading region, a drift region, an insulation region, an edge termination region, an emitter region, a base region, a collector region, a gate region, a source region, a drain region, an isolation region, or a passivation region either alone or in any combination.

In accordance with another embodiment, a donor substrate includes a plurality of electronic devices arranged in an array overlaying a surface region of the donor substrate, adjacent ones of the plurality of electronic devices in the array separated by a first pitch that is less than a design width, each of the plurality of electronic devices including: gallium containing device layers of epitaxial material, the epitaxial material comprising at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; a sacrificial region configured to be selectively removed to allow transfer of at least a portion of the plurality of electronic devices to one or more carrier substrates; anchors extending between each of the plurality of electronic devices and the donor substrate, the anchors configured to mechanically support the plurality of electronic devices after removal of at least part of the sacrificial regions; and one or more metal contact regions overlying the gallium containing device layers so that the gallium containing device layers are between the sacrificial region and the one or more metal contact regions, the one or more metal contact regions configured to provide an electrical coupling with at least one of the gallium containing device layers, a surface region of at least one of the one or more metal contact regions configured to contact and bond to a surface region of metal contact regions on the one or more carrier substrates.

In an embodiment, the sacrificial region is disposed between the gallium containing device layers and the surface region of the donor substrate.

In another embodiment, the gallium containing device layers comprise gallium and nitrogen or gallium and arsenic.

In another embodiment, the electronic devices comprise at least one of Schottky diode devices, p-n diode devices, bipolar junction transistor (BJT) devices, field-effect transistor (FET) devices, metal-oxide-semiconductor field-effect transistor (MOSFET) devices, junction field effect transistor (JFET) devices, enhancement mode junction field effect transistor (eJFET) devices, metal-semiconductor FET (MESFET) devices, high-electron-mobility transistor (HEMT) devices, insulated gate bipolar transistor (IGBT) devices, or heterojunction bipolar transistor (HBT) devices, metal-insulator semiconductor barrier Schottky rectifier devices, static induction transistor (SIT) devices, current apertured vertical electron transistor (CAVET) devices, and wherein the electronic devices comprise at least one of trench type devices, normally-on type devices, normally-off type devices, p-type devices, n-type devices, or combinations thereof.

In another embodiment, the donor substrate is selected from a gallium nitride substrate, a sapphire substrate, a silicon carbide substrate, a silicon substrate, a gallium oxide substrate, a spinel substrate, a lanthanum aluminate substrate, a magnesium oxide substrate, or a template type substrate.

In another embodiment, the sacrificial region includes GaN, InGaN, AlInGaN, AlGaN, AlGaAs, AlInP, InGaAs, InAlAs, Ge, silicon, or silicon oxide.

In yet another embodiment, the plurality of electronic devices include one or more components, the one or more components being selected from at least one of an electrical contact bond pad, a current spreading region, a drift region, an insulation region, an edge termination region, an emitter region, a base region, a collector region, a gate region, a source region, a drain region, an isolation region, or a passivation region either alone or in any combination.

In accordance with another embodiment, a carrier substrate configured with circuitry for distributing electronic signals or current includes a plurality of electronic devices arranged in an array overlaying a surface region of the carrier substrate, wherein each of a first portion of the plurality of electronic devices include: gallium containing device layers of epitaxial material, the epitaxial material comprising at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; and one or more contact regions overlying the surface region of the carrier substrate, a surface region of the one or more contact regions contacting and bonded to a surface region of one or more metal contact regions of each electronic device, the one or more metal contact regions configured to provide an electrical coupling with at least one of the gallium containing device layers; and wherein each of a second portion of the plurality of electronic devices are different types of electronic devices than the first portion of the plurality of electronic devices.

In an embodiment, the second portion of the plurality of electronic devices include at least one of other gallium nitride based electronic devices, silicon based electronic devices, or gallium arsenic based electronic devices.

In another embodiment, the gallium containing device layers comprise gallium and nitrogen or gallium and arsenic.

In another embodiment, the electronic devices comprise at least one of Schottky diode devices, p-n diode devices, bipolar junction transistor (BJT) devices, field-effect transistor (FET) devices, metal-oxide-semiconductor field-effect transistor (MOSFET) devices, junction field effect transistor (JFET) devices, enhancement mode junction field effect transistor (eJFET) devices, metal-semiconductor FET (MESFET) devices, high-electron-mobility transistor (HEMT) devices, insulated gate bipolar transistor (IGBT) devices, or heterojunction bipolar transistor (HBT) devices, metal-insulator semiconductor barrier Schottky rectifier devices, static induction transistor (SIT) devices, current apertured vertical electron transistor (CAVET) devices, and wherein the electronic devices comprise at least one of trench type devices, normally-on type devices, normally-off type devices, p-type devices, n-type devices, or combinations thereof.

In another embodiment, the carrier substrate is selected from silicon substrate, a sapphire substrate, an aluminum nitride substrate, a silicon nitride substrate, a silicon carbide substrate, a glass substrate, a group V semiconductor substrate, a III-V semiconductor substrate, a II-VI semiconductor substrate, a glass substrate, a glass ceramic substrate, a quartz substrate, a high purity fused silica substrate, a silicon carbide substrate, an aluminum nitride substrate, a germanium substrate, an aluminum oxynitride substrate, a gallium arsenide substrate, a diamond substrate, a synthetic diamond substrate, a gallium nitride substrate, an indium phosphide substrate, a flexible member, a circuit board member, a CMOS substrate, a silicon substrate with CMOS circuitry, a silicon on insulator (SOI) substrate, or a gallium nitride on silicon substrate.

In yet another embodiment, the plurality of electronic devices include one or more components, the one or more components being selected from at least one of an electrical contact bond pad, a current spreading region, a drift region, an insulation region, an edge termination region, an emitter region, a base region, a collector region, a gate region, a source region, a drain region, an isolation region, or a passivation region either alone or in any combination.

In accordance with another embodiment, a partially completed semiconductor device includes a plurality of electronic devices arranged in an array overlying a surface region of a donor substrate, adjacent ones of the plurality of electronic devices in the array separated by a first pitch, each of the plurality of electronic devices comprising a sacrificial region overlying the surface region of the donor substrate and gallium containing device layers of epitaxial material overlying the sacrificial region, the epitaxial material comprises at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; bonding regions overlying a first portion of the plurality of electronic devices, wherein a surface region of a second portion of the bonding regions contact and are bonded to a surface region of contact regions on a carrier substrate to form bonded electronic devices; and anchors extending between each of the plurality of electronic devices and the donor substrate. The bonded electronic devices on the donor substrate are configured to be releasable by selectively removing at least part of the sacrificial regions using a wet etch to transfer the second portion of the plurality of electronic devices to the carrier substrate, wherein the anchors are configured to mechanically support the plurality of electronic devices after removal of at least part of the sacrificial regions, and wherein adjacent pairs of the bonded electronic devices are configured with a second pitch on the carrier substrate that is equal to or greater than the first pitch.

In accordance with another embodiment, a method for manufacturing electronic devices includes providing a donor substrate; forming a plurality of electronic devices arranged in an array overlying a surface region of the donor substrate, adjacent ones of the plurality of electronic devices in the array separated by a first pitch, each of the plurality of electronic devices comprising a sacrificial region overlying the surface region of the donor substrate and gallium containing device layers of epitaxial material overlying the sacrificial region, the epitaxial material comprising at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; forming bonding regions overlying a first portion of the plurality of electronic devices, each of the bonding regions comprising a metal contact configured to provide electrical coupling with at least one of the gallium containing device layers; forming anchors extending between each of the plurality of electronic devices and the donor substrate; providing a carrier substrate; forming contact regions on the carrier substrate; bonding a second portion of the bonding regions with the contact regions on the carrier substrate to form bonded electronic devices, the contact regions on the carrier substrate configured to provide electrical coupling to corresponding electronic devices; subjecting the sacrificial region to a chemical energy source to fully or partially remove the sacrificial region; and releasing the bonded electronic devices from the donor substrate to transfer the bonded electronic devices to the carrier substrate, wherein adjacent pairs of the bonded electronic devices are configured with a second pitch on the carrier substrate that is equal to or greater than the first pitch.

In an embodiment, the chemical energy source includes a photo electrochemical (PEC) etch that comprises KOH, HCl, or $HNO_3$, a wet etch, or laser induced chemical energy source.

In another embodiment, after transferring the plurality of electronic devices from the donor substrate, the donor substrate is prepared for re-use.

In accordance with another embodiment, a method for manufacturing electronic devices includes providing a donor substrate; forming a plurality of electronic devices arranged in an array overlying a surface region of the donor substrate, adjacent ones of the plurality of electronic devices in the array separated by a first pitch, each of the plurality of electronic devices comprising a sacrificial region overlying the surface region of the donor substrate and gallium containing device layers of epitaxial material overlying the sacrificial region, the epitaxial material comprising at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; forming bonding regions overlying the plurality of electronic devices; subjecting the sacrificial region to a chemical energy source to fully or partially remove the sacrificial region; providing an intermediate substrate; attaching the bonding regions of the plurality of electronic devices on the donor substrate to the intermediate substrate; releasing the plurality of electronic devices from the donor substrate to transfer the plurality of electronic devices to the intermediate substrate as transferred electronic devices; providing a carrier substrate; selectively picking up one or more of the transferred electronic devices from the intermediate substrate and placing the one or more of the transferred electronic devices on the carrier substrate and bonding the bonding regions of the one or more of the transferred electronic devices to the carrier substrate to form bonded structures; wherein each adjacent pair of the bonded structures on the carrier substrate is configured with a second pitch that is equal to or greater than the first pitch; and repeating the selectively picking up, placing, and bonding steps one or more times to transfer additional ones of the transferred electronic devices from the intermediate substrate to the carrier substrate.

In an embodiment, the intermediate substrate includes a releasable tape.

In accordance with another embodiment, a method for manufacturing an integrated circuit comprising gallium nitride based electronic devices includes providing a donor substrate; forming a plurality of gallium nitride based electronic devices arranged in an array overlying a surface region of the donor substrate, adjacent ones of the plurality of gallium nitride based electronic devices in the array separated by a first pitch, each of the plurality of gallium nitride based electronic devices comprising a sacrificial region overlying the surface region of the donor substrate and gallium and nitrogen containing device layers of epitaxial material overlying the sacrificial region, the epitaxial material comprising at least an intrinsic-type or unintentionally doped gallium and nitrogen containing region or at least an n-type gallium and nitrogen containing region or at least a p-type gallium and nitrogen containing region or at least a combination of one or more of the intrinsic-type or unintentionally doped gallium and nitrogen containing region, the n-type gallium and nitrogen containing region, or the p-type gallium and nitrogen containing region; forming bonding regions overlying a first portion of the plurality of gallium nitride based electronic devices, each of the bonding regions comprising a metal contact configured to provide electrical coupling with at least one of the gallium and nitrogen containing device layers; forming anchors extending between each of the plurality of gallium nitride based electronic devices and the donor substrate; providing a carrier substrate; forming contact regions on the carrier substrate; bonding a second portion of the bonding regions with the contact regions on the carrier substrate to form bonded gallium nitride based electronic devices, the contact regions on the carrier substrate configured to provide electrical coupling to corresponding gallium nitride based electronic devices; subjecting the sacrificial region to a chemical energy source to fully or partially remove the sacrificial region; and releasing the bonded gallium nitride based electronic devices from the donor substrate to transfer the bonded gallium nitride based electronic devices to the carrier substrate and provide transferred gallium nitride based electronic devices, wherein adjacent pairs of the transferred gallium nitride based electronic devices are configured with a second pitch on the carrier substrate that is equal to or greater than the first pitch.

In an embodiment, the carrier substrate includes complementary metal oxide semiconductor (CMOS) circuitry, and the method further comprises forming electrical contacts between the transferred gallium nitride based electronic devices and the CMOS circuitry to form integrated circuits comprising silicon based devices and the transferred gallium nitride based electronic devices.

In another embodiment, the carrier substrate comprises a circuit backplane, and the method further comprises forming electrical contacts between the transferred gallium nitride based electronic devices and the circuit backplane.

In another embodiment, the method also includes forming electrical contacts between the transferred gallium nitride based electronic devices and other gallium nitride based devices on the carrier substrate, the other gallium nitride based devices including at least one of normally-on devices, normally-off devices, n-type devices, p-type devices, transistor devices, or diode devices.

In yet another embodiment, the method also includes forming electrical contacts between the transferred gallium nitride based electronic devices and at least one circuit, the at least one circuit including a driver circuit, a bridge circuit, or a buck power stage circuit.

In accordance with another embodiment, a method for manufacturing a heterogenous integrated circuit comprising gallium nitride based electronic devices includes providing a donor substrate; forming a plurality of gallium nitride based electronic devices arranged in an array overlying a surface region of the donor substrate, adjacent ones of the plurality of gallium nitride based electronic devices in the array separated by a first pitch, each of the plurality of gallium nitride based electronic devices comprising a sacrificial region overlying the surface region of the donor substrate and gallium and nitrogen containing device layers of epitaxial material overlying the sacrificial region, the epitaxial material comprising at least an intrinsic-type or unintentionally doped gallium and nitrogen containing region or at least an n-type gallium and nitrogen containing region or at least a p-type gallium and nitrogen containing region or at least a combination of one or more of the intrinsic-type or unintentionally doped gallium and nitrogen containing region, the n-type gallium and nitrogen containing region, or the p-type gallium and nitrogen containing region; forming first bonding regions overlying a first portion of the plurality of gallium nitride based electronic devices; forming anchors extending between each of the plurality of gallium nitride based electronic devices and the donor substrate; providing a carrier substrate comprising electrical circuitry with circuit elements including at least one of transistors, resistors, capacitors, or inductors, wherein the circuit elements are interconnected to form integrated circuits; forming second bonding regions on the carrier substrate; bonding at least some of the first bonding regions with the second bonding regions on the carrier substrate to form bonded gallium nitride based electronic devices; subjecting the sacrificial region to a chemical energy source to fully or partially remove the sacrificial region; and releasing the bonded gallium nitride based electronic devices from the donor substrate to transfer the bonded gallium nitride based electronic devices to the carrier substrate and provide transferred gallium nitride based electronic devices, wherein adjacent pairs of the transferred gallium nitride based electronic devices are configured with a second pitch on the carrier substrate that is equal to or greater than the first pitch.

In an embodiment, the carrier substrate includes CMOS circuitry, and the method further comprises forming electrical contacts between the transferred gallium nitride based electronic devices and the CMOS circuitry to form integrated circuits comprising the transferred gallium nitride based electronic devices and at least one of other gallium nitride based devices, silicon based devices, or gallium arsenic based devices.

In another embodiment, the method also includes forming electrical contacts between the transferred gallium nitride based electronic devices and one or more circuits on the carrier substrate, the one or more circuits including at least one of a backplane or a CMOS circuit with gallium and arsenic based electronic devices and/or indium and phosphorous based electronic devices and/or silicon based electronic devices.

In yet another embodiment, the method also includes further comprising forming electrical contacts between the transferred gallium nitride based electronic devices and other gallium nitride based devices on the carrier substrate, the other gallium nitride based devices including at least one of normally-on devices, normally-off devices, n-type devices, p-type devices, lateral devices with vertical devices, transistor devices, diode devices, gallium and arsenic based devices, indium and phosphorous based devices, or silicon based devices.

In accordance with another embodiment, a method for manufacturing gallium nitride based electronic devices configured for improved heat dissipation includes providing a donor substrate; forming a plurality of gallium nitride based electronic devices arranged in an array overlying a surface region of the donor substrate, adjacent ones of the plurality of gallium nitride based electronic devices in the array separated by a first pitch, each of the plurality of gallium nitride based electronic devices comprising a sacrificial region overlying the surface region of the donor substrate and gallium and nitrogen containing device layers of epitaxial material overlying the sacrificial region, the epitaxial material comprising at least an intrinsic-type or unintentionally doped gallium and nitrogen containing region or at least an n-type gallium and nitrogen containing region or at least a p-type gallium and nitrogen containing region or at least a combination of one or more of the intrinsic-type or unintentionally doped gallium and nitrogen containing region, the n-type gallium and nitrogen containing region, or the p-type gallium and nitrogen containing region; forming bonding regions overlying the epitaxial material on a first portion of the plurality of gallium nitride based electronic devices, each of the bonding regions comprising a metal contact configured to provide electrical coupling with at least one of the gallium and nitrogen containing device layers; forming anchors extending between each of the plurality of gallium nitride based electronic devices and the donor substrate; providing a carrier substrate, the carrier substrate being thermally conductive and comprised of diamond, silicon carbide, or aluminum nitride; forming contact regions on the carrier substrate; bonding a second portion of the bonding regions with the contact regions on the carrier substrate to form bonded gallium nitride based electronic devices, the contact regions on the carrier substrate configured to provide electrical coupling to corresponding gallium nitride based electronic devices and provide a thermal path from active layers of the epitaxial material to the carrier substrate; subjecting the sacrificial region to a chemical energy source to fully or partially remove the sacrificial region; and releasing the bonded gallium nitride based electronic devices from the donor substrate to transfer the bonded gallium nitride based electronic devices to the carrier substrate and provide transferred gallium nitride based electronic devices, wherein adjacent pairs of the transferred gallium nitride based electronic devices are configured with a second pitch on the carrier substrate that is equal to or greater than the first pitch.

In accordance with yet another embodiment, a method for manufacturing custom circuits comprised of one or more gallium nitride based electronic devices includes providing a plurality of donor substrates; forming electronic devices on the plurality of donor substrates; wherein at least one of the plurality of donor substrates includes gallium nitride based electronic devices, and wherein at least one of the plurality of donor substrates has a different type of electronic devices than others of the plurality of donor substrates to provide a library or inventory of different types of electronic devices on the plurality of donor substrates; and forming a custom circuit by bonding the different types of electronic devices to a carrier substrate to form bonded electronic devices, wherein the different types of electronic devices are bonded to the carrier substrate based on a pre-determined configuration according to a prescribed circuit design.

In an embodiment, the library or inventory of the different types of electronic devices are stored on the plurality of donor substrates.

In another embodiment, the method also includes transferring the bonded electronic devices to the carrier substrate by fully or partially removing a sacrificial region and supporting the bonded electronic devices during the transfer process using anchors.

In yet another embodiment, the library or inventory of the different types of electronic devices are stored on one or more intermediate members, and the method further comprises selectively picking up one or more of the different types of electronic devices from the one or more intermediate members and placing the one or more of the different types of electronic devices on the carrier substrate and bonding the different types of electronic devices to the carrier substrate to form the bonded electronic devices. In some embodiments, the one or more intermediate members include releasable tape.

In an example, the present invention enables the integration of different semiconductor devices onto a common carrier for integration to increase functionality of the resulting semiconductor chip formed on the carrier wafer.

The present invention achieves these benefits and others in the context of known process technology. However, a further understanding of the nature and advantages of the present invention may be realized by reference to the latter portions of the specification and attached drawings.

Various embodiments of this invention can be used to realize one or more of the following benefits for semiconductor devices based on gallium and nitrogen containing epitaxial material:

1. This invention enables wafer process of high quality pseudomorphically grown gallium and nitrogen containing devices on carrier wafers with very large diameter. For example, the gallium and nitrogen containing devices can be processed on 2", 4", 6", 8", 12" or even larger carrier wafers for dramatically reduced wafer fabrication costs compared to processing on native GaN substrates. Since current native GaN substrates are limited to 2" diameter in high volume and are only now being introduced at 4" diameter in low volume, such substrates are far behind the scaling roadmap of the more mature silicon, sapphire, silicon carbide and other substrates. This invention enables wafer process of high-quality gallium and nitrogen containing devices on carrier wafers of more mature substrate technologies, overcoming the limitations associated with small GaN wafer availability. As an example, power electronic devices formed on native bulk GaN substrates are limited to 2" or 4" wafer fab, which is not competitive with devices formed on silicon, sapphire, silicon carbide. Of course, in some embodiments for the fabrication of devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In an embodiment, the gallium and nitrogen containing epitaxial materials are deposited on sapphire or SiC due to their relatively low cost and ability to achieve relatively low defectivity and low strain epitaxial films. In another embodiment the gallium and nitrogen containing epitaxial materials are deposited on silicon wafers due to the low cost of silicon wafers and availability of large area silicon wafers; i.e. wafers with greater than 150 mm diameter.

2. This invention enables the fabrication of semiconductor devices from high quality low-defect-density gallium and nitrogen epitaxial material pseudomorphically grown on native substrates with drastically reduced consumption of the native substrate such as a GaN substrate, allowing device implementation in applications where very low cost is critical. Using conventional growth and processing techniques on native GaN substrates is cost prohibitive since it requires consumption of the native substrates with each wafer fabrication. These native substrates are orders of magnitude more expensive than more mature substrate technologies such as silicon, sapphire, silicon carbide, gallium arsenide, and indium phosphide. Since this invention provides a method to transfer high-quality gallium and nitrogen containing material from a native gallium and nitrogen containing substrate or a foreign substrate to a carrier wafer without destruction of the native substrate, the native substrate can be re-used. This invention enables the native GaN substrate to be re-used 10 or more times. As an example, high electron mobility transistors are conventionally formed on silicon wafers, sapphire wafers, or silicon carbide wafers and are comprised of a buffer layer at the substrate interface to mitigate defects resulting from the heteroepitaxial structure. Although this heteroepitaxial approach is not ideal because the defects in the epitaxy can limit the device performance, it does enable the formation of HEMT devices with sufficient performance and the required cost structure. However, this invention will enable HEMT devices to be fabricated from pseudomorphic epitaxial material for much lower defect density material with a very similar scale and cost structure.

3. This invention enables improved utilization of the high-quality gallium and nitrogen containing substrate or a foreign substrate through a "die expansion" technology. Since this invention enables the high-quality gallium and nitrogen containing epitaxial material to be transferred to the carrier wafer at a different (i.e. larger) pitch than the pitch formed on the gallium and nitrogen containing substrate or the foreign substrate, the epitaxial material can be strategically positioned on the carrier wafer to only occupy regions where it is needed within the final semiconductor device. That is, the epitaxial semiconductor device layers can be sized and positioned only where they are needed within the final semiconductor device architecture. Since many finished semiconductor devices have chip area functioning to support bond pad regions, dissipate heat, help light extraction, etc. wherein active epitaxial material is not required, it is wasteful to use area that is occupied or was occupied by the costly epitaxial material. As an example, the epitaxial material may only be required on a small fraction of the chip. In this invention small GaN mesas can be positioned on the carrier wafer only where the electronic device will be formed during wafer processing.

4. This invention enables the use of gallium and nitrogen containing nonpolar and semipolar oriented substrates in commercial semiconductor devices. The current small size and high cost of nonpolar and semipolar substrates limits their application to commercially viable semiconductor devices. Through the improved usage of substrate and epitaxial area by die expansion, the transfer of the epitaxy to large carrier wafers for device fabrication, and the ability to re-use the gallium and nitrogen containing substrates, the cost and size challenges can be overcome, enabling proliferation of nonpolar and semipolar based GaN devices in a wide range of applications.

BRIEF DESCRIPTION OF THE DRAWINGS

FIG. 1A is a simplified process flow for epitaxial preparation in an example of the present invention.

FIG. 1B is a simplified process flow for epitaxial preparation in an example using protect layers in an example of the present invention.

FIG. 2A is a simplified process flow for bonding and then etching the sacrificial regions in an example of the present invention.

FIG. 2B is a simplified process flow for partially or nearly completely etching the sacrificial region and then bonding wherein the unetched regions act as anchors used for mechanical support to epitaxial mesas in an example of the present invention.

FIG. 2C is a simplified process flow for etching the sacrificial region and then bonding wherein non semiconductor anchor features are used for mechanical support to epitaxial mesas in an example of the present invention.

FIG. 2D is a simplified process flow for etching the sacrificial region and then bonding wherein semiconductor anchor features are used for mechanical support to epitaxial mesas in an example of the present invention.

FIG. 2E is a simplified top-view schematic of semiconductor anchor features providing mechanical support to epitaxial mesas in an example of the present invention.

FIG. 2F is a simplified side-view schematic of process flow for using semiconductor anchor features providing mechanical support to epitaxial mesas in an example of the present invention.

FIG. 2G is a simplified top-view schematic of metal anchor features providing mechanical support to epitaxial mesas in an example of the present invention.

FIG. 2H is a simplified side-view schematic of process flow for using metal anchor features providing mechanical support to epitaxial mesas in an example of the present invention FIG. 2I is a simplified schematic of electrical circuit formed during PEC etching with metal anchors connecting the anode and cathode in an example of the present invention.

FIG. 3A is a simplified side view of a selective area bonding process in an example of the present invention.

FIGS. 3B-3G are simplified side views of a bonding processes using an intermediate substrate in examples of the present invention.

FIG. 4A is a simplified schematic diagram illustrating the transfer of epitaxy device layers from various substrate sizes to 100-, 200- and 300-mm carrier wafers in an example of the present invention.

FIG. 4B is a simplified schematic illustrating how the of carrier wafer can be processed to form the submount of the final semiconductor device structure in an example of the present invention.

FIG. 5 is a simplified schematic process flow illustrating substrate re-use in an example of the present invention.

FIG. 6A is a simplified schematic process flow of bonding the electronic device to the carrier wafer in an example of the present invention.

FIG. 6B is a simplified schematic process flow of bonding the electronic device to the carrier wafer in an example of the present invention.

FIG. 6C is a simplified top-view schematic illustration of die expansion of an electronic device epitaxial structure in an example of the present invention.

FIG. 6D is a simplified top-view schematic illustrating the transfer of different electronic devices to a carrier wafer in an example according to the present invention.

FIG. 7A is a table listing example material properties of GaN, SiC, and Si at 300K.

FIG. 7B is a plot of theoretical on-resistance vs blocking voltage for GaN, SiC, and Si.

FIG. 8A is a simplified schematic of an epitaxial structure of a Schottky diode power device according to an example of the present invention.

FIG. 8B is a simplified schematic cross-section of a structure of a Schottky diode power device on a carrier wafer according to an example of the present invention.

FIG. 8C is a simplified schematic of an epitaxial structure of a Schottky barrier diode device according to an example of the present invention.

FIG. 8D is a simplified schematic cross-section of a structure of a Schottky barrier diode device on a carrier wafer according to an example of the present invention.

FIGS. 8E and 8F are simplified schematic cross-sections of structures of Schottky barrier diode devices formed according to examples of methods of the invention.

FIGS. 8G and 8H are simplified schematic cross-sections of structures of metal-insulator-semiconductor barrier Schottky rectifier devices formed according to examples of methods of the invention.

FIGS. 8I and 8J are simplified schematic cross-sections of structures of metal-insulator-semiconductor barrier Schottky rectifier devices formed according to examples of methods of the invention.

FIG. 9A is a simplified schematic of an epitaxial structure of a p-n diode power device according to an example of the present invention.

FIG. 9B is a simplified schematic cross-section of a structure of a p-n diode power device on a carrier wafer according to an example of the present invention.

FIG. 9C is a simplified schematic of an epitaxial structure of a p-n diode power device according to an example of the present invention.

FIG. 9D is a simplified schematic cross-section of a structure of a p-n diode power device on a carrier wafer according to an example of the present invention.

FIGS. 9E to 9V illustrate methods by which various electronic devices are formed on a gallium and nitrogen containing or foreign wafer and transferred to a carrier wafer according to examples of the present invention.

FIG. 10A is a simplified example of a conventional HEMT device formed epitaxially on a foreign substrate according to an example of the present invention.

FIG. 10B is a simplified schematic of an epitaxial structure of a HEMT device formed on a gallium and nitrogen containing substrate or a foreign substrate according to an example of the present invention.

FIG. 10C is a simplified schematic of an epitaxial structure of a HEMT device formed on a foreign substrate according to an example of the present invention.

FIG. 10D is a simplified schematic cross-section of a structure of a HEMT/HFET device on a carrier wafer according to an example of the present invention.

FIG. 10E is a simplified schematic cross-section of a structure of a HEMT/HFET device on a carrier wafer according to an example of the present invention.

FIG. 10F is a simplified schematic cross-section of a structure of an insulated HEMT/MIS-HEMT device on a carrier wafer according to an example of the present invention.

FIGS. 10G and 10H illustrate a method by which a HEMT device is formed on a gallium and nitrogen containing or foreign wafer and transferred to a carrier wafer according to examples of the present invention.

FIG. 10I is a simplified schematic of an epitaxial structure of a HEMT device grown on a gallium and nitrogen containing substrate or a foreign substrate according to an example of the present invention.

FIG. 10J is a simplified schematic of an epitaxial structure of a HEMT device grown on a foreign substrate according to an example of the present invention.

FIG. 10K is a simplified schematic cross-section of a structure of a HEMT device on a carrier wafer according to an example of the present invention.

FIG. 10L is a simplified schematic cross-section of a structure of a HEMT device on a carrier wafer according to an example of the present invention.

FIG. 10M is a simplified schematic cross-section of a structure of a HEMT device on a carrier wafer according to an example of the present invention.

FIG. 10N is a simplified schematic cross-section of a structure of a recessed gate HEMT device on a carrier wafer according to an example of the present invention.

FIGS. 10O and 10P illustrate a method by which a HEMT device is formed on a gallium and nitrogen containing or foreign wafer and transferred to a carrier wafer according to examples of the present invention.

FIG. 10Q is a simplified schematic cross-section of a structure of a GIT device on a carrier wafer according to an example of the present invention.

FIG. 10R is a simplified schematic of an epitaxial structure of a HEMT device on a gallium and nitrogen containing substrate or a foreign substrate according to an example of the present invention.

FIG. 10S is a simplified schematic of an epitaxial structure of a HEMT device on a foreign substrate according to an example of the present invention.

FIG. 10T is a simplified schematic cross-section of a structure of a plurality of HEMT devices formed on a gallium and nitrogen containing or foreign substrate according to an example of the present invention.

FIG. 10U is a simplified schematic cross-section of a structure of a plurality of HEMT devices selectively bonded to multiple carrier wafers or printed circuit boards according to an example of the present invention.

FIG. 11A is a simplified cross-section schematic example of preparation of Schottky diode epitaxial device layers for die expanded transfer according to an embodiment of this invention.

FIG. 11B is a simplified cross-sectional schematic example of selective bonding of Schottky diode epitaxial device layers for die expansion according to an embodiment of this invention.

FIG. 11C is an example top-view schematic of conventional Schottky diode device.

FIG. 11D is an example cross-sectional view of a conventional Schottky diode device.

FIG. 11E is an example cross-sectional view of Schottky diode device according to this invention.

FIG. 11F is an example top-view schematic of conventional HEMT device.

FIG. 11G is an example cross-sectional view of a conventional HEMT device.

FIG. 11H is an example cross-sectional view of HEMT device according to this invention.

FIG. 12A is a simplified schematic example of electronic device integration onto a common carrier wafer according to this invention.

FIG. 12B is a simplified schematic example of electronic device integration onto a common carrier wafer according to this invention.

FIG. 12C is a simplified schematic example of electronic device integration onto a carrier wafer configured with device functionality according to this invention.

FIG. 12D is a simplified schematic cross-section of electronics devices integrated onto a high thermal conductivity substrate according to this invention.

FIG. 12E is a simplified schematic cross-section of a structure of electronic device integration on a carrier wafer according to this invention.

FIG. 12F is a simplified schematic cross-section of a structure of different electronic devices connected to a carrier wafer according to this invention.

FIGS. 12G and 12H illustrate a method by which a GaAs electronic device is formed and integrated with another electronic device on a carrier wafer according to this invention.

FIG. 13A illustrates an example of an integrated circuit formed with transferred GaN devices according to some embodiments.

FIG. 13B illustrates an example of an integrated circuit formed with transferred GaN devices according to some embodiments.

FIG. 13C illustrates an example of an integrated circuit formed with transferred GaN devices according to some embodiments.

FIG. 13D illustrates an example of an integrated circuit formed with transferred GaN devices using an intermediate substrate according to some embodiments.

FIG. 13E illustrates an example of an integrated circuit formed with a top-side contact process on an intermediate carrier according to some embodiments.

FIG. 13F illustrates an example of heterogeneous integration of III-IV electronic devices on CMOS substrates according to some embodiments.

FIG. 13G illustrates an example of integrating gallium and nitrogen containing electronic devices with CMOS circuitry according to some embodiments.

FIG. 13H illustrates an example of gallium and nitrogen containing electronic devices on diamond substrates according to some embodiments.

FIG. 13I illustrates an example of gallium and nitrogen containing electronic devices with improved thermal performance according to some embodiments.

FIGS. 15A-15C are simplified cross sectional diagrams illustrating a round robin sequence for transferring electronic devices from a donor substrate to a carrier substrate in accordance with some embodiments.

DETAILED DESCRIPTION

Figure 14A:
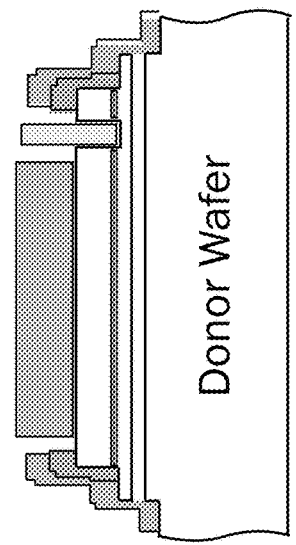
FIGS. 14A-14D are simplified cross sectional diagrams illustrating a process of selective anchor removal in accordance with some embodiments.

Embodiments of the invention provide methods for fabricating semiconductor devices based on gallium and nitrogen containing epitaxial materials grown on bulk gallium and nitrogen containing substrates or foreign substrates. Typically, these devices are fabricated using an epitaxial deposition on a gallium and nitrogen containing substrate or a foreign substrate followed by processing steps on the epitaxial substrate and overlying epitaxial material. In some embodiments, for the fabrication of devices such as electronic or power electronic devices, the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. By using a selective etch process, such as a photoelectrochemical (PEC) etch, combined with a bonding process, at least a portion of the epitaxial material can be transferred to one or more carrier wafers. Subsequently, the carrier wafer with the bonded epitaxial material is subjected to processing steps to form semiconductor devices including electronic devices such as Schottky diodes, p-n diodes, transistors, field effect transistors, bipolar junction transistors, high electron mobility transistors, solar cell devices, and the like. In other embodiments, the semiconductor devices are fully or partially formed in the epitaxial material before transfer to the carrier wafer or to an integrated circuit. In other embodiments, different types of semiconductor devices are configured on a common carrier using the selective bonding and etching process to form an integrated device or integrated circuit. In some embodiments the carrier wafer may include electrical circuitry and additional circuit elements such as transistors, resistors, capacitors, and/or inductors. What follows is a general description of the typical configuration and fabrication of some of these devices.

The invention involves a semiconductor device wafer composed of one or more sacrificial layers and one or more device layers overlying the surface region of a substrate wafer. The substrate wafer comprises a bulk gallium and nitrogen containing material such as GaN but can be others. In the example of a GaN substrate, the GaN substrate can be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the substrate surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

Current state of the art is to use bulk GaN substrates produced by growth of reduced defect density boules either by hydride vapor phase epitaxy or ammonothermal growth. In both cases, relatively large (e.g., typically two-inch diameter or greater) GaN c-plane substrates can be produced which have relatively low density of uniformly distributed defects. Growth on c-plane wafers is advantageous to growth on non-polar and semi-polar oriented GaN wafers only in the aspect that two-inch and greater diameter c-plane wafers are currently available and non-polar and semi-polar orientations are generally restricted in size due to their being crosscut from c-plane oriented boules.

Polar c-plane GaN wafers with no offcut are oriented primarily with the surface normal parallel to the [0001] direction of the wurtzite crystal lattice. The wafer may have an offcut, where the surface normal of the wafer is tilted towards one or a combination of the <11-20> or <10-10> directions. For an arbitrary offcut direction, one would normally specify the tilt towards orthogonal pairs of directions found in the <11-20> and <10-10> families. For example, [10-10] and [1-210] are orthogonal and might be used to specify an arbitrary offcut. In general, offcuts will be predominantly towards only one of the <11-20> or <10-10> directions, with only relatively small deviations. For example, a c-plane wafer may have an offcut between 0.1 and 10 degrees towards the [10-10] direction or it may have an offcut between 0.1 and 10 degrees towards the [11-20] direction. Though larger and smaller offcuts would be possible, a wafer with an offcut less than 0.1 degrees may be considered to be nominally on-axis.

Wafer offcut is important because it will determine both the density of atomic steps on the wafer surface as well as the termination of the step edges. Because an arbitrarily oriented surface of a crystal is likely to have a high surface energy, a crystal will tend to form an approximation of an inclined face using a collection of low energy planes. In general, an offcut c-plane wafer would result in a stepped surface comprised of [0001] step surfaces and step-edges composed of prismatic planes (i.e. (11-20) or (10-10)). Due to anisotropy in the crystal structure the number and configuration of dangling bonds at (11-20) step edges will be different from those at a (10-10) step edge. Since the direction and magnitude of the offcut controls the density and orientation of the step edges, a large amount of control over the chemical character of the substrate can be affected by offcut. Many growth processes such as chemical ordering, incorporation of volatile species and formation of stacking faults can be linked to the way atoms incorporate at the edges of steps. Therefore, proper selection of substrate offcut is critical to achieving the best epitaxial film quality.

Though c-plane wafers are larger than non-polar and semi-polar oriented wafers and offer a cost advantage, they have a severe drawback is in some semiconductor devices that result from internal fields originating from spontaneous and piezo induced polarization fields. By using nonpolar or semipolar GaN substrate orientations these internal fields can be reduced, and improved performance is possible. Similarly, in electronic devices there are aspects wherein having reduced internal fields or reduced polarization fields, improved performance can be formed.

The limited currently available size and increased cost of nonpolar and semipolar substrates limits their practicality for deployment in commercial semiconductor devices. A powerful breakthrough enabled by this present invention is the use of nonpolar or semipolar substrates at a low cost since die expansion can be used, substrates can be re-used, and the overlying epitaxy of small wafers can be transferred onto larger carrier wafers for device fabrication. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about $10E5$ $cm^{-2}$ and about $10E7$ $cm^{-2}$ or below $10E5$ $cm^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10E5$ $cm^{-2}$ and about $10E8$ $cm^{-2}$, in a direction that is substantially orthogonal or oblique with respect to the surface. As a consequence of the orthogonal or oblique orientation of the dislocations, the surface dislocation density is between about $10E5$ $cm^{-2}$ and about $10E7$ $cm^{-2}$ or below about $10E5$ $cm^{-2}$.

Of course, in some embodiments for the fabrication of electronic devices, the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In an embodiment, the gallium and nitrogen containing epitaxial materials are deposited on silicon wafers due to the low cost of silicon wafers and availability of large area silicon wafers; i.e. wafers having greater than 150 mm diameter.

Another advantage offered by the present invention is the ability to access either the Ga-face or the N-face of the gallium and nitrogen containing epitaxial device layers for device fabrication and contact formation. For example, if the epitaxial layers are grown on a Ga-face substrate the epitaxial layers will be formed terminating with a Ga-face surface. After the epitaxy is transferred to the carrier wafer for process the N-face will be exposed for process. The N-face may provide an advantage to the device such as an improved contact property or an improved behavior for the semiconductor layers. In the case where it is desirable to do the device fabrication with the Ga-face on the surface, semiconductor process steps may be performed on the epitaxial wafers prior to transfer to the carrier wafer. The order of the epitaxial stack can be arranged to provide the most benefit to the device.

Following the growth of the epitaxial layers on the bulk gallium and nitrogen containing substrate or the foreign substrate, the semiconductor device layers are separated from the substrate by a selective wet etching process such as a PEC etch configured to selectively remove the sacrificial layers and enable release of the device layers to one or more carrier wafers. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the one or more sacrificial layers on the sidewall of the mesa structure. As used herein, the term mesa region or mesa may be used to describe the patterned epitaxial material on the gallium and nitrogen containing substrate or the foreign substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is used to fully or partially remove the one or more sacrificial layers while leaving the semiconductor device layers intact. The resulting structure comprises undercut mesas comprised of epitaxial device layers. The undercut mesas correspond to dice from which semiconductor devices are or will be formed on. In some embodiments a protective passivation layer can be employed on the sidewall of the mesa regions to prevent the device layers from being exposed to the selective etch. In other embodiments a protective passivation is not needed because the device layers are not sensitive to the selective etch or measures are taken to prevent etching of sensitive layers such as shorting the anode and cathode. The undercut mesas corresponding to the dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In an embodiment, the PEC etching is deployed as the selective etch to remove the one or more sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolytes including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

The preparation of the epitaxy wafer is shown in FIG. 1A. A substrate 100 is overlaid by a buffer layer 101, a selectively removable sacrificial layer 107, a buffer layer 101, a collection of device layers 102 and a contact layer 103. The sacrificial region is exposed by etching of vias that extend below the sacrificial layer and segment the layers 101, 102, 103, and 107 into mesas. A layer composed of bonding media 108 is deposited overlaying the mesas. In some embodiments the bonding layer is deposited before the sacrificial layer is exposed. The sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 1A is a top down etch to expose the sacrificial layers, followed by a bonding metal deposition as shown in FIG. 1A. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention involving light emitting devices uses a sacrificial region with a higher bandgap than the active region such that both layers are absorbing during the bandgap PEC etching process.

In one embodiment, the active region can be prevented from etching during the bandgap selective PEC etch using an insulating protective layer on the sidewall, as shown in FIG. 1B. The device layers 102 are exposed using an etch and an etch resistant protect layer 104 is deposited overlaying the edges of the device layers such that they are not exposed to the etch chemicals. The sacrificial layer is then exposed by an etch of vias. A bonding layer 108 is deposited and a selective etch process is used to remove the sacrificial layers. In some embodiments the bonding layer is deposited after the selective etch. This workflow is advantageous when the device layers are susceptible to damage from the etch process used to remove the sacrificial layer. With the sacrificial region exposed, a bandgap selective PEC etch may be used to undercut the mesas. At this point, the selective area bonding process shown in FIG. 1B may be used to continue fabricating devices. In other embodiments involving electronic devices or power electronic devices that do not contain light emitting layers, special measures may not need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In one embodiment wherein the semiconductor device comprises electronic devices, PEC etching is achieved by electrically shorting the p-side of the p-n junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example, an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g., Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200 degrees Celsius. Temperatures should be high enough to promote diffusivity between the bonding layers at the bonding interface, but not so high as to promote unintentional alloying of individual layers in each metal stack. Application of pressure enhances the bond rate and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer, one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point and will form contact and a good bond under moderate pressures and temperatures. All glass bonds are relatively brittle, and require the coefficient of thermal expansion of the glass to be sufficiently close to the bonding partner wafers (i.e., the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercially available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the hydrocarbons, metal ions and other contaminants on the bonding surfaces. The bonding surfaces are then brought into contact and bonded at elevated temperature under applied pressure. In some cases, the surfaces are treated chemically with one or more of acids, bases or plasma treatments to produce a surface that yields a weak bond when brought into contact with the oxide surface. For example, the exposed surface of the gallium containing material may be treated to form a thin layer of gallium oxide, which being chemically similar to the oxide bonding surface, will bond more readily. Furthermore, the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases, the surfaces are treated chemically with one or more of acids, bases or plasma treatments to produce a surface that yields a weak bond when brought into contact with the oxide surface. Bonding is performed at elevated temperatures and elevated pressures.

In another embodiment, the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment, the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, gold, silver, aluminum, stainless steel, or steel.

In another embodiment, the carrier wafer is selected based on size and cost. For example, ingle crystal silicon wafers are available in diameters up to 300 mm or 12 inch and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention, the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount, the number of components and operations needed to build a packaged device is reduced, thereby lowering the cost of the final semiconductor device significantly.

In one embodiment of this invention, the bonding of the semiconductor device epitaxial material to the carrier wafer process can be performed prior to the selective etching of the sacrificial region and subsequent release of the gallium and nitrogen containing or foreign substrate. FIG. 2A is a schematic illustration of a process comprised of first forming the bond between the gallium and nitrogen containing epitaxial material formed on the gallium and nitrogen containing or foreign substrate and then subjecting the release material to the PEC etch process to release the gallium and nitrogen containing or foreign substrate. In this embodiment, an epitaxial material is deposited on the gallium and nitrogen containing or foreign substrate, such as a GaN substrate, through an epitaxial deposition process such as metal organic chemical vapor deposition (MOCVD), molecular beam epitaxy (MBE), or other. The epitaxial material consists of at least a sacrificial release layer and one or more device layers. In some embodiments a buffer layer is grown on between the substrate surface region and the sacrificial release region. In FIG. 2A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer.

The device layers can be comprised of many configurations suited for the specific semiconductor device. For example, a p-n diode device structure would be comprised of at least one or more n-type gallium and nitrogen containing layers and one or more p-type gallium and nitrogen layers. In yet another example, a Schottky diode device would be comprised of an n-type gallium and nitrogen containing layer and a very low doped layer intended to be an intrinsic layer. As used herein, the term intrinsic or intrinsic region is used to describe a semiconductor material with very low doping or carrier concentration. The intrinsic region can be formed by growing epitaxial materials that are not intentionally doped (NID), unintentionally doped (UID), or may be intentionally doped to compensate the unintentional background doping to reduce the carrier concentration. The intrinsic region is typically configured as an insulating region, a semi-insulating region, or a drift region. The epitaxial material is subjected to processing steps such as metal and dielectric deposition steps, lithography, and etching steps to form mesa regions with a bond region on the top. The carrier wafer 108 which is patterned with bond pads 107 is brought into contact with the bond layers 105 using a precision alignment process. After the bonding process is complete, the sacrificial etch is carried out. The selective etch of the sacrificial layer releases the mesas from the substrate.

In an embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In an example, FIG. 2B is a schematic representation of the "etch then bond" process flow where the mesas are retained on the substrate by controlling the etch process such that not all of the sacrificial layer is removed. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer. The selective etch process is carried out to the point where only a small fraction of the sacrificial layer is remaining, such that the mesas are retained on the substrate, but the unetched portions of the sacrificial layer are easily broken during or after the mesas are bonded to the carrier wafer.

A critical challenge of the etch then bond embodiment is mechanically supporting the undercut epitaxial device layer mesa region from spatially shifting prior to the bonding step. If the mesas shift, the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions are used to mechanically support the mesas to the gallium and nitrogen containing or foreign substrate prior to the bonding step wherein they are released from the gallium and nitrogen containing or foreign substrate and transferred to the carrier wafer.

Anchor regions are special features that can be designed into the photo masks which attach the undercut device layers to the gallium and nitrogen containing or foreign substrate, but which are too large to themselves be undercut, or which due to the design of the mask, contain regions where the sacrificial layers are not removed or these features may be composed of metals or dielectrics that are resistant to the etch. These features act as anchors, preventing the undercut device layers from detaching from the substrate and prevent the device layers from spatially shifting. This attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

In one embodiment the anchor region is formed by features that are wider than the device layer mesas such that the sacrificial region in these anchor regions is not fully removed during the undercut of the device layers. FIG. 2C is a schematic representation of the "etch then bond" process flow where the mesas are retained on the substrate by deposition of an etch resistant material acting as an anchor by connecting the mesas to the substrate. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photo-electrochemical etch process for selectively removing the sacrificial layer. A layer of etch resistant material 107, which may be composed of metal, ceramic, polymer or a glass, is deposited such that it connects to both the mesa and the substrate. The selective etch process is carried out such that the sacrificial layer is fully removed and only the etch-resistant layer 107 connects the mesa to the substrate.

FIG. 2D is a simplified schematic representation of the "etch then bond" process flow where the mesas are retained on the substrate by use of an anchor composed of epitaxial material. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer. The anchor is shaped such that during the etch, a small portion of the sacrificial layer remains unetched 108 and creates a connection between the undercut mesa and the substrate wafer.

In one embodiment the anchors are positioned either at the ends or sides of the undercut die such that they are connected by a narrow undercut region of material. FIG. 2E shows this configuration as the "peninsular" anchor. The narrow connecting material 304 is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators 305 and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material. It should be appreciated that the geometries shown in this and some other figures are not intended to represent actual electronic devices but are intended to highlight the process or features for transferring the epitaxy.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In an embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut, they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

FIG. 2E shows a top-view schematic of an example of a transferable mesa of GaN epitaxial material with a metal anchor bridging between the bond metal on the top of the mesa and the cathode metal in the etched field. FIG. 2F presents a cross-sectional view of an example of a transferable semiconductor device layer mesa at the location of a metal anchor. Here the mesa is formed by dry or wet chemical etching. After the sacrificial layer is removed by selective photochemical etching, the thick metal provides mechanical support to retain the mesa in position on the GaN wafer until the bonding to the carrier wafer is carried out.

FIG. 2G is a schematic representation of charge flow in a device using a metal anchor during PEC etching of the sacrificial layer. It is possible to selectively etch the sacrificial layer even if the pump light is absorbed by the active region. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the device layers. The buildup of carriers produces a potential difference that drives carriers through the metal anchors where they recombine. The flat band conditions in the sacrificial region result in a buildup of holes that result in rapid etching of the sacrificial layers.

The use of metal anchors have several advantages over the use of anchors made from the epitaxial device material. The first is density of the transferrable mesas on the donor wafer containing the epitaxial semiconductor device layers and the gallium and nitrogen containing bulk substrate or on the foreign substrate in the case of heteroepitaxy. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example, the cathode metal stack might consist of 100 nm of Ti to promote adhesion of the cathode metal stack and provide a good electrical contact to the n-type cladding. The cathode metal stack may then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention, the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment, the undercutting process is controlled such that the sacrificial layer is not fully removed.

In an embodiment, the semiconductor device epitaxy material with the underlying sacrificial region is fabricated into a dense array of mesas on the gallium and nitrogen containing bulk substrate or foreign substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the one or more sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 microns to about 500 microns or to about 5000 microns. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate or a foreign substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 microns to about 1000 microns or to about 5000 microns, but could be as large as about 3-10 mm or greater in the case where a large semiconductor device chip is required for the application. The larger second pitch could enable easier mechanical handling without the expense of the costly gallium and nitrogen containing substrate or the foreign substrate and epitaxial material, allow the real estate for additional features to be added to the semiconductor device chip such as bond pads that do not require the costly gallium and nitrogen containing substrate or the foreign substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate or the foreign substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch may be increased on the carrier wafer relative to the original epitaxy wafer. The arrangement of epitaxy material allows device components, which do not require the presence of the expensive gallium and nitrogen containing or foreign substrate and overlying epitaxy material often fabricated on a gallium and nitrogen containing or foreign substrate, to be fabricated on the lower cost carrier wafer, allowing for more efficient utilization of the gallium and nitrogen containing or foreign substrate and overlying epitaxy material.

FIG. 3A is a schematic representation of the die expansion process with selective area bonding according to the present invention. A device wafer is prepared for bonding in accordance with an embodiment of this invention. The wafer consists of a substrate 106, buffer layers 103, the fully removed sacrificial layer 109, the device layers 102, the bonding media 101, the cathode metal utilized in the PEC etch removal of the sacrificial layer and the anchor material 104. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer 107 and bond pads 108 at second pitch. The substrate is aligned to the carrier wafer such that a subset of the mesa on the gallium and nitrogen containing or foreign substrate with a first pitch align with a subset of bond pads on the carrier at a second pitch. Since the first pitch is greater than the second pitch and the mesas will comprise device die, the basis for die expansion is established. The bonding process is carried out and upon separation of the substrate from the carrier wafer the subset of mesas are selectively transferred to the carrier. The process is then repeated with a second set of mesas and bond pads on the carrier wafer until the carrier wafer is populated fully by epitaxial mesas. The gallium and nitrogen containing epitaxy substrate 201 can now optionally be prepared for reuse.

In the example depicted in FIG. 3A, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 3A. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1.

In one embodiment the bonding between the carrier wafer and the gallium and nitrogen containing or foreign substrate with epitaxial layers is performed between bonding layers that have been applied to the carrier and the gallium and nitrogen containing or foreign substrate with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process.

In one embodiment, the carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations and is not limited to the two iterations depicted in FIG. 3A. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing or foreign substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 micron and about 500 microns wide or between about 500 micron and about 3000 microns wide and between about 100 and about 3000 µm long. In an example, the second die pitch on the carrier wafer is between about 100 microns and about 200 microns or between about 200 microns and about 1000 microns or between about 1000 microns and about 3000 microns. In an example, the second die pitch on the carrier wafer is between about 2 times and about 50 times larger than the die pitch on the epitaxy wafer. In an example, electronic devices are fabricated on the carrier wafer before epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material, are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention, device dice from a plurality of epitaxial wafers are transferred to the carrier wafer such that each design width on the carrier wafer contains dice from a plurality of epitaxial wafers. When transferring die at close spacings from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

In some embodiments, multiple semiconductor device die are transferred to a single carrier wafer and placed within close proximity to each other. Dice in close proximity are preferably within one millimeter of each other, but could be other distances from each other.

In another embodiment of the invention, individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constraints.

By enabling the gallium and nitrogen containing epitaxial layer dice to be transferred to the carrier wafer at a larger pitch, the expensive gallium and nitrogen containing or foreign substrate and epitaxial device layers can be more efficiently utilized. Additionally, a larger area will be required on the carrier wafer than the area of the gallium and nitrogen containing or foreign substrate. For example, in a fixed expansion configuration, a carrier wafer with 4 times larger area will be required to receive all of the transferred device dice. This is powerful feature for GaN devices formed on GaN substrates since currently bulk GaN substrates are commercially available in 2" diameter with recent announcements of 4" diameter sampling. These wafer diameters are relatively small compared to the well-established silicon substrate technology, which are currently available at diameters up to 12". For example, a 12" substrate has 36 times the substrate area of a 2" GaN substrate and 9 times the substrate area of a 4" GaN substrate, which are not yet available in high volume. This drastically larger area enables device processing with orders of magnitude more device dies per wafer to provide massive reductions in manufacturing costs.

FIGS. 3B-3G are simplified side views of a bonding process using an intermediate substrate in an example of the present invention. When the intermediate substrate bonding process is used, die are transferred from a donor substrate, such as an epitaxial wafer, to an intermediate substrate member, and are subsequently transferred from the intermediate substrate member to the carrier wafer, instead of being transferred directly from the donor substrate to the carrier wafer. In this embodiment, an intermediate member and pick and place member, such as a pedestal collet, can be used to eliminate bonding interference issues associated with bonding multiple die from different donor wafers to a carrier wafer. In this approach, after the sacrificial release layer is removed, the die are weakly bond to the donor substrate. The donor wafer is pressed into an intermediate member which, for example, has a pressure sensitive adhesive tape or coating applied to the surface that adheres to each individual die and has an adhesion force strong enough to break the anchors on the donor wafer as the donor wafer and intermediate member are pulled apart. This process may provide a mass transfer of the die from the donor wafer to the intermediate member.

Substrates with low flatness and total thickness variation (TTV) may be used for the intermediate member. These include, but are not limited to, silicon substrates, sapphire substrates, glass substrates, and the like. In some instances, an ultraviolet (UV) release layer or laser-based release layer can be used with substrates of an appropriate transparency.

A wide variety of materials can be used for the adhesive layer. As an example, a double-sided thermal release tape may be directly applied to the intermediate member and be used as the temporary adhesive layer. These tapes are traditionally used in many areas of semiconductor processing and have very good thickness and thickness variation control. In addition, the initial adhesive strength of the tape can be tuned to overcome the failure strength of the anchors on the donor wafer to facilitate transfer from the donor wafer to the intermediate member. Upon heating, the adhesive strength drops so the transferred die can be removed in subsequent transfer steps. In addition to thermal release tapes, a double-sided UV release tape may be used in some embodiments. Similar to the thermal release tape, the adhesion strength of the UV release tape can be reduced to facilitate transfer from the intermediate member. Instead of using heat, the UV release tape is activated by exposing the tape to UV light to reduce the adhesion strength. When using UV release tape, a transparent substrate may be used so the tape can be exposed through the substrate. In other embodiments, the transferred die may be coupled to the intermediate member by a vacuum, van der waals forces, chemical bonds, and the like.

After the die are transferred to the intermediate member, the adhesion strength of the adhesion layer is reduced to enable subsequent pickup with, for example, a die attach collet. A pedestal style die attach collet may be used to selectively align and pick up die from the intermediate member. The pedestal feature is designed to avoid X, Y, and Z clearance issues with existing die from previous transfers or existing topography of the carrier wafers. In addition, these collets can be designed to pick up many die at one time allowing massive parallel die transfer to a receiving carrier substrate. After pickup from the intermediate member, the die are aligned and bonded to the carrier wafer. The pickup collets can be made of typical materials used in a variety of high temperature die attach processes. This process is repeated until all the die from the intermediate member are transferred to the carrier wafer.

FIGS. 3B-3G provide an example of how this approach may be used to transfer die from multiple donor wafers for an electronic device. Initially, epitaxial device layers are grown on each donor wafer. The donor wafers then go through device processing. FIG. 3B is a cross-sectional illustration of an intermediate substrate member having an adhesion layer thereon. There intermediate substrate member may comprise any of the materials of any of the substrates discussed herein, and/or may comprise another material. The adhesion layer on the intermediate substrate member may comprise any adhesive material known to those of skill in the art. In some embodiments, the adhesion layer comprises a UV or thermal release film.

FIG. 3C is a cross-sectional illustration of the intermediate substrate member having die attached thereto. For example, the die may be formed on the donor substrate using processing steps and methods discussed herein and/or otherwise known to those of skill in the art. The die may be attached to the donor substrate by anchors connected to the donor substrate and to the die. To transfer the die from the donor substrate to the intermediate substrate member, the donor substrate may be manipulated so as to cause the interface regions on the die to contact the adhesion layer on the intermediate substrate member. In some embodiments, causing the interface regions to contact the adhesion layer causes the interface regions to adhere to the adhesion layer with sufficient adhesion force. In some embodiments, while the interface regions contact the adhesion layer, the adhesion layer is activated, for example using UV radiation, heat, or by another method to cause the interface regions to adhere to the adhesion layer with sufficient adhesion force. Once the interface regions are adhered to the intermediate member with sufficient adhesion force, the donor substrate is removed. Because the adhesion force by which the interface regions adhered to the adhesion layer is sufficient, removing the donor substrate causes the anchors to mechanically fail, releasing the die from the donor substrate.

FIG. 3D is a cross-sectional illustration of the intermediate substrate member having die attached thereto and a pick and place member configured to remove die from the intermediate substrate member. The pick and place member may, for example, be part of a pick and place tool understood by those of skill in the art. To remove die from the intermediate substrate member, the pick and place member causes a particular die to be fixed thereto using, for example, mechanical, pneumatic, and/or electrostatic forces. Once a particular die is fixed to the pick and place member, the pick and place member is moved so as to cause the die fixed to the pick and place member to separate from the intermediate substrate member.

FIG. 3E is a cross-sectional illustration of the pick and place member placing the die fixed thereto onto a carrier wafer. The pick and place member is moved so as to align the interface region of the die fixed thereto with a particular target bond pad, for example, previously formed on the carrier wafer. To transfer the die from the pick and place tool to the carrier wafer, the pick and place member is moved so as to cause the interface (or bonding) region of the die attached thereto to contact the target bond pad. In some embodiments, causing the interface regions to contact the target bond pad causes the interface regions to adhere to the target bond pad. In some embodiments, while the interface region contacts the target bond pad, the connection is formed, for example, using UV radiation, heat, or by another method to cause the interface regions to adhere to the target bond pad. For example, heat may be applied so as to cause a metal of the interface region to melt with a metal of the target bond pad. Once the interface region is fixed to the target bond pad, the pick and place member is caused to release the die.

FIGS. 3F and 3G are cross-sectional illustrations of the pick and place member placing additional die on the carrier wafer. In the illustrated embodiment, the additional die are different from the die illustrated in FIG. 3E. In the illustrated embodiment, the die illustrated in FIG. 3E comprises a first electronic device, the die attached to the carrier wafer in FIG. 3F comprises a second electronic device, and the die attached to the carrier wafer in FIG. 3G comprises a third electronic device. In some embodiments, the electronic devices may be the same or different types of electronic devices.

FIG. 4A is an illustration of bondable area for various substrate dimensions on a 100 mm diameter carrier wafer 1001. In this configuration die expansion is happening in one dimension only. The number of transfers possible is fixed by the size and shape of the substrate relative to the carrier. Several examples are shown, including 25.4 mm diameter wafers 1002, 32 mm diameter wafers 1003 and 2×2 cm² substrates 1004. Other combinations of 50 mm diameter substrates 1006 and various carrier wafers are shown: 100 mm 1001, 200 mm 1005 and 300 mm 1007.

Selection of the carrier wafer with high thermal conductivity (e.g. greater than about 150 K/mW) can offer many advantages including enabling a lower device operation temperature, which typically improves device performance. In addition, a high thermal conductivity submount may also allow for the use of full thickness carrier wafers (e.g. >about 300 microns) with low thermal resistance, therefore no thinning of the carrier wafer is required. In another embodiment of the invention bar and die singulation is achieved with a sawing process. Sawing is a well-established process used for the singulation of semiconductor electronic devices.

In one example where high thermal conductivity is desired, SiC is used as both a carrier and a submount. SiC is available in wafer diameters up to about 150 mm from multiple vendors with high thermal conductivities ranging from about 360-490 W/mK depending on the crystal polytype and impurities. FIG. 4B shows a schematic of the cross section of a SiC wafer 402 used as both a carrier wafer and a submount for a resulting semiconductor device. Before transfer of the device material the SiC wafer is fabricated with a bonding layer 401 for attachment to the semiconductor device package. The opposing face of the SiC wafer is fabricated with a thin, electrically insulating layer 403, electrically conductive traces and wire-bond pads 405 and an electrically conductive bonding media 108. The device material is then transferred to the carrier via previously described processes. Electrical isolation layers 408 are fabricated on the wafer using standard lithographic processes and electrical contacts and wire bond pads 407 are made to the topside of the semiconductor device. The electrical isolation layers are important to ensure that the semiconductor devices are electrically isolated from the package or heat sink. The passivation layers can be located either between the carrier and the epitaxial die or on the side of the carrier wafer that is bonded to the package or heat sink. The individual dice can be singulated from the SiC wafer and packaged. SiC wafers are available in many polytypes including the hexagonal 4H and 6H as well as the cubic 3C. The high thermal conductivity of SiC allows for using commercially available SiC wafers as submounts without thinning. In some embodiments the insulating layer 403 is placed between the SiC substrate 402 and the bonding layer 401.

After completion of fabrication of the semiconductor devices on the carrier wafer, the carrier wafer will be diced into semiconductor devices in a die singulation process. In one embodiment of the invention, the die singulation is achieved with a sawing process. Sawing is a well-established process used for the singulation of semiconductor electronic devices. For example, DISCO saws can be used. DISCO's dicing saws cut semiconductor wafers (Si, GaAs, etc.), glass, ceramic, and a wide variety of other materials at a level of precision measured in micrometers.

In another embodiment of the invention, the die singulation is achieved by a scribing and breaking process. For example, a diamond or laser scribing process may be used wherein the carrier wafer is subjected a scribing. In the case of a laser scribing process, a UV laser may be used induce a scribe profile in the carrier substrate. The carrier substrate is then subjected to a breaking process.

In another embodiment of the invention, the die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment the carrier wafer is a device wafer itself. In one example, the carrier wafer is a silicon wafer and comprised of Si Complementary metal-oxide-semiconductor (CMOS) devices such as transistors.

Another advantage is that this invention transfers the epitaxial material comprising the semiconductor device from the substrate without destroying the substrate, thereby allowing the substrate to be reclaimed and reused for the growth of more devices. In the case when the substrate can be reclaimed many times, the effective substrate cost quickly approaches the cost of reclaim rather than the cost of the original substrate. Since it is both substrate size and substrate cost associated with many types of semiconductor devices formed on bulk gallium and nitrogen containing or foreign substrates preventing mainstream adoption, this technology overcomes this barrier and can enable mainstream adoption of highly cost sensitive electronic devices. Relative to more mature substrate technologies such as silicon, sapphire, and silicon carbide, GaN substrates are both small and expensive. This in itself is prohibitive to the realization of cost competitive electronic devices using conventional methods on bulk GaN substrates. By enabling both die expansion and substrate re-use, this invention breaks those barriers and allows for the fabrication of high-performance electronic devices at a competitive cost. Moreover, it enables the fabrication of GaN-based electronic devices at a fraction of the cost of electronic devices fabricated with conventional technologies where die expansion and substrate re-use are not possible.

In this invention the substrate can be recycled by reconditioning the surface to an epi-ready state using a combination of one or more of lapping, polishing and chemical mechanical polishing. Substrate recycling would require removal of any variation in wafer height remaining from the transfer process. FIG. 5 is an illustration of a substrate re-use process. According to this embodiment, an epitaxial substrate 504 is provided. An epitaxial process is carried out where a buffer-layer 503 is deposited with a thickness between 1 and 50 microns. The buffer layer consists of the same material as the substrate. The buffer layer is overlaid by the selectively removable sacrificial layer 502 and the device layers 501. The epitaxial wafer is then processed in accordance with embodiments of this invention including deposition of a cathode layer 505 and a bond layer 506. The selective etch and bond process is carried out such that the device mesas are transferred from the substrate. The substrate now consists of the original substrate, the buffer layer which is now patterned with mesas and trenches and the cathode layer. The cathode layer is optionally removed with etches. Finally, the buffer layer is removed by lapping, polishing and chemical mechanical polishing (CMP) such that the semiconductor substrate surface is returned to an equivalent condition as before the epitaxial growth. This removal would be achieved by lapping the wafer surface with abrasive slurry. The abrasive media would be one or more of silica, alumina, silicon carbide or diamond. Progressively smaller particle sizes would be used to first planarize the wafer surface and then remove subsurface damage to the crystal induced by the initial removal process. Initial particle sizes in the range of about 1-10 microns could be used, followed by about 0.1-100 micron. The final step would be a chemical mechanical polish (CMP), typically comprising of colloidal silica suspended in an aqueous solution. The CMP step would restore an "epi ready" surface typically characterized by low density of crystalline defects and low RMS (<about 10 nm) roughness. Final cleaning steps may include use of a surfactant to remove residual slurry as well as cleans to remove contaminants such as exposure to acidic solutions (for example HCl, HCl:HNO$_3$, HF and the like) and exposure to solvents (for example isopropanol, methanol and acetone). In some embodiments the buffer layer thickness is chosen such that the substrate thickness is not reduced after lapping and CMP. In other embodiments the substrate is allowed to thin during successive reclamations. In some embodiments, a substrate could be recycled more than 10 times without significant change in thickness. In some embodiments, the epitaxial layers include thick buffers that are subsequently removed by the recycling process, thereby leaving the net thickness of the substrate unchanged or even enabling the thickness to increase.

In addition to re-use of native epitaxial substrates, in many embodiments of the current invention the electronic devices are grown on a foreign substrate such as silicon carbide, sapphire, or silicon. In these embodiments, the foreign substrate can be prepared to re-use in a similar or different fashion than that described for preparing epitaxial substrates for re-use. In one example, the electronic device epitaxial layers are grown on SiC wafers and then after the growth wafer is subjected to the epitaxial transfer step, the SiC substrate is prepared for re-use by one or more steps of dry etching, wet etching, grinding, polishing, plasma treatments, or any other treatments.

With the basics of the invention describing the transfer of the gallium and nitrogen containing device layers from the bulk gallium and nitrogen containing or foreign substrate to a carrier wafer using a PEC undercut and bonding technology described that enables die expansion, leveraging of large carrier wafer size for fabrication, re-use of native gallium and nitrogen containing or foreign substrates, and integration of multiple functionality semiconductor devices, specific examples of device layers and the resulting devices can now be described. This invention can be extended to many and almost all semiconductor devices so the descriptions provided here are merely examples and there could be many others.

Of course, in some embodiments of the present invention the gallium and nitrogen containing epitaxial device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In an embodiment, the gallium and nitrogen containing epitaxial materials are deposited on silicon wafers due to the low cost of silicon wafers and availability of large area silicon wafers; i.e. wafers with greater than 150 mm diameter.

In an embodiment the mesa is fabricated with both a p-contact metal and an n-contact metal before transfer. This is shown in the left-hand side of FIG. 6A in a schematic cross-section. The carrier wafer 209 has two sets of bond pads 206 and 208 that correspond to the on-die p-type bond pad 205 and on-die n-type bond pad 207 respectively. To form the on-die n-type bond pad a via is etched through the p-type 204 and device region 203 layers exposing the n-type layer 202. In this depiction, the removed sacrificial layer is shown between the mesa layers and the epitaxial substrate 201. Metal anchors may be used in this embodiment, but are not shown in this depiction. The right-hand side of FIG. 6A shows the electronic device (or die) on the carrier wafer after bonding and transfer. The heights of the on-carrier bond-pads 206 and 208 are chosen to accommodate the difference in height on wafer of the p-type and n-type on-wafer bond pads 205 and 207 and accommodate for any plastic deformation of the bond pad. Bonding alignment tolerances using modern flip-chip bonders is on the order of several microns or less, which is adequate for aligning these types of vias in relatively large area mesas. Bonding in this way is advantageous because it allows for immediate on-wafer testing of devices after transfer. The n-type contact metal can be anything that forms a good electrical contact to n-type GaN, such as Al, Ti, Ni, among others.

In another embodiment the mesa is fabricated without an n-contact metal before transfer. This is shown in the left-hand side of FIG. 6B in a schematic cross-section. The carrier wafer 307 has only one set of bond pads 304 per die corresponding to the on-wafer p-side bond pad 306. The p-type 305, device region 303 and n-type 302 layers are only exposed at the edges of the mesa. In this depiction, the removed sacrificial layer is shown between the mesa layers and the epitaxial substrate 301. Metal anchors may be used in this embodiment but are not shown in this depiction. The right-hand side of FIG. 6B depicts in schematic-cross-section the electronic device on the carrier wafer after transfer. The surface of the n-type layer 308 is exposed. In this embodiment, an n-type contact would be deposited on the n-type surface in order to make electrical contact to the device. The n-contacts may also be formed from high aspect ratio metal features that are limited in area but efficiently and uniformly inject electrons into the n-type material such that the active region is uniformly illuminated. Electrical contact is made to the n-contact material using either inter-connect metal lines deposited with lithography or by wire bonding.

The device structures are prepared with a lithographically defined etch exposing forming mesas on the epitaxial wafer and exposing the sacrificial layers at the mesa sidewalls. P-type contact metals are deposited on top of the mesas and n-type contact metals are deposited in the trenches between mesas. Metal interconnects are deposited, which connect electrically the p-type and n-type contact metals. These interconnects both electrically short the device region p-n junction, thereby inhibiting PEC etching as described above, and function as non-etchable anchors that retain the mesas on the epitaxial wafer after sacrificial layers are fully removed by the selective PEC etch. The left half of FIG. 6C shows a schematic representation of the plan-view of a closely packed array of device die before transfer to a carrier wafer. The metal stack consists of the p-contact metal and bond pad 403, the metal anchors 404 and the cathode and n-contact metal 401. The p-contact and bond pad overlay the device mesa 402, which has a square shape. Note that the schematic is not drawn to scale. The mesas may be of the typical dimension of 1×1 mm2 found in many state-of-the-art high-power devices, while the trenches between wafers may only be 50 microns or less wide. The right half of FIG. 6C shows mesas (or electronic devices) after a 4-to-1 transfer process whereby one fourth of the die are transferred in a single bonding process (or "stamp"). The dotted square 405 indicates the area of the carrier wafer occupied by a single die. It is clear that, after singulation of the carrier wafer, a single device or die will be bonded to a chip at least four times the area of an individual mesa. The trench area between mesas on the epitaxial wafer will be similar to the kerf loss from sawing or dicing the wafer with a laser, therefore there is little improvement in epitaxial material utilization from transferring the die in this way. There are, however, other advantages. For example, the transfer can be carried out in a highly parallel way, with all die on a wafer transferred in a few (e.g. less than 10) bonding operations depending on the relative decrease of die density from substrate to carrier. This is an improvement over a pick-an-place method of transferring die to carrier wafers, which is a serial process. This advantage becomes more significant as the die area is reduced. In an example, one may wish to operate a device at a fixed current density using a fixed device area. A similar configuration could be advantageous for the elimination of waste heat in heat-sinks. Many small die that are widely spaced may be cooled more efficiently than a single die operated at the same power due to the finite thermal conductivity of the device packaging. It is obvious that in a pick-and-place based die transfer model the number of transfer operations required scales with the number die. This invention is therefore advantageous in that the number of transfer operations scales only with the change in die density from substrate to carrier wafer.

FIG. 6D shows a simplified schematic view of a two-dimensional matrix comprising different electronic devices or dice based on one embodiment of this invention. As shown in FIG. 6D, a first donor wafer with a first epitaxial material 401 is processed to form a first array of electronic devices 402, a second donor wafer with a second epitaxial material 403 is processed to form a second array of electronic devices 404, and a third donor with a third epitaxial material 405 is processed to form a third array of electronic devices 406. In one example, the first epitaxial material is formed of gallium and nitrogen containing material, the second epitaxial material is formed of gallium and nitrogen containing material, and the third epitaxial material is formed of gallium and arsenic containing material. After subjecting the donor wafers to the process according to this invention wherein a release layer is removed underneath the epitaxial material, at least a fraction of the first array of electronic devices 402, a fraction of the second array of electronic devices 404, and a fraction of the third array of electronic devices 406 are subsequently selectively transferred to the carrier wafer 407 in a predetermined pattern. The pattern shown in FIG. 6D is an example pattern where the first epitaxial material forming the first array of electronic devices, second epitaxial material forming the second array of electronic devices, and third epitaxial material forming the third array of electronic devices are arranged in a repeating pattern to create domains 408 comprising the electronic devices. The electronic devices may be driven via electrical drive current fed through an interconnection and drive circuitry system. This is one such example pattern that could be used for an electronic system, but there could be other shapes, sizes and arrangements of electronic devices.

In various embodiments of this invention the processing of the device structure is performed to various degrees before and after the epitaxial dice are transferred to the carrier. For example, prior to transfer to the carrier wafer a p-contact may be formed on the epitaxial material. After the epitaxial material is transferred to the carrier wafer, subsequent processing is performed to complete the process of forming devices from the epitaxial material. Process steps may include photolithography, etching processes, dielectric deposition processes, metal deposition processes, wet chemical techniques, and many others.

The carrier wafer is selected from any suitable material and preferably is configured with interconnection scheme to provide current to the electronic devices and can be configured with electronics to form drive circuitry including resistors, capacitors, and transistor such as a thin film transistor (TFT) network. For example, the primary carrier wafer could be selected from a silicon wafer, a sapphire wafer, an aluminum nitride wafer, a silicon nitride wafer, a silicon carbide wafer, a glass wafer, a group V semiconductor, a III-V semiconductor, or a II-VI semiconductor, or others such as a silicon substrate, sapphire substrate, glass substrate, glass ceramics substrate, quartz substrate, high purity fused silica substrate, silicon carbide substrate, aluminum nitride substrate, germanium substrate, aluminum oxynitride substrate, gallium arsenide substrate, diamond substrate, gallium nitride substrate, indium phosphide substrate, flexible member, circuit board member, silicon wafer with CMOS circuitry, silicon on insulator (SOI) substrate, or gallium nitride on silicon substrate. In a preferred embodiment the carrier wafer is selected from a silicon wafer. In one example the silicon wafer has interconnects or integrated circuit functionality defined within the wafer such as TFT technology. Such circuits or features defined in the silicon wafer can be formed using Complementary metal-oxide-semiconductor (CMOS) processing. By using such CMOS technology electronic devices such as metal-oxide-semiconductor field-effect transistors (MOSFETs) including nMOSFETs and pMOSFETS and others can be defined directly in the carrier wafer. CMOS processing is ideal for high volume, high circuit density, low-cost manufacturing of the logic gates and multiplexing drive circuitry used, for example, in an LED based display device. In an alternative embodiment including TFTs, the TFT substrate can be configured on a primary carrier wafer. In alternative embodiments, the carrier wafer material may be flexible or curved to create a flexible or curved device. Some examples of flexible materials would be polymers, other organic based materials, and thin metallic.

The bonding of the electronic devices to the carrier wafer is preferably comprised of conductive interfaces such as metallic interfaces like Au—Au bonds to provide an electrical pathway from the interconnection network formed on the carrier wafer to the anode or cathode of the electronic devices. In some examples of metallic interfaces, such as an Au—Au interface, the bonding can be performed using a thermo-compressive process such as using a wafer bonding tool. In alternative embodiments, the electronic devices are bonded using a reflow process such as using an indium reflow or a AuSn reflow. Using an indium reflow process may be advantageous to limit the temperature exposure of the electronic devices.

In certain embodiments, the control transistors are provided by a separate control circuit that is not fabricated on the backplane. This embodiment greatly reduces the complexity of the backplane as it becomes only a grid of electrically isolated conductor lines and bond pads. For example, if the backplane is glass or other insulating material, the transistors would be limited to those that can be fabricated on such substrates such as thin-film transistors (TFTs), organic or polymer semiconductor transistors and the like. In another example, if the backplane is a silicon wafer, then the transistors could be TFTs, bipolar junction-transistors (BJTs), metal-oxide-semiconductor field effect transistors (MOSFETs) or the like and could be fabricated either with deposition of semiconducting layers such as with TFTs or fabricated in the backplane wafer using diffusion processes as in BJTs or MOSFETs.

In a specific embodiment, the gallium and nitrogen containing or foreign substrate member is a bulk GaN substrate characterized by having a polar, nonpolar, or semipolar crystalline surface region, but can be others. In a specific embodiment, the bulk nitride GaN substrate comprises nitrogen and has a surface dislocation density between about $10E5$ cm$^{-2}$ and about $10E7$ cm$^{-2}$ or below $10E5$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN. In a specific embodiment, the device can be fabricated on a slightly off-cut polar substrate.

Given the high gallium and nitrogen containing or foreign substrate costs, difficulty in scaling up gallium and nitrogen containing or foreign substrate size, the inefficiencies inherent in the processing of small wafers, and potential supply limitations, it becomes extremely desirable to maximize utilization of available gallium and nitrogen containing or foreign substrate and overlying epitaxial material. In the fabrication of electronic devices, it is typically the case that minimum device size is determined by device components such as the wire bonding pads or mechanical handling considerations. Minimizing device size is critical to reducing manufacturing costs as smaller device sizes allow a greater number of devices to be fabricated on a single wafer in a single processing run. Through the deployment of the device (or die) expansion technology enabled by this invention, the current invention is a method of maximizing the number of devices which can be fabricated from a given gallium and nitrogen containing or foreign substrate and overlying epitaxial material by spreading out the epitaxial material onto a carrier In an example of die expansion for the electronic devices, the devices (or die) are transferred to a carrier wafer at a second pitch where the second pitch is greater than the first pitch. This invention enables fabrication of electronic devices at very high density on a substrate. This high density being greater than what is practical for electronic devices built using current fabrication processes. Electronic devices are transferred to a carrier wafer at a larger pitch (e.g., lower density) than they are found on the substrate. The carrier wafer can be made from a less expensive material, or one with material properties that enable using the carrier as a submount or the carrier wafer can be an engineered wafer including passivation layers and electrical elements fabricated with standard lithographic processes. Once transferred, the electronic devices can be processed using standard lithographic processes. The carrier wafer diameter can be chosen such that die from multiple gallium and nitrogen containing or foreign substrates can be transferred to a single carrier and processed into electronic devices in parallel using standard lithographic processes.

Semiconductor devices play a key role in power electronic systems. Most of these applications today are enabled by silicon. Silicon has been a dominant material for power management since the late 1950's. The advantages silicon had over earlier semiconductors included enabling new applications, higher reliability, ease of use, and lower cost. All of these advantages stemmed from the basic physical properties of silicon combined with a huge investment in manufacturing infrastructure and engineering. Wide bandgap (WBG) semiconductors, such as silicon carbide (SiC) and gallium nitride (GaN) possess material properties that are superior to silicon for power switching operation. They have been under extensive academic research for more than 20 years and promise to replace silicon with better energy efficiency. In the example of hybrid electric vehicles (HEV), existing silicon insulated gate bipolar transistors (IGBT) and diodes contribute about 20-25% of traction inverter system cost. Power devices based on GaN is one of the most anticipated technology candidates for the next-generation HEV power conversion application.

Recent technology advancements make its application prospect increasingly realistic, such as the availability of native and GaN-on-silicon substrates, development of normally-off gate structures, suppression of the current collapse phenomenon as well as the demonstration of high-voltage blocking capability. Perfectly, crystalline GaN has superior materials properties as compared to silicon for certain power electronics applications. It has a higher bandgap, higher thermal conductivity, higher breakdown voltage, and higher electron mobility than silicon. In principle, these properties should provide lower losses in high power conversion, higher frequency switching, and high operating temperatures.

FIG. 7A shows four key electrical properties of GaN, Si, and SiC— the primary three semiconductor materials currently competing for market share of the power management market. To compare potential device performance in a power transistor the best theoretical performance can be calculated. For power devices there are many characteristics that matter in the variety of power conversion systems available today. Five of the most important are conduction efficiency, breakdown voltage, switching efficiency, size and cost. Using the data from FIG. 7A (and adjusting for the enhanced mobility of the GaN 2DEG), the theoretical minimum device on-resistance (the inverse of conductivity) as a function of breakdown voltage and as a function of material is calculated. As shown in FIG. 7B, SiC and GaN both have a superior relationship between on-resistance and breakdown voltage due to their higher critical electric field strength. This allows devices to be smaller and the electrical terminals closer together for a given breakdown voltage requirement. GaN has an extra advantage compared with SiC as a result of the enhanced mobility of electrons in the 2DEG. This translates into a GaN device with a smaller size for a given on-resistance and breakdown voltage. Additional advantages of GaN over SiC include various device possibilities using GaN/AlGaN heterojunctions which are not available in the SiC and the ability to use AlGaN layers with larger band gaps to achieve higher critical electric fields than in GaN alone.

In the present invention a wide range of power electronic and transistor devices can be formed. Examples of such devices include Schottky diode devices, p-n diode devices, bipolar junction transistor (BJT), field-effect transistor (FET), metal-oxide-semiconductor field (MOSFET), junction field effect transistor (JFET), metal-semiconductor FETs (MESFETs), high-electron-mobility transistors (HEMT), insulated gate bipolar transistors (IGBT), heterojunction bipolar transistors (HBT), and others. In one embodiment, the semiconductor device layers are epitaxially grown on a bulk polar GaN substrate. In another embodiment, the semiconductor device layers are epitaxially grown on bulk nonpolar or semipolar GaN substrate, The devices may be processed to form contacts on the N-face and the Ga-face to provide performance enhancements and the layer structures may be ordered to provide an advantage over what is possible using conventional device fabrication technologies.

One embodiment of a GaN power device fabricated using this invention is a Schottky diode, which is a two terminal majority carrier device with a low forward voltage drop and a very fast switching action. When current flows through the Schottky diode device there is a small voltage drop across the diode terminals. An ideal Schottky diode should have characteristics such as high breakdown voltage, low leakage current, low forward voltage drop, low on-state resistance, and fast recovery. The keys characteristics for the fabrication of ideal Schottky diodes are the selection of a semiconductor material with optimum intrinsic properties, high crystal quality of the semiconductor layers, high quality intrinsic layer as a drift region with desired thickness, proper device structure and design, good edge termination, rectifying Schottky contact, low contact resistance for the ohmic contact, and high conductivity from the ohmic contacts to the intrinsic drift region. In GaN the majority carrier is most typically electrons, or n-type, but it can be p-type. As used herein, the term intrinsic or intrinsic region is used to describe a semiconductor material with very low doping or carrier concentration. The intrinsic region can be formed by growing epitaxial materials that are not intentionally doped (NID), unintentionally doped (UID), or may be intentionally doped to compensate the unintentional background doping to reduce the carrier concentration. The intrinsic region is typically configured as an insulating region, a semi-insulating region, or a drift region.

The three primary or typical device geometries for Schottky diodes are lateral, semi-vertical mesa, and vertical. The earliest GaN Schottky type diodes were lateral type, which suffer from very poor lateral conductivity. The semi-vertical structure comprises a mesa etched in GaN that is typically grown on a foreign substrate. A Schottky contact is made on top of the mesa and ohmic contacts are made on the etched region surrounding the mesa. These structures were improved over the lateral structures but were still limited by lateral conductivity of the epi layers connecting the ohmically contacted material to the intrinsic material. With the advent of native bulk GaN substrates truly vertical Schottky diodes were enabled. By forming epitaxial intrinsic layers on top of highly doped GaN substrates and forming the ohmic contact to the substrate and the Schottky contacts to the intrinsic layers extremely high performance Schottky diodes were realized. This invention enables a truly vertical Schottky diode without the need for a substrate in the final device by using a highly conductive metal region to laterally conduct to the ohmic contact in one configuration or laterally conduct to the Schottky contact region in an alternative configuration. Since the metal layers are highly conductive and can be made several microns thick (1-15 microns or more) the lateral conductivity will be extremely high and even improved over the conductivity in conventional vertical Schottky diodes, which include the resistance of the substrate.

In a typical embodiment, a metal-semiconductor junction is formed between a metal and a semiconductor, creating a Schottky barrier on the anode side of the device. Typical metals used for the Schottky barrier are molybdenum, platinum, palladium, nickel, gold, chromium, tungsten, but can be others. The metal region forming the Schottky barrier can be comprised of a metal stack comprising multiple layers including additional metals such as gold. The semiconductor layers forming the Schottky barrier are typically comprised of a gallium and nitrogen containing material such as GaN with very low conductivity (intrinsic region or drift) that is either unintentionally doped or may be intentionally doped with a species to compensate the unintentional background doping to achieve a low conductivity. These regions may be comprised of one or more layers, wherein the layers are comprised of GaN or other gallium and nitrogen containing alloys. These layers typically need to have carrier concentrations of less than about 1E17 cm-3, less than about 6E16 cm-3, less than about 3E16 cm-3, or less than about 1E16 cm-3. The thickness of this region is typically between 0.5 um and 10 um, or about 10 um and 30 um, or about 30 um and 60 um. Sometimes referred to as the standoff region or the drift region, the thickness and conductivity of this intrinsic region sets the resistivity of the device, which will determine power dissipation and maximum current density of the device. The thicker and less conductive this region, the larger the breakdown voltage or critical field of the device.

In this embodiment, the cathode side of the device is typically formed with an ohmic metal contact to a semiconductor layer. Typical metals used to form the ohmic contact include titanium or aluminum, but could be others. The ohmic metal contact region is often comprised of a metal stack that may include additional metals such as gold, nickel, palladium, or platinum. The ohmic contact is made to a semiconductor contact layer such as an n-type gallium and nitrogen containing material such as GaN. In one example the n-type GaN layer is doped with an n-type dopant such as silicon at a doping level between 5E17 and 1E20 $cm^{-3}$. The n-type contact layer may have a thickness between about 25 nm and 100 nm, or about 100 nm to about 1000 nm, or about 1000 nm to about 3000 nm.

In one embodiment of this invention, a Schottky diode epitaxial structure is grown on a bulk gallium and nitrogen containing substrate or a foreign substrate. The growth is comprised of an epitaxial technique such as metal organic vapor deposition (MOCVD), molecular beam epitaxy (MBE), hydride vapor phase epitaxy (HVPE), or a combination. As shown in FIG. 8A, the epitaxial structure would comprise a buffer layer grown on top of the substrate. The buffer layer could be comprised of GaN or n-type GaN. Overlying the buffer layer is a sacrificial region as described in this invention. Overlying the sacrificial region are the Schottky diode device layers comprising an n-type contact layer such as n-type GaN and a nominally unintentionally doped or intrinsic region comprised of gallium and nitrogen containing material such as GaN overlying the n-type contact region. In one embodiment the n-contact layer is comprised n-type GaN with a thickness of between 10 nm and 100 nm or 100 nm and 3000 nm. In this embodiment the n-type GaN may be silicon doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In one embodiment, a vertical Schottky diode device structure is formed from the epitaxial structure in FIG. 8A to result in a device structure as shown in FIG. 8B. In this embodiment, the epitaxial device material is prepared for transfer by forming a mesa region by etching the epitaxial material to a depth at or below the sacrificial region. The etching process can be a dry etching process such as a reactive ion etch (ME), an inductively coupled plasma (ICP) etch, a chemical assisted ion beam etch (CAIBE), or other. Typical gases used in the etching process may include Cl and/or BCl3. Alternatively, the mesa could be defined through a wet etch process. The wet etch process may be selective and designed to terminate on the sacrificial region. In this embodiment, a Schottky diode contact is formed on top of epitaxial region on the intrinsic GaN material, which can be done either before or after the mesa is defined. The metal for the Schottky diode contact may be selected, for example, from one of or a combination of molybdenum, platinum, palladium, nickel, gold, chromium, tungsten, or others. Overlying the Schottky contact is a bonding region, which in some embodiments may be, for example, an n-type contact of the Schottky diode comprised of a metal such as Al, Ti, or the like. The metal may be the same metal as used for the Schottky contact, or in an embodiment, additional layers of metal would be deposited over the Schottky contact metal. In one embodiment, this metal would be a gold metal to form a gold-gold bond. Metal depositions can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote higher conductivity or coverage.

In addition to preparing the epitaxial device layers for transfer step with the formation of the mesa structures with Schottky contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer, which in some embodiments may serve as, for example, an n-electrode or bond pad of the electronic device. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the Schottky barrier contact. Once bonded, with the substrate released the remainder of the device process would be performed to the epitaxial device material on carrier wafer. The subsequent processing steps would include forming the n-type ohmic contact with the exposed n-type contact layer on the top of the transferred mesa. The n-type ohmic contact would comprise a metal to allow for a good ohmic contact such as titanium or aluminum. In many embodiments a metal stack would be deposited with more than one layers wherein the ohmic contact layer is in contact with the n-type GaN layer and metals such as gold and/or nickel are configured in the stack overlying the ohmic contact layer. The ohmic metal deposition can be performed by conventional methods such as electron beam deposition, sputtering, or thermal evaporation, and annealing steps may be used to improve the contact quality.

Additional processing steps to form the completed Schottky diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the Schottky metal contact and/or the ohmic metal contact and may be configured to be partially or fully formed on the carrier wafer surrounding the epitaxial device material. Additionally, edge termination regions may be formed in the device. Edge termination is one of the key technologies for fabricating high voltage Schottky diodes, which functions to reduce the peak electric field along the Schottky contact edge and enhance the breakdown voltage. Several methods are used for edge termination including, but not limited to mesa, guard rings, field plates and high resistivity region by ion implantation can be used to reduce the chance of premature breakdown.

In an alternative embodiment of this invention, a Schottky diode epitaxial structure is grown on a bulk GaN substrate. The growth is comprised of an epitaxial technique such as metal organic vapor deposition (MOCVD), molecular beam epitaxy (MBE), hydride vapor phase epitaxy (HVPE), or a combination. As shown in FIG. 8C, the epitaxial structure in this embodiment would comprise a buffer layer grown on top of the substrate. The buffer layer could be comprised of GaN or n-type GaN. Overlying the buffer layer is a sacrificial region as described in this invention. Overlying the sacrificial region are the Schottky diode device layers comprising a nominally unintentionally doped or intrinsic region comprised of gallium and nitrogen containing material such as GaN and an n-type contact layer such as n-type GaN overlying the nominally unintentionally doped or intrinsic region. In one embodiment the intrinsic or drift region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the n-contact layer is comprised n-type GaN with a thickness of between 10 nm and 100 nm or 100 nm and 3000 nm. In this embodiment the n-type GaN may be silicon doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In an alternative embodiment of a vertical Schottky diode device structure according to this invention the epitaxial structure in FIG. 8C is fabricated to result in a device structure as shown in FIG. 8D. In this embodiment, the epitaxial device material is prepared for transfer by forming a mesa region by etching the epitaxial material to a depth at or below the sacrificial region. The etching process can be a dry etching process such as a reactive ion etch (ME), an inductively coupled plasma (ICP) etch, a chemical assisted ion beam etch (CAIBE), or other. Typical gases used in the etching process may include Cl and/or BCl3. Alternatively, the mesa could be defined through a wet etch process. The wet etch process may be selective and designed to terminate on the sacrificial region. In this embodiment an n-type ohmic contact is formed on top of epitaxial region on the n-type GaN contact layer, which can be done either before or after the mesa is defined. The n-type ohmic contact would comprise a metal to allow for a good ohmic contact such as titanium or aluminum. In many embodiments a metal stack would be deposited with more than one layers wherein the ohmic contact layer is in contact with the n-type GaN layer and metals such as gold and/or nickel are configured in the stack overlying the ohmic contact layer. Metal depositions can be performed by conventional methods such as electron beam deposition, sputtering, thermal evaporation, or others. In some embodiments electroplating may be used to deposit a thick layer of a conductive metal such as gold to promote higher conductivity or coverage. In addition to preparing the epitaxial device layers for transfer step with the formation of the mesa structures with Schottky contacts and comprising bonding regions, the carrier wafer would be prepared for the transfer process. Overlying or part of the ohmic contact is a bonding region comprised of a metal. The metal may be the same metal as used for the ohmic contact layer, or in an embodiment, additional layers of metal would be deposited over the ohmic contact metal to form a metal layer stack. In one embodiment, this metal would be comprised of at least a gold metal to form a gold-gold bond.

In addition to preparing the epitaxial device layers for transfer step with the formation of the mesa structures with ohmic contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer, which in some embodiments may serve as, for example, an n-electrode or bond pad of the electronic device. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process may comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the ohmic contact in contact with the n-type contact layer. Once bonded, with the substrate released the remainder of the device process would be performed to the epitaxial device material on carrier wafer. Depending on the embodiment, subsequent processing steps may include forming the Schottky barrier contact with an exposed portion of the intrinsic or nominally undoped layer on the top of the transferred mesa. The Schottky barrier metal contact would be selected from one of or a combination of molybdenum, platinum, palladium, nickel, gold, chromium, tungsten, or others. Metal depositions can be performed by conventional methods such as electron beam deposition, sputtering, or thermal evaporation.

Additional processing steps to form the completed Schottky diode device could include photolithography, deposition of dielectric passivation regions such as silicon dioxide or silicon nitride. Dry or wet etching or lift off of the dielectric may be necessary to form patterned regions. Additionally, larger bond pad regions may be formed to make the device addressable by electrical power sources. The bond pads would be connected to the Schottky metal contact and/or the ohmic metal contact and may be configured to be partially or fully formed on the carrier wafer surrounding the epitaxial device material. Additionally, edge termination regions may be formed in the device. Edge termination is one of the key technologies for fabricating high voltage Schottky diodes, which functions to reduce the peak electric field along the Schottky contact edge and enhance the breakdown voltage. Several methods are used for edge termination including, but not limited to mesa, guard rings, field plates and high resistivity region by ion implantation can be used to reduce the chance of premature breakdown. A final device structure of this embodiment including edge termination regions is shown in FIG. 8D.

In another embodiment of this invention, a p-n diode power electronic device can be fabricated. A p-n diode power device is a two terminal semiconductor diode based upon the p-n junction wherein the diode conducts current in only one direction, and it is made by joining a p-type semiconducting layer to an n-type semiconducting layer. Under a forward bias current flows with a small resistance and in reverse bias little or no current is able to flow until the diode reaches breakdown. Semiconductor p-n diodes have multiple uses including rectification of alternating current to direct current, detection of radio signals, emitting light and detecting light.

An ideal p-n diode should have characteristics such as high breakdown voltage, low leakage current, low forward voltage drop, low on-state resistance, and fast recovery. The key properties to form ideal p-n diodes are the selection of a semiconductor material with optimum intrinsic properties, semiconductor crystal quality with very low defect density, high quality intrinsic layer as drift region with desired thickness, a good ohmic n-contact for low n-type contact resistance for, a good ohmic p-contact for low p-type contact resistance; highly conductive n-type and p-type semiconductor layers sandwiching the intrinsic drift region, proper device structure and design, and good edge termination.

Two typical device geometries for p-n diodes are semi-vertical mesa and vertical. The GaN-based semi-vertical mesa structure typically comprises a mesa structure formed with an etching process into gallium and nitrogen containing material such as GaN. The epitaxial structure can be grown on either native GaN or foreign substrates such as silicon or sapphire. In one example an ohmic metal contact is made to a p-type semiconductor on the top of the mesa and an ohmic metal contact to an n-type semiconductor is made in the region surrounding the mesa. This performance can be limited in the semi-vertical mesa structure by the lateral conductivity of the n-type epi layers connecting n-type ohmic contact to the mesa region where current will flow vertically. With the introduction of native bulk GaN substrates truly vertical p-n diodes were enabled. By forming epitaxial intrinsic drift layers overly a highly doped GaN substrates, forming a p-type gallium and nitrogen containing layer such as p-type GaN overlying the intrinsic layer, and forming ohmic contacts to both the p-type region overlying the intrinsic region and the highly doped n-type substrates high performance truly vertical p-n diodes were realized. In this invention enables a truly vertical p-n diode device without the need for a substrate in the final device by using a highly conductive metal region to laterally conduct to the n-type contact in one configuration or laterally conduct to the p-type contact region in an alternative configuration. Since the metal layers such as gold are highly conductive and can be made several microns thick (1-10 microns or more) the lateral conductivity will be extremely high and even improved over the conductivity in conventional vertical Schottky diodes, which include the resistance of the substrate.

In a typical embodiment, a gallium and nitrogen containing semiconductor material intrinsic or unintentionally doped drift region is sandwiched between a p-type semiconductor gallium and nitrogen containing semiconductor such as GaN and n-type semiconductor gallium and nitrogen containing semiconductor such as GaN. A metal-semiconductor contact is formed between a metal and a p-type semiconductor such as p-GaN and a metal-semiconductor contact is formed between a metal and an n-type semiconductor such as n-type GaN. Typical metals used for a high-quality p-type contacts are palladium, platinum, nickel, or nickel-gold, but can be others. The metal region forming the Schottky barrier can be comprised of a metal stack comprising multiple layers including additional metals such as gold. The semiconductor unintentionally doped drift region or intrinsic region comprised of a gallium and nitrogen containing material such as GaN with very low conductivity is either unintentionally doped or may be intentionally doped with a species to compensate the unintentional background doping to achieve a low conductivity. These drift regions may be comprised of one or more layers, wherein the layers are comprised of GaN or other gallium and nitrogen containing alloys. These drift layers typically need to have carrier concentrations of less than about 1E17 cm-3, less than about 6E16 cm-3, less than about 3E16 cm-3, or less than about 1E16 cm-3. The thickness of this region is typically between 0.5 um and 10 um, or about 10 um and 30 um, or about 30 um and 60 um. The thicker and less conductive this region, the larger the breakdown voltage or critical field of the device.

FIGS. 8E and 8F illustrate a method by which the Schottky device is formed and partially or fully processed while attached to the gallium and nitrogen containing or foreign wafer, and by which the device is transferred to the carrier wafer.

FIG. 8E is a simplified schematic cross-section of a structure of a device according to an example of the present invention. As illustrated in FIG. 8E(a), the Schottky device is partially formed on the gallium and nitrogen containing substrate or a foreign substrate, and as illustrated in FIG. 8E(b), the device is further processed to form edge termination and a Schottky contact, for example comprising a Schottky metal, such as platinum, nickel and/or palladium. The edge termination and the Schottky contact are formed using techniques discussed herein and/or otherwise known to those of skill in the art.

FIG. 8F is a simplified schematic cross-section of the device of FIG. 8E after transfer to a carrier wafer according to an example of the present invention. The device may be attached to a Schottky contact electrode, which has been previously formed on the carrier wafer. The device may be additionally processed after being attached to the carrier wafer. In this example, after the device is attached to the carrier wafer, an n-type contact is formed on the exposed n+ GaN contact layer. The n-type contact may be formed using a metal such as aluminum and/or titanium using processes known to those of skill in the art, and/or discussed herein. The n-type contact may then be electrically connected with other contacts formed on the carrier wafer or formed on devices on the carrier wafer, for example using wire interconnects, wire bonding, or other methods.

Trench structures may be used in GaN vertical devices. For example, they may be used in trench metal-insulator-semiconductor barrier Schottky rectifiers, where they shield the high electric field at the Schottky contact. The addition of the trench enhances reverse blocking characteristics of the GaN Schottky rectifier by increasing breakdown voltage and reducing leakage current at high reverse biases.

Trench structures can also be used in other vertical GaN power devices such as current aperture vertical electron transistors and MOSFETs. Normally-off GaN transistors also benefit from the addition of trenches. The current-aperture vertical electron transistor is a normally-on device that combines the high conductivity of a two-dimensional electron gas channel at the AlGaN/GaN heterojunction with the improved field distribution of a vertical structure. Normally-off operation is possible by switching to a trenched semi-polar gate. Using a trench with the vertical GaN MOSFET combines normally-off operation with low on-resistance.

FIGS. 8G and 8H illustrate a method by which the device, a metal-insulator-semiconductor barrier Schottky rectifier, is formed and partially or fully processed while attached to the gallium and nitrogen containing or foreign wafer, and by which the device is transferred to the carrier wafer.

FIG. 8G is a simplified schematic cross-section of a vertical metal-insulator semiconductor barrier Schottky rectifier according to an example of the present invention. The rectifier is formed on a gallium and nitrogen containing substrate or a foreign substrate using techniques discussed herein and/or otherwise known to those of skill in the art.

FIG. 8H is a simplified schematic cross-section of the rectifier illustrated in FIG. 8G attached to a carrier wafer according to an example of the present invention. The rectifier is attached to a bond pad which may serve as a cathode electrode comprising a metal, such as aluminum or titanium, where the cathode has been previously formed on the carrier wafer. The rectifier may be additionally processed after being attached to the carrier wafer. In this example, the exposed GaN drift layer is etched to form trenches, which are subsequently processed so as to have a dielectric layer formed therein, as illustrated. The dielectric layer may comprise any dielectric material, such as those discussed herein, or otherwise known to those of skill in the art. The processing may also include forming an anode contact in the trenches. The material of the anode contact may for example, be a metal or another conductor, such as those discussed herein, or otherwise known to those of skill in the art. As understood by those of skill in the art, the trenches enhance the reverse current blocking characteristics of the rectifier, reduce the leakage current at high reverse biases, and increase or double the breakdown voltage reverse biased.

FIGS. 8I and 8J illustrate a method by which the device, a metal-insulator-semiconductor barrier Schottky rectifier, is formed and partially or fully processed while attached to the gallium and nitrogen containing or foreign wafer, and by which the device is transferred to the carrier wafer.

FIG. 8I is a simplified schematic cross-section of a structure of a device according to an example of the present invention. As illustrated in FIG. 8I(a), the device is partially formed on the gallium and nitrogen containing substrate or a foreign substrate, and as illustrated in FIG. 8I(b), the device is further processed to form trenches with dielectric layers and an anode contact, for example, using materials and techniques discussed elsewhere herein and/or otherwise known to those of skill in the art.

FIG. 8J is a simplified schematic cross-section of the device of FIG. 8I transferred to a carrier wafer according to an example of the present invention. The device is attached to a bonding pad, which may serve as an anode electrode of the metal-insulator-semiconductor barrier Schottky rectifier device, comprising a metal, such as aluminum or titanium, where the anode electrode has been previously formed on the carrier wafer. The device may be additionally processed after being attached to the carrier wafer. In this example, after the device is attached to the carrier wafer, a cathode n-type contact is formed on the exposed n+ GaN contact layer. The cathode contact may be formed using a metal such as aluminum and/or titanium according to processes known to those of skill in the art and/or discussed herein. The cathode contact may then be electrically connected with other contacts formed on the carrier wafer or formed on devices on the carrier wafer, for example using wire interconnects, wire bonding, or other methods.

In one embodiment of this invention, a p-n diode epitaxial structure is grown on a bulk gallium and nitrogen containing substrate such as GaN or a foreign substrate. The growth is comprised of an epitaxial technique such as metal organic vapor deposition (MOCVD), molecular beam epitaxy (MBE), hydride vapor phase epitaxy (HVPE), or a combination. As shown in FIG. 9A, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the p-n diode device layers comprising an n-type contact layer such as n-type GaN, a nominally unintentionally doped drift region or intrinsic region comprised of gallium and nitrogen containing material such as GaN overlying the n-type contact region, and an p-type contact layer such as p-type GaN overlying the nominally unintentionally doped drift region or intrinsic region comprised of gallium and nitrogen containing material. In one embodiment the n-contact layer is comprised n-type GaN with a thickness of between 10 nm and 100 nm or 100 nm and 3000 nm. In one embodiment the n-type GaN may be silicon doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the p-contact layer is comprised p-type GaN with a thickness of between 10 nm and 100 nm or 100 nm and 3000 nm. In one embodiment the p-type GaN may be magnesium doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In one embodiment, a vertical p-n diode device structure is formed from the epitaxial structure in FIG. 9A to result in a device structure as shown in FIG. 9B. In this embodiment, the epitaxial device material is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAIBE), or other. Typical gases used in the etching process may include Cl and/or BCl3. Alternatively, the mesa could be defined through a wet etch process. The wet etch process may be selective and designed to terminate on the sacrificial region. In this embodiment, an ohmic contact is formed on top of epitaxial region on the p-type gallium and nitrogen containing material, which can be done either before or after the mesa is defined. The metal for the ohmic contact would be selected, for example, from one of or a combination of platinum, palladium, nickel, nickel-gold, gold, or others. Overlying the p-type contact is a bonding region comprised of a metal, which in some embodiments may be, for example, an p-type contact of the p-n diode device comprised of a metal such as Al, Ti, or the like. The metal may be the same metal as used for the ohmic p-type contact, or in an embodiment, additional layers of metal may be deposited over the p-type contact metal. In one embodiment, this metal would be a gold metal to form a gold-gold bond. Metal depositions can be performed by conventional methods such as electron beam deposition, sputtering, thermal evaporation, or others, and annealing steps may be used to enhance the contact properties. In some embodiments electroplating may be used to deposit a thick layer of a conductive metal such as gold to promote higher conductivity or coverage.

In addition to preparing the epitaxial device layers for the transfer step with the formation of the mesa structures with p-type contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer, which in some embodiments may serve as, for example, an p-electrode or bond pad of the electronic device. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the p-type contact. Once bonded, with the substrate released the remainder of the device process would be performed to the epitaxial device material on the carrier wafer. The subsequent processing steps would include forming the n-type ohmic contact with the exposed n-type semiconductor contact layer on the top of the transferred mesa. The n-type contact would comprise a metal to allow for a good ohmic contact such as titanium or aluminum. In many embodiments a metal stack would be deposited with more than one layers wherein the n-type contact layer is in contact with the n-type GaN layer and metals such as gold, nicker, platinum, or palladium are configured in the stack overlying the n-type contact layer. The n-type metal deposition can be performed by conventional methods such as electron beam deposition, sputtering, or thermal evaporation, and annealing steps may be used to improve the contact quality.

Additional processing steps to form the completed p-n diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the p-type contact metal and/or the n-type contact metal and may be configured to be partially or fully formed on the carrier wafer surrounding the epitaxial device material. Additionally, edge termination regions may be formed in the device. Edge termination is one of the key technologies for fabricating high voltage diodes, which functions to reduce the peak electric field along the contact edge and enhance the breakdown voltage. Several methods are used for edge termination including, but not limited to mesa, guard rings, field plates and high resistivity region by ion implantation can be used to reduce the chance of premature breakdown.

In an alternative embodiment of this invention, a p-n diode epitaxial structure is grown on a bulk gallium and nitrogen containing substrate such as GaN or a foreign substrate. The growth is comprised of an epitaxial technique such as metal organic vapor deposition (MOCVD), molecular beam epitaxy (MBE), hydride vapor phase epitaxy (HVPE), or a combination. The epitaxial structure according to this embodiment, as shown in FIG. 9C, comprises a buffer layer grown on top of the GaN substrate. The buffer layer could be comprised of GaN or n-type GaN. Overlying the buffer layer is a sacrificial region as described in this invention. Overlying the sacrificial region are the p-n diode device layers comprising an p-type contact layer such as p-type GaN, a nominally unintentionally doped drift region or intrinsic region comprised of gallium and nitrogen containing material such as GaN overlying the p-type contact region, and an n-type contact layer such as n-type GaN overlying the nominally unintentionally doped drift region or intrinsic region comprised of gallium and nitrogen containing material. In one embodiment the p-contact layer is comprised p-type GaN with a thickness of between 10 nm and 100 nm or 100 nm and 3000 nm. In one embodiment the p-type GaN may be magnesium doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the n-contact layer is comprised n-type GaN with a thickness of between 10 nm and 100 nm or 100 nm and 3000 nm. In one embodiment the n-type GaN may be silicon doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In this embodiment, a vertical p-n diode device structure is formed from the epitaxial structure in FIG. 9C to result in a device structure as shown in FIG. 9D. In this embodiment, the epitaxial device material is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAIBE), or other. Typical gases used in the etching process may include Cl and/or BCl3. Alternatively, the mesa could be defined through a wet etch process. The wet etch process may be selective and designed to terminate on the sacrificial region. In this embodiment, an ohmic contact is formed on top of epitaxial region on the n-type gallium and nitrogen containing material, which can be done either before or after the mesa is defined. The metal for the ohmic contact would be selected, for example, from one of or a combination of aluminum, titanium, platinum, palladium, nickel, nickel-gold, gold, or others. Overlying the n-type contact is a bonding region comprised of a metal, which in some embodiments may be, for example, an n-type contact of the p-n diode device comprised of a metal such as Al, Ti, or the like. The metal may be the same metal as used for the ohmic n-type contact, or in an embodiment, additional layers of metal may be deposited over the n-type contact metal. In one embodiment, this metal would be a gold metal to form a gold-gold bond. Metal depositions can be performed by conventional methods such as electron beam deposition, sputtering, thermal evaporation, or others, and annealing steps may be performed. In some embodiments electroplating may be used to deposit a thick layer of a conductive metal such as gold to promote higher conductivity or coverage.

In addition to preparing the epitaxial device layers for the transfer step with the formation of the mesa structures with n-type contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer, which in some embodiments may serve as, for example, an n-electrode or bond pad of the electronic device. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the n-type contact. Once bonded, with the substrate released the remainder of the device process would be performed to the epitaxial device material on the carrier wafer. The subsequent processing steps would include forming the p-type ohmic contact with the exposed p-type semiconductor contact layer on the top of the transferred mesa. The p-type ohmic contact would comprise a metal to allow for a good ohmic contact such as platinum, palladium, nickel, nickel-gold, or a combination thereof. In many embodiments a metal stack would be deposited with more than one layers wherein the ohmic contact layer is in contact with the n-type GaN layer and metals such as gold, nickel, platinum, or palladium are configured in the stack overlying the contact layer. The p-type contact metal deposition can be performed by conventional methods such as electron beam deposition, sputtering, or thermal evaporation, and annealing steps may be used to improve the contact quality.

Additional processing steps to form the completed p-n diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the p-type contact metal and/or the n-type contact metal and may be configured to be partially or fully formed on the carrier wafer surrounding the epitaxial device material. Additionally, edge termination regions may be formed in the device. Edge termination is one of the key technologies for fabricating high voltage diodes, which functions to reduce the peak electric field along the contact edge and enhance the breakdown voltage. Several methods are used for edge termination including, but not limited to mesa, guard rings, field plates and high resistivity region by ion implantation can be used to reduce the chance of premature breakdown.

FIGS. 9E and 9F illustrate a method by which the p-n diode device is formed and partially processed while attached to the gallium and nitrogen containing or foreign wafer, and by which the device is transferred to the carrier wafer.

FIG. 9E is a simplified schematic cross-section of a structure of a device according to an example of the present invention. As illustrated, in FIG. 9E(a), the device is partially formed on the substrate, and as illustrated in FIG. 9E(b), the device is further processed to form edge termination and a p-type contact, for example comprising a metal, such as platinum, nickel and/or palladium. The edge termination and p-type contact are formed using techniques discussed herein and/or otherwise known to those of skill in the art.

FIG. 9F is a simplified schematic cross-section of the device of FIG. 9E after transfer to a carrier wafer according to an example of the present invention. The device is attached to a contact electrode, which has been previously formed on the carrier wafer. The device may be additionally processed after being attached to the carrier wafer. In this example, after the device is attached to the carrier wafer, an n-type contact is formed on the exposed n+ GaN contact layer. The n-type contact may be formed using a metal such as aluminum and/or titanium using processes known to those of skill in the art and/or discussed herein. The n-type contact may then be electrically connected with other contacts formed on the carrier wafer or formed on devices on the carrier wafer, for example using wire interconnects, wire bonding, or other methods.

FIGS. 9G and 9H illustrate a method by which the device, a vertical SITs device, is formed and partially or fully processed while attached to the gallium and nitrogen containing or foreign wafer, and by which the device is transferred to the carrier wafer.

FIG. 9G is a simplified schematic cross-section of a vertical SITs device according to an example of the present invention. The device is formed on a gallium and nitrogen containing substrate or a foreign substrate using techniques discussed herein and/or otherwise known to those of skill in the art.

FIG. 9H is a simplified schematic cross-section of the device illustrated in FIG. 9G after transfer to a carrier wafer according to an example of the present invention. The device may be attached to a bonding pad that serves as a drain contact comprising, for example, a metal, such as aluminum or titanium, where the drain contact has been previously formed on the carrier wafer. The device may be additionally processed after being attached to the carrier wafer. In this example, the exposed n+ GaN contact layer and the GaN drift layer are etched to form recess regions where gate contact layers are formed as illustrated. The gate contact layers may comprise any conductive material, such as those discussed herein or otherwise known to those of skill in the art. The further processing may also include forming a source contact on the n+ GaN contact layer. The material of the source contact may for example, be a metal or another conductor, such as those discussed herein or otherwise known to those of skill in the art.

FIGS. 9I and 9J illustrate a method by which the device, a vertical SITs device, is formed and partially or fully processed while attached to the gallium and nitrogen containing or foreign wafer, and by which the device is transferred to the carrier wafer.

FIG. 9I is a simplified schematic cross-section of a structure of a device according to an example of the present invention. As illustrated in FIG. 9I(a), the device is partially formed on the substrate, and as illustrated in FIG. 9I(b), the device is further processed by etching the exposed n+ GaN contact layer and the GaN drift layer to form the recess regions where gate contact layers are formed as illustrated. The gate contact layers may comprise any conductive material, such as those discussed herein or otherwise known to those of skill in the art. The further processing may also include forming a source contact on the n+ GaN contact layer. The material of the source contact may, for example, be a metal or another conductor, such as those discussed herein or otherwise known to those of skill in the art.

FIG. 9J is a simplified schematic cross-section of the device of FIG. 9I transferred to a carrier wafer according to an example of the present invention. The device is attached to source and gate electrodes comprising a metal, such as aluminum or titanium, where the source and gate electrodes have been previously formed on the carrier wafer. The device may be additionally processed after being attached to the carrier wafer. In this example, after the device is attached to the carrier wafer, a drain contact is formed on the exposed n+ GaN contact layer. The drain contact may be formed using a metal such as aluminum and/or titanium using processes known to those of skill in the art and/or discussed herein. The drain contact may then be electrically connected with other contacts formed on the carrier wafer or formed on devices on the carrier wafer, for example using wire interconnects, wire bonding, or other methods.

FIGS. 9K and 9L illustrate a method by which the device, a vertical CAVET device, is formed and partially or fully processed while attached to the gallium and nitrogen containing or foreign wafer, and by which the device is transferred to the carrier wafer.

FIG. 9K is a simplified schematic cross-section of a structure of a device according to an example of the present invention. As illustrated in FIG. 9K(a), the device is partially formed on the substrate. In addition, as illustrated in FIG. 9K(b), the device is further processed to form current blocking layers as illustrated. The current blocking layers may be formed using, for example, an ion implant process, a selective p-GaN growth process, or another process, such as those discussed herein or otherwise known to those of skill in the art. As illustrated in FIG. 9K(c), the further processing also includes forming a second GaN drift layer and an n+ GaN layer over the previously formed GaN drift layer and the current blocking layers. The second GaN drift layer and the n+ GaN layer may be formed using materials and processes, such as those discussed herein or otherwise known to those of skill in the art.

FIG. 9L is a simplified schematic cross-section of the device of FIG. 9K transferred to a carrier wafer according to an example of the present invention. The device is attached to a bonding pad, which may serve as a drain electrode comprising, for example, a metal, such as aluminum or titanium, where the drain electrode has been previously formed on the carrier wafer. The device may be additionally processed after being attached to the carrier wafer. In this example, the exposed p+ GaN layer, the AlGaN layer, and the GaN drift layer are etched to form recesses where source contact layers are formed as illustrated. The source contact layers may be formed using materials and processes, such as those discussed herein or otherwise known to those of skill in the art. The further processing may also include forming a gate contact on the p+ GaN contact layer. The gate contact may be formed using materials and processes, such as those discussed herein or otherwise known to those of skill in the art.

FIGS. 9M and 9N illustrate a method by which the device, a vertical CAVET device, is formed and partially or fully processed while attached to the gallium and nitrogen containing or foreign wafer, and by which the device is transferred to the carrier wafer.

FIG. 9M is a simplified schematic cross-section of a structure of a device according to an example of the present invention. As illustrated in FIG. 9M(a), the device is partially formed on the substrate. In addition, as illustrated in FIG. 9M(b), the device is further processed to form current blocking layers as illustrated. The current blocking layers may be formed using, for example, an ion implant process, a selective p-GaN growth process, or another process, such as those discussed herein or otherwise known to those of skill in the art. As illustrated in FIG. 9M(c) the further processing also includes forming a second GaN drift layer, an AlGaN layer, and a p+ GaN layer over the previously formed GaN drift layer and the current blocking layers. The second GaN drift layer, the AlGaN layer, and the p+ GaN layer may be formed using materials and processes, such as those discussed herein or otherwise known to those of skill in the art.

As illustrated in FIG. 9N(a), the further processing also includes etching the exposed p+ GaN layer, the AlGaN layer, and the GaN drift layer to form recesses where source contact layers are formed as illustrated. The source contact layers may be formed using materials and processes, such as those discussed herein or otherwise known to those of skill in the art. The further processing also includes forming a gate contact on the p+ GaN contact layer. The gate contact may be formed using materials and processes, such as those discussed herein or otherwise known to those of skill in the art.

FIG. 9N(b) is a simplified schematic cross-section of the device of FIGS. 9M and 9N(a) transferred to a carrier wafer according to an example of the present invention. The device is attached to gate and source electrodes comprising, for example, a metal, such as aluminum or titanium, where the gate and source electrodes have been previously formed on the carrier wafer. The device may be additionally processed after being attached to the carrier wafer. In this example, a drain electrode bond pad is formed on the n+ GaN layer. The drain electrode may be formed using materials and processes, such as those discussed herein or otherwise known to those of skill in the art.

FIGS. 9O and 9P illustrate a method by which the device, a vertical MOSFET device, is formed and partially or fully processed while attached to the gallium and nitrogen containing or foreign wafer, and by which the device is transferred to the carrier wafer.

FIG. 9O is a simplified schematic cross-section of a structure of a device according to an example of the present invention. The device is formed on a gallium and nitrogen containing substrate or a foreign substrate using materials and processes such as those discussed herein or otherwise known to those of skill in the art.

FIG. 9P is a simplified schematic cross-section of the device of FIG. 9O after transfer to a carrier wafer according to an example of the present invention. The device may be attached to bonding pad that serves as a drain electrode comprising, for example, a metal, such as aluminum or titanium, where the drain electrode has been previously formed on the carrier wafer. The device may be additionally processed after being attached to the carrier wafer. In this example, the exposed n+ GaN layer, the p+ GaN layer, and the GaN drift layer are etched to form a trench where a dielectric layer and a gate contact are formed therein as illustrated. The dielectric layer and the gate contact may be formed using materials and processes, such as those discussed herein or otherwise known to those of skill in the art. The further processing may also include forming source contacts on the n+ GaN layer. The source contacts may be formed using materials and processes, such as those discussed herein or otherwise known to those of skill in the art.

FIGS. 9Q and 9R illustrate a method by which the device, a vertical MOSFET device, is formed and partially or fully processed while attached to the gallium and nitrogen containing or foreign wafer, and by which the device is transferred to the carrier wafer.

FIG. 9Q is a simplified schematic cross-section of a structure of a device according to an example of the present invention. As illustrated in FIG. 9Q(a), the device is partially formed on the substrate, and as illustrated in FIG. 9Q(b), the device is further processed by etching the exposed n+ GaN layer, the p+ GaN layer, and the GaN drift layer to form a trench where a dielectric layer and a gate contact are formed therein as illustrated. The dielectric layer and the gate contact may be formed using materials and processes, such as those discussed herein or otherwise known to those of skill in the art. The processing also includes forming source contacts on the n+ GaN layer. The source contacts may be formed using materials and processes, such as those discussed herein or otherwise known to those of skill in the art.

FIG. 9R is a simplified schematic cross-section of the device of FIG. 9Q after transfer to a carrier wafer according to an example of the present invention. The device may be attached to gate and source electrodes comprising, for example, a metal, such as aluminum or titanium, where the gate and source electrodes have been previously formed on the carrier wafer. The device maybe additionally processed after being attached to the carrier wafer. In this example, the additional processing includes forming a drain contact on the n+ GaN contact layer. The drain contact may be formed using materials and processes, such as those discussed herein or otherwise known to those of skill in the art. Similar processing could be used for a FIN MOSFET (FINFET) or other electronic devices.

FIGS. 9S and 9T illustrate a method by which the device, a trench CAVET device, is formed and partially or fully processed while attached to the gallium and nitrogen containing or foreign wafer, and by which the device is transferred to the carrier wafer.

FIG. 9S is a simplified schematic cross-section of a structure of a device according to an example of the present invention. As illustrated in FIG. 9S(a), the device is partially formed on the substrate. In addition, as illustrated in FIG. 9S(b), the device is further processed such that the exposed p GaN layer is etched to form a trench. In addition, as illustrated in FIG. 9S(c), the device is further processed such that a GaN layer, an AlGaN layer, and a dielectric layer are formed as illustrated. The GaN layer, the AlGaN layer, and the dielectric layer may be formed using materials and processes such as those discussed herein or otherwise known to those of skill in the art.

In addition, as illustrated in FIG. 9T(a), the further processing also includes etching the dielectric layer, the AlGaN layer, and the second GaN drift layer to form recesses where source contacts are formed. As illustrated, the further processing also includes forming a gate contact on the dielectric layer. The source contacts and the gate contact may be formed using materials and processes such as those discussed herein or otherwise known to those of skill in the art.

FIG. 9T(b) is a simplified schematic cross-section of the device of FIGS. 9S and 9T(a) after transfer to a carrier wafer according to an example of the present invention. The device is attached to gate and source electrodes comprising, for example, a metal, such as aluminum or titanium, where the gate and source electrodes have been previously formed on the carrier wafer. The device is additionally processed after being attached to the carrier wafer. In this example, the additional processing includes forming a drain electrode bond pad on the n+ GaN contact layer. The drain electrode bond pad may be formed using materials and processes, such as those discussed herein or otherwise known to those of skill in the art.

FIGS. 9U and 9V illustrate a method by which the device, a vertical enhancement mode junction field effect transistor (eJFET) device, is formed and partially or fully processed while attached to the gallium and nitrogen containing or foreign wafer, and by which the device is transferred to the carrier wafer.

FIG. 9U is a simplified schematic cross-section of a structure of a device according to an example of the present invention. As illustrated in FIG. 9U(a), the device is partially formed on the substrate. In addition, as illustrated in FIG. 9U(b), the device is further processed such that the exposed GaN drift layer is etched to form recesses. In addition, as illustrated in FIG. 9U(c), the device is further processed such that pGaN layers and junction termination JTE are formed. The pGaN layers and the junction termination may be formed using materials and processes such as those discussed herein or otherwise known to those of skill in the art.

Furthermore, as illustrated in FIG. 9V(a), the device is further processed to form source and gate contacts. The source and gate contacts may be formed using materials and processes such as those discussed herein or otherwise known to those of skill in the art.

FIG. 9V(b) is a simplified schematic cross-section of the device of FIGS. 9U and 9V(a) after transfer to a carrier wafer according to an example of the present invention. The device may be attached to gate and source electrodes comprising, for example, a metal, such as aluminum or titanium, where the gate and source electrodes have been previously formed on the carrier wafer. The device is additionally processed after being attached to the carrier wafer. In this example, the additional processing includes forming a drain contact on the GaN drift layer. The drain contact may be formed using materials and processes, such as those discussed herein or otherwise known to those of skill in the art.

Another embodiment of a GaN power device fabricated according to this invention is a high electron mobility transistor device (HEMT), which is a three terminal device comprised of a source, a gate, and a drain. The HEMT is a heterostructure field-effect transistor (FET) based on a heterojunction which consists of at least two different semiconducting materials such as GaN and AlGaN brought into contact with each other to form an interface, typically using epitaxial growth. Due to the different band gaps of the semiconductor materials and their relative alignment to each other, band discontinuities form at the interface. By choosing proper materials and compositions of the semiconductor materials, the conduction band offset can form a triangular shaped potential well confining electrons in the horizontal direction. Within the well the electrons can only move in a two-dimensional plane parallel to the heterointerface and are therefore referred to as a two-dimensional electron gas (2DEG). Since the HEMT is a field effect transistor (FET) formed with a heterostructure it is also known as an (HFET) or modulation-doped FET (MODFET). The advantages of the HEMT include its high carrier concentration and its higher electron mobility due to reduced ionized impurity scattering. The combination of high carrier concentration and high electron mobility results in a high current density and a low channel resistance, which are especially important for high frequency operation and power switching applications.

GaN HEMTs have attracted attention due to their high-power performance. HEMT transistors are able to operate at higher frequencies than ordinary transistors, up to millimeter wave frequencies, and are used in high-frequency products such as cell phones, satellite television receivers, voltage converters, and radar equipment.

GaN power transistors are typically formed as planar HEMT devices, where the conductive transistor channel is a 2DEG formed at the interface between a high bandgap layer such as AlGaN, AlN, or InAlGaN, and a lower bandgap layer such as GaN or InGaN. Source and drain contacts are formed to the 2DEG, while a gate is formed over the higher bandgap layer such as AlGaN. Imperfections in the crystalline epitaxial structure that create traps or other defects can limit performance such as compressing the gain and other nonlinear effects. Forming a very high-quality epitaxial material free from defects and excessive impurities is critical to the device performance. Efforts to form higher quality epi-layers in AlGaN/GaN HEMTs have resulted in significant improvement of the large-signal characteristics. This first step of device formation comprises forming the epitaxial layer structure on a substrate. The lack of large area, low cost GaN substrates has historically necessitated heteroepitaxy on compatible substrates, commonly sapphire, silicon carbide, or silicon, but can be others such as aluminum nitride. The epitaxial layers may be either grown entirely by MBE or MOCVD or on a resistive GaN buffer grown by vapor phase epitaxy.

Heteroepitaxy on such severely lattice-mismatched substrates makes the nucleation layer and buffer one of the most critical aspects of the growth. With sapphire as a substrate, the nucleation layer typically consists of GaN or AlN. Overlying the buffer layer is typically an insulating GaN layer with a thickness ranging from about 0.5 µm to about 5 um or about 5 um to 10 um. The insulating layer can be an intrinsic region, a not intentionally doped region (NID) an unintentionally doped region (UID), or a region intentionally doped to compensate the unwanted background dopants and increase the resistance. Typical carrier concentrations in this insulating layer would be less than about 1E17 cm-3, less than about 5E17 cm-3, or less than about 1E16 cm-3. Overlying the insulating GaN layer is the AlGaN electron supply region. The AlGaN electron supply region may be comprised of an AlGaN layer doped with silicon at a concentration of between 5E17 cm-3 and 1E20 cm-3 with a thickness ranging from 5 nm to about 100 nm. In some embodiments no doping is used or a modulation doped is implemented. In some embodiments the AlGaN supply region is comprised of multiple layers including an undoped AlGaN spacer layer ranging in thickness from 1 nm to about 15 nm overlying the GaN insulating layer, the n-type doped AlGaN layer with a thickness ranging from 5 nm to 100 nm overlying the AlGaN spacer layer, and an undoped AlGaN barrier layer with a thickness ranging 5 nm to 100 nm overlying the n-type doped AlGaN layer. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The composition of the AlGaN electron supply region is a critical design parameter as it can influence the carrier concentration. In some embodiments, a GaN cap or n-type GaN layer may be formed over the AlGaN electron supply region.

An example of a conventional HEMT device grown on a foreign substrate is shown in FIG. 10A. Following the formation of the AlGaN and GaN epitaxial layers, device fabrication of a typical AlGaN/GaN HEMT as shown in FIG. 10A may initiate with the definition of the active device area. This can be either be defined through a patterning and etching of a mesa process or an implantation process. In the more typical etching embodiment, wet or dry etching techniques can be deployed wherein Cl2 or BCl3 are common gases used in etching by RIE, ICP, or CAME methods of etching. Next, the source and drain ohmic contacts are formed. In one embodiment the source and drain contacts are made by partially etching the AlGaN region in the source and drain regions and depositing the ohmic contact metals. In another embodiment the source and drain contacts are formed directly to the AlGaN surface region. In yet another embodiment the source and drain contacts are made by etching through the AlGaN region and into the insulating GaN region to form an ohmic contact directly with the 2DEG. In yet another embodiment, the source and drain contacts are formed on an n-type GaN or NID GaN layer overlying the AlGaN region. The source and drain contact metallization is often followed by an annealing step to improve the contact characteristics. An example ohmic contact may be Ti/Al/Ni/Au, but it could be others such as Al/Ni/Au, a Ta-based ohmic contact, or others. The gate metal is typically defined by a deposition and lift-off process of a metal such as Ni/Au, but could be others such as Pt, Pd, or Au. The deposition method can be electron beam deposition, sputtering, thermal evaporation, or other techniques. In many of the early GaN transistors, this gate electrode was formed as a Schottky contact to the top surface. By applying negative voltage to this contact, the Schottky barrier becomes reverse biased and the electrons underneath are depleted. Therefore, in order to turn this device OFF, a negative voltage relative to both drain and source electrodes is needed. This type of transistor is called a depletion mode, or d-mode, HFET. Dielectric passivation layers are formed on the device to electrically isolate certain features, protect certain regions, and to eliminate dispersion between the large signal alternating current (AC) and the direct current (DC) characteristics of the HEMT.

In the example conventional HEMT device in FIG. 10A, as with any power FET, there are gate, source, and a drain electrodes. The source and drain electrodes form an ohmic contact with the underlying 2DEG. This creates a short-circuit between the source and the drain until the 2DEG is depleted and the semi-insulating GaN crystal can block the flow of current. The gate electrode is placed on top of the AlGaN layer functioning to deplete the 2DEG. In some embodiments, the gate electrode is formed as a Schottky contact to the top surface. By applying negative voltage to this contact, the Schottky barrier becomes reverse biased and the electrons underneath are depleted. Therefore, in order to turn this device OFF, a negative voltage relative to both drain and source electrodes is needed. This type of transistor is called a depletion mode, or d-mode, HFET and is a normally ON device. Embodiments for normally OFF devices are possible in the present invention.

In one embodiment according to this invention, a HEMT epitaxial device structure is grown on a bulk gallium and nitrogen containing substrate such as GaN or on a foreign substrate. The growth is comprised of an epitaxial technique such as metal organic vapor deposition (MOCVD) or molecular beam epitaxy (MBE), but can be other techniques. As shown in FIG. 10B, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the HEMT device layers comprising a higher bandgap material such as AlGaN electron supply region overlying the sacrificial region and an intrinsic region or nominally UID or NID insulating gallium and nitrogen containing material such as GaN overlying the higher bandgap region. The AlGaN electron supply region may be comprised of an AlGaN layer doped with silicon at a concentration of between 1E18 cm-3 and 1E20 cm-3 with a thickness ranging from about 5 nm to about 100 nm. In some embodiments no doping is used or a modulation doping is implemented. The AlGaN supply region may be comprised of multiple layers including an undoped AlGaN spacer layer ranging in thickness from 1 nm to about 15 nm, an n-type doped AlGaN layer with a thickness ranging from 5 nm to 100 nm, and an undoped AlGaN barrier layer with a thickness ranging 5 nm to 100 nm. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The insulating layer is comprised of GaN and may be an NID, UID, or an intentionally doped region to compensate the unwanted background dopants and increase the resistance and create the insulating property. The insulating region would comprise a thickness ranging from about 0.5 µm to about 5 um or about 5 um to 10 um with a typical carrier concentrations of less than about 1E17 cm-3, less than about 5E16 cm-3, or less than about 1E16 cm-3, or less than about 5E15 cm-3. In other embodiments the high bandgap layer may be comprised of AlN.

In one embodiment according to this invention, the epitaxial device material, such as that shown in FIG. 10B, is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAIBE), or other. Typical gases used in the etching process may include Cl and/or BCl3. Alternatively, the mesa could be defined through a wet etch process. The wet etch process may be selective and designed to terminate on the sacrificial region. A bonding region is formed overlying the mesa region. The bonding region may be comprised of a metal, a dielectric, an oxide, or from a semiconductor layer overlying the GaN insulating layer. In some embodiments it is desirable to use an insulating bonding region to isolate the device and minimize parasitic capacitance of the final device. Examples of insulating bond regions would oxide bonding regions, dielectric bonding regions, glass bonding regions, or polymer bonding regions, or other.

In addition to preparing the epitaxial device layers for the transfer step with the formation of the mesa structures and bonding regions, the carrier wafer is prepared for the transfer process. The carrier wafer could be selected from silicon, silicon carbide, sapphire, aluminum nitride, or others. In a preferred embodiment the carrier wafer would be insulating or semi-insulating and would be selected from sapphire, silicon carbide, or aluminum nitride. In preparation for the transfer process, bonding regions may be formed on the carrier wafer. The bonding region could be comprised of metal, dielectric, oxide, semiconductor, glass, polymer, or other, or a combination thereof. In an embodiment, the bonding region would be similar to the bonding region on the top of the mesa structures such that the bond interface would be comprised of a like-like material, such as oxide-oxide, semiconductor-semiconductor, or metal-metal. In the case of oxide or dielectrics, depositions may be performed with chemical vapor deposition processes, sputtering processes, electron beam deposition processes, or other processes. For metal interfaces, the material can be deposited by conventional methods such as electron beam deposition, sputtering, thermal evaporation, or others. In an alternative embodiment the bonding region is comprised of two dissimilar materials such as semiconductor-glass, oxide-glass, semiconductor-polymer, or other. The transfer process would comprise a PEC etch to selectively remove the sacrificial release material followed by a bonding step to selectively transfer the epitaxial material to the carrier wafer and release the substrate. The bonding may be selected from a thermocompression bonding, a diffusion bonding, or other. Once bonded, with the substrate released the remainder of the device process would be performed to the epitaxial device material on the carrier wafer.

In one embodiment according to this invention, the epitaxial device material, such as that shown in FIG. 10C, is prepared for transfer by forming a mesa region by etching the epitaxial material to a depth at or below the sacrificial region. As shown in FIG. 10C, the epitaxial structure comprises a GaN buffer layer grown on top of a foreign substrate, comprising, for example, a material other than GaN, such as SiC, Si, sapphire, or another material. The benefits of transferring the devices from the foreign substrate to a carrier wafer include improved thermal properties when the carrier wafer is made from materials such as diamond or silicon carbide, integration of GaN electronic components into circuits including CMOS circuits, forming GaN based ICs, etc.

In some embodiments, an optional nucleation or buffer layer may be formed on the foreign substrate. For example, materials having lattice structures compatible with the GaN buffer layer, and in some embodiments, compatible with the foreign substrate, may be used so that the lattice structure of the buffer layer is sufficiently free of defects. These and other layers may be used in electronic devices that are formed and transferred to carrier wafers in accordance with embodiments described herein.

The subsequent processing steps determine the final device structure of the HEMT device. Simplified example HEMT device structures that could be fabricated from the epitaxial structure in FIG. 10B or 10C according to this invention are shown in FIGS. 10D-10F. In both device structures the process includes forming an isolation structure for the active device area by etching a mesa or by ion implantation, or in an embodiment, the transferred epitaxial mesa would provide the isolation for the active device area. In the embodiment shown in FIG. 10D, the source and drain contacts are made to the surface of the exposed AlGaN region. In the embodiment according to FIG. 10E, the source and drain contacts are made after etching either into the AlGaN layer or through the AlGaN to directly contact the insulating layer. In one embodiment, the source and drain contacts would be comprised of Ti/Al/Ni/Au, but could be others such as Al/Ni/Au, a Ta-based ohmic contact, or others. The source and drain contact metallization is often followed by an annealing step to improve the contact characteristics. Next, the gate metal is defined. In one embodiment the gate is formed by a lift-off process of a metal such as Ni/Au, but could be others such as Pt, Pd, or Au. The deposition method can be electron beam deposition, sputtering, thermal evaporation, or other techniques. Dielectric passivation layers such as silicon nitride are formed on the device to electrically isolate certain features, protect certain regions, and to eliminate dispersion between the large signal AC and the DC characteristics of the HEMT.

In an embodiment of this invention a gate insulator is implemented by placing an insulating material such as a dielectric or oxide between the semiconductor material and the gate electrode. In this metal-insulator-semiconductor high-electron-mobility transistor (MIS-HEMT) device several insulator materials can be used including SiO2, SiNx, Al2O3, AlN, HfO2, ZrO2, La2O3, and Ta2O5. A gate insulator is not needed for RF devices but may be required for power devices to suppress the gate leakage current and current collapse. An example of a MIS-HEMT device according to one embodiment of this invention is shown in FIG. 10F.

FIGS. 10G and 10H illustrate a method by which the device, a HEMT device, is formed and processed while attached to the gallium and nitrogen containing or foreign wafer, comprising, for example, Silicon, Sapphire, or Silicon Carbide.

FIG. 10G is a simplified schematic cross-section of a structure of a device according to an example of the present invention. As illustrated in FIG. 10G(a), the device is partially formed on the substrate. In addition, as illustrated in FIG. 10G(b), the device is further processed by etching the AlGaN layer and forming source, drain, and gate contacts as illustrated. The source, drain, and gate contacts may be formed using materials and processes such as those discussed herein or otherwise known to those of skill in the art.

FIG. 10H is a simplified schematic cross-section of the device of FIG. 10G after transfer to a carrier wafer according to an example of the present invention. The device is attached to drain, gate, and source electrodes comprising, for example, a metal, such as aluminum or titanium, where the drain, gate, and source electrodes have been previously formed on the carrier wafer.

In another HEMT device embodiment according to the present invention, the epitaxial device stack includes a GaN, AlGaN, or INGaN cap layer between the sacrificial region and the AlGaN region, as shown in FIG. 10I. The epitaxial structure also comprises a GaN buffer layer grown on top of a gallium and nitrogen containing or foreign substrate, comprising, for example, GaN. The GaN, AlGaN, or INGaN cap layer is formed with materials and process such as those discussed herein or otherwise known to those of skill in the art.

In another HEMT device embodiment according to the present invention the epitaxial device stack includes a GaN, AlGaN, or INGaN cap layer between the sacrificial region and the AlGaN region. The GaN, AlGaN, or INGaN cap layer is formed with materials and process such as those discussed herein or otherwise known to those of skill in the art. As shown in the example of FIG. 10J, the epitaxial structure comprises a GaN buffer layer grown on top of a foreign substrate, comprising, for example, a material other than GaN, such as SiC, Si, sapphire, or another material. The benefits of transferring the HEMT devices to a carrier wafer include improved thermal properties when the carrier wafer is made from materials such as diamond or silicon carbide, integration of GaN electronic components into circuits including CMOS circuits, forming GaN based ICs, etc.

In some embodiments, a nucleation or buffer layer is formed on the foreign substrate. For example, materials having lattice structures compatible with the GaN buffer layer, and in some embodiments compatible with the foreign substrate, may be used so that the lattice structure of the buffer layer is sufficiently free of defects.

The GaN buffer layer could be comprised of GaN or n-type GaN. Overlying the GaN buffer layer is a sacrificial region as described in this invention. Overlying the sacrificial region are the HEMT device layers comprising a cap layer, a higher bandgap material such as AlGaN electron supply region overlying the sacrificial region and an intrinsic region or nominally UID or NID insulating gallium and nitrogen containing material such as GaN overlying the higher bandgap region. In one embodiment the cap layer is a GaN cap layer comprised of UID or NID GaN to create an insulating region. In an alternative embodiment the cap layer is a GaN cap layer comprised of an n-type GaN to create a conductive region. In an alternative embodiment the cap layer is an AlGaN cap layer, which can be a p-type or n-type AlGaN. In an alternative embodiment the cap layer is an InGaN cap layer, which can be a p-type or n-type InGaN. The AlGaN electron supply region may be comprised of an AlGaN layer doped with silicon at a concentration of between 5E17 cm-3 and 1E20 cm-3 with a thickness ranging from about 5 nm to about 100 nm. In some embodiments no doping is used or a modulation doping is implemented. The AlGaN supply region may be comprised of multiple layers including an undoped AlGaN spacer layer ranging in thickness from 1 nm to about 15 nm, an n-type doped AlGaN layer with a thickness ranging from 5 nm to 100 nm, and an undoped AlGaN barrier layer with a thickness ranging 5 nm to 100 nm. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The insulating layer is comprised of GaN and may be an NID, UID, or an intentionally doped region to compensate the unwanted background dopants and increase the resistance and create the insulating property. The insulating region would comprise a thickness ranging from about 0.5 μm to about 5 um or about 5 um to 10 um with a typical carrier concentrations of less than about 1E17 cm-3, less than about 5E16 cm-3, or less than about 1E16 cm-3, or less than about 5E15 cm-3.

In one embodiment according to this invention, the epitaxial device material, such as that shown in FIG. 10J, is prepared for transfer by forming a mesa region by etching the epitaxial material to a depth at or below the sacrificial region. The etching process can be a dry etching process such as a RIE, ICP etch, CAIBE, or other. Typical gases used in the etching process may include Cl and/or BCl3. Alternatively, the mesa could be defined through a wet etch process. The wet etch process may be selective and designed to terminate on the sacrificial region. A bonding region is formed overlying the mesa region. The bonding region may be comprised of a metal, a dielectric, an oxide, or from a semiconductor layer overlying the GaN insulating layer. In some embodiments it is desirable to use an insulating bonding region to isolate the device and minimize parasitic capacitance of the final device. In this embodiment the carrier wafer is prepared for the transfer process. The carrier wafer could be selected from silicon, silicon carbide, sapphire, aluminum nitride, or others. In a preferred embodiment the carrier wafer would be insulating or semi-insulating and would be selected from sapphire, silicon carbide, or aluminum nitride. In preparation for the transfer process, bonding regions may be formed on the carrier wafer. The bonding region could be comprised of metal, dielectric, oxide, semiconductor, glass, polymer, or other, or a combination thereof. In one embodiment, the bonding region would be similar to the bonding region on the top of the mesa structures such that the bond interface would be comprised of a like-like material, such as oxide-oxide, semiconductor-semiconductor, or metal-metal. In an alternative embodiment the bonding region is comprised of two dissimilar materials such as semiconductor-glass, oxide-glass, semiconductor-polymer, or other.

Subsequent processing steps determine the final device structure of the HEMT device. Simplified example HEMT device structures that could be fabricated from the epitaxial structure in FIG. 10I or 10J according to this invention are shown in FIG. 10K, FIG. 10L, FIG. 10M, FIG. 10N, and FIG. 10Q. In all device structures the process may include forming an isolation structure for the active device area by etching a mesa or by ion implantation, or in an embodiment the transferred epitaxial mesa may provide the isolation for the active device area. In the embodiment shown in FIG. 10K the cap layer is an n-type GaN cap layer. In this embodiment the source and drain contacts are made to the surface of the exposed n-type GaN cap layer overlying the AlGaN region to form good ohmic contacts, while the gate contact is made to the AlGaN region. In the embodiment according to FIG. 10L, the cap layer is an n-type GaN cap layer. In this embodiment the source and drain contacts are made after etching through the n-GaN cap layer to contact the AlGaN region, while the gate contact is made to the n-type GaN cap layer. In yet another embodiment according to FIG. 10M, the cap layer is a UID or NID GaN cap layer. In this embodiment the source and drain contacts are made to a UID or NID GaN cap layer and an insulator material is placed between gate and the GaN cap layer. In one embodiment, the source and drain contacts would be comprised of Ti/Al/Ni/Au, but could be others such as Al/Ni/Au, a Ta-based ohmic contact, or others. The source and drain contact metallization is often followed by an annealing step to improve the contact characteristics. Next, the gate metal is defined. In one embodiment the gate is formed by a lift-off process of a metal such as Ni/Au, but could be others such as Pt, Pd, or Au. The deposition method can be electron beam deposition, sputtering, thermal evaporation, or other techniques. Dielectric passivation layers such as silicon nitride are formed on the device to electrically isolate certain features, protect certain regions, and to eliminate dispersion between the large signal AC and the DC characteristics of the HEMT.

In a conventional HEMT, the device is normally ON, but applying a bias to the gate electrode depletes electrons in the channel below to prohibit current flow and turn the device OFF. Normally OFF devices are desirable for several applications. For example, a normally-off device operation is required to simplify the inverter circuit for electric or hybrid electric vehicles. Normally-off operation in GaN HEMT can be achieved by several methods, although they face limitations and tradeoffs. The most widely used method is by gate recess etching.

This can be performed by ICP plasma to remove the AlGaN layer on top of the GaN channel layer. The reduction of AlGaN thickness results in a lower polarization-induced 2DEG density. A recessed gate HEMT device according to one embodiment of this invention is show in FIG. 10N as an example. In this embodiment the cap layer is a GaN cap layer. In this embodiment the source and drain contacts are made to the GaN cap layer. An etch is performed to etch into the AlGaN region in the gate region. A passivation layer or insulating layer is applied in the etched region and the gate electrode is formed.

Another HEMT device enabling normally OFF operation is the gate injection transistor (GIT) device. In this device a p-type GaN, InGaN, or AlGaN layer is placed between the gate electrode and the AlGaN supply region. In the example of p-type AlGaN, the GIT structure is normally-off because a p-AlGaN layer raises the potential at the AlGaN/GaN interface channel above the Fermi level. This could also be understood as a natural depletion of mobile electrons on the n-side due to the built-in p-n junction. By applying a positive gate bias, the channel begins to accumulate 2DEG as the quantum well reaches the Fermi level, thereby turning the device on.

FIGS. 10O and 10P illustrate a method by which the device, a HEMT device, is formed and processed while attached to the gallium and nitrogen containing or foreign wafer, comprising, for example, Silicon, Sapphire, or Silicon Carbide.

FIG. 10O is a simplified schematic cross-section of a structure of a device according to an example of the present invention. As illustrated in FIG. 10O(a), the device is partially formed on the substrate. In addition, as illustrated in FIG. 10O(b), the device is further processed to etch the cap layer and the AlGaN layer to form a trench. The device is further processed to form source and drain contacts, and to form a gate dielectric and a gate contact, as illustrated. The source and drain contacts, the dielectric layer, and the gate contact may be formed using a process such as those discussed herein or otherwise known to those of skill in the art.

FIG. 10P is a simplified schematic cross-section of the device of FIG. 10O attached to a carrier wafer according to an example of the present invention. The device is attached to drain, gate, and source electrodes comprising, for example, a metal, such as aluminum or titanium, where the drain, gate, and source electrodes have been previously formed on the carrier wafer. The drain, gate, and source electrodes may be formed using materials and processes such as those discussed herein or otherwise known to those of skill in the art.

A GIT device according to one embodiment of the present invention is show in FIG. 10Q as an example. In this embodiment the cap layer is a p-type AlGaN cap layer. In this embodiment the source and drain contacts are made to the AlGaN supply layer after etching through the p-type AlGaN cap layer. The gate contact is made to the p-type AlGaN cap region between the source and the drain.

In alternative embodiment according to this invention, HEMT epitaxial device layers would be grown on the gallium and nitrogen containing or foreign substrate in a reverse order compared to FIG. 10B and FIG. 10J. That is, overlying the sacrificial region, first the lower bandgap intrinsic region or nominally UID or NID insulating gallium and nitrogen containing material such as GaN is formed. Overlying the insulating region, the higher bandgap region such as AlGaN is formed. An example of this embodiment according to the present invention is shown in FIG. 10R. Of course, this is just one example, and the structure could include additional features such as a cap layer overlying the AlGaN region. The cap layer could be comprised of UID, n-type, or p-type GaN, AlGaN, or InGaN. The HEMT power devices would then be fabricated on the gallium and nitrogen containing substrate such as GaN or on the foreign substrate. In the process, source, drain, and gate electrodes would be applied, and sufficient insulating and passivating layers would be configured on the devices according to the descriptions provided in earlier examples. Mesas would be formed using an etching process to expose the sacrificial region. The etching process can be a dry etching process such as RIE, ICP etch, a CAME, or other. Typical gases used in the etching process may include Cl and/or BCl3. Alternatively, the mesa could be defined through a wet etch process. The wet etch process may be selective and designed to terminate on the sacrificial region. Following the mesa formation process the sacrificial region would be fully or partially removed using a selective etch process such as PEC etching. In an embodiment, anchor regions would be formed to mechanically support the HEMT device mesas and hold them in place with sacrificial region removed prior to the bonding step. The anchor regions could be formed from a semiconductor material, a metal material, an oxide, or a dielectric. Bonding regions would be formed configured to bond the HEMT devices to a carrier wafer. In an embodiment the bonding regions would be metal regions overlying the source, drain, and gate electrodes, but can be others.

In one embodiment according to this invention, the epitaxial device material, such as that shown in FIG. 10S, is prepared for transfer by forming a mesa region by etching the epitaxial material to a depth at or below the sacrificial region. As shown in FIG. 10S, the epitaxial structure comprises a GaN buffer layer grown on top of a foreign substrate, comprising, for example, a material other than GaN, such as SiC, Si, sapphire, or another material. The benefits of transferring the HEMT devices to a carrier wafer include improved thermal properties when the carrier wafer is made from materials such as diamond or silicon carbide, integration of GaN electronic components into circuits including CMOS circuits, forming GaN based ICs, etc.

In some embodiments, a nucleation or buffer layer is formed on the foreign substrate. For example, materials having lattice structures compatible with the GaN buffer layer and, in some embodiments, compatible with the foreign substrate, may be used so that the lattice structure of the buffer layer is sufficiently free of defects.

FIG. 10T shows an example of an array of HEMT devices prepared for transfer to a carrier wafer according to this invention. As illustrated in FIG. 10T, the substrate may comprise GaN or may be a foreign substrate, comprising, for example, a material other than GaN, such as SiC, Si, sapphire, or another material. In some embodiments, a nucleation or buffer layer is formed on the foreign substrate. For example, materials having lattice structures compatible with the GaN buffer layer and, in some embodiments, compatible with the foreign substrate, may be used so that the lattice structure of the buffer layer is sufficiently free of defects.

In addition to preparing the HEMT devices for the transfer step with the fabrication of the device structures including forming the source, gate, and drain regions along with applying the necessary passivation layers, formation of the mesa structures, anchor structures, and bonding regions, along with selectively etching the sacrificial region, the carrier wafer is prepared for the transfer process. The carrier wafer could be selected from silicon, silicon carbide, sapphire, aluminum nitride, or others. In one embodiment the carrier wafer would be insulating or semi-insulating and would be selected from sapphire, silicon carbide, or aluminum nitride. In another embodiment the carrier wafer would be configured from silicon and comprise electronic devices formed from a complementary metal-oxide-semiconductor (CMOS) process. In another embodiment the power devices would be transferred directly to a printed circuit board. In preparation for the transfer process, bonding regions may be formed on the carrier wafer. In a preferred embodiment, the bonding regions would be comprised of metal and be configured to bond to the source, gate, and drain metal bond regions. The metal regions on the carrier may be comprised of a material such as gold, platinum, titanium, palladium, copper, aluminum, or a combination thereof. The metal material can be deposited by conventional methods such as electron beam deposition, sputtering, thermal evaporation, or others such as electroplating.

The bonding may be selected from a thermocompression bonding, a diffusion bonding, or other. Once bonded and the substrate released, the remainder of the device processing would be performed to the epitaxial device material on the carrier wafer. In one configuration, bond pad regions to access the source, gate, and drain would be formed substantially on the carrier wafer. In another configuration, electrical interconnects would be used to connect the GaN power devices to other devices on the carrier wafer such as CMOS devices integrated within the carrier or other devices transferred to the carrier wafer according to this invention. FIG. 10U shows an example of selective bonding wherein the bond interface regions from the GaN wafers comprising the HEMT devices are bonded to the bond region on a carrier wafer or a printed circuit board. As illustrated in FIG. 10U, the carrier wafer may comprise GaN or may be a foreign substrate, comprising, for example, a material other than GaN, such as SiC, Si, sapphire, or another material. In some embodiments, a nucleation or buffer layer is formed on the foreign substrate. For example, materials having lattice structures compatible with the GaN buffer layer and, in some embodiments, compatible with the foreign substrate, may be used so that the lattice structure of the buffer layer is sufficiently free of defects. By selective bonding, one or more HEMT devices can be transferred to multiple carrier wafers or printed circuit boards. An advantage to this device structure is the lack of conduction layers below the insulating GaN region.

As in any of the gallium and nitrogen containing semiconductor devices according to this invention, the die expansion process can be applied to electronic devices such as Schottky diode devices, p-n diode devices, HEMT devices, FET devices, heterojunction bipolar transistor, or any other transistor devices. As an example, a cross-sectional schematic process flow illustrating the semiconductor epitaxial device layers of a Schottky diode device in preparation for die expansion is shown in FIG. 11A. As described in this invention, after deposition of the device layers over the sacrificial region, mesa regions are defined at a first pitch. Before or after the mesa regions are defined, the ohmic contact is formed to the n-type contact layer and a bonding region is formed overlying the mesa. The sacrificial region is then selectively etched using a selective etching process such as PEC etching. The etch can be a full etch wherein the entirety of the sacrificial region is removed or wherein the sacrificial region is partially removed such that a portion remains unetched. The unetched sacrificial region could function as an anchor region, providing mechanical support to the epitaxial layers to hold them in place prior to the bonding steps. As previously described, other materials can be used for anchor features such as metal regions, dielectric regions, oxide regions, or other. As illustrated in FIG. 11A, the substrate may comprise GaN or may be a foreign substrate, comprising, for example, a material other than GaN, such as SiC, Si, sapphire, or another material. In some embodiments, a nucleation or buffer layer is formed on the foreign substrate. For example, materials having lattice structures compatible with the GaN buffer layer and, in some embodiments, compatible with the foreign substrate, may be used so that the lattice structure of the buffer layer is sufficiently free of defects.

FIG. 11B is an example illustration of the selective bonding process to a carrier wafer wherein the mesa on the substrate comprised of the Schottky diode device layers are transferred to the carrier wafer in a sequential fashion according to a second pitch that is greater than the pitch that the mesa was formed at on the substrate. After bonding to the carrier wafer, the remaining steps are performed for the fabrication of the Schottky diode device. As illustrated, the substrate may comprise GaN or may be a foreign substrate, comprising, for example, a material other than GaN, such as SiC, Si, sapphire, or another material. In some embodiments, a nucleation or buffer layer is formed on the foreign substrate. For example, materials having lattice structures compatible with the GaN buffer layer and, in some embodiments, compatible with the foreign substrate, may be used so that the lattice structure of the buffer layer is sufficiently free of defects.

The value of such die expansion applied to electronic devices could be enormous through the greatly increased utilization of the epi area. The origin of this large value creation is that typical GaN based power devices have a very small "active" area relative to the total chip area required for the device. This is due to the fact that the electrodes or bond pads that are used to connect the "active" device area to external or on-chip power sources often require factors of 5 or more area than the active devices themselves require. As an example, a top-view schematic of an example conventional Schottky diode device is shown in FIG. 11C. According to FIG. 11C, the device is comprised by a total area depicted by 100. Within the total area 100 of the device, the active area 101 is depicted with the dashed line. As shown, the active area wherein Schottky diode function is generated where the Schottky contact electrode 102 and the ohmic contact electrode 103 actually connects to the active area 101 is much smaller than the area 100 configured to provide sufficient area for the full Schottky contact electrode 102 and the ohmic contact electrode 103.

A cross section of the conventional Schottky diode device shown in FIG. 11C is shown in FIG. 11D. According to FIG. 11D, epitaxial layers are formed on the substrate 200, which may be selected from silicon, silicon carbide, sapphire, or other. The epitaxial layers are configured with a nucleation layer 201 overlying the substrate 200, an n-contact layer and/or conduction region 202 overlying the nucleation region 201, and an intrinsic, UID, or NID drift region 203 overlying the n-contact layer region 202. In this example, a mesa region is formed to define the active area. In some embodiments the mesa is formed using an etching process wherein the etch destructively removes the epitaxial semiconductor material and terminates at or near the substrate. On top of the active area mesa the Schottky diode contact is made with a Schottky diode contact electrode 204 to the drift region 203 in the active area. In this embodiment, the Schottky contact electrode is primarily positioned overlying the substrate wherein the semiconductor was destructively etched. In typical configurations, insulating layers such as dielectrics or oxides would be positioned between the mesa and the electrode and/or between the substrate and the electrode. On the side of the active area wherein the semiconductor layers have been exposed to leave a portion of the n-contact layer region 202 exposed, the ohmic n-contact and n-contact electrode 205 is formed. In this conventional embodiment, the ohmic n-contact electrode is primarily positioned overlying the n-contact and lateral conduction regions and/or overlying the substrate wherein the semiconductor was etched to the substrate. In typical configurations, insulating layers such as dielectrics or oxides would be positioned between the mesa and the electrode and/or between the substrate and the electrode.

A cross section of a Schottky diode device according to this invention is shown in FIG. 11E. According to FIG. 11E, the Schottky diode device layer mesa has been transferred from a native gallium and nitrogen containing or foreign substrate to a carrier wafer 300. In this embodiment, the transferred mesa region substantially defines the active area of the device. Overlying the carrier wafer 300 is the bond region 301, overlying the bond region 301 is the intrinsic, or UID, or NID drift region 302, and overlying the drift region 302 is the n-contact layer region 303. In this embodiment the bond region 301 is formed from a highly conductive metal configured with the designed thickness and conductivity to enable a high current operation with minimal resistance and hence, enable a vertical Schottky diode device. According to the present invention, the Schottky contact electrode is overlying the metallic bond region to form an electrical contact. In some embodiments a thick electrode metal is formed over the metallic bond region to enable probing or wirebonding. In another embodiment, the bond region metal on the carrier wafer is the electrode region. Overlying the n-contact layer region 303 is the ohmic n-contact electrode 305, which extends off the mesa and onto the carrier wafer. In typical configurations, insulating layers such as dielectrics or oxides would be positioned between the mesa and the electrode and/or between the carrier wafer and the electrode. An aspect of this invention embodiment is the transferred epitaxial material that was initially formed on a bulk GaN substrate is only occupying the "active" area where it is needed and a vast majority of the electrode metal is contained on the carrier wafer. This is a drastic improvement in the use of epitaxy material and epitaxial substrate area since in conventional methods the electrodes occupy regions wherein the epitaxial material is present or was present prior to using a destructive removal process such as etching. In the present invention for forming a Schottky diode device, very little of the gallium and nitrogen containing epitaxial material is wasted.

In an alternative example of die expansion for semiconductor power electronic devices, a top-view schematic of an example conventional HEMT device is shown in FIG. 11F. According to FIG. 11F, the device is comprised by a total area depicted by 400. Within the total area 400 of the device, the active area 401 is depicted with the dashed line. As shown, the HEMT function is generated where the source electrode 402, gate electrode 403, and drain electrode 404 actually connect to the active area 401 is much smaller than the area 400 configured to provide sufficient area for the full area of the source contact electrode 402, gate contact electrode 403, drain contact electrode 404.

A cross section of the conventional HEMT diode device shown in FIG. 11F is shown in FIG. 11G. According to FIG. 11G, epitaxial layers are formed on the substrate 500, which may be selected from silicon, silicon carbide, sapphire, or other. The epitaxial layers are configured with a nucleation layer 501 overlying the substrate 500, a low bandgap region 502 such as GaN that is typically, UID, or NID overlying the nucleation layer 501, and a high bandgap region 503 such as AlGaN overlying the low bandgap region 502. In this example, a mesa region is formed to define the active area. In some embodiments the mesa is formed using an etching process wherein the etch destructively removes the epitaxial semiconductor material and terminates at or near the substrate. On top of the active area mesa the source contact is made with a source contact electrode 504, a gate contact is made with a gate contact electrode 505, and drain contact is made with the drain contact electrode 506. In this embodiment, the source, gate, and drain contact electrodes are primarily positioned overlying the substrate wherein the semiconductor was destructively etched. In typical configurations, insulating layers such as dielectrics or oxides would be positioned between the mesa and the electrode and/or between the substrate and the electrode.

A cross section of a HEMT device according to this invention is shown in FIG. 11H. According to FIG. 11H, the HEMT diode device layer mesa has been transferred from a native gallium and nitrogen containing or foreign substrate to a carrier wafer 600. In this embodiment, the transferred mesa region substantially defines the active area of the device. Overlying the carrier wafer 600 within the active area is the bond region 601, the lower bandgap material such as GaN region 602 overlying the bond region 601, and the higher bandgap region 603 overlying the lower bandgap region 602. In this embodiment the bond region 601 may be formed from an insulating region such as an oxide material. In alternative embodiments it may be formed by a metal. On top of the active area mesa the source contact is made with a source contact electrode 604, a gate contact is made with a gate contact electrode 605, and drain contact is made with the drain contact electrode 606. In this embodiment, the source, gate, and drain contact electrodes are primarily positioned overlying the carrier wafer. In typical configurations, insulating layers such as dielectrics or oxides would be positioned between the mesa and the electrode and/or between the substrate and the electrode. An aspect of this invention embodiment is the transferred epitaxial material that was initially formed on a bulk GaN substrate is only primarily occupying the "active" area where it is needed to generate the HEMT function and a vast majority of the electrode metal that is required for making electrical connections is contained on the carrier wafer. This is a drastic improvement in the use of epitaxy material and epitaxial substrate area since in conventional methods the electrodes occupy regions wherein the epitaxial material is present or was present prior to using a destructive removal process such as etching. In the present invention for forming a HEMT device, very little of the gallium and nitrogen containing epitaxial material is wasted.

One feature of the present invention is the ability to fabricate devices with increased functionality by transferring various semiconductor components to a common carrier wafer to form an integrated semiconductor device. There are many applications where it would be advantageous to have various semiconductor components on a common carrier wafer to form an integrated device. One example is the integration of various electronic power devices. For example, GaN power devices such as MOSFETs, HEMTs, and MOS-Channel HEMTs (MOSCHEMTs) have shown outstanding performance. Thus, integration of GaN power devices such as HEMTs can reduce the cost, size, and efficiency of solid state systems. Another emerging application is in LI-FI, which is a bidirectional, high speed and fully networked wireless communications, like WI-FI, using visible light. Since LI-FI requires driver circuitry to modulate the light output of the LED devices, merging electronic devices onto the same chip as the LED would be advantageous.

FIG. 12A is an example of a MOSFET device integrated with a HEMT device and Schottky diode device. The integrated devices in FIG. 12A are merely an example of integration using the present invention. According to some embodiments of this invention, any configuration and any number of semiconductor devices can be integrated onto a common substrate. In some embodiments, the common substrate comprises a carrier wafer, an IC wafer, a CMOS circuit, or another substrate, and in some embodiments, the common substrate comprises semiconductor devices such as silicon devices. In the embodiment shown in FIG. 12A, a HEMT device is fabricated on a substrate, which could be on a native GaN substrate or a foreign substrate. The HEMT device is comprised of a sacrificial region underlying the HEMT device layers. Mesas are formed using an etching process and the sacrificial region is selectively etched. In an embodiment, anchor structures or regions are formed to maintain the structural integrity of the HEMT device layers to hold them in place. Following the formation of the bond region overlying the mesa region, the HEMT structure is transferred to a carrier wafer. Similar process steps are employed to transfer the previously formed or partially formed Schottky device layers and the previously formed or partially formed MOSFET device layers to the common substrate. The HEMT, Schottky diode and MOSFET device layers may then be further processed into their respective devices. A simplified schematic of the resulting structure is shown in FIG. 12A. In other embodiments, one or more of the electronic devices may be formed and transferred in a top-down configuration rather than the bottom-down configuration shown in this example.

In another embodiment of integrating a MOSFET device with a HEMT device, the HEMT device is processed on the gallium and nitrogen substrate such as GaN or on another substrate. The gate, source, and drain regions are formed along with all of the passive regions. The HEMT device is then transferred to the common substrate such that the gate, source, and drain regions form metal bonds to the common substrate. In one embodiment, the MOSFET epitaxial layers are transferred to the common substrate and then the MOSFET device is formed using process steps understood by those of skill in the art and/or discussed herein. In some embodiments, processing steps are performed on the MOSFET epitaxial layers on the gallium and nitrogen containing substrate or other carrier wafer.

In an embodiment, another device is integrated with a HEMT device, such as that shown in FIG. 12B. The HEMT device may be processed on the gallium and nitrogen substrate such as GaN or on another substrate. The gate, source, and drain regions are formed along with the passive regions. The HEMT device is then transferred to the common substrate such that the gate, source, and drain regions form metal bonds to the common substrate. In one embodiment, epitaxial layers of the other device are transferred to the common substrate and then the other device is formed using process steps understood by those of skill in the art and/or discussed herein. In some embodiments, processing steps are performed on the epitaxial layers of the other device on the gallium and nitrogen containing substrate or on another substrate. In some embodiments, the other device comprises one or more GaAs based electronic devices such as GaAs based transistors, SiC based electronic devices, Si based electronic devices, GaN based devices, or any other kinds of electronic devices.

In yet another embodiment of semiconductor device integration according to this invention, a gallium and nitrogen semiconductor device or epitaxial layer structure is transferred to a common substrate comprising semiconductor devices. An example of this embodiment is transferring an electronic device to a silicon wafer with CMOS circuitry configured as the driver for the electronic device. In another example of this embodiment, one or more GaN based HEMT devices (and/or other GaN devices) are bonded to a silicon substrate comprising silicon MOSFET devices (not shown). In some embodiments, different types of HEMT devices are bonded to the silicon substrate. For example, by cascading a high-voltage, normally-on GaN device and a low-voltage silicon MOSFET device, a normally OFF high-power device can be formed. This approach can provide a simple and low-cost method to deliver a normally-off GaN device. A simplified schematic of the device is shown in FIG. 12C. For example, in some embodiments, the one or more GaN based HEMT devices (and/or other GaN devices) are grown on GaN, silicon, sapphire, or silicon carbide and then lifted off and transferred to a select common substrate. The electronic devices may be vertical devices or lateral devices and may be oriented with drain, source, gate upward or downward contacting electrodes on the carrier wafer, or a combination of orientations. In one embodiment, a D-mode GaN HEMT is integrated with a low-voltage e-mode Si MOSFET.

In yet another embodiment of semiconductor device integration according to this invention, a gallium and nitrogen semiconductor device or epitaxial layer structure is transferred to a common high thermal conductivity substrate comprising, for example, at least one of diamond, silicon carbide, and another semiconductor material. This approach can enable superior heat extraction over that which the devices could achieve on their native growth substrates and/or can enable higher performance switching and device operation. For example, GaN HEMTs could be grown on silicon or sapphire and then lifted off and transferred to a select carrier wafer. A possible additional benefit is that if the GaN HEMTs are lifted off of silicon and transferred to a select carrier of a different material, higher HEMT breakdown voltages may be achieved due to removal of the silicon substrate. In some embodiments, different types of HEMT devices are bonded to the select carrier. The electronic devices may be vertical devices or lateral devices and may be oriented with drain, source, gate upward or downward contacting electrodes on the carrier wafer, or a combination of orientations. A simplified schematic of the device is shown in FIG. 12D.

Devices with n-type channels with negatively charged carriers (electrons) provide normally-off characteristics. This allows lower power consumption and fail-safe features. Devices with p-channels may enable complementary IC designs that reduce power loss in logic control systems.

P-type gates in AlGaN/GaN heterostructure field-effect transistors (HFETs) provide normally-off operation and low channel resistance by injecting holes from the gate.

In yet another embodiment of semiconductor device integration according to this invention, a gallium and nitrogen semiconductor device or epitaxial layer structure is transferred to a common substrate. For example, diverse types of electronic devices can be integrated together to form different circuit architectures or functions. This diversity includes lateral devices, vertical devices, GaN devices, GaAs devices, Si devices, other types of devices, normally-on devices, normally-off devices, trench devices, p-type devices, n-type devices. A simplified schematic of this type of device is shown in FIG. 12E, which illustrates integration of a p-type transistor and an n-type transistor on the same substrate. Another simplified schematic of this type of device is shown in FIG. 12F, which illustrates integration of a normally-on CAVET device with a normally-off trench MOSFET device on the same substrate. As illustrated in these examples, any combination of different electronic devices may be transferred to the same carrier wafer in accordance with the embodiments described herein.

FIGS. 12G and 12H illustrate a method by which the device, a GaAs electronic device, or an electronic device of another material, is formed and processed while attached to another substrate, comprising, for example, gallium and nitrogen, Silicon, Sapphire, or Silicon Carbide, where the carrier wafer has a normally-off trench MOSFET (or any other electronic device) connected thereto.

FIG. 12G is a simplified schematic cross-section of a structure of a device according to an example of the present invention. As illustrated in FIG. 12G(a), the device is partially formed on a GaAs or other material substrate. In addition, as illustrated in the example of FIG. 12G(b), the device is a HEMT device, and is further processed to etch the n+ GaAs and n+ AlGaAs layers. The device is also further processed to form source, gate, and drain contacts on the GaAs substrate as illustrated. The source, gate, and drain contacts may be formed using materials and processes such as those discussed herein or otherwise known to those of skill in the art. In other embodiments, the device includes one or more bipolar junction transistors (BJTs), MOSFETs, enhancement-mode MOSFETs, heterojunction bipolar transistors (HBTs), metal-semiconductor FETs (MESFETs), high electron mobility transistors (HEMTs), pHEMTs, laterally diffused MOS (LDMOS), JFETs, Schottky diodes, p-n diodes, and/or other types of devices.

FIG. 12H is a simplified schematic cross-section of the device of FIG. 12G attached to a carrier wafer according to an example of the present invention, where the carrier wafer has a normally-off trench MOSFET device thereon. In this embodiment, the carrier wafer may be an IC wafer, a CMOS circuit, or another wafer, such as any of the wafers or carrier wafers or substrates discussed herein or otherwise known to those of skill in the art. The device is attached to drain, gate, and source electrodes comprising, for example, a metal, such as aluminum or titanium, where the drain, gate, and source electrodes have been previously formed on the carrier wafer.

FIG. 13A is an example of an integrated circuit formed with transferred GaN devices according to some embodiments. In the illustrated example, GaN power transistors are integrated with a semiconductor on insulator (SOI) CMOS driver chip onto an inexpensive package substrate (Si, glass, ceramic, etc.). These embodiments enable a very small, very thin integrated voltage regulator, such as a buck converter, or the like. These embodiments leverage the transfer process, for example, to simultaneously mechanically bond and generate electrical interconnects. The interconnection distance between transistors and gate driver is very short, which significantly reduces parasitic and switching loss, and reduces electrical and thermal resistance to support high current density. The interconnects and passives (inductors, capacitors, etc.) may be fabricated on the package substrate such that they do not take up real estate on the more expensive III-V substrate.

Embodiments of the present invention can use various schemes for electrical interconnect between the transferred device and the carrier or host wafer. In one embodiment, electrical interconnect can be formed only on the topside of the transferred device. To form an electrical interconnect between the topside of the transferred device and the carrier wafer, complimentary bonding metal pads are formed on both surfaces using typical metals such as: Au, Cu, In, Al, etc. In addition, metal oxides such as indium tin oxide can also be bonded together using thermocompression bonding. As described previously, this transfer processes may leverage thermocompression bonding between the metallization of the donor wafer device and the metallization of the carrier wafer. As a result, the bond forms an electrical interconnect between the donor wafer metallization and carrier wafer metallization. This bonding scheme can easily be integrated into back-end CMOS processes. For example, electrical vias can be terminated at the final overglass (passivation) layer of a CMOS carrier wafer. The complimentary bonding pads can be deposited on top of the electrical vias to form contact between the transferred device and CMOS circuitry. This embodiment eliminates the need to form electrical interconnects post transfer which minimizes process complexity and cost.

In another embodiment, a transferred device can have both topside and backside contacts. After the device is transferred to the carrier wafer forming a topside contact, an additional contact can be generated on the backside of the donor wafer device. This process typically involves depositing and patterning a backside metal contact with the appropriate metallization on the transferred devices. After the contact metallization process, a passivation layer is deposited on the transferred devices and carrier wafer for electrical isolation. Various dielectric films can be used such as oxides, nitrides, or organic dielectrics such as polyimide, BCB, parylene, etc. After passivation, openings are generated in the passivation layer and electrical contacts can be formed between the transferred devices and carrier wafer using various interconnect schemes. In one embodiment, a standard redistribution layer (RDL) interconnect can be used because the transferred device thickness is very thin. In another embodiment, wirebonds can be used to connect the device backside contact to the carrier wafer contacts.

In another embodiment, electrical interconnects can be formed only on the backside of the transferred device. This can be accomplished by integrating an electrically insulating layer between the bonding metal and the device or the bonding metal and the carrier wafer. This allows the device to be transferred, but the bond is primarily used for mechanical purposes due to the electrical isolation layer. At this point, a backside electrical interconnect can be formed as described previously.

In another embodiment, a multi-layer interconnect approach can be used to enable three-dimensional, monolithic integration of stacked devices. For example, a first layer of devices can be transferred to the carrier substrate with various interconnect designs such as those described previously. A dielectric layer can be used to isolate and generate a new planar surface on top of the transferred devices. This can be accomplished by depositing traditional dielectric thin films (oxides, nitrides, etc.) followed by subsequent chemical mechanical polishing to planarize the thin film. Organic based dielectrics can also be used which are designed to self-level and also generate planar surfaces. After the devices are encapsulated and the dielectric layer planarized, vias can be etched and filled with metal interconnects to electrically connect the devices. Bonding pads can be defined on top of the vias to generate pads for the next level of transferred devices. At this stage, this approach can be repeated multiple times to build 3D, monolithic device structures with several layers of transferred devices. This device stacking approach can reduce interconnect distances between devices and enable 3D heterogeneous integration of different device technologies.

This transfer technology can be used to attach devices on the top and bottom surfaces of the carrier wafer. In one embodiment, the carrier wafer can consist of an interposer substrate. The interposer has through substrate vias that electrically connect both top and bottom surfaces to support 2.5D packaging approaches. Devices can be transferred and electrically interconnected on the top surface of the interposer and can be connected to devices that are transferred to the bottom by through substrate vias. The interposer substrate can be fabricated on various substrates including silicon, glass, glass/ceramic, ceramics, etc.

FIG. 13B illustrates an example of an integrated circuit formed with transferred GaN devices according to some embodiments. The illustrated examples include one IC having electrodes electrically connecting the transferred devices to the substrate which are only on the sides of the transferred devices facing the substrate. The illustrated examples also include one IC having electrodes electrically connecting the transferred devices to the substrate which are both on the sides of the transferred devices facing the substrate and on the sides of the transferred devices not facing the substrate or opposite the substrate.

FIG. 13C illustrates examples of an integrated circuit formed with transferred devices according to some embodiments. In the illustrated example, a package substrate comprising, for example, Si, glass, a ceramic, or another material is populated with die from each of an n-type GaN HEMT wafer, a p-type GaN HEMT wafer, and an SOI CMOS wafer. Because the package substrate has interconnects and passive components, such as inductors, capacitors, and resistors previously formed thereon, no or little processing is required after the die are transferred from the various wafers.

FIG. 13D illustrates an example of an integrated circuit formed with transferred devices according to some embodiments. In the illustrated example, a device wafer having die formed thereon and attached thereto with anchors, for example, is pressed into an intermediate substrate which has a pressure sensitive adhesive tape or other coating applied to a surface that adheres to each individual die. The adhesion force is strong enough to break the anchors attaching the die to the device wafer when the device wafer and intermediate carrier wafer are pulled apart. This process results in a mass transfer of the die to the intermediate substrate. A pedestal style chuck may be used to selectively align and pick up die from the intermediate substrate. The pedestal chuck may be controlled and maneuvered around existing topography and/or previously placed die. The chuck may be designed to pick up many die at one time allowing massive parallel die transfer to a destination substrate. This process can be repeated multiple times with different device types, for example, from different device wafers so that multiple device types are placed on a single destination substrate.

FIG. 13E illustrates an example of an integrated circuit formed with transferred GaN devices according to some embodiments. In the illustrated example, the IC substrate has transferred GaN devices having top-side contacts. Accordingly, electrodes electrically connect the transferred devices to the substrate on sides of the transferred devices not facing the substrate or opposite the substrate. In the illustrated example, the devices on the donor wafer are passivated and channels are formed in the passivation to allow etching of the sacrificial release layer. In addition, the devices may be mass transferred from the donor wafer to an intermediate carrier wafer that has an adhesion layer strong enough to break device anchors. Bonding pads are deposited and patterned on the devices. Additional processing can also be done at this step. The devices are bonded and transferred to a package substrate, interposer, IC wafer, or the like. In some embodiments, at least some of the bonds form a back side electrode. In some embodiments, one or more of the bonds form mechanical connections and do not make electrical connections.

Some embodiments bond the topside of a device to a carrier wafer. This results in a "flipped" device architecture that can be preferential in some applications. However, there can be other applications that require the orientation of device architecture to be preserved during the transfer process. FIG. 13E describes a process flow that enables the device orientation to be preserved during the transfer process. The initial part of this transfer process uses the same release process as described earlier. The devices are processed on the donor wafer and optionally passivated. The passivation layer may be used as for protection during the sacrificial release layer etch and may form anchors to the substrate to secure the devices on the donor wafer after the sacrificial release layer is removed. The sacrificial release layer is etched and the devices are mass transferred from the donor wafer to an intermediate carrier wafer that has a temporary adhesion layer to secure the devices for further processing. This results in the topside of the device bonded down to the intermediate carrier wafer and the backside of the devices are exposed. Further processing can be performed on the backside of the devices before the next transfer process. A metal bonding layer is patterned and deposited on the exposed backside. This metal layer can be used as a backside electrode, or it can be used as a bonding layer only. The devices may be thermocompression bonded to an alternate substrate which has complimentary metal pads. This substrate can be a package substrate, interposer substrate, integrated circuit (IC) wafer, or other substrates depending on application. The devices are now bonded to an alternate substrate with the initial device orientation preserved. Additional passivation steps and topside electrode formation steps may be used to form a topside contact. Additional processing besides electrodes can also be performed on the topside of the device. In addition, further processing can be performed on the substrate to create passives (inductor, resistors, capacitors, interconnects, bond pads, etc). Additional transfer processes can be performed to attach other devices to the substrate.

FIG. 13F illustrates an example of an integrated circuit formed with GaN devices transferred to a CMOS substrate according to some embodiments. In the illustrated example, III-V device die are mass transferred to the CMOS substrate. In addition, the device die are repeatedly placed across the CMOS substrate forming bonds which are both electrical and mechanical. Densely spaced die on the III-V wafer can be "re-pitched" (expanded) onto the CMOS substrate for highly efficient use of the III-V wafer. Multiple device types from different source wafers can be transferred enabling heterogenous integration of III-V devices with CMOS technologies. The transfer process generates robust metallic bonds that are compatible with CMOS BEOL (Back end of line) interconnect formation processing.

FIG. 13G illustrates an example of an integrated circuit formed with transferred GaN devices according to some embodiments. In the illustrated example, the GaN devices are directly bonded to CMOS driver circuitry previously formed on a semiconductor wafer comprising, for example, silicon. For example, GaN HEMTs may be integrated with CMOS drivers for power conversion circuits, such as buck converters and the like. As a result, GaN HEMT devices are used for superior switching speed and improved efficiency, and the transfer process enables direct bonding of the GaN HEMTs to the CMOS driver circuitry to greatly minimize interconnect parasitics for faster and more power efficient operation. These embodiments also eliminate substrate related HEMT leakage paths because the HEMT devices do not share a common semiconductor substrate. In addition, these embodiments result in a smaller footprint because the HEMT devices are transferred directly on top of the CMOS circuitry. As illustrated, the GaN HEMT devices are transferred to the CMOS wafer, which has previously formed interconnect structures thereon in a CMOS BEOL process, and the contacts of the GaN HEMT devices electrically and mechanically connect to the previously formed interconnect.

FIG. 13H illustrates an example of an integrated circuit formed with GaN devices transferred to a highly thermal conductive substrate according to some embodiments. In the illustrated example, the GaN devices are bonded to a diamond substrate. In alternative embodiments, the GaN devices are bonded to a substrate of another highly thermal conductive material, such as SiC, AlN, AlON, or another material. The illustrated transfer process is "device first" which enables full or partial processing of the GaN devices on another substrate prior to transfer. In some embodiments, the GaN device processing is completely decoupled from the device to substrate attachment process. Accordingly, there is no need to grow a diamond substrate onto a GaN on Si or SiC device wafer. Therefore, the design and processing options are increased, and single crystal diamond substrates with high or ultra-high thermal conductivity may be used.

FIG. 13I illustrates benefits of an integrated circuit formed with GaN devices transferred to a highly thermal conductive substrate according to some embodiments. In the illustrated example, the GaN devices are bonded to a diamond substrate. In alternative embodiments, the GaN devices are bonded to a substrate of another highly thermal conductive material, such as SiC, AlN, AlON, or another material. The benefits include improved thermal performance of, for example, power and/or RF devices. Because the GaN power transistors are bonded to a high thermal conductivity diamond substrate, junction temperatures of the GaN devices are reduced, and output power is improved and/or device sizes may be reduced. The transfer process may use metallic bonding for low thermal resistance of the bonds. The metallic bonds also form an electrical interconnect, so no additional processing is necessary to electrically attach the chips post transfer. In addition, the die are inverted, reducing thermal path from device heat generation sources to the diamond substrate.

In some embodiments, an optional nucleation or buffer layer may be formed on the foreign substrate. For example, materials having lattice structures compatible with a GaN buffer layer, and in some embodiments, compatible with a foreign substrate, may be used so that the lattice structure of the buffer layer is sufficiently free of defects. These and other layers may be used in electronic devices that are formed and transferred to carrier wafers in accordance with embodiments described herein.

Transfer of electronic devices or materials and their subsequent heterogeneous integration is an attractive strategy to realize high performance and low-cost circuits for a wide variety of new applications. Additionally, new device configurations can be achieved that could not otherwise be realized. To enable transfer, the device may be designed with an integrated sacrificial release layer that can be selectively etched while minimizing impact to the device structure and anchor system previously described. There are many different device technologies and materials systems that can benefit from this integration approach leveraging electronic device transfer.

In some embodiments, gallium and nitrogen containing devices grown on silicon substrates can be transferred to alternate substrates for performance improvements. In this example, the release layer may be a (111) Si substrate used to grow the epitaxial gallium and nitrogen containing buffer and devices layers. Anisotropic silicon etchants such as KOH and TMAH can be used to laterally etch the (110) planes. The (110) planes etch faster than the (111) plane so the etchant laterally undercuts the gallium and nitrogen containing device releasing it from the silicon substrate. For this instance, the anchor structures may be fabricated from a material such as silicon nitride so that they are not etched during the release process and can withstand the subsequent bonding process (e.g., thermocompression bonding).

In other embodiments, CMOS or MEM's devices grown on silicon-on-insulator wafers (SOI) wafers can also be transferred to alternate substrates. In an example, the release layer may be the buried oxide layer of the SOI wafer. HF and/or other fluorine containing etch chemistries can be used due to the high selectivity of the oxide and silicon layers. Silicon can be used in some embodiments as an etch resistant anchor material.

In another embodiment, gallium and arsenic containing devices can integrate various sacrificial release layers in the epitaxially grown layers to enable electronic device transfer. There are multiple release layers that can be used with this material system. For example, Al(Ga)As layers can be etched with HF-based solutions due to the high selectivity between GaAs and AlAs. An alternative release layer for GaAs is Al0.5In0.5P, which can be etched using hydrochloric acid (HCl) with high selectivity to GaAs. There are also applications that leverage Ge as a release layer integrated into the GaAs-based epitaxially design. The device can be released by using gas phase lateral etching of the Ge layer with XeF2.

In other embodiments, InP-based devices can be transferred by integrating InGaAs and InAlAs sacrificial release layers into the epitaxial layer stack. These layers are readily etched with a low temperature FeCl3 etchant that has a high selectivity to InP.

Figure 14B:
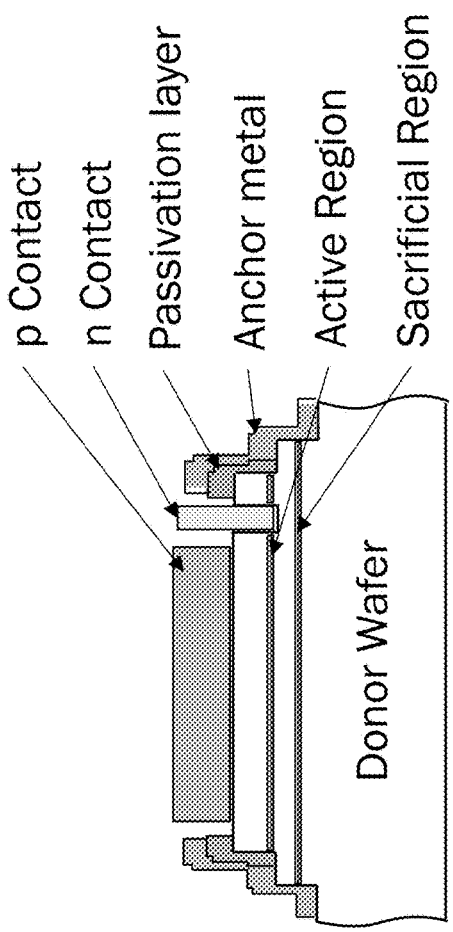
Figure 14C:
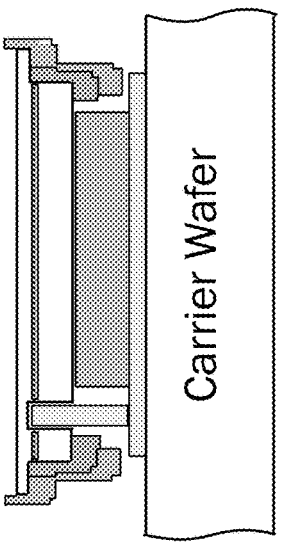
Figure 14D:
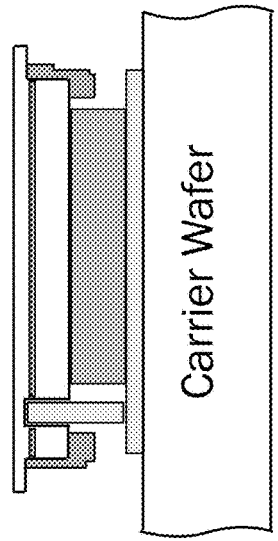

In accordance with any of the embodiments described herein, it may be desirable to remove anchor features after the epitaxial structure or electronic device has been transferred to the carrier substrate. The use of anchors is described, for example, with regard to FIGS. 2A-2I and may be used with any embodiment. There are several ways that this can be accomplished. For example, a selective wet etch of the anchor material can remove the anchors without damaging any of the desirable device layers or the epitaxial material. One example workflow is illustrated in FIGS. 14A-14D, which are simplified cross sectional diagrams illustrating a process of selective anchor removal in accordance with an embodiment. In this example, the epitaxial material is prepared for transfer, including forming any contact, passivation layers, and/or anchor metals by performing steps that may include an active region exposure etch and a sacrificial region exposure etch. Common metals that may be included for the gallium and nitrogen containing structure include Pd, Al, Au, Ti, Pt, and others. Passivation layer materials can include SiO2, Al2O3, SiN, AlN, AlON, and others. In this example, TiW is selected as the anchor metal material, but alternative anchor metal materials, including Ti, Al, W, SiO2, SiN, Ni, Cr, may be used in some embodiments. After the epitaxial structure or electronic device is prepared, the sacrificial region is etched, followed by bonding and transfer to the carrier wafer. After transfer the anchors may be removed by a wet etch process. In this example, a Ti-Tungsten TiW-30 etchant, a commercially available product from Trasense Company, is used to remove the TiW anchors. This wet etchant is selected for compatibility with all metals in the device structure, and in this case it will not etch Pd, Au, Al, or Al2O3. Alternate wet etchants with selectivity to common metals include, but are not limited to HF, buffered HF, Ti etchant TFT, H2O2, Ni etchant type TFB, chromium etchant, and the like. An alternative method to preventing unwanted etching during anchor removal is to cap an etching-susceptible layer with a non-susceptible layer to prevent the etchant from coming in contact with the etching-susceptible layer. In addition to wet etching processes, selective anchor removal can be performed by dry etching methods as well. These dry etching methods can be chemically selective, or masking using photoresist may be used to avoid unwanted material removal.

FIGS. 15A-15C are simplified cross sectional diagrams illustrating a round robin sequence for transferring epitaxial structures or electronic devices from a donor substrate to a carrier substrate in accordance with an embodiment. In this embodiment, a kind of a round robin workflow sequence with the donor wafers and carrier wafers is implemented to avoid having adjacent epitaxial structures or electronic devices on the donor wafer collide with the epitaxial structures or electronic devices that have already been bonded to the carrier wafer. In this particular example of sequencing, there may be three different carrier wafers or three different regions or areas on the same carrier wafer. In order to achieve expansion and to avoid both adjacent epitaxial structures or electronic devices from the donor wafer sticking to the carrier wafer and to prevent collisions or mechanical interference between the adjacent epitaxial structures or electronic devices on the donor wafer and epitaxial structures or electronic devices already bonded to the carrier, the round robin sequencing may be combined with an additional technique such as sequentially forming the bond pads on the carrier wafer or by varying the height of the different sets of epitaxial structures or electronic devices on the donor wafers. The specific approach shown in FIGS. 15A-15C utilizes the successive formation of the bond pads with the appropriate height, but this is just for illustration and of course other methods could be combined with the round robin workflow approach.

In the example shown in FIGS. 15A-15C, the sequence is comprised of three different carrier wafers or three different regions on the same carrier wafer, and three different donor wafers that may have the same or different types of electronic devices (Donor 1, Donor 2, and Donor 3). An objective of this round robin sequence is to utilize the "gaps" that are formed on the donor wafers where there are missing epitaxial structures or electronic devices as the different sets of epitaxial structures or electronic devices are bonded from the donor wafers to the carrier wafers. By aligning these gaps on the donor wafers with the epitaxial structures or electronic devices that are already bonded to the carrier wafer, there is sufficient clearance to prevent adjacent epitaxial structures or electronic devices on the donor wafers from colliding with epitaxial structures or electronic devices that are already bonded to the carrier wafer. As shown in FIGS. 15A-15C, a first set of epitaxial structures or electronic devices Epi $1_1$ are bonded from Donor 1 to the first carrier wafer, a second set of epitaxial structures or electronic devices Epi $2_2$ are bonded from Donor 2 to a second carrier wafer or another area on the first carrier wafer, and a third set of epitaxial structures or electronic devices Epi $3_3$ are bonded from Donor 3 to a third carrier wafer or another area on the first carrier wafer. In another bonding sequence, a second set of epitaxial structures or electronic devices Epi $1_2$ are bonded to the carrier wafer, a third set of epitaxial structures or electronic devices Epi $2_3$ are bonded to the carrier wafer, and a first set of epitaxial structures or electronic devices Epi $3_1$ are bonded to the carrier wafer. In yet another bonding sequence, a third set of epitaxial structures or electronic devices Epi $1_3$ are bonded to the carrier wafer, a first set of epitaxial structures or electronic devices Epi $2_1$ are bonded to the carrier wafer, and a second set of epitaxial structures or electronic devices Epi $3_2$ are bonded to the carrier wafer.

It should be understood that the method described above and partially illustrated in FIGS. 15A-15C is merely one example of this round robin bonding sequence. Other sequences, electronic devices, and number of donor wafers and carrier wafers may be used in accordance with the principles described. There are many configurations, sequences, arrangements, spatial layouts, geometries, and processes that could utilize this round robin approach. For example, FIGS. 15A-15C show a cross sectional view of a first electronic device type, a second electronic device type, and a third electronic device type arranged in a side-by-side or linear configuration. This linear configuration is one such arrangement for electronic devices, but of course there could be others.

Integrated circuits using transferred electronic devices in accordance with embodiments described herein include power management integrated circuits that integrate, for example, GaN power transistors with CMOS gate drivers for high performance buck power stage for high efficiency power conversion, RF front end integrated circuits that integrate, for example, GaN power amplifiers with RF SOI switches and InP low noise amplifiers for higher performance RF front end for 5G+ applications, and power electronics integrated circuits that integrate, for example, GaN HEMT's and IGBT's for high efficiency invertors for electric vehicles.

As used herein, the terms GaN substrate and gallium containing substrate are associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

The methods, structures, and configurations discussed above are examples. Various configurations may omit, substitute, or add various procedures or features as appropriate. For instance, in alternative configurations, the methods may be performed in an order different from that described, and/or various features may be added, omitted, and/or combined. Also, features described with respect to certain configurations may be combined in various other configurations. Different aspects and elements of the configurations may be combined in a similar manner. Also, technology evolves and thus many of the elements are examples and do not limit the scope of the disclosure or claims.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A carrier substrate configured with circuitry for distributing electronic signals or current, comprising:
    a plurality of electronic devices arranged in an array overlaying a surface region of the carrier substrate, wherein each of a first portion of the plurality of electronic devices include:
    gallium containing device layers of epitaxial material, the epitaxial material comprising at least an intrinsic-type or unintentionally doped gallium containing region or at least an n-type gallium containing region or at least a p-type gallium containing region or at least a combination of one or more of the intrinsic-type or unintentionally doped gallium containing region, the n-type gallium containing region, or the p-type gallium containing region; and
    one or more contact regions overlying the surface region of the carrier substrate, a surface region of the one or more contact regions contacting and bonded to a surface region of one or more metal contact regions of each electronic device, the one or more metal contact regions configured to provide an electrical coupling with at least one of the gallium containing device layers;
    and wherein each of a second portion of the plurality of electronic devices are different types of electronic devices than the first portion of the plurality of electronic devices.

2. The carrier substrate of claim 1 wherein the second portion of the plurality of electronic devices include at least one of other gallium nitride based electronic devices, silicon based electronic devices, or gallium arsenic based electronic devices.

3. The carrier substrate of claim 1 wherein the gallium containing device layers comprise gallium and nitrogen or gallium and arsenic.

4. The carrier substrate of claim 1 wherein the electronic devices comprise at least one of Schottky diode devices, p-n diode devices, bipolar junction transistor (BJT) devices, field-effect transistor (FET) devices, metal-oxide-semiconductor field-effect transistor (MOSFET) devices, junction field effect transistor (JFET) devices, enhancement mode junction field effect transistor (eJFET) devices, metal-semiconductor FET (MESFET) devices, high-electron-mobility transistor (HEMT) devices, insulated gate bipolar transistor (IGBT) devices, or heterojunction bipolar transistor (HBT) devices, metal-insulator semiconductor barrier Schottky rectifier devices, static induction transistor (SIT) devices, current apertured vertical electron transistor (CAVET) devices, and wherein the electronic devices comprise at least one of trench type devices, normally-on type devices, normally-off type devices, p-type devices, n-type devices, or combinations thereof.

5. The carrier substrate of claim 1 wherein the carrier substrate is selected from silicon substrate, a sapphire substrate, an aluminum nitride substrate, a silicon nitride substrate, a silicon carbide substrate, a glass substrate, a group V semiconductor substrate, a III-V semiconductor substrate, a II-VI semiconductor substrate, a glass substrate, a glass ceramic substrate, a quartz substrate, a high purity fused silica substrate, a silicon carbide substrate, an aluminum nitride substrate, a germanium substrate, an aluminum oxynitride substrate, a gallium arsenide substrate, a diamond substrate, a synthetic diamond substrate, a gallium nitride substrate, an indium phosphide substrate, a flexible member, a circuit board member, a CMOS substrate, a silicon substrate with CMOS circuitry, a silicon on insulator (SOI) substrate, or a gallium nitride on silicon substrate.

6. The carrier substrate of claim 1 wherein the plurality of electronic devices include one or more components, the one or more components being selected from at least one of an electrical contact bond pad, a current spreading region, a drift region, an insulation region, an edge termination region, an emitter region, a base region, a collector region, a gate region, a source region, a drain region, an isolation region, or a passivation region either alone or in any combination.

* * * * *